(12) United States Patent
Tarutani et al.

(10) Patent No.: US 8,088,550 B2
(45) Date of Patent: Jan. 3, 2012

(54) POSITIVE RESIST COMPOSITION AND PATTERN FORMING METHOD

(75) Inventors: Shinji Tarutani, Shizuoka (JP); Hideaki Tsubaki, Shizuoka (JP); Kenji Wada, Shizuoka (JP)

(73) Assignee: Fujifilm Corporation, Tokyo (JP)

( * ) Notice: Subject to any disclaimer, the term of this patent is extended or adjusted under 35 U.S.C. 154(b) by 386 days.

(21) Appl. No.: 12/181,757

(22) Filed: Jul. 29, 2008

(65) Prior Publication Data

US 2009/0035692 A1 Feb. 5, 2009

(30) Foreign Application Priority Data

Jul. 30, 2007 (JP) ................................ 2007-198055

(51) Int. Cl.
*G03F 7/004* (2006.01)
*G03F 7/30* (2006.01)

(52) U.S. Cl. ..................... 430/270.1; 430/326; 430/330; 430/910

(58) Field of Classification Search ............... 430/270.1, 430/326, 330, 910
See application file for complete search history.

(56) References Cited

U.S. PATENT DOCUMENTS

| 5,847,218 | A | * | 12/1998 | Ohsawa et al. ............... 564/430 |
| 5,880,169 | A | * | 3/1999 | Osawa et al. .................. 522/25 |
| 6,048,661 | A | * | 4/2000 | Nishi et al. .................. 430/270.1 |
| 6,794,108 | B1 | | 9/2004 | Sato et al. |
| 2006/0269871 | A1 | | 11/2006 | Harada et al. |
| 2007/0148589 | A1 | * | 6/2007 | Kanda et al. ................ 430/270.1 |
| 2007/0172761 | A1 | * | 7/2007 | Takahashi et al. .......... 430/270.1 |
| 2007/0172769 | A1 | * | 7/2007 | Kanna et al. ................... 430/311 |

FOREIGN PATENT DOCUMENTS

| EP | 0 667 338 A1 | 8/1995 |
| EP | 1 736 824 A2 | 12/2006 |
| EP | 1 830 227 A1 | 9/2007 |
| JP | 2002-75857 A | 3/2002 |
| WO | 2004/077158 A1 | 9/2004 |

OTHER PUBLICATIONS

B.J. Lin, "Plenary Paper—Semiconductor Foundry, Lithography, and Partners" Emerging Lithographic Technologies VI, SPIE Proc., vol. 4688 (2002) pp. 11-24.
Extended European Search Report issued on Sep. 15, 2008.

* cited by examiner

*Primary Examiner* — John Chu
(74) *Attorney, Agent, or Firm* — Sughrue Mion, PLLC

(57) ABSTRACT

A positive resist composition, includes: (A) a compound capable of generating an acid upon irradiation with actinic rays or radiation; (B) a resin of which solubility in an alkali developer increases under an action of an acid; (C) a compound capable of decomposing under an action of an acid to generate an acid; and (D) a compound which itself acts as a base for the acids generated from the component (A) and the component (C) but decomposes upon irradiation with actinic rays or radiation to lose a basicity for the acids generated from the component (A) and the component (C).

19 Claims, 1 Drawing Sheet

POSITIVE RESIST COMPOSITION AND PATTERN FORMING METHOD

BACKGROUND OF THE INVENTION

1. Field of the Invention

The present invention relates to a positive resist composition and a pattern forming method, more specifically, a pattern forming method for use in the production process of a semiconductor such as IC, in the production of a circuit substrate of liquid crystal, thermal head or the like, or in other photofabrication processes, in particular, a pattern forming method by KrF or ArF exposure using a chemical amplification resist such as positive resist,

2. Description of the Related Art

The chemical amplification resist composition is a pattern forming material for forming a pattern on a substrate by producing an acid in the exposed area upon irradiation with actinic rays or radiation such as far ultraviolet light and through a reaction using this acid as the catalyst, changing the solubility in a developer between the portion irradiated with actinic rays or radiation and the non-irradiated portion.

With recent miniaturization of the circuit pattern of a semiconductor device, a lithography technique using an ArF excimer laser (193 nm) as the exposure light source is fully in progress and in order to cope with higher miniaturization, an immersion exposure technique of filling a high refractive index liquid (hereinafter sometimes referred to as an "immersion liquid") between a projection lens and a sample is being applied to the mass production of a semiconductor device. Recent progress of the immersion exposure technique is reported, for example, in SPIE Proc., 4688, 11 (2002) and International Publication No. WO2004-077158, pamphlet.

However, even by employing this immersion exposure technique using an ArF excimer laser as the exposure light source, pattern formation of a 32 nm-generation semi-conductor device is considered to be impossible because of insufficient resolving power. For this reason, a method employing a special pattern forming method using an exposure machine having a projection lens with NA of 1.2 to 1.35 is attracting attention.

Several methods have been proposed for this special pattern forming method, and one of these methods is a double exposure process.

The double exposure process is a process of applying exposure twice on the same photoresist film, where the pattern in the exposure field is divided into two pattern groups and the exposure is preformed in twice for respective divided pattern groups.

JP-A-2002-75857 (the term "JP-A" as used herein means an "unexamined published Japanese patent application") indicates that it is indispensable in this method to have, like a two-photon absorption resist, a property of the photosensitivity or solubility in a developer being changed in proportion to the square of exposure intensity, but a resist having such a property has not been developed yet.

Under such a circumstance, a resist composition assured of high resolving power and responsive also to a double exposure process is keenly demanded.

SUMMARY OF THE INVENTION

An object of the present invention is to provide a resist composition and a pattern forming method, which are assured of high resolving power and applicable also to a multiple exposure process of performing exposure a plurality of times on the same resist film.

The present invention is as follows.

(1) A positive resist composition, comprising:

(A) a compound capable of generating an acid upon irradiation with actinic rays or radiation;

(B) a resin of which solubility in an alkali developer increases under an action of an acid;

(C) a compound capable of decomposing under an action of an acid to generate an acid; and (D) a compound which itself acts as a base for the acids generated from the component (A) and the component (C) but decomposes upon irradiation with actinic rays or radiation to lose a basicity for the acids generated from the component (A) and the component (C).

(2) The positive resist composition as described in (1) above, wherein the resin as the component (B) contains at least one of a repeating unit represented by formula (Ia) and a repeating unit represented by formula (Ib) and is a resin of which solubility in an alkali developer increases under an action of an acid:

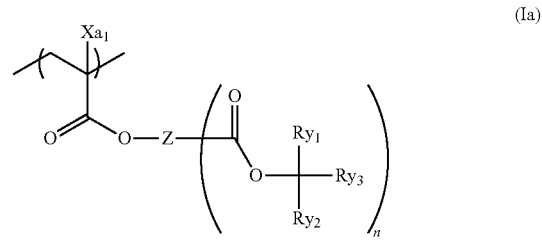

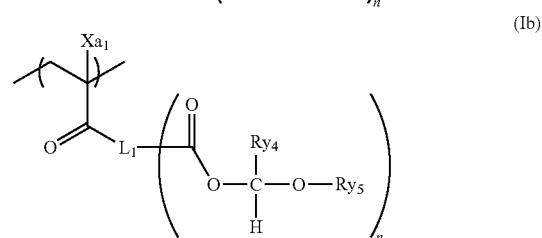

wherein $Xa_1$ represents a hydrogen atom, an alkyl group, a cyano group or a halogen atom;

$Ry_1$ to $Ry_3$ each independently represents an alkyl group or a cycloalkyl group, and at least two members out of $Ry_1$ to $Ry_3$ may combine to form a monocyclic or polycyclic cyclohydrocarbon structure;

Z represents a (n+1)-valent linking group;

$Ry_4$ and $Ry_5$ each independently represents an alkyl group or a cycloalkyl group, and $Ry_4$ and $Ry_5$ may combine to form a monocyclic or polycyclic cyclohydrocarbon structure;

$L_1$ represents a (n+1)-valent linking group; and n represents an integer of 1 to 3.

(3) The positive resist composition as described in (1) or (2) above, wherein the compound as the component (D) is a compound capable of generating at least one of a carboxylic acid and a compound represented by formula (I) upon irradiation with actinic rays or radiation:

wherein $R_1$ and $R_2$ each independently represents a monovalent organic group, provided that either one of $R_1$ and $R_2$ has a proton acceptor functional group, $R_1$ and $R_2$ may combine to form a ring, and the ring formed may have a proton acceptor functional group; and $X_1$ and $X_2$ each independently represents —CO— or —SO$_2$—.

(4) The positive resist composition as described in any of (1) to (3) above, wherein the compound as the component (A) is a sulfonium salt of an alkylsulfonic acid, a benzenesulfonic acid, an imide acid or a methide acid.

(5) The positive resist composition as described in any of (1) to (4) above, wherein the compound as the component (C) generates the same acid under an action of an acid as the acid generated from the compound as the component (A) upon irradiation with actinic rays or radiation.

(6) A pattern forming method, comprising:

forming a resist film from the positive resist composition as described in any of (1) to (5) above; and exposing and developing the resist film.

Furthermore, the preferred embodiment of the present invention includes the following constructions.

(7) The positive resist composition as described in any of (1) to (5) above, wherein the resin as the component (B) further contains a repeating unit having a lactone structure.

(8) The positive resist composition as described in any of (1) to (5) and (7) above, wherein the resin as the component (B) further contains a repeating unit having a hydroxyl group or a cyano group.

(9) The positive resist composition as described in any of (1) to (5), (7) and (8) above, further comprising:

at least one of a fluorine-containing surfactant and a silicon-containing surfactant.

(10) The positive resist composition as described in any of (1) to (5) and (7) to (9) above, further comprising:

a hydrophobic resin.

(11) A pattern forming method, comprising in this order:

coating a substrate with the positive resist composition as described in any of (1) to (5) and (7) to (9) above, so as to form a resist film;

exposing the resist film;

heating the resist film at a first temperature;

heating the resist film at a second temperature; and developing the resist film, wherein the second temperature is higher than the first temperature.

DETAILED DESCRIPTION OF THE INVENTION

Figure 1:
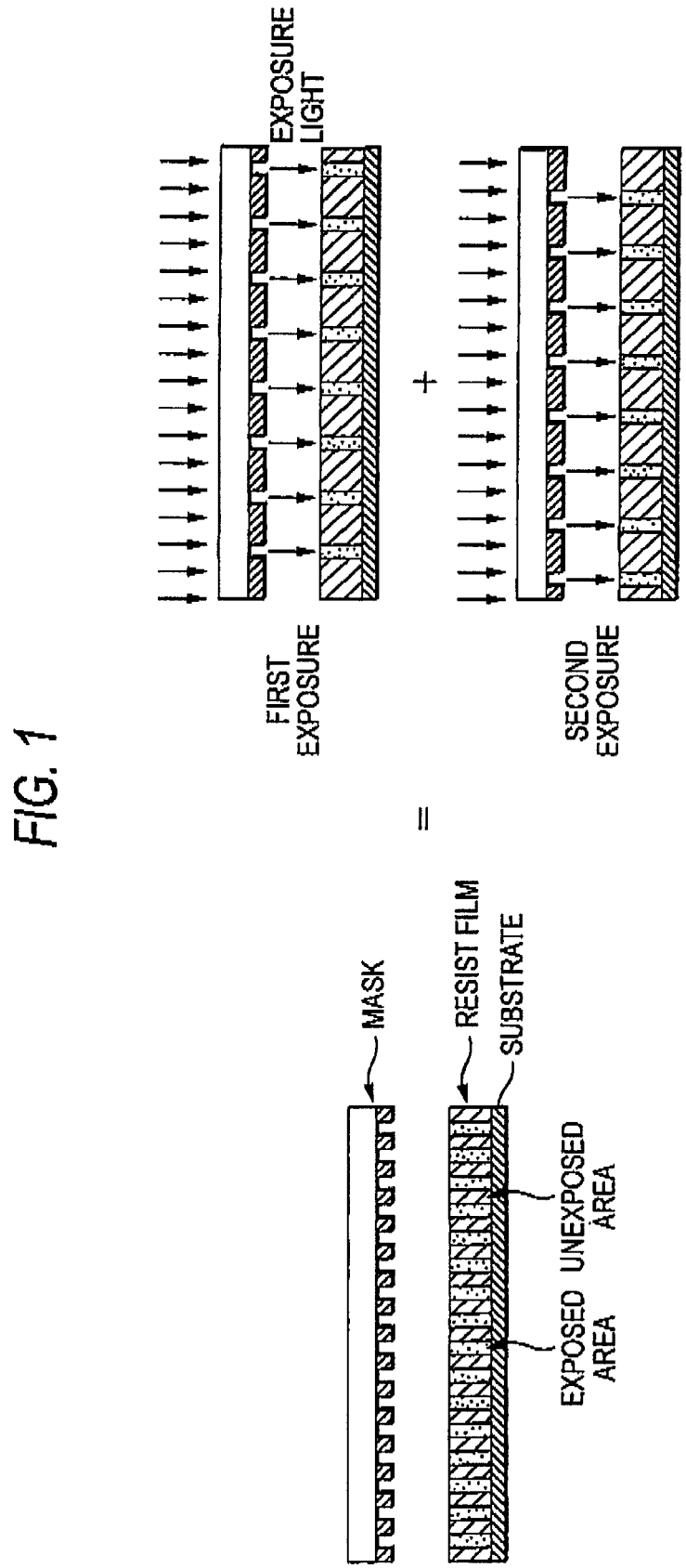
FIG. 1 represents a schematic view showing the state of the double exposure process in the present invention.

The best mode for carrying out the present invention is described below.

Incidentally, in the present invention, when a group (atomic group) is denoted without specifying whether substituted or unsubstituted, the group includes both a group having no substituent and a group having a substituent. For example, an "alkyl group" includes not only an alkyl group having no substituent (unsubstituted alkyl group) but also an alkyl group having a substituent (substituted alkyl group).

<Positive Resist Composition>

(A) Compound Capable of Generating an Acid Upon Irradiation with Actinic Rays or Radiation The positive resist composition of the present invention contains a compound capable of generating an acid upon irradiation with actinic rays or radiation (hereinafter sometimes referred to as an "acid generator").

The acid generator which can be used may be appropriately selected from a photoinitiator for photocationic polymerization, a photoinitiator for photoradical polymerization, a photo-decoloring agent for coloring matters, a photo-discoloring agent, a compound known to generate an acid upon irradiation with actinic rays or radiation and used for microresist or the like, and a mixture thereof Examples thereof include a diazonium salt, a phosphonium salt, a sulfonium salt, an iodonium salt, imidosulfonate, oxime sulfonate, diazodisulfone, disulfone and o-nitrobenzyl sulfonate.

Also, a compound where such a group or compound capable of generating an acid upon irradiation with actinic rays or radiation is introduced into the main or side chain of a polymer, for example, compounds described in U.S. Pat. No. 3,849,137, German Patent 3,914,407, JP-A-63-26653, JP-A-55-164824, JP-A-62-69263, JP-A-63-146038, JP-A-63-163452, JP-A-62-153853 and JP-A-63-146029, may be used.

Furthermore, compounds capable of generating an acid by the effect of light described, for example, in U.S. Pat. No. 3,779,778 and European Patent 126,712 may also be used.

Out of the acid generators, the compounds represented by the following formulae (ZI), (ZII) and (ZIII) are preferred.

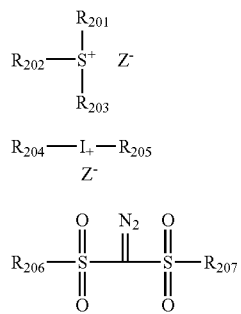

In formula (ZI), $R_{201}$, $R_{202}$ and $R_{203}$ each independently represents an organic group.

The carbon number of the organic group as $R_{201}$, $R_{202}$ and $R_{203}$ is generally from 1 to 30, preferably from 1 to 20.

Two members out of $R_{201}$ to $R_{203}$ may combine to form a ring structure, and the ring may contain an oxygen atom, a sulfur atom, an ester bond, an amide bond or a carbonyl group. Examples of the group formed by combining two members out of $R_{201}$ to $R_{203}$ include an alkylene group (e.g., butylene, pentylene).

$Z^-$ represents a non-nucleophilic anion.

Examples of the non-nucleophilic anion as $Z^-$ include sulfonate anion, carboxylate anion, sulfonylimide anion, bis(alkylsulfonyl)imide anion and tris(alkylsulfonyl)methyl anion, with sulfonate anion being preferred.

The non-nucleophilic anion is an anion having an extremely low ability of causing a nucleophilic reaction and this anion can suppress the decomposition with aging due to intramolecular nucleophilic reaction. By virtue of this anion, the aging stability of the resist is enhanced.

Examples of the sulfonate anion include aliphatic sulfonate anion, aromatic sulfonate anion and camphorsulfonate anion.

Examples of the carboxylate anion include aliphatic carboxylate anion, aromatic carboxylate anion and aralkylcarboxylate anion.

The aliphatic moiety in the aliphatic sulfonate anion may be an alkyl group or a cycloalkyl group and is preferably an alkyl group having a carbon number of 1 to 30 or a cycloalkyl group having a carbon number of 3 to 30. Examples thereof include a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an eicosyl group, a cyclopropyl group, a cyclopentyl group, a cyclohexyl group, an adamantyl group, a norbornyl group and a boronyl group.

The aromatic group in the aromatic sulfonate anion is preferably an aryl group having a carbon number of 6 to 14, and examples thereof include a phenyl group, a tolyl group and a naphthyl group.

The alkyl group, cycloalkyl group and aryl group in the aliphatic sulfonate anion and aromatic sulfonate anion each may have a substituent. Examples of the substituent of the alkyl group, cycloalkyl group and aryl group in the aliphatic sulfonate anion and aromatic sulfonate anion include a nitro group, a halogen atom (e.g., fluorine, chlorine, bromine, iodine), a carboxyl group, a hydroxyl group, an amino group, a cyano group, an alkoxy group (preferably having a carbon number of 1 to 15), a cycloalkyl group (preferably having a carbon number of 3 to 15), an aryl group (preferably having a carbon number of 6 to 14), an alkoxycarbonyl group (preferably having a carbon number of 2 to 7), an acyl group (preferably having a carbon number of 2 to 12), an alkoxycarbonyloxy group (preferably having a carbon number of 2 to 7), an alkylthio group (preferably having a carbon number of 1 to 15), an alkylsulfonyl group (preferably having a carbon number of 1 to 15), an alkyliminosulfonyl group (preferably having a carbon number of 2 to 15), an aryloxysulfonyl group (preferably having a carbon number of 6 to 20), an alkylaryloxysulfonyl group (preferably having a carbon number of 7 to 20), a cycloalkylaryloxysulfonyl group (preferably having a carbon number of 10 to 20), an alkyloxyalkyloxy group (preferably having a carbon number of 5 to 20) and a cycloalkylakyloxyalkyloxy group (preferably having a carbon number of 8 to 20). As for the aryl group or ring structure in each group, examples of the substituent further include an alkyl group (preferably having a carbon number of 1 to 15).

The sulfonate anion which is preferably used in the present invention can be represented by the following formula:

$R—SO_3^-$

In the formula above, R represents an alkyl group, a cycloalkyl group, an aryl group, an aralkyl group, an alkoxy group, an alkenyl group, an aryloxy group or an alkenyloxy group.

The alkyl group includes an alkyl group having a carbon number of 1 to 8, and specific examples thereof include a methyl group, an ethyl group, a propyl group, an isopropyl group, a butyl group and an octyl group.

The cycloalkyl group includes a cycloalkyl group having a carbon number of 4 to 10, and specific examples thereof include a cyclopropyl group, a cyclopentyl group, a cyclohexyl group, a cycloheptyl group, an adamantyl group, a boronyl group, an isoboronyl group, a tricyclodecanyl group, a dicyclopentenyl group, a norbornane epoxy group, a menthyl group, an isomenthyl group, a neomenthyl group and a tetracyclododecanyl group.

The aryl group includes an aryl group having a carbon number of 6 to 14, and specific examples thereof include a phenyl group, a naphthyl group and a tolyl group.

The aralkyl group includes an aralkyl group having a carbon number of 7 to 20, and specific examples thereof include a benzyl group, a phenethyl group and a naphthylethyl group.

The alkoxy group includes an alkoxy group having a carbon number of 1 to 8, and specific examples thereof include a methoxy group, an ethoxy group, a propoxy group and a butoxy group.

The alkenyl group includes an alkenyl group having a carbon number of 2 to 6, and specific examples thereof include a vinyl group, a propenyl group, an allyl group, a butenyl group, a pentenyl group, a hexenyl group and a cyclohexenyl group.

The aryloxy group includes an aryloxy group having a carbon number of 6 to 14, and specific examples thereof include a phenoxy group and a naphthoxy group.

The alkenyloxy group includes an alkenyloxy group having a carbon number of 2 to 8, and specific examples thereof include a vinyloxy group and an allyloxy group.

These substituents each may further have a substituent, and examples of the substituent include a halogen atom such as Cl, Br and F, a —CN group, an —OH group, an alkyl group having a carbon number of 1 to 4, a cycloalkyl group having a carbon number of 3 to 8, an alkoxy group having a carbon number of 1 to 4, an acylamino group such as acetylamino group, an aralkyl group such as benzyl group and phenethyl group, an aryloxyalkyl group such as phenoxyethyl group, an alkoxycarbonyl group having a carbon number of 2 to 5, and an acyloxy group having a carbon number of 2 to 5. However, the range of the substituent is not limited thereto.

Preferred examples of R include a methyl group, an ethyl group, a propyl group, a butyl group, an octyl group, a trifluoromethyl group, a nonafluorobutyl group, a heptadecafluorooctyl group, a 2,2,2-trifluoroethyl group, a phenyl group, a pentafluorophenyl group, a methoxyphenyl group, a toluyl group, a mesityl group, a fluorophenyl group, a naphthyl group, a cyclohexyl group and a camphor group.

Specific examples of the sulfonate anion represented by the formula above are set forth below, but the contents of the present invention are not limited thereto.

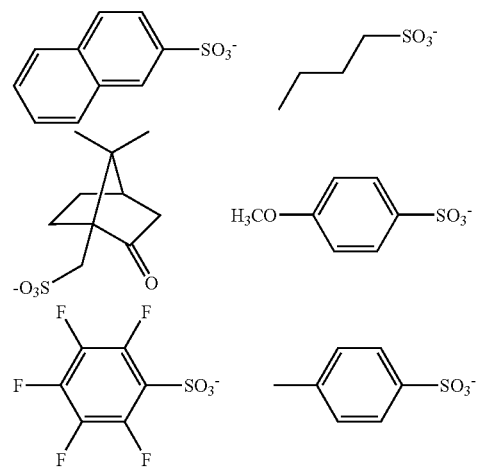

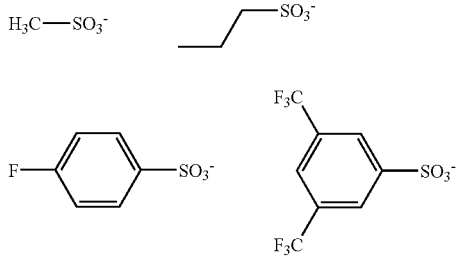
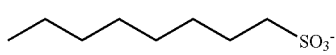
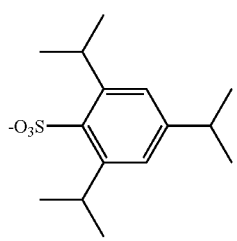
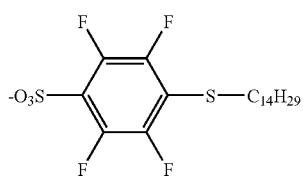
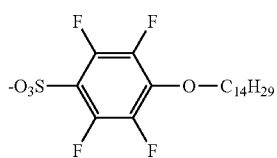
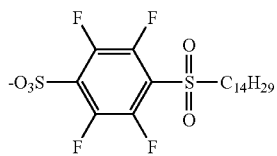
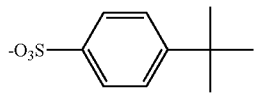
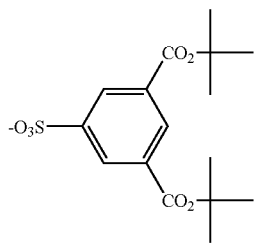

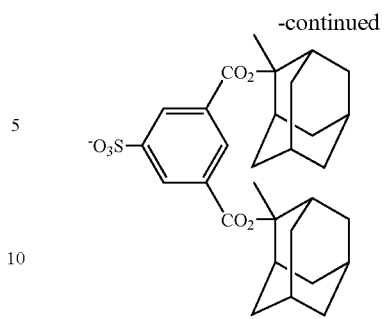
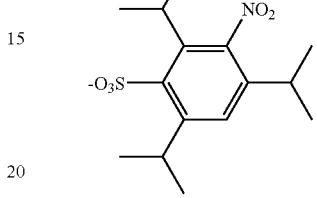
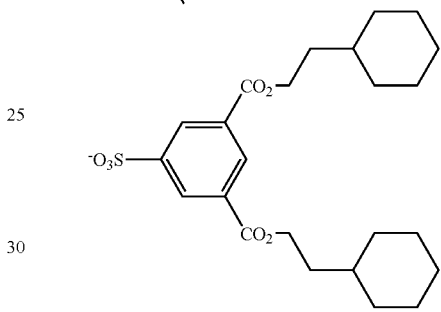

Examples of the aliphatic moiety in the aliphatic carboxylate anion include the same alkyl group and cycloalkyl group as in the aliphatic sulfonate anion.

Examples of the aromatic group in the aromatic carboxylate anion include the same aryl group as in the aromatic sulfonate anion.

The aralkyl group in the aralkylcarboxylate anion is preferably an aralkyl group having a carbon number of 6 to 12, and examples thereof include a benzyl group, a phenethyl group, a naphthylmethyl group, a naphthylethyl group and a naphthylmethyl group.

The alkyl group, cycloalkyl group, aryl group and aralkyl group in the aliphatic carboxylate anion, aromatic carboxylate anion and aralkylcarboxylate anion each may have a substituent. Examples of the substituent of the alkyl group, cycloalkyl group, aryl group and araklyl group in the aliphatic carboxylate anion, aromatic carboxylate anion and aralkylarboxylate anion include the same halogen atom, alkyl group, cycloalkyl group, alkoxy group and alkylthio group as in the aromatic sulfonate anion.

Examples of the sulfonylimide anion include saccharin anion.

The alkyl group in the bis(alkylsulfonyl)imide anion and tris(alkylsulfonyl)methyl anion is preferably an alkyl group having a carbon number of 1 to 5, and examples thereof include a methyl group, an ethyl group, a propyl group, an isopropyl group, an n-butyl group, an isobutyl group, a sec-butyl group, a pentyl group and a neopentyl group. Examples of the substituent of such an alkyl group include a halogen atom, a halogen atom-substituted alkyl group, an alkoxy group, an alkylthio group, an alkyloxysulfonyl group, an aryloxysulfonyl group, and a cycloalkylaryloxysulfonyl group, with a fluorine atom-substituted alkyl group being preferred.

Other examples of the non-nucleophilic anion include fluorinated phosphorus, fluorinated boron and fluorinated antimony.

The non-nucleophilic anion of $Z^-$ is preferably an aliphatic sulfonate anion substituted by a fluorine atom at the α-position of the sulfonic acid, an aromatic sulfonate anion substituted by a fluorine atom or a group having a fluorine atom, a bis(alkylsulfonyl)imide anion with the alkyl group being substituted by a fluorine atom, or a tris(alkylsulfonyl)methide anion with the alkyl group being substituted by a fluorine atom. The non-nucleophilic anion is more preferably a perfluoroaliphatic sulfonate anion having a carbon number of 4 to 8 or a benzenesulfonate anion having a fluorine atom, still more preferably nonafluorobutanesulfonate anion, perfluorooctanesulfonate anion, pentafluorobenzenesulfonate anion or 3,5-bis(trifluoromethyl)benzenesulfonate anion.

Examples of the organic group as $R_{201}$, $R_{202}$ and $R_{203}$ include the corresponding groups in the compounds (ZI-1), (ZI-2) and (ZI-3) described later.

The compound may be a compound having a plurality of structures represented by formula (ZI), for example, may be a compound having a structure where at least one of $R_{201}$ to $R_{203}$ in the compound represented by formula (ZI) is bonded to at least one of $R_{201}$ to $R_{203}$ in another compound represented by formula (ZI).

The component (ZI) is more preferably a compound (ZI-1), (ZI-2) or (ZI-3) described below.

The compound (ZI-1) is an arylsulfonium compound where at least one of $R_{201}$ to $R_{203}$ in formula (ZI) is an aryl group, that is, a compound having arylsulfonium as the cation.

In the arylsulfonium compound, $R_{201}$ to $R_{203}$ all may be an aryl group or a part of $R_{201}$ to $R_{203}$ may be an aryl group with the remaining being an alkyl group or a cycloalkyl group.

Examples of the arylsulfonium compound include a triarylsulfonium compound, a diarylalkylsulfonium compound, an aryldialkylsulfonium compound, a diarylcycloalkyl-sulfonium compound and an aryldicycloalkylsulfonium compound.

The aryl group in the arylsulfonium compound is preferably a phenyl group or a naphthyl group, more preferably a phenyl group. The aryl group may be an aryl group having a heterocyclic structure containing an oxygen atom, a nitrogen atom, a sulfur atom or the like. Examples of the aryl group having a heterocyclic structure include a pyrrole residue (a group formed by removing one hydrogen atom from a pyrrole), a furan residue (a group formed by removing one hydrogen atom from a furan), a thiophene residue (a group formed by removing one hydrogen atom from a thiophene), an indole residue (a group formed by removing one hydrogen atom from an indole), a benzofuran residue (a group formed by removing one hydrogen atom from a benzofuran) and a benzothiophene residue (a group formed by removing one hydrogen atom from a benzothiophene). In the case where the arylsulfonium compound has two or more aryl groups, these two or more aryl groups may be the same or different.

The alkyl group or cycloalkyl group which is present, if desired, in the arylsulfonium compound is preferably a linear or branched alkyl group having a carbon number of 1 to 15 or a cycloalkyl group having a carbon number of 3 to 15, and examples thereof include a methyl group, an ethyl group, a propyl group, an n-butyl group, a sec-butyl group, a tert-butyl group, a cyclopropyl group, a cyclobutyl group and a cyclohexyl group.

The aryl group, alkyl group and cycloalkyl group of $R_{201}$ to $R_{203}$ each may have, as the substituent, an alkyl group (for example, an alkyl group having a carbon number of 1 to 15), a cycloalkyl group (for example, a cycloalkyl group having a carbon number of 3 to 15), an aryl group (for example, an aryl group having a carbon number of 6 to 14), an alkoxy group (for example, an alkoxy group having a carbon number of 1 to 15), a halogen atom, a hydroxyl group or a phenylthio group. The substituent is preferably a linear or branched alkyl group having a carbon number of 1 to 12, a cycloalkyl group having a carbon number of 3 to 12, or a linear, branched or cyclic alkoxy group having a carbon number of 1 to 12, more preferably an alkyl group having a carbon number of 1 to 4, or an alkoxy group having a carbon number of 1 to 4. The substituent may be substituted to any one of three members $R_{201}$ to $R_{203}$ or may be substituted to all of these three members. In the case where $R_{201}$ to $R_{203}$ are an aryl group, the substituent is preferably substituted at the p-position of the aryl group.

The compound (ZI-2) is described below.

The compound (ZI-2) is a compound where $R_{201}$ to $R_{203}$ in formula (ZI) each independently represents an aromatic ring-free organic group. The aromatic ring as used herein includes an aromatic ring containing a heteroatom.

The aromatic ring-free organic group as $R_{201}$ to $R_{203}$ has a carbon number of generally from 1 to 30, preferably from 1 to 20.

$R_{201}$ to $R_{203}$ each independently represents preferably an alkyl group, a cycloalkyl group, an allyl group or a vinyl group, more preferably a linear or branched 2-oxoalkyl group, a 2-oxocycloalkyl group or an alkoxycarbonylmethyl group, still more preferably a linear or branched 2-oxoalkyl group.

The alkyl group or cycloalkyl group of $R_{201}$ to $R_{203}$ is preferably a linear or branched alkyl group having a carbon number of 1 to 10 (e.g., methyl, ethyl, propyl, butyl, pentyl) or a cycloalkyl group having a carbon number of 3 to 10 (e.g., cyclopentyl, cyclohexyl, norbornyl). The alkyl group is more preferably a 2-oxoalkyl group or an alkoxycarbonylmethyl group. The cycloalkyl group is more preferably a 2-oxocycloalkyl group.

The 2-oxoalkyl group may be either linear or branched and is preferably a group having >C=O at the 2-position of the above-described alkyl group.

The 2-oxocycloalkyl group is preferably a group having >C=O at the 2-position of the above-described cycloalkyl group.

The alkoxy group in the alkoxycarbonylmethyl group is preferably an alkoxy group having a carbon number of 1 to 5 (e.g., methoxy, ethoxy, propoxy, butoxy, pentoxy).

$R_{201}$ to $R_{203}$ each may be further substituted by a halogen atom, an alkoxy group (for example, an alkoxy group having a carbon number of 1 to 5), a hydroxyl group, a cyano group or a nitro group.

The compound (ZI-3) is a compound represented by the following formula (ZI-3), and this is a compound having a phenacylsulfonium salt structure.

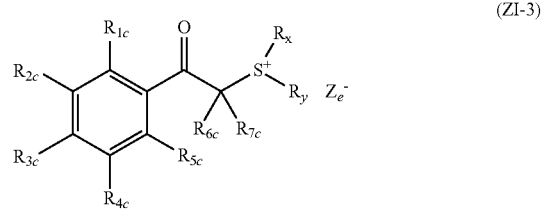

(ZI-3)

In formula (ZI-3), $R_{1c}$ to $R_{5c}$ each independently represents a hydrogen atom, an alkyl group, a cycloalkyl group, an alkoxy group or a halogen atom.

$R_{6c}$ and $R_{7c}$ each independently represents a hydrogen atom, an alkyl group or a cycloalkyl group.

$R_x$ and $R_y$ each independently represents an alkyl group, a cycloalkyl group, an allyl group or a vinyl group.

Any two or more members out of $R_{1c}$ to $R_{5c}$, a pair of $R_{6c}$ and $R_{7c}$, or a pair of $R_x$ and $R_y$ may combine with each other to form a ring structure. This ring structure may contain an oxygen atom, a sulfur atom, an ester bond or an amido bond. Examples of the group formed by combining any two or more members out of $R_{1c}$ to $R_{5c}$, a pair of $R_{6c}$ and $R_{7c}$, or a pair of $R_x$ and $R_y$ include a butylene group and a pentylene group.

$Zc^-$ represents a non-nucleophilic anion, and examples thereof are the same as those of the non-nucleophilic anion of $Z^-$ in formula (ZI).

The alkyl group as $R_{1c}$ to $R_{7c}$ may be either linear or branched and is, for example, an alkyl group having a carbon number of 1 to 20, preferably a linear or branched alkyl group having a carbon number of 1 to 12 (e.g., methyl, ethyl, linear or branched propyl, linear or branched butyl, linear or branched pentyl). The cycloalkyl group is, for example, a cycloalkyl group having a carbon number of 3 to 8 (e.g., cyclopentyl, cyclohexyl).

The alkoxy group as $R_{1c}$ to $R_{5c}$ may be linear, branched or cyclic and is, for example, an alkoxy group having a carbon number of 1 to 10, preferably a linear or branched alkoxy group having a carbon number of 1 to 5 (e.g., methoxy, ethoxy, linear or branched propoxy, linear or branched butoxy, linear or branched pentoxy) or a cyclic alkoxy group having a carbon number of 3 to 8 (e.g., cyclopentyloxy, cyclohexyloxy).

A compound where any one of $R_{1c}$ to $R_{5c}$ is a linear or branched alkyl group, a cycloalkyl group or a linear, branched or cyclic alkoxy group is preferred, and a compound where the sum of carbon numbers of $R_{1c}$ to $R_{5c}$ is from 2 to 15 is more preferred. By virtue of such a compound, the solvent solubility is more enhanced and production of particles during storage can be suppressed.

Examples of the alkyl group and cycloalkyl group as $R_x$ and $R_y$ are the same as those of the alkyl group and cycloalkyl group in $R_{1c}$ to $R_{7c}$. Among these, a 2-oxoalkyl group, a 2-oxocycloalkyl group and an alkoxycarbonylmethyl group are preferred.

Examples of the 2-oxoalkyl group and 2-oxocycloalkyl group include a group having >C=O at the 2-position of the alkyl group or cycloalkyl group as $R_{1c}$ to $R_{7c}$.

Examples of the alkoxy group in the alkoxycarbonylmethyl group are the same as those of the alkoxy group in $R_{1c}$ to $R_{5c}$.

$R_x$ and $R_y$ each is preferably an alkyl or cycloalkyl group having a carbon number of 4 or more, more preferably 6 or more, still more preferably 8 or more.

In formulae (ZII) and (ZIII), $R_{204}$ to $R_{207}$ each independently represents an aryl group, an alkyl group or a cycloalkyl group.

The aryl group of $R_{204}$ to $R_{207}$ is preferably a phenyl group or a naphthyl group, more preferably a phenyl group. The aryl group of $R_{204}$ and $R_{207}$ may be an aryl group having a heterocyclic structure containing an oxygen atom, a nitrogen atom, a sulfur atom or the like. Examples of the aryl group having a heterocyclic structure include a pyrrole residue (a group formed by removing one hydrogen atom from a pyrrole), a furan residue (a group formed by removing one hydrogen atom from a furan), a thiophene residue (a group formed by removing one hydrogen atom from a thiophene), an indole residue (a group formed by removing one hydrogen atom from an indole), a benzofuran residue (a group formed by removing one hydrogen atom from a benzofuran) and a benzothiophene residue (a group formed by removing one hydrogen atom from a benzothiophene).

The alkyl group or cycloalkyl group in $R_{204}$ to $R_{207}$ is preferably a linear or branched alkyl group having a carbon number of 1 to 10 (e.g., methyl, ethyl, propyl, butyl, pentyl) or a cycloalkyl group having a carbon number of 3 to 10 (e.g., cyclopentyl, cyclohexyl, norbornyl).

The aryl group, alkyl group and cycloalkyl group of $R_{204}$ to $R_{207}$ each may have a substituent. Examples of the substituent which the aryl group, alkyl group and cycloalkyl group of $R_{204}$ to $R_{207}$ each may have include an alkyl group (for example, an alkyl group having a carbon number of 1 to 15), a cycloalkyl group (for example, a cycloalkyl group having a carbon number of 3 to 15), an aryl group (for example, an aryl group having a carbon number of 6 to 15), an alkoxy group (for example, an alkoxy group having a carbon number of 1 to 15), a halogen atom, a hydroxyl group and a phenylthio group.

$Z^-$ represents a non-nucleophilic anion, and examples thereof are the same as those of the non-nucleophilic anion of $Z^-$ in formula (ZI).

Other examples of the acid generator include the compounds represented by the following formulae (ZIV), (ZV) and (ZVI).

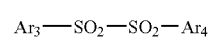

ZIV

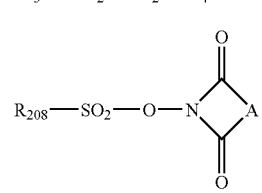

ZV

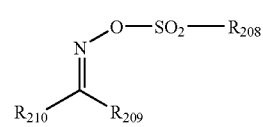

ZVI

In formulae (ZIV) to (ZVI), $Ar_3$ and $Ar_4$ each independently represents an aryl group.

$R_{208}$, $R_{209}$ and $R_{210}$ each independently represents an alkyl group, a cycloalkyl group or an aryl group.

A represents an alkylene group, an alkenylene group or an arylene group.

Among the acid generators, more preferred are the compounds represented by formulae (ZI) to (ZIII).

The acid generator is preferably a compound capable of generating an acid having one sulfonic acid group or imide group, more preferably a compound capable of generating a monovalent perfluoroalkanesulfonic acid, a compound capable of generating a monovalent aromatic sulfonic acid substituted by a fluorine atom or a fluorine atom-containing group, or a compound capable of generating a monovalent imide acid substituted by a fluorine atom or a fluorine atom-containing group, still more preferably a sulfonium salt of fluoro-substituted alkanesulfonic acid, fluorine-substituted benzenesulfonic acid, fluorine-substituted imide acid or fluorine-substituted methide acid. In particular, the acid generated from the acid generator which can be used is preferably a fluoro-substituted alkanesulfonic acid, fluoro-substituted benzenesulfonic acid or fluoro-substituted imide acid having a pica of −1 or less and in this case, the sensitivity can be enhanced.
Among the acid generators, particularly preferred compounds are set forth below.
(z1a)
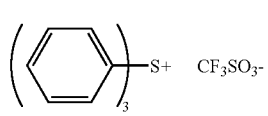
(z2a)
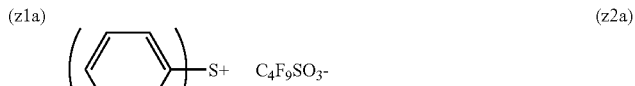
(z3a)
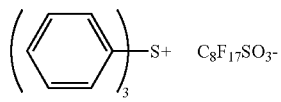
(z4a)
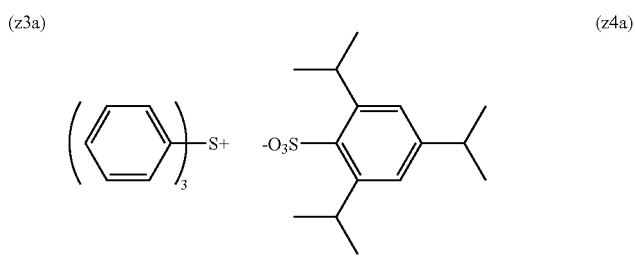
(z5a)
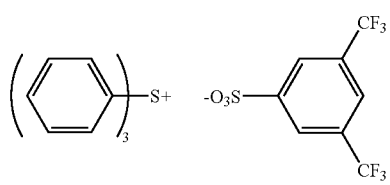
(z6a)
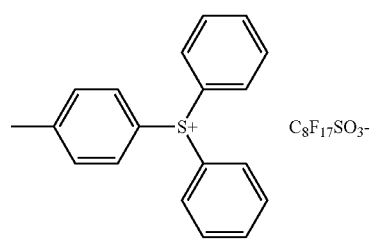
(z7a)
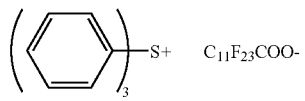
(z8a)
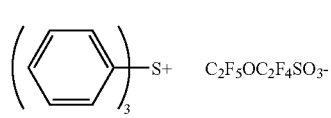
(z9a)
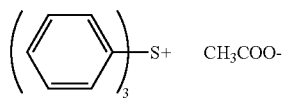
(z10a)
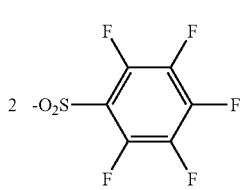
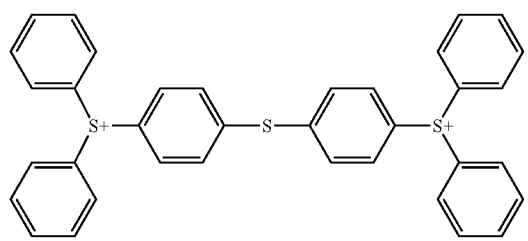
(z11a)
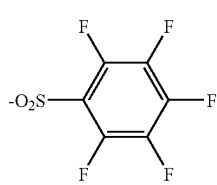
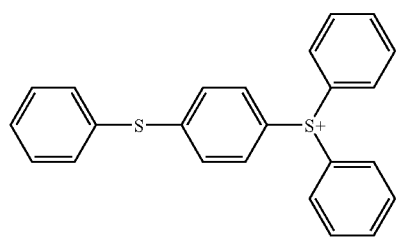
(z12a)
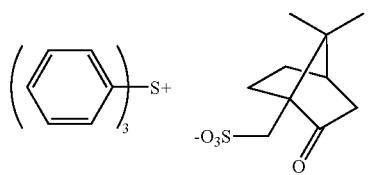
(z13a)
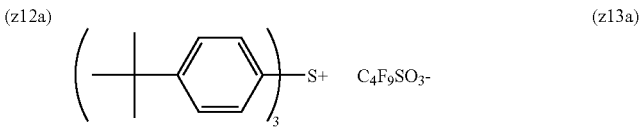

(z14a) 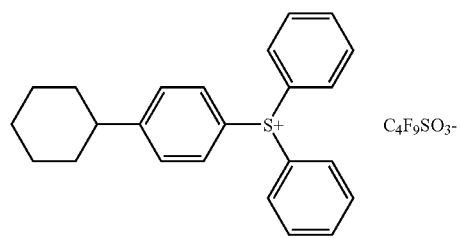 C_4F_9SO_3^-
(z15a) 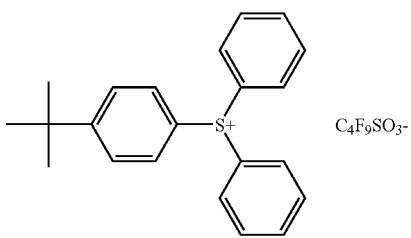 C_4F_9SO_3^-
(z16a) 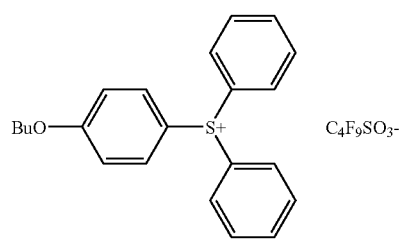 C_4F_9SO_3^-
(z17a) 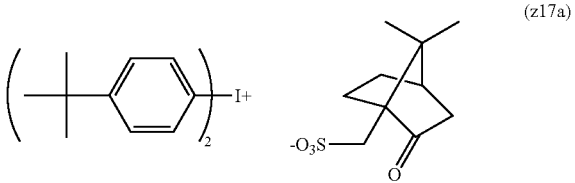 
(z18a) 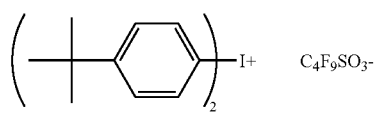 C_4F_9SO_3^-
(z19a) 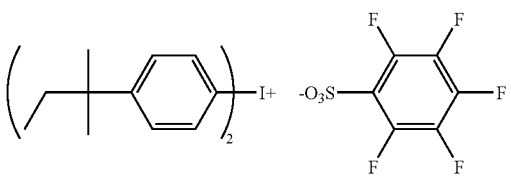
(z20a) 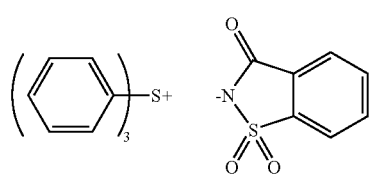
(z21a) 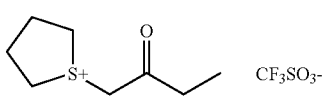 CF_3SO_3^-
(z22a) 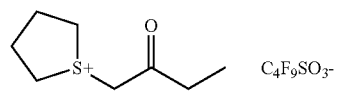 C_4F_9SO_3^-
(z23a) 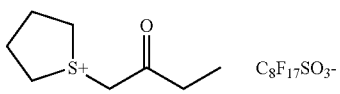 C_8F_17SO_3^-
(z24a) 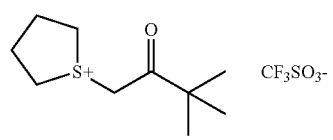 CF_3SO_3^-
(z25a) 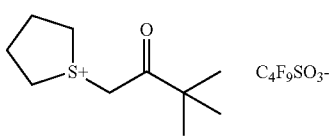 C_4F_9SO_3^-
(z26a) 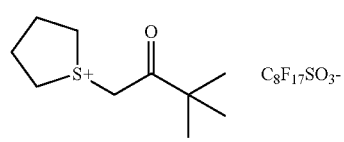 C_8F_17SO_3^-
(z27a) 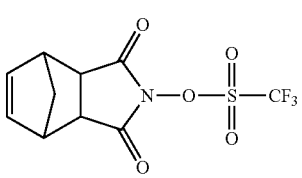
(z28a) 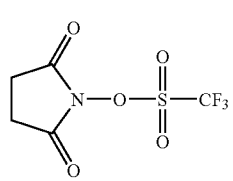
(z29a) 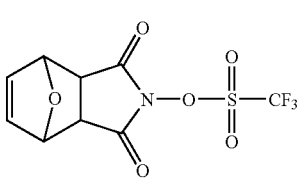
(z30a) 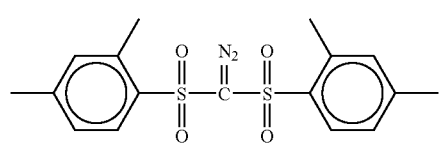
(z31a) 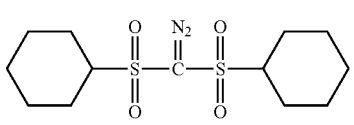

(z32a) 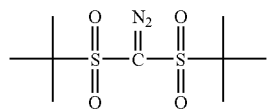
(z33a) 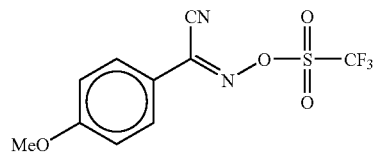
(z34a) 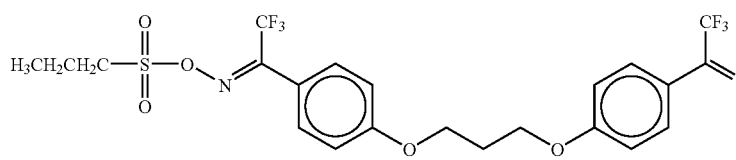
(z35a) 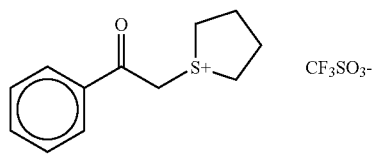 CF₃SO₃⁻
(z36a) 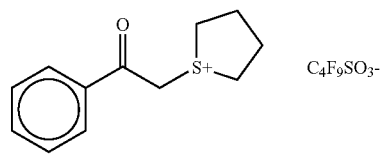 C₄F₉SO₃⁻
(z37a) 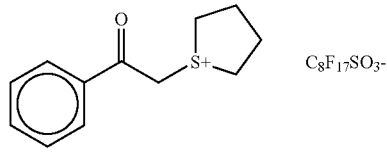 C₈F₁₇SO₃⁻
(z38a) 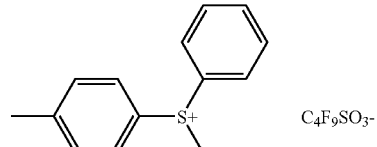 C₄F₉SO₃⁻
(z39a) 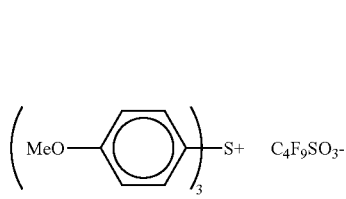 C₄F₉SO₃⁻
(z40a) 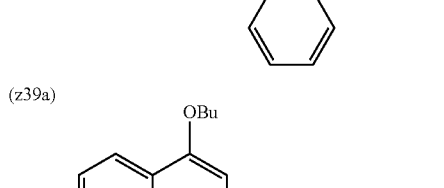 C₄F₉SO₃⁻
(z41a) 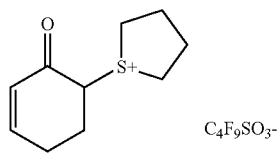 C₄F₉SO₃⁻
(z42a) 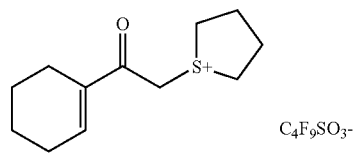 C₄F₉SO₃⁻
(z43a) 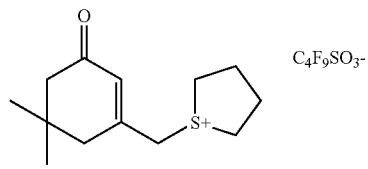 C₄F₉SO₃⁻
(z44a) 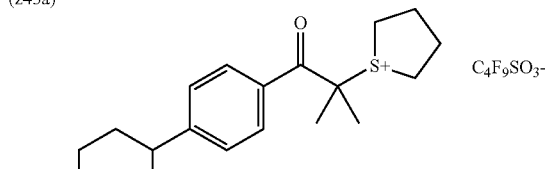 C₄F₉SO₃⁻
(z45a) 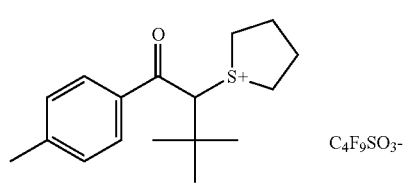 C₄F₉SO₃⁻
(z46a) 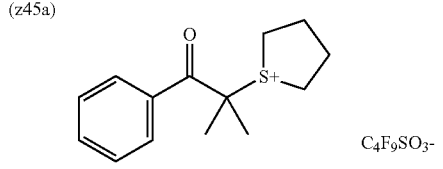 C₄F₉SO₃⁻

-continued
(z47a) 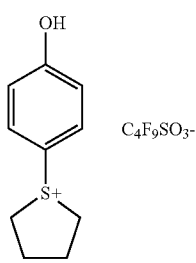
(z48a) 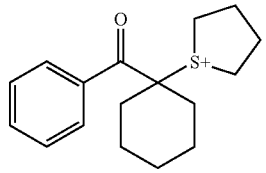
(z49a) 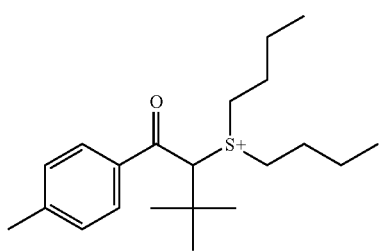
(z50a) 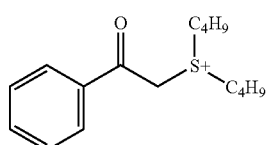
(z51a) 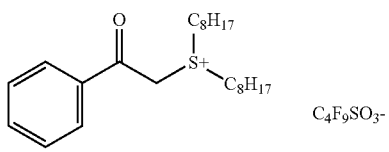
(z52a) 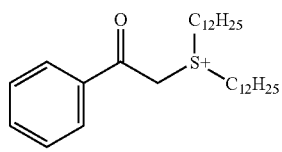
(z53a) 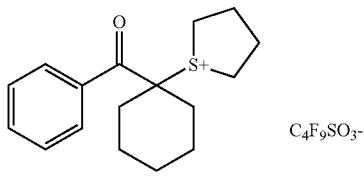
(z54a) 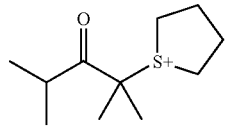
(z55a) 
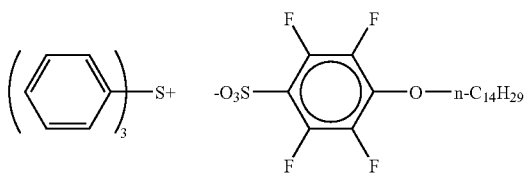
(z56a) 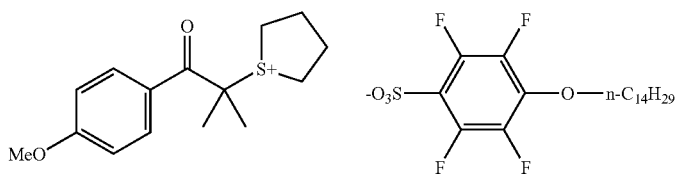
(z57a) 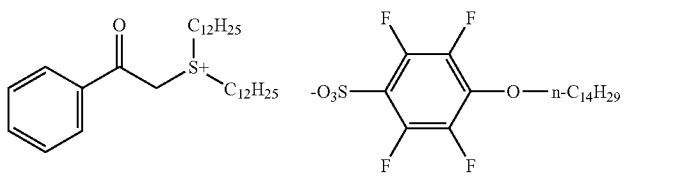
(z58a) 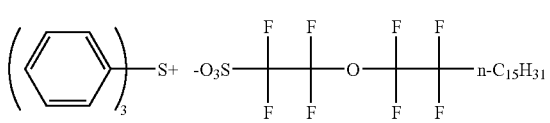
(z59a) 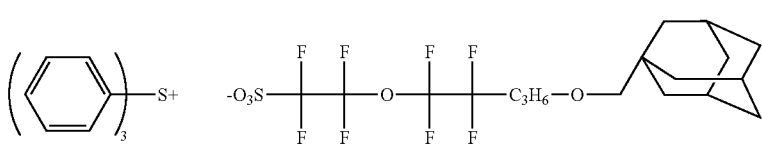

-continued
(z60a) 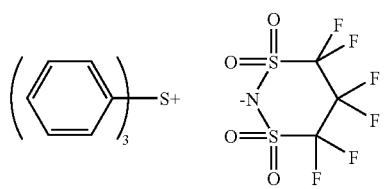
(z61a) 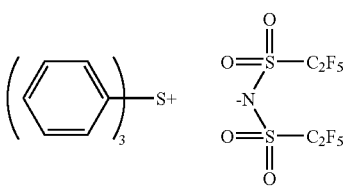
(z62a) 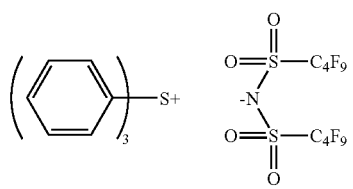
(z63a) 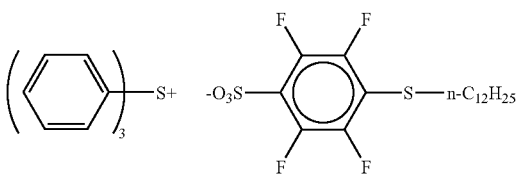
(z64a) 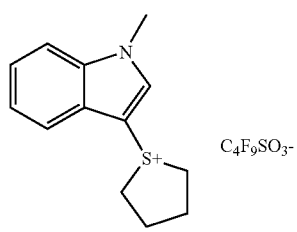
(z65a) 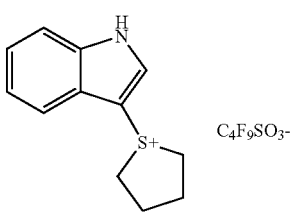
(z66a) 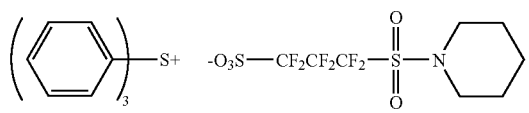
(z67a) 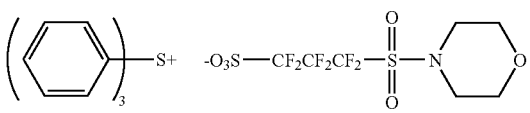
(z68a) 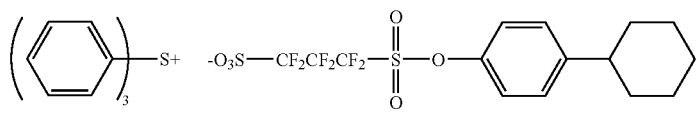
(z69a) 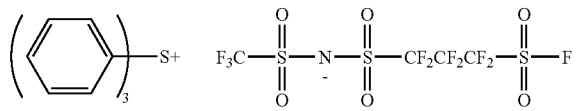
(z70a) 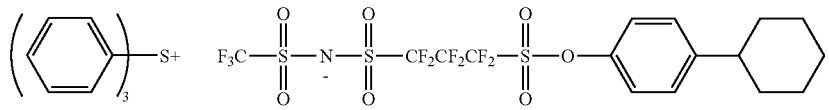
(z71a) 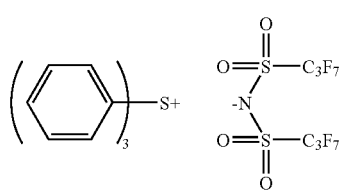
(z72a) 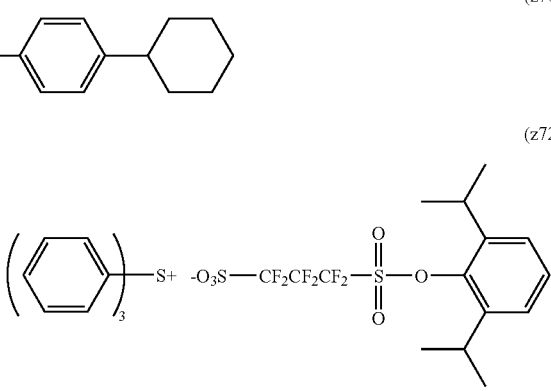
(z73a) 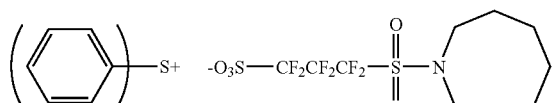
(z74a) 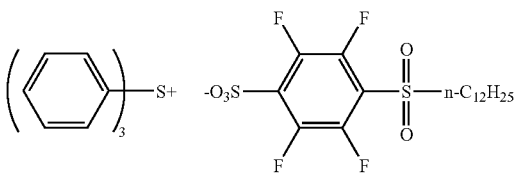

-continued
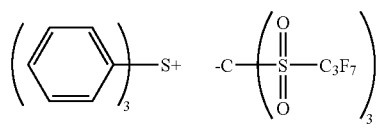 (z75a)
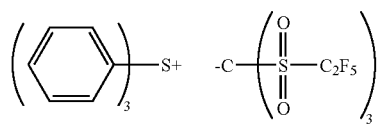 (z76a)
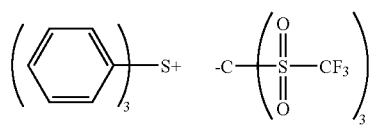 (z77a)
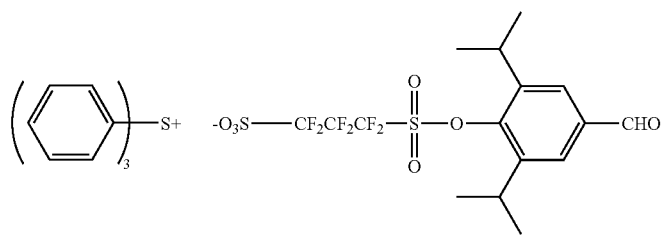 (z78a)
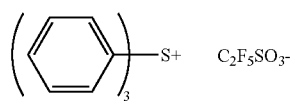 (z79a)
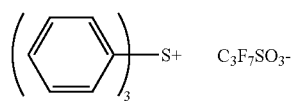 (z80a)
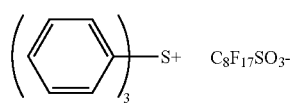 (z81a)
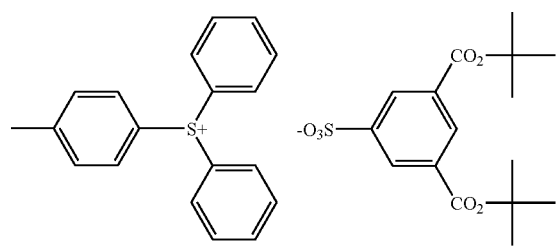 (z82a)
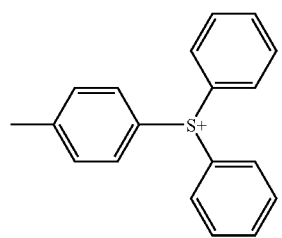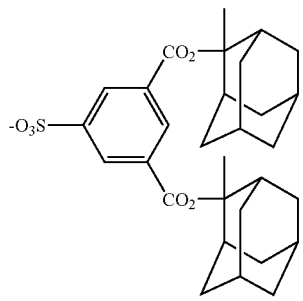 (z83a)
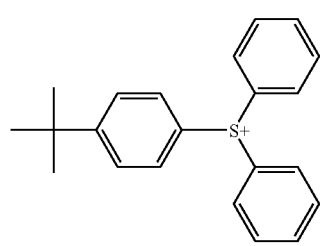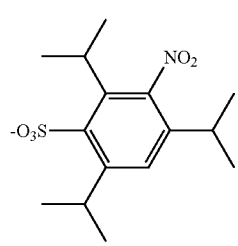 (z84a)

-continued

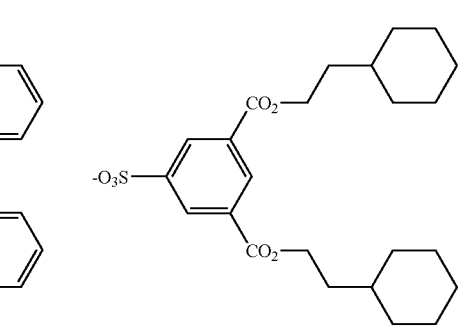
(z85a)

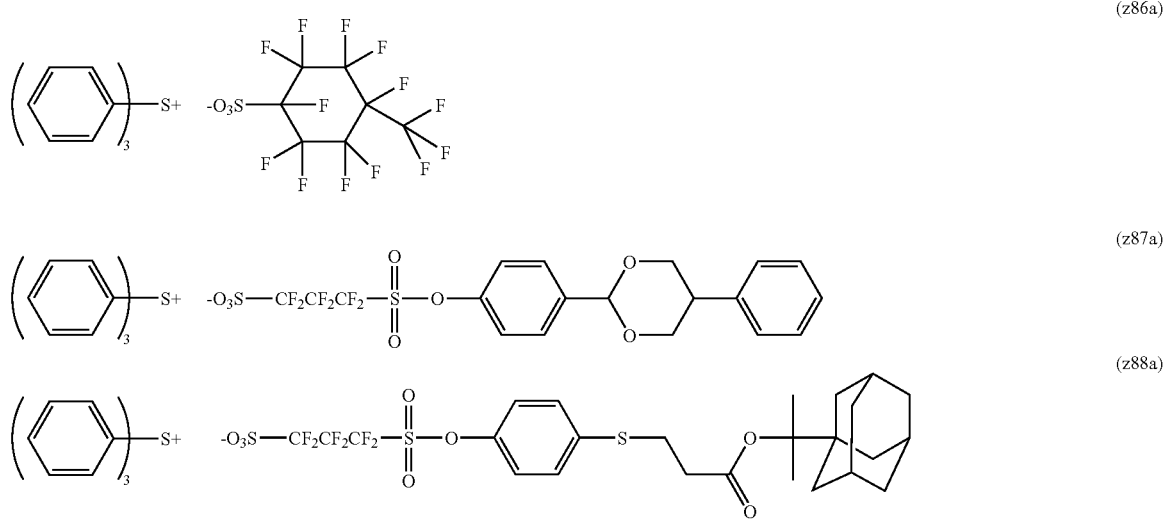
(z86a)

(z87a)

(z88a)

(z89a)

(z90a)

(z91a)

The acid generator is preferably a compound capable of generating an acid having a molecular weight of 150 or more, more preferably a compound capable of generating a sulfonic acid having a cyclic structure. Above all, alkylsulfonates and benzenesulfonates are preferred.

Among the acid generators, particularly preferred compounds are set forth below.

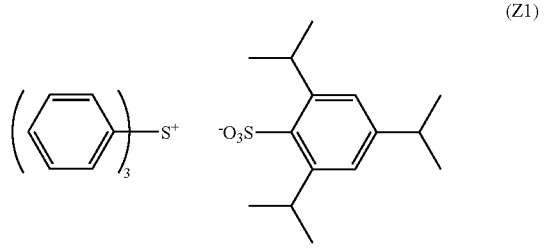
(Z1)

(Z2) 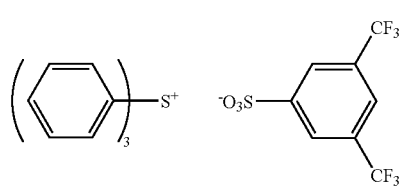
(Z3) 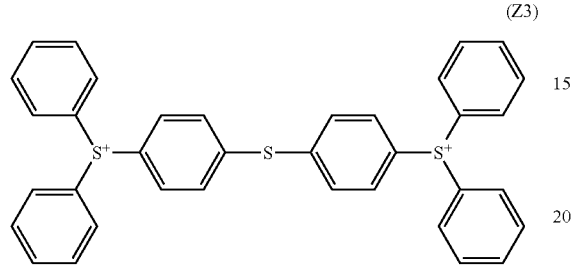
(Z4) 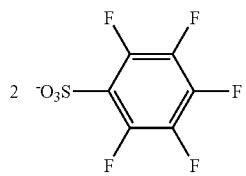
(Z5) 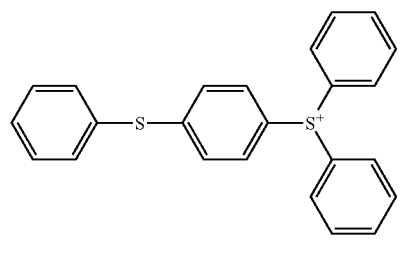
(Z6) 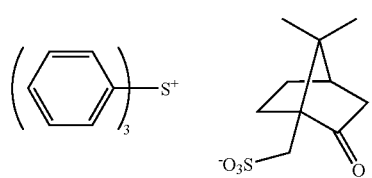
(Z7) 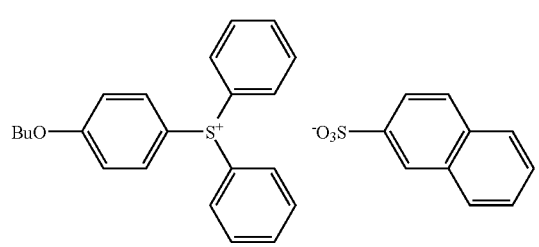
(Z8) 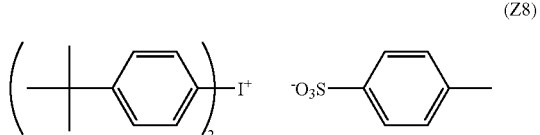
(Z9) 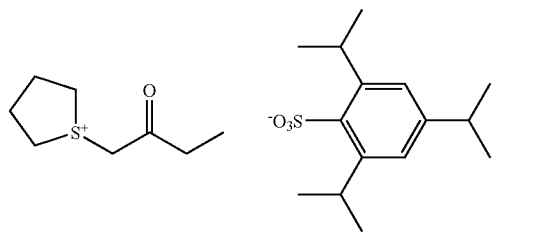
(Z10) 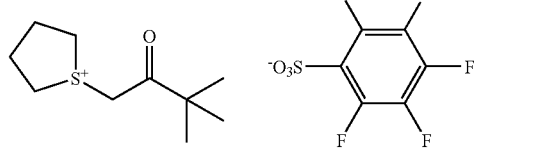
(Z11) 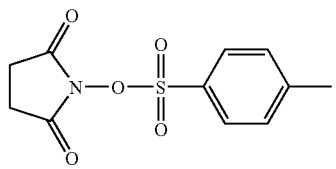
(Z12) 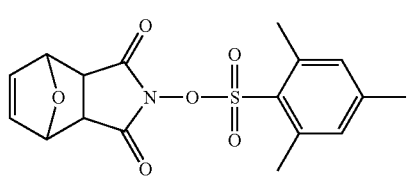
(Z13) 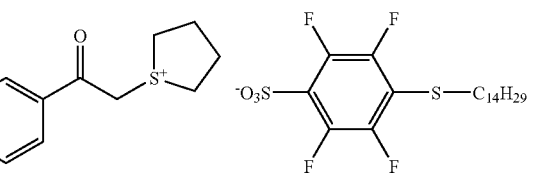
(Z14) 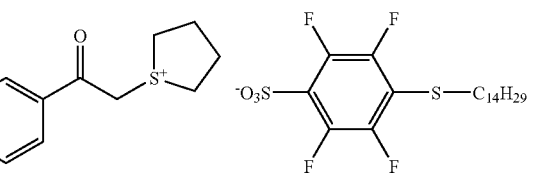
(Z15) 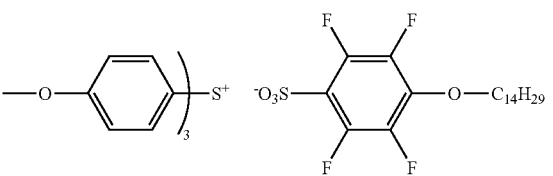

(Z16) 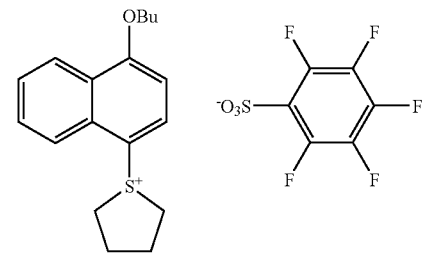
(Z17) 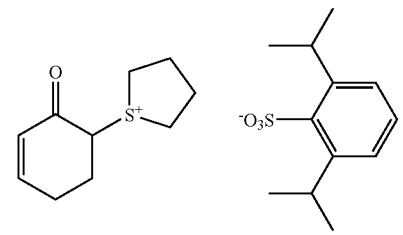
(Z18) 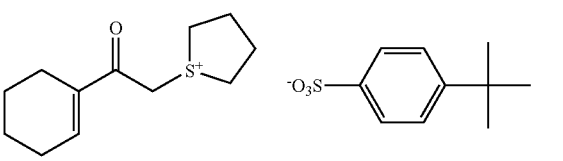
(Z19) 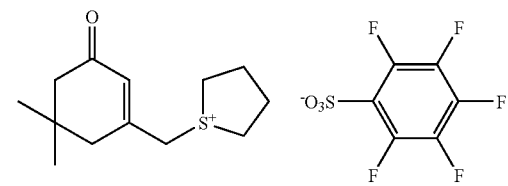
(Z20) 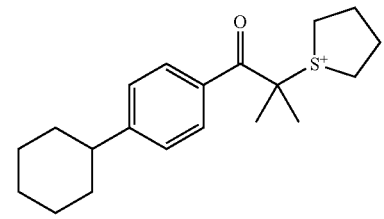
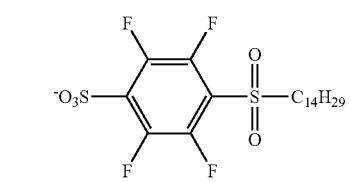
(Z21) 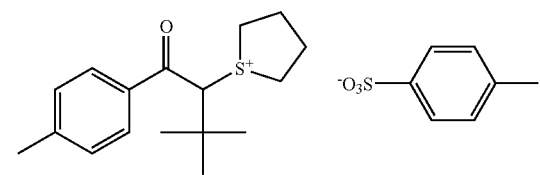
(Z22) 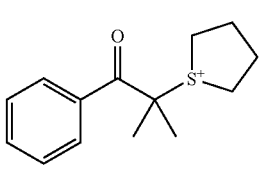 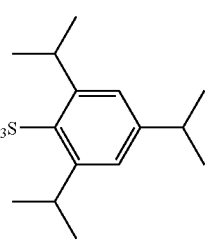
(Z23) 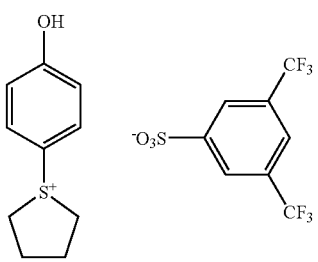
(Z24) 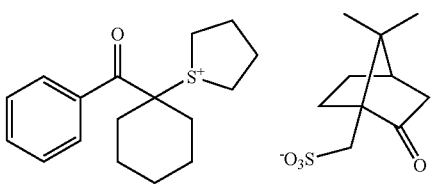
(Z25) 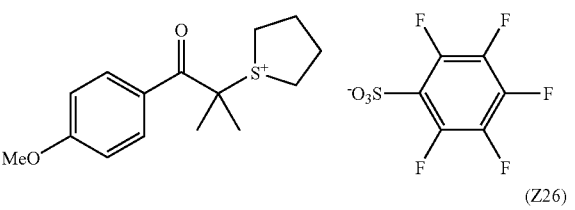
(Z26) 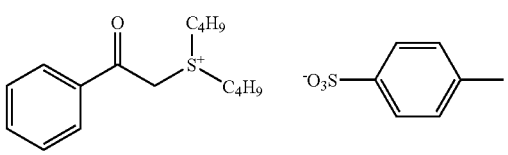
(Z27) 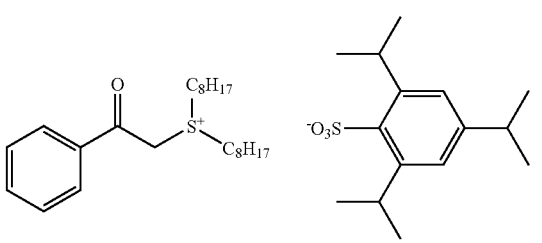
(Z28) 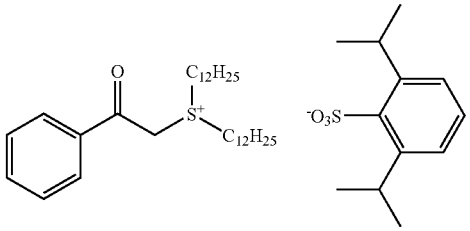

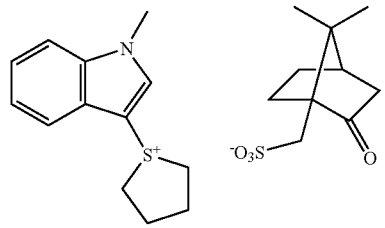
(Z29)

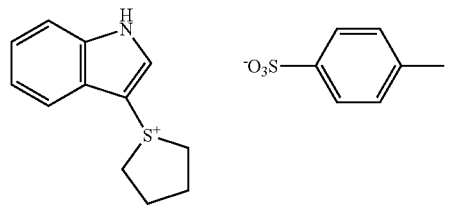
(Z30)

(Z31)

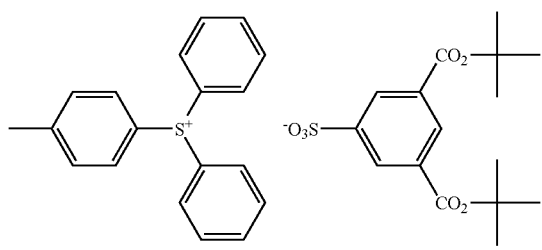
(Z32)

(Z33)

(Z34)

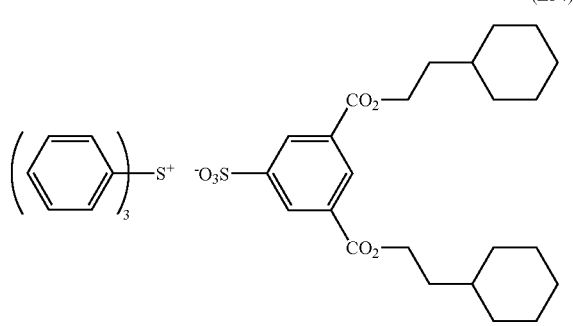

One kind of an acid generator may be used alone or two or more kinds of acid generators may be used in combination.

The content of the acid generator in the positive resist composition is preferably from 0.1 to 5 mass %, more preferably from 0.5 to 2 mass %, based on the entire solid content of the positive resist composition. (In this specification, mass ratio is equal to weight ratio.)

(B) Resin of which Solubility in an Alkali Developer Increases Under the Action of an Acid The positive resist composition of the present invention contains a resin of which solubility in an alkali developer increases under the action of an acid.

The resin of which solubility in an alkali developer increases under the action of an acid contains 80 mol % or more of an aromatic group-free copolymerization component. The aromatic group-free copolymerization component is preferably contained in a proportion of 90 to 100 mol %, more preferably from 95 to 100 mol %.

Examples of the aromatic group-free copolymerization component include a resin having a repeating unit represented by the following formula (Ia) and/or a repeating unit represented by formula (Ib) (sometimes referred to as a "resin as the component (B)"), and a repeating unit having a lactone structure, which is described later.

The resin of which solubility in an alkali developer increases under the action of an acid, used in the positive resist composition of the present invention, preferably contains a resin having a repeating unit represented by the following formula (Ia) and/or a repeating unit represented by formula (Ib) (sometimes referred to as a "resin as the component (B)").

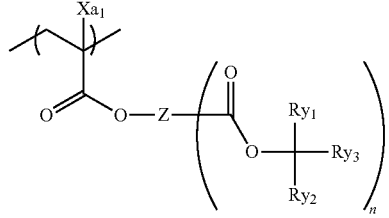
(Ia)

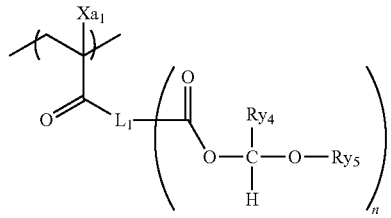
(Ib)

In formulae (Ia) and (Ib), $Xa_1$ represents a hydrogen atom, an alkyl group, a cyano group or a halogen atom.

$Ry_1$ to $Ry_3$ each independently represents an alkyl group or a cycloalkyl group, and at least two members out of $Ry_1$ to $Ry_3$ may combine to form a monocyclic or polycyclic cyclohydrocarbon structure.

Z represents a (n+1)-valent linking group.

$Ry_4$ and $Ry_5$ each independently represents an alkyl group or a cycloalkyl group, and $Ry_4$ and $Ry_5$ may combine to form a monocyclic or polycyclic cyclohydrocarbon structure.

$L_1$ represents a (n+1)-valent linking group.

n represents an integer of 1 to 3.

In formula (Ia), the alkyl group of $Xa_1$ is preferably a linear alkyl group having a carbon number of 1 to 5, and examples thereof include a methyl group. The alkyl group of $Xa_1$ may be substituted by a hydroxyl group, a halogen atom or the like.

$Xa_1$ is preferably a hydrogen atom or a methyl group.

The alkyl group of $Ry_1$ to $Ry_3$ may be either a linear alkyl group or a branched alkyl group and may have a substituent. The linear or branched alkyl group is preferably a linear or branched alkyl group having a carbon number of 1 to 8, more preferably from 1 to 4, and examples thereof include a methyl group, an ethyl group, a propyl group, an isopropyl group, a butyl group, an isobutyl group and a tert-butyl group, with a methyl group and an ethyl group being preferred.

The cycloalkyl group of $Ry_1$ to $Ry_3$ includes, for example, a monocyclic cycloalkyl group having a carbon number of 3 to 8 and a polycyclic cycloalkyl group having a carbon number of 7 to 14 and may have a substituent. Preferred examples of the monocyclic cycloalkyl group include a cyclopentyl group, a cyclohexyl group and a cyclopropyl group, and preferred examples of the polycyclic cycloalkyl group include an adamantyl group, a norbornane group, a tetracyclododecanyl group, a tricyclodecanyl group and a diamantyl group.

The monocyclic cyclohydrocarbon structure formed by combining at least two members out of $Ry_1$ to $Ry_3$ is preferably a cyclopentyl group or a cyclohexyl group. The polycyclic cyclohydrocarbon structure formed by combining at least two members out of $Ry_1$ to $Ry_3$ is preferably an adamantyl group, a norbornyl group or a tetracyclododecanyl group.

Z is preferably an (n+1)-valent linking group having a carbon number of 1 to 20, more preferably a group formed by removing (n–1) hydrogen atoms from a linear alkylene group having a carbon number of 1 to 4, a cyclic alkylene group having a carbon number of 5 to 20, or a divalent linking group comprising a combination thereof, and may further have an oxy group, a carbonyl group or the like, if desired. The chain alkylene group having a carbon number of 1 to 4 includes a methylene group, an ethylene group, a propylene group and a butylene group and may be linear or branched. A methylene group is preferred. The cyclic alkylene group having a carbon number of 5 to 20 includes a monocyclic cycloalkylene group such as cyclopentylene group and cyclohexylene group, and a polycyclic cycloalkylene group such as norbornylene group and adamantylene group. An adamantylene group is preferred.

The polymerizable compound for forming the repeating unit represented by formula (Ia) can be easily synthesized by a known method. For example, using the same technique as the method described in JP-A-2005-331918, as shown in the formula below, an alcohol and a carboxylic halogenide compound are reacted under basic conditions, and the reaction product is reacted with a carboxylic acid compound under basic conditions, whereby the polymerizable compound can be synthesized.

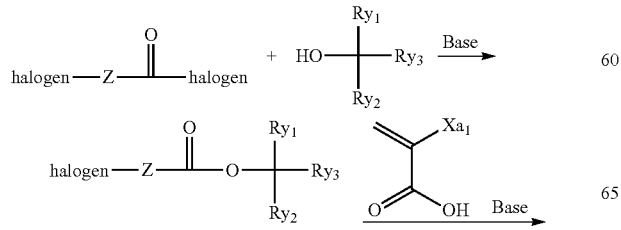

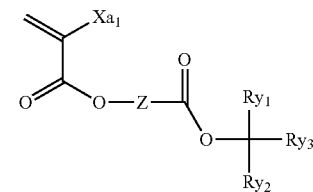

Specific preferred examples of the repeating unit represented by formula (Ia) are set forth below, but the present invention is not limited thereto.

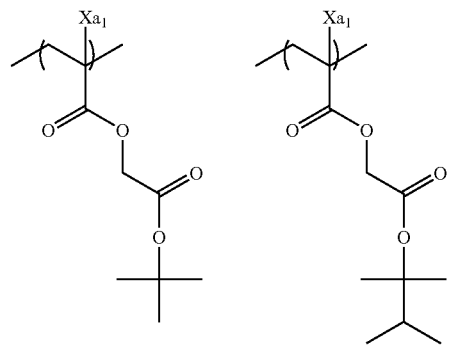

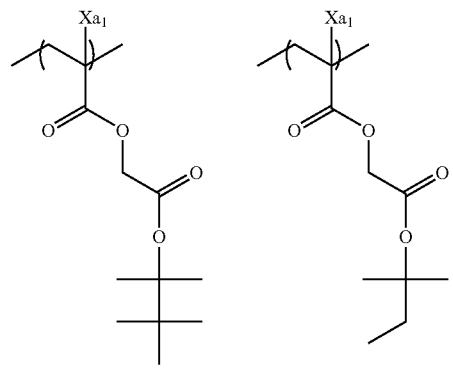

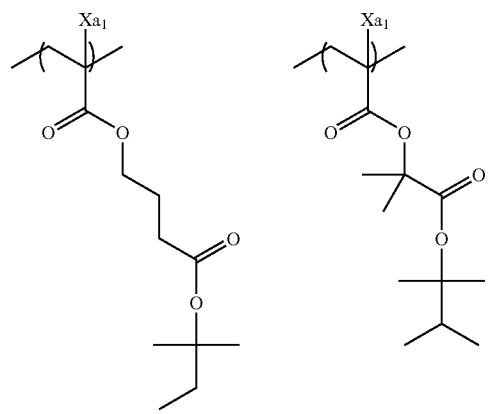

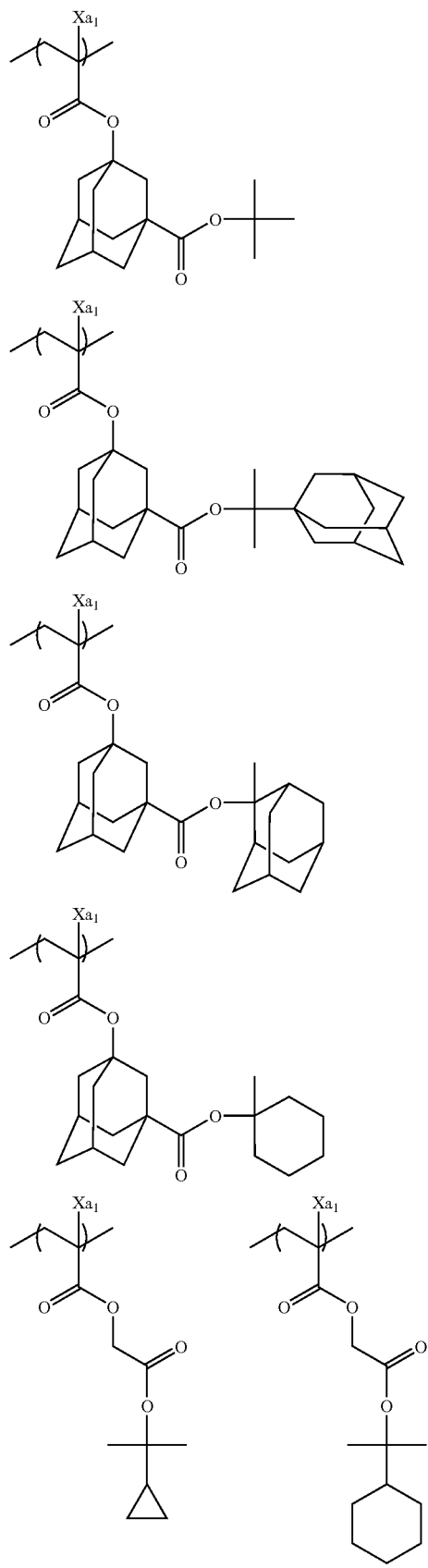
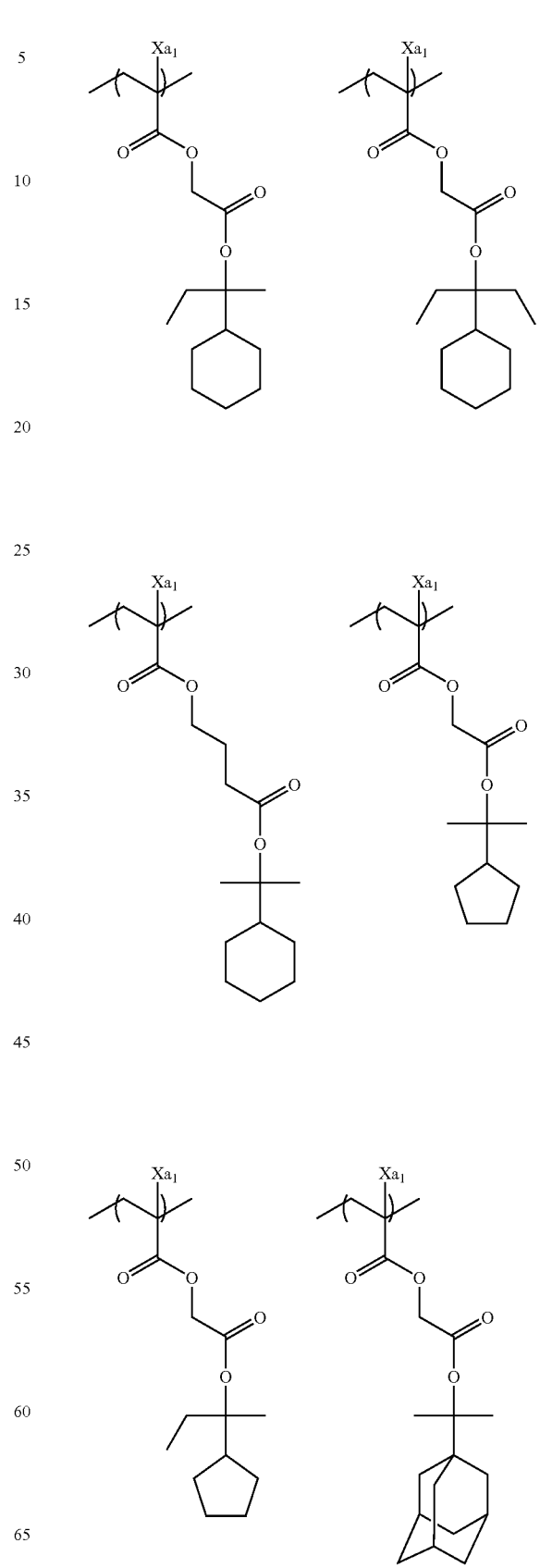

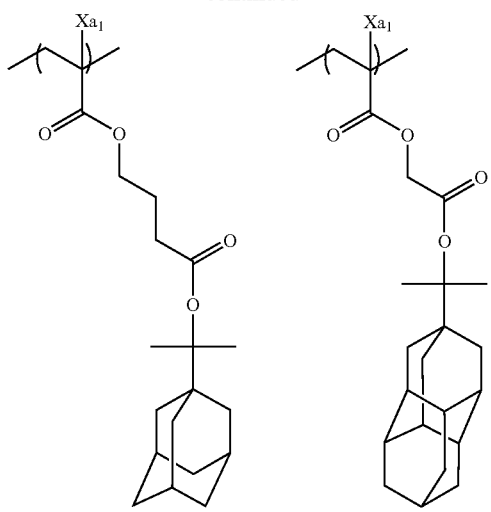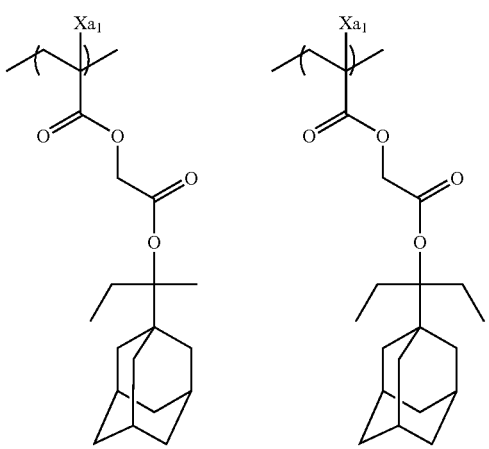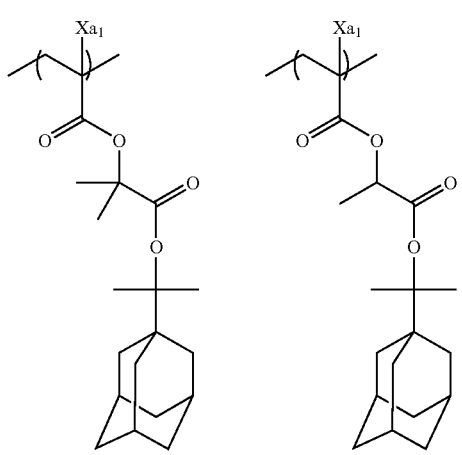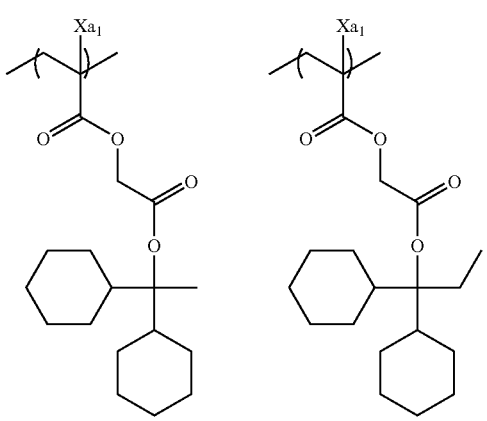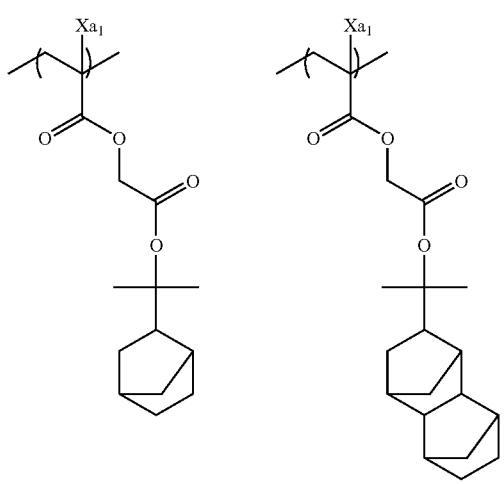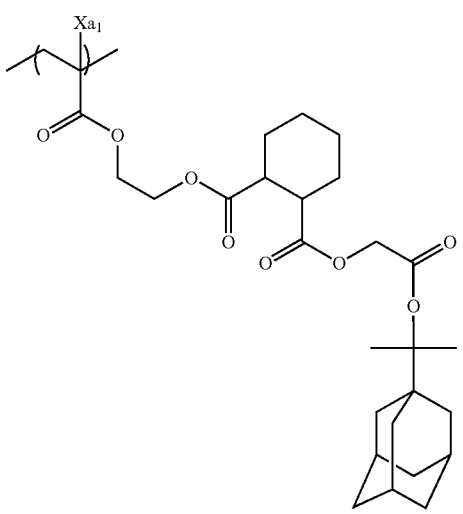

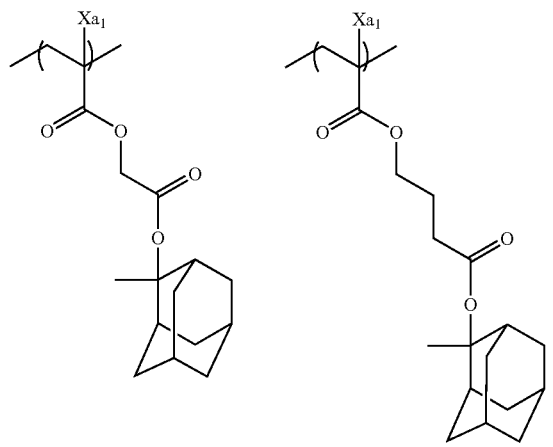
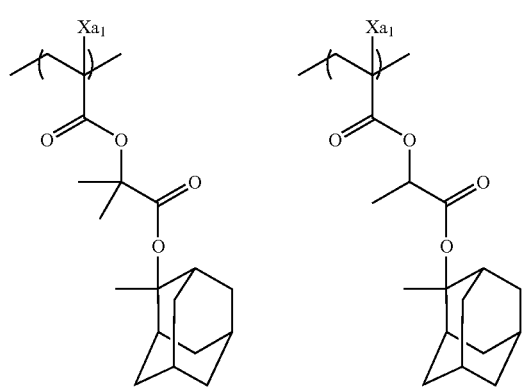
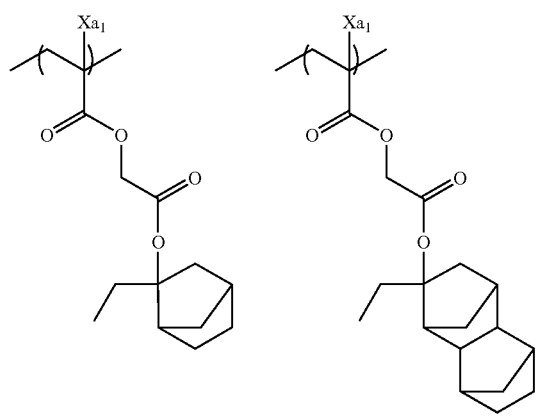
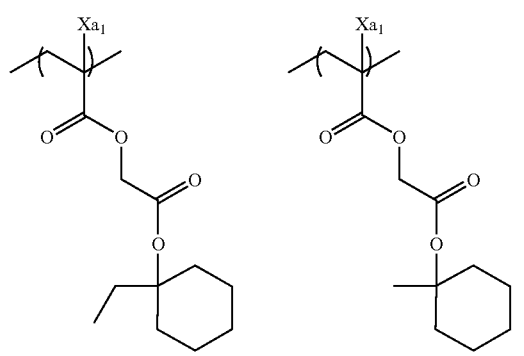
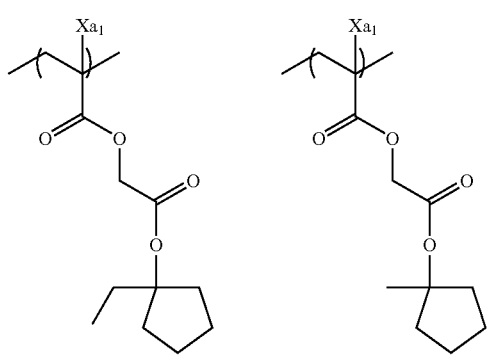
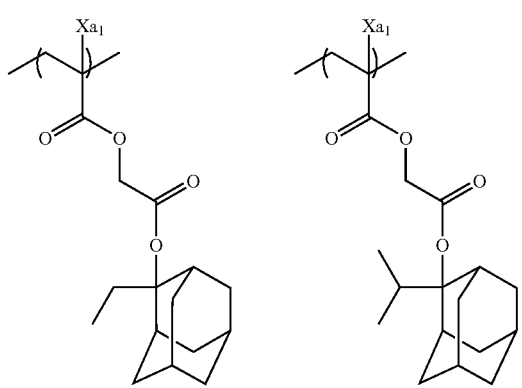
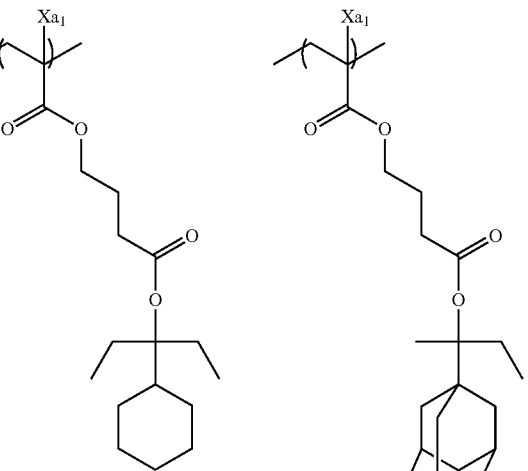

-continued

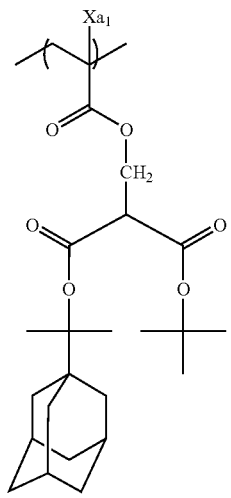
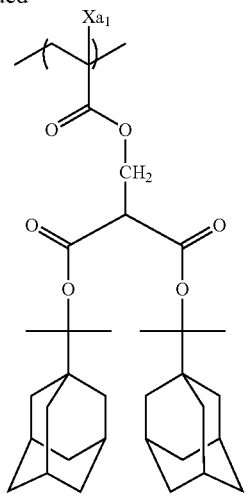

$Xa_1$ in formula (Ib) is the same as $Xa_1$ in formula (Ia).

The alkyl group of $Ry_4$ and $Ry_5$ may have a substituent and is preferably a linear or branched alkyl group having a carbon number of 1 to 20, more preferably a linear or branched alkyl group having a carbon number of 1 to 10, still more preferably a methyl group, an ethyl group, a propyl group, an isopropyl group, an n-butyl group, an isobutyl group, a sec-butyl group, a tert-butyl group, a pentyl group, a hexyl group, a heptyl group, an octyl group, a nonyl group or a decyl group.

The cycloalkyl group of $Ry_4$ and $Ry_5$ may be monocyclic or polycyclic or may have a substituent and includes, for example, a group having a carbon number of 5 or more and having a monocyclo, bicyclo, tricyclo or tetracyclo structure. The carbon number thereof is preferably from 6 to 30, more preferably from 7 to 25.

Preferred examples of the cycloalkyl group include an adamantyl group, a noradamantyl group, a decalin residue, a tricyclodecanyl group, a tetracyclododecanyl group, a norbornyl group, a cedrol group, a cyclohexyl group, a cycloheptyl group, a cyclooctyl group, a cyclodecanyl group and a cyclododecanyl group. Among these, more preferred are an adamantyl group, a decalin residue, a norbornyl group, a cedrol group, a cyclohexyl group, a cycloheptyl group, a cyclooctyl group, a cyclodecanyl group and a cyclododecanyl group.

Examples of the substituent which the alkyl group and cycloalkyl group each may have include a hydroxyl group, a carboxy group, a cyano group, a halogen atom (e.g., chlorine, bromine, fluorine, iodine), an alkoxy group (preferably having a carbon number of 1 to 4, e.g., methoxy, ethoxy, propoxy, butoxy), an acyl group (preferably having a carbon number of 2 to 5, e.g., formyl, acetyl), an acyloxy group (preferably having a carbon number of 2 to 5, e.g., acetoxy), an aryl group (preferably having a carbon number of 6 to 14, e.g., phenyl), and a cycloalkyl group (for example, the cycloalkyl group as $Ry_4$ and $Ry_5$).

As for the cyclic structure in the substituent above, examples of the substituent further include an alkyl group (for example, the alkyl group as $Ry_4$ and $Ry_5$).

The (n+1)-valent linking group of $L_1$ includes, for example, an (n+1)-valent linking group formed by arbitrarily combining the following linking blocks or the bonds of two or more linking blocks, with each other.

Examples of the linking block include (L-1) to (L-23) shown below.

In the formulae shown below, each $R^L$ independently represents a hydrogen atom, a halogen atom, a hydroxyl group, a mercapto group, a monovalent organic group, or a single bond connecting to an arbitrary atom constituting the linking group. $Z^-$ is not particularly limited as long as it is an anion corresponding to the conjugate base of an organic or inorganic acid, and may be a polyvalent anion. The anion includes an anion corresponding to the conjugate base of an organic acid, such as $R^{a1}$—$SO_3^-$, $R^{a1}$—$SO_2^-$, $R^{a1}$—$CO_2^-$, $R^{a1}$—$CS_2^-$, $R^{a1}$—O—$CS_2^-$, $R^{a1}$—S—$CS_2^-$, $R^{a1}$—O—$PO_2^-$, $(R^{a1}$—O$)_2PO_2^-$, $R^{a1}(R^{a1}$—O$)PO_2^-$, $R^{a1}$-$EW^1$-Z-$EW^2$—$R^{a1}$, $(R^{a1})B^-$ and $Ar^xO^-$, and an anion corresponding to the conjugate base of an inorganic acid, such as $F^-$, $Cl^-$, $Br^-$, $I^-$, $PF_6^-$, $BF_4^-$, $SbF_6^-$, $ClO_4^-$, $SO_4^{2-}$, $NO_3^-$, $CO_3^{2-}$, $SCN^-$, $CN^-$, $SiF_6^-$; $FSO_3^-$, $I_3^-$, $IBr_3^-$ and $IBr_2^-$. Here, $R^{a1}$ is an organic substituent and represents an alkyl group, an alkenyl group, an alkynyl group, an aryl group, an aralkyl group, or a group further substituted by such a group. In the case where a plurality of $R^{a1}$'s are present in the molecule, these may be independently selected or may combine with each other to form a ring. $EW^1$ and $EW^{2-}$ each represents an electron-withdrawing group, and specific examples thereof include —SO—, —CO—, —$SO_2$— and —CN. Z represents —$CR^{z1}$— or —N— ($R^{z1}$ is a hydrogen atom or a substituent). $Ar^x$ represents an aryl group.

(L-1)

(L-2)

(L-3)

(L-4)

(L-5)

(L-6)

(L-7)

(L-8)

(L-9)

(L-10)

(L-11)

-continued

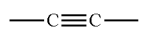 (L-12)

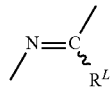 (L-13)

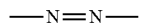 (L-14)

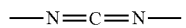 (L-15)

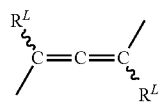 (L-16)

 (L-17)

 (L-18)

 (L-19)

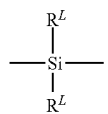 (L-20)

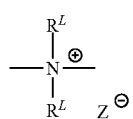 (L-21)

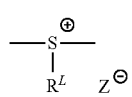 (L-22)

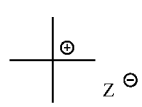 (L-23)

$L_1$ is preferably a linking group having at least one block of (L-6), more preferably a linking group having at least one block of (L-4) and at least one block of (L-6), still more preferably a linking group having at least one block of (L-1), at least one block of (L-4) and at least one block of (L-6), yet still more preferably a linking group having at least one block of (L-1), at least one block of (L-4) and at least one block of (L-6), where the total number of blocks constituting the linking group is 4 or more (preferably from 4 to 20).

A preferred embodiment of formula (Ib) is a structure represented by the following formula (1-A).

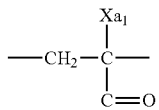 (1-A)

In formula (1-A), $Xa_1$ and $R_{y5}$ have the same meanings as in formula (Ib).

$L_2$ represents a divalent linking group out of the (n+1)-valent linking groups of $L_1$ in formula (Ib).

X represents a linking group selected from —O—, —S— and —NR$^x$— (wherein R$^x$ represents a hydrogen atom, an alkyl group or an aryl group), The linking group as $L_2$ is preferably a linking group having at least one block of (L-4), more preferably a linking group having 2 or more blocks of (L-4) (more preferably from 2 to 18 blocks of (L-4)) and having at least one ring structure formed by combining a plurality of R$^L$'s present in the block, still more preferably a linking group having 3 or more blocks of (L-4) and having at least one ring structure formed by combining a plurality of R$^L$'s present in the block.

X preferably represents a linking group selected from —O—, —S— and —NR$^x$— (wherein R$^x$ represents a hydrogen atom, an alkyl group having a carbon number of 1 to 12, or an aryl group having a carbon number of 6 to 12) and is more preferably —O— or —NR$^x$—, still more preferably —O—.

Suitable examples of the repeating unit represented by formula (Ib) are set forth below, but the present invention is not limited thereto.

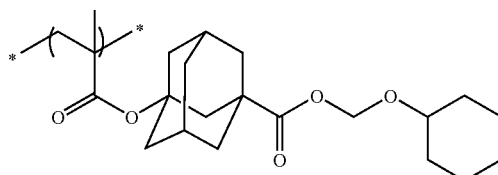

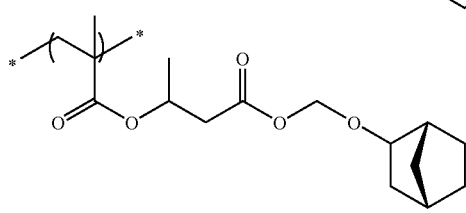

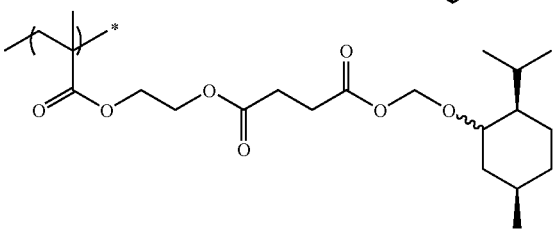

45
-continued
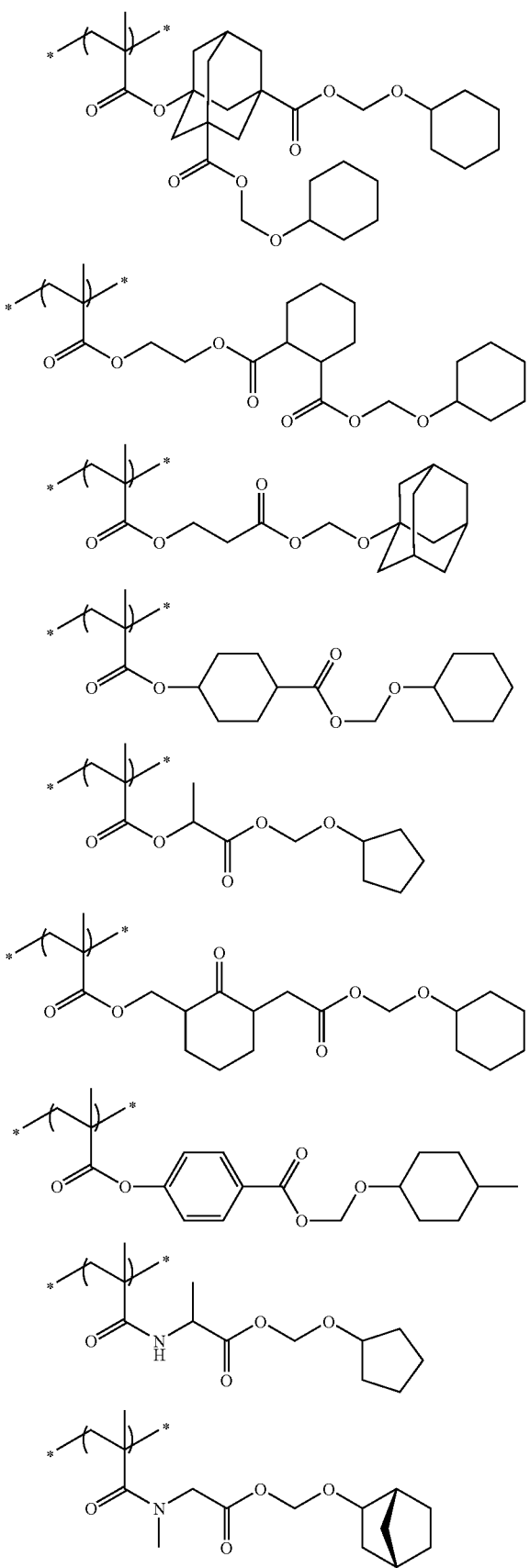
46
-continued
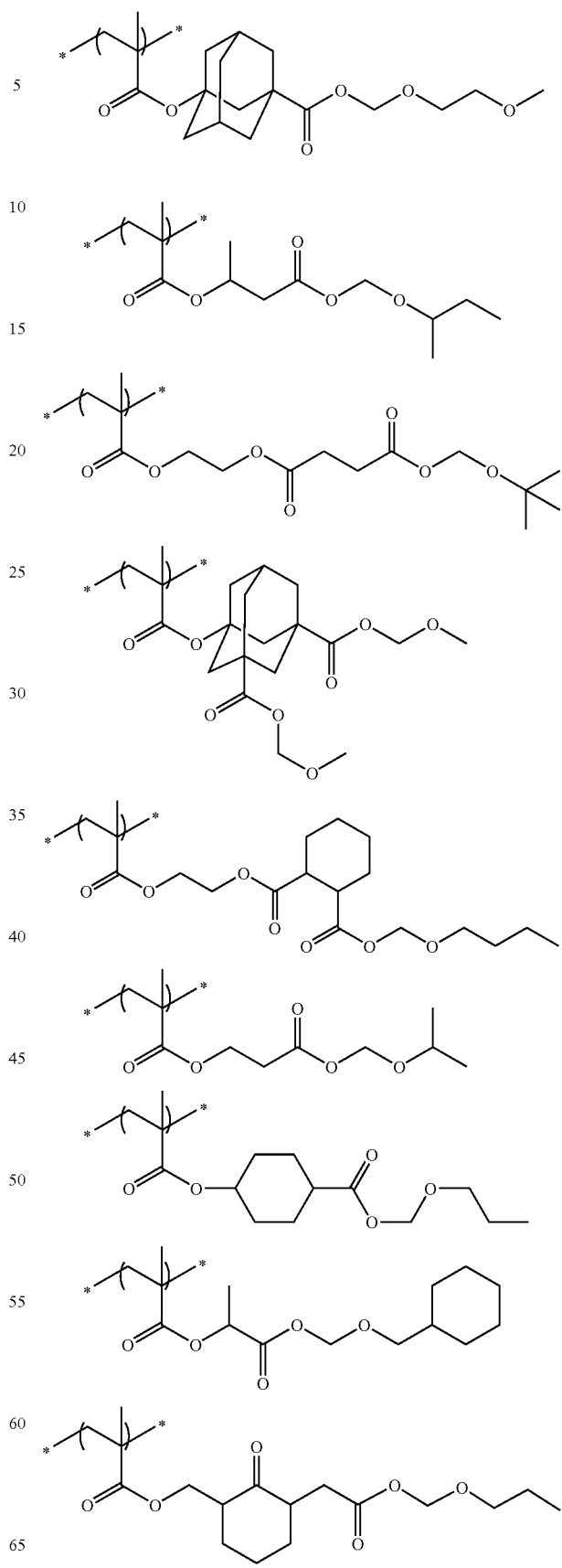

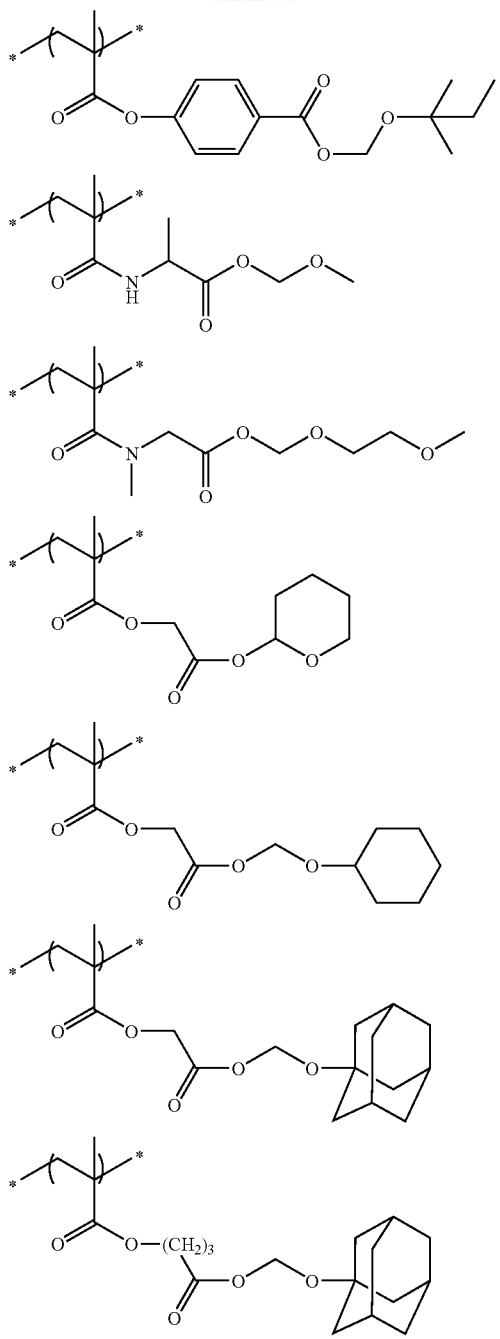

The monomer corresponding to the repeating unit represented by formula (Ib) can be synthesized by reacting $R^2$—O—$CH_2$—X and a polymerizable group-containing carboxylic acid in the presence of a base. Here, X represents a halogen atom such as Cl, or a leaving group represented by —$OR^{2a}$ (wherein $R^{2a}$ is an alkyl group, an aryl group, a hydrogen atom or the like). The monomer can be also obtained by a method such as acetal exchange.

The repeating units represented by formula (Ia) and/or formula (Ib) are an acid-decomposable repeating unit having a group capable of decomposing under the action of an acid to generate a carboxyl group and increase the dissolution rate in an alkali developer (acid-decomposable group).

The resin as the component (B) may further contain an acid-decomposable repeating unit other than the acid-decomposable repeating units represented by formula (Ia) and/or formula (Ib).

The acid-decomposable repeating unit other than the acid-decomposable repeating units represented by formula (Ia) and/or formula (Ib) is preferably a repeating unit represented by the following formula (II).

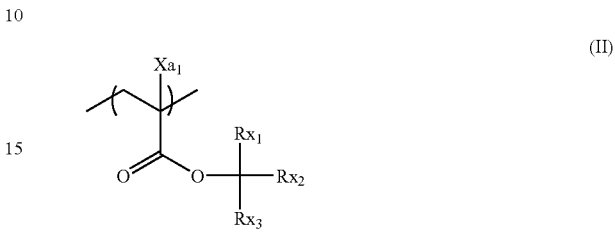

(II)

In formula (II), $Xa_1$ represents a hydrogen atom, an alkyl group, a cyano group or a halogen atom and is the same as $Xa_1$ in formula (Ia) and/or formula (Ib).

$Rx_1$ to $Rx_3$ each independently represents an alkyl group or a cycloalkyl group, and at least two members out of $Rx_1$ to $Rx_3$ may combine to form a cycloalkyl group.

The alkyl group of $Rx_1$ to $Rx_3$ is preferably a linear or branched alkyl group having a carbon number of 1 to 4, such as methyl group, ethyl group, n-propyl group, isopropyl group, n-butyl group, isobutyl group and tert-butyl group.

The cycloalkyl group of $Rx_1$ to $Rx_3$ is preferably a monocyclic cycloalkyl group such as cyclopentyl group and cyclohexyl group, or a polycyclic cycloalkyl group such as norbornyl group, tetracyclodecanyl group, tetracyclododecanyl group and adamantyl group.

The cycloalkyl group formed by combining at least two members out of $Rx_1$ to $Rx_3$ is preferably a monocyclic cycloalkyl group such as cyclopentyl group and cyclohexyl group, or a polycyclic cycloalkyl group such as norbornyl group, tetracyclodecanyl group, tetracyclododecanyl group and adamantyl group.

An embodiment where $Rx_1$ is a methyl group or an ethyl group and $Rx_2$ and $Rx_3$ are combined to form the above-described monocyclic or polycyclic cycloalkyl group is preferred.

The repeating unit represented by formula (II) preferably has a monocyclic or polycyclic alicyclic hydrocarbon structure.

Specific preferred examples of the repeating unit having an acid-decomposable group are set forth below, but the present invention is not limited thereto.

(In the formulae, Rx represents H, $CH_3$, $CF_3$ or $CH_2OH$, and Rxa and Rxb each represents an alkyl group having a carbon number of 1 to 4.)

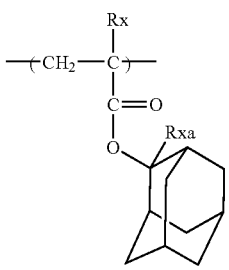

1

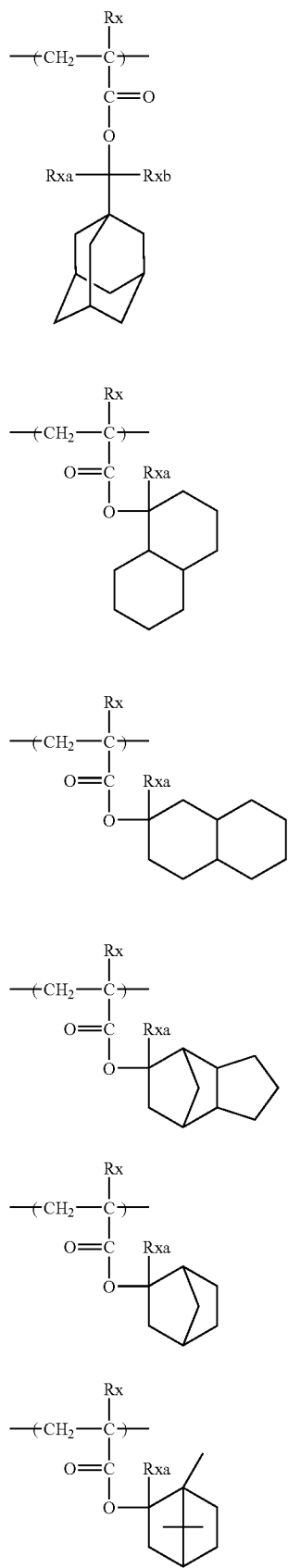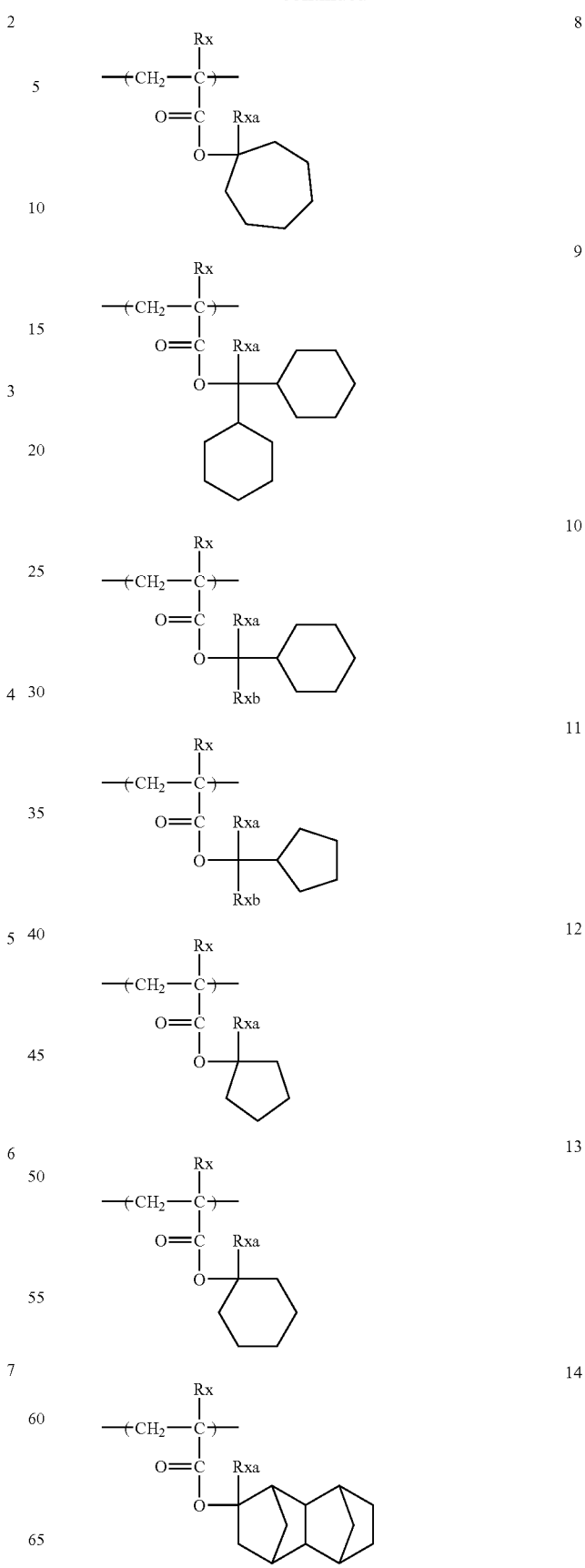

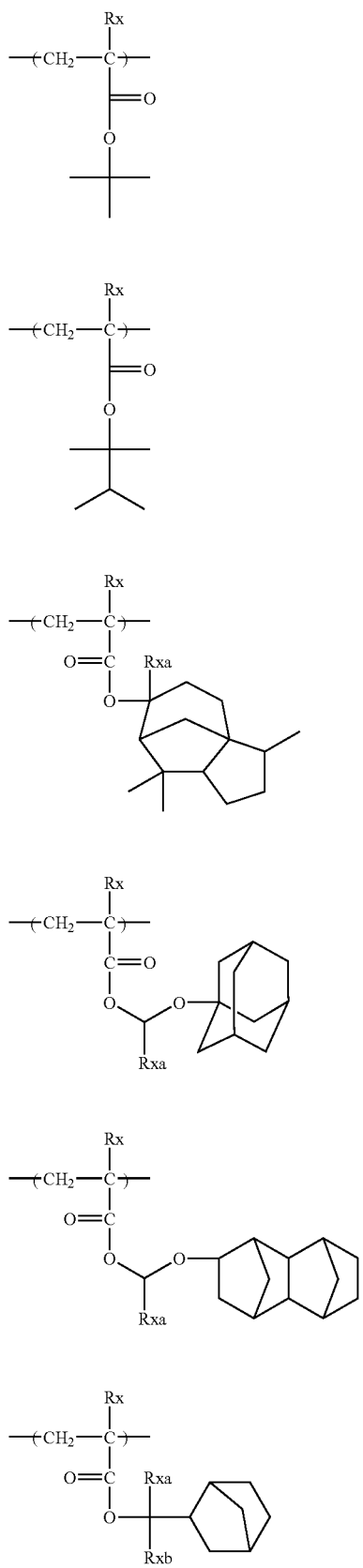

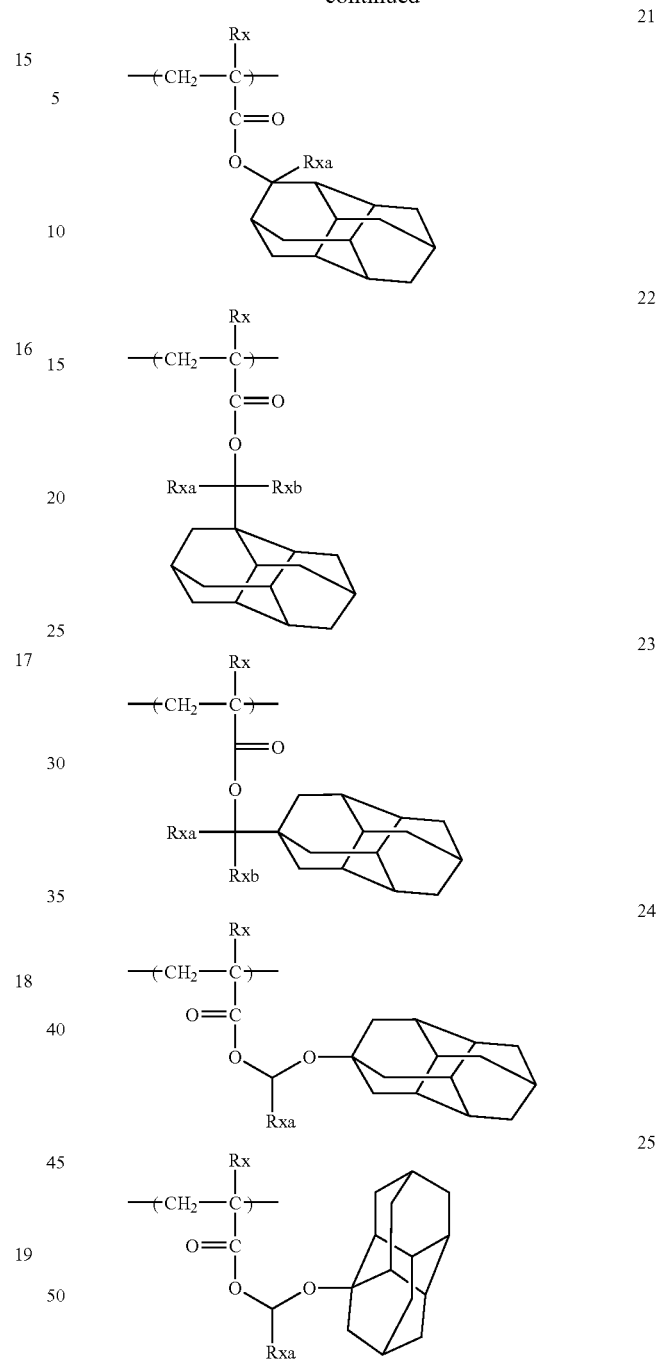

Among the repeating units represented by formula (II), preferred are repeating units 1, 2, 10, 11, 12, 13 and 14 in these specific examples.

In the case of using the acid-decomposable group-containing repeating units represented by formula (Ia) and/or formula (Ib) in combination with other acid-decomposable group-containing repeating units (preferably a repeating unit represented by formula (II)), the ratio between the acid-decomposable group-containing repeating units represented by formula (Ia) and/or formula (Ib) and the other acid-decomposable group-containing repeating unit is, in terms of molar ratio, from 90:10 to 10:90, preferably from 80:20 to 20:80.

The content of all acid-decomposable group-containing repeating units in the resin as the component (B) is preferably from 20 to 50 mol %, more preferably from 25 to 45 mol %, based on all repeating units in the polymer.

The resin as the component (B) preferably further contains a repeating unit having at least one kind of a group selected from a lactone group, a hydroxyl group, cyano group and an alkali-soluble group.

The resin as the component (B) preferably contains a repeating unit having a lactone structure.

As for the lactone structure, any repeating unit may be used as long as it has a lactone structure, but the lactone structure is preferably a 5- to 7-membered ring lactone structure, and a repeating unit where another ring structure is condensed to the 5- to 7-membered ring lactone structure in the form of forming a bicyclo or spiro structure is preferred. The resin more preferably contains a repeating unit having a lactone structure represented by any one of the following formulae (LC1-1) to (LC1-16) The lactone structure may be bonded directly to the main chain. Among these lactone structures, preferred are (LC1-1), (LC1-4), (LC1-5), (LC1-6), (LC1-13) and (LC1-14). By virtue of using a specific lactone structure, the line edge roughness and development defect are improved.

LC1-1

LC1-2

LC1-3

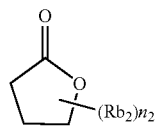

LC1-4

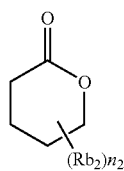

LC1-5

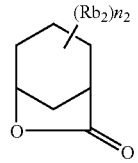

LC1-6

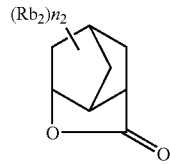

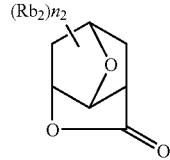

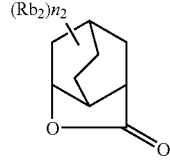

-continued

LC1-7

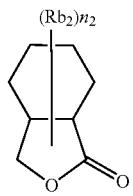

LC1-8

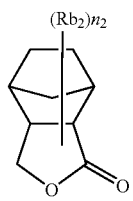

LC1-9

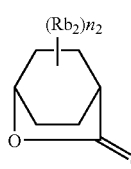

LC1-10

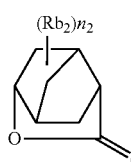

LC1-11

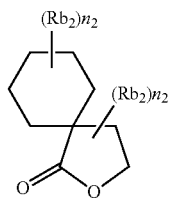

LC1-12

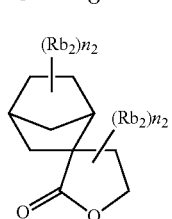

LC1-13

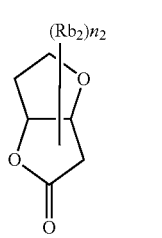

LC1-14

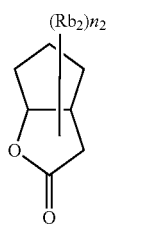

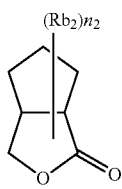

LC1-15

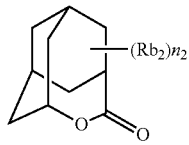

LC1-16

The lactone structure moiety may or may not have a substituent ($Rb_2$). Preferred examples of the substituent ($Rb_2$) include an alkyl group having a carbon number of 1 to 8, a cycloalkyl group having a carbon number of 4 to 7, an alkoxy group having a carbon number of 1 to 8, an alkoxycarbonyl group having a carbon number of 2 to 8, a carboxyl group, a halogen atom, a hydroxyl group, a cyano group and an acid-decomposable group. Among these, an alkyl group having a carbon number of 1 to 4, a cyano group and an acid-decomposable group are more preferred. $n_2$ represents an integer of 0 to 4. When $n_2$ is an integer of 2 or more, the plurality of substituents ($Rb_2$) present in the lactone structure may be the same or different and also, the plurality of substituents ($Rb_2$) present in the lactone structure may combine with each other to form a ring.

The repeating unit having a lactone structure represented by any one of formulae (LC1-1) to (LC1-16) includes a repeating unit represented by the following formula (AI).

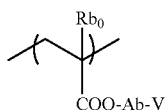

(AI)

In formula (AI), $Rb_0$ represents a hydrogen atom, a halogen atom or an alkyl group having a carbon number of 1 to 4. Preferred examples of the substituent which the alkyl group of $Rb_0$ may have include a hydroxyl group and a halogen atom. The halogen atom of $Rb_0$ includes a fluorine atom, a chlorine atom, a bromine atom and an iodine atom. $Rb_0$ is preferably a hydrogen atom, a methyl group, a hydroxymethyl group or a trifluoromethyl group, particularly preferably a hydrogen atom or a methyl group.

Ab represents a single bond, an alkylene group, a divalent linking group having a monocyclic or polycyclic alicyclic hydrocarbon structure, an ether group, an ester group, a carbonyl group, a carboxyl group, or a divalent group comprising a combination thereof, and is preferably a single bond or a divalent linking group represented by -$Ab_1$-$CO_2$—. $Ab_1$ represents a linear or branched alkylene group or a monocyclic or polycyclic cycloalkylene group and is preferably a methylene group, an ethylene group, a cyclohexyl group, an adamantyl group or a norbornyl group.

V represents a group having a structure represented by any one of formulae (LC1-1) to (LC1-16).

The repeating unit having a lactone structure usually has an optical isomer, but any optical isomer may be used. One optical isomer may be used alone or a mixture of a plurality of optical isomers may be used. In the case of mainly using one optical isomer, the optical purity (ee) thereof is preferably 90 or more, more preferably 95 or more.

The content of the repeating unit having a lactone structure is preferably from 15 to 60 mol %, more preferably from 20 to 50 mol %, still more preferably from 30 to 50 mol %, based on all repeating units in the polymer.

Specific examples of the repeating unit having a lactone structure are set forth below, but the present invention is not limited thereto.

(In the formulae, Rx is H, $CH_3$, $CH_2OH$ or $CF_3$.)

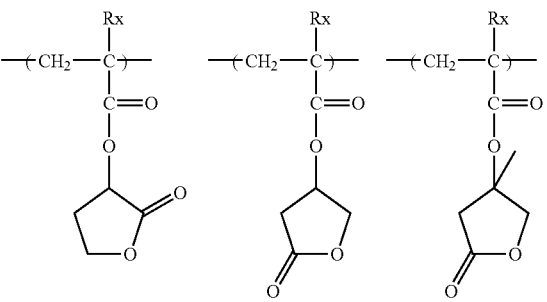

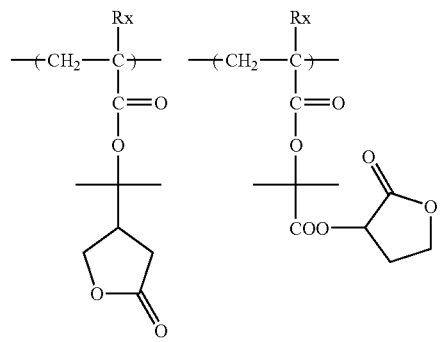

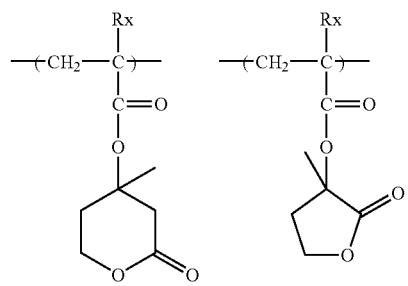

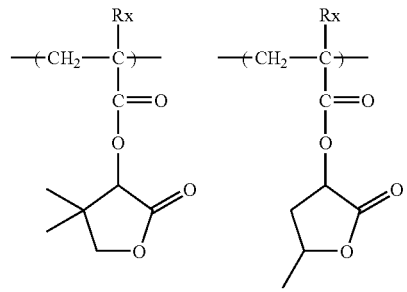

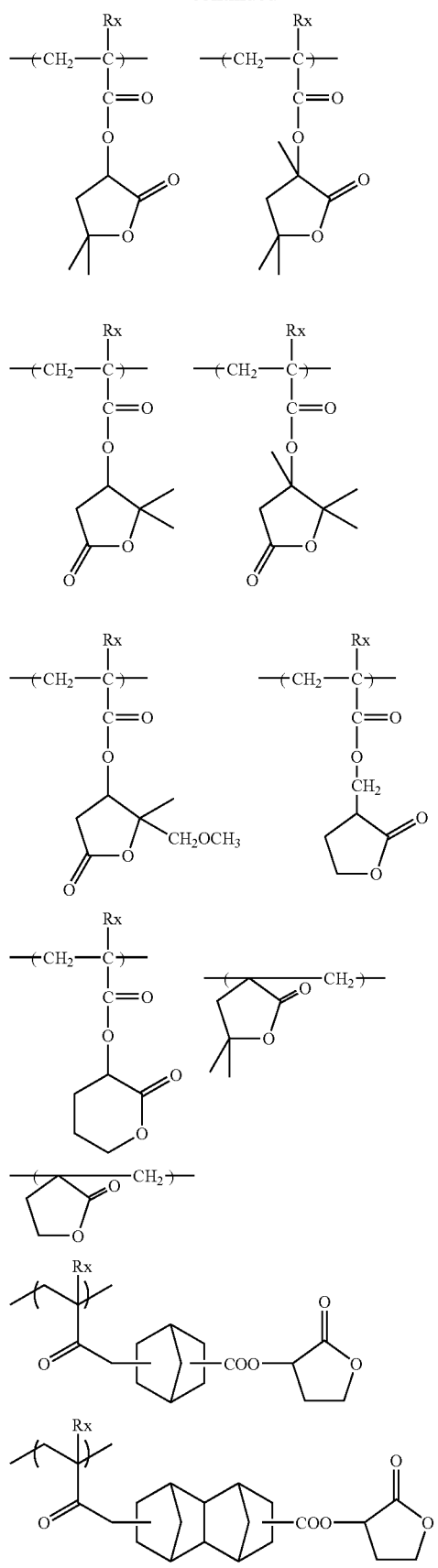
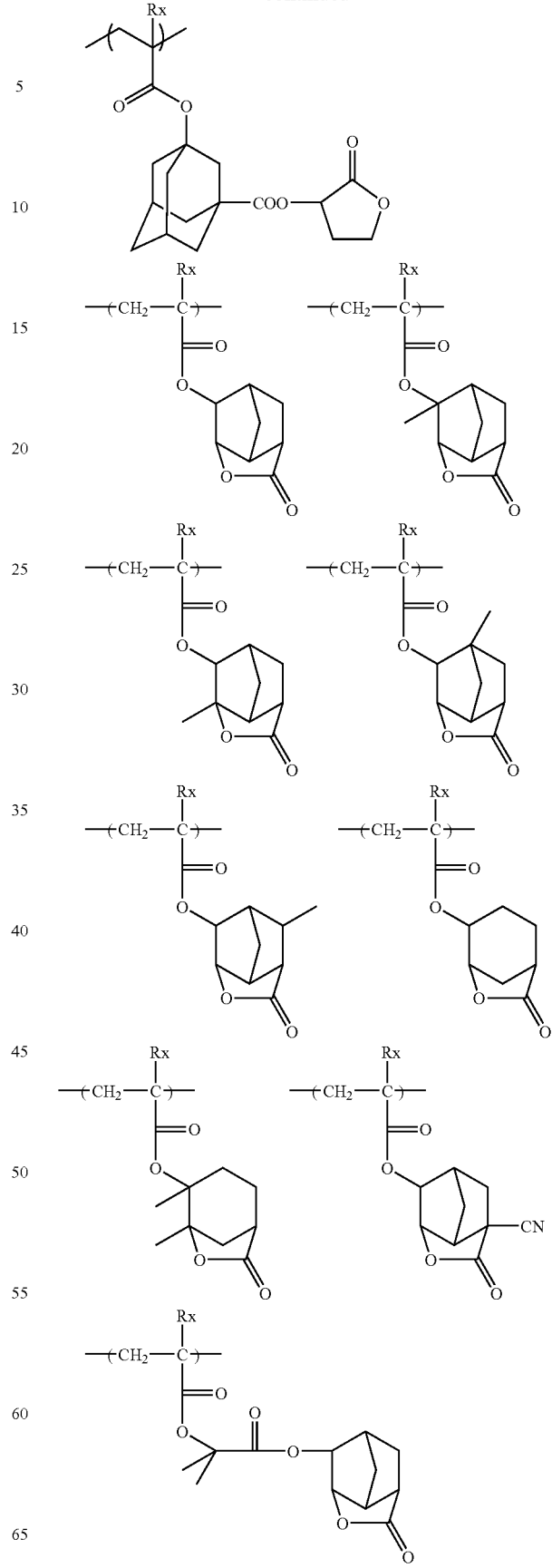

59
-continued
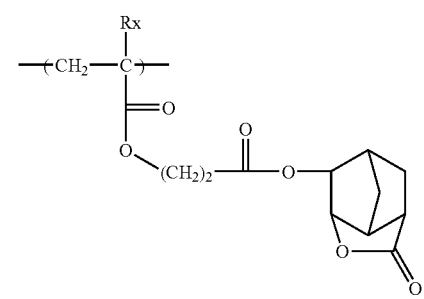
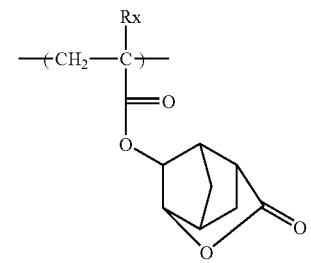
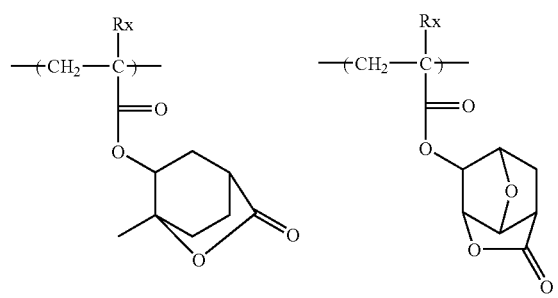
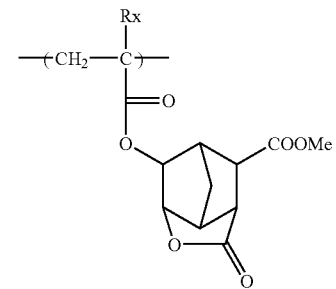
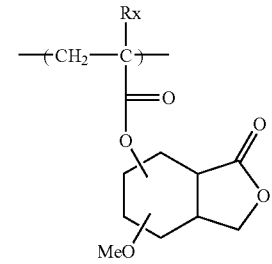
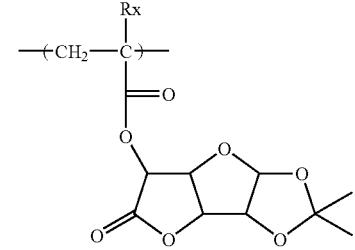
60
-continued
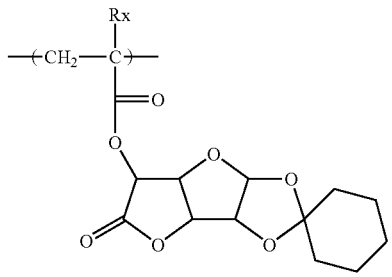
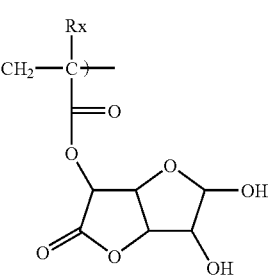
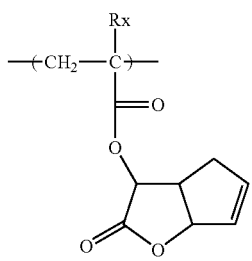
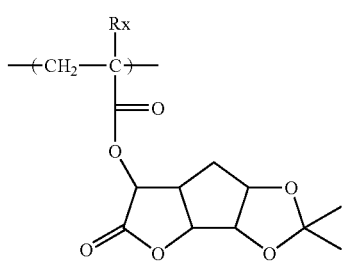
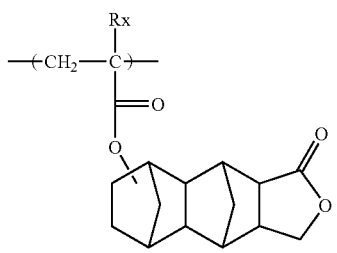
(In the formulae, Rx is H, CH$_3$, CH$_2$OH or CF$_3$.)

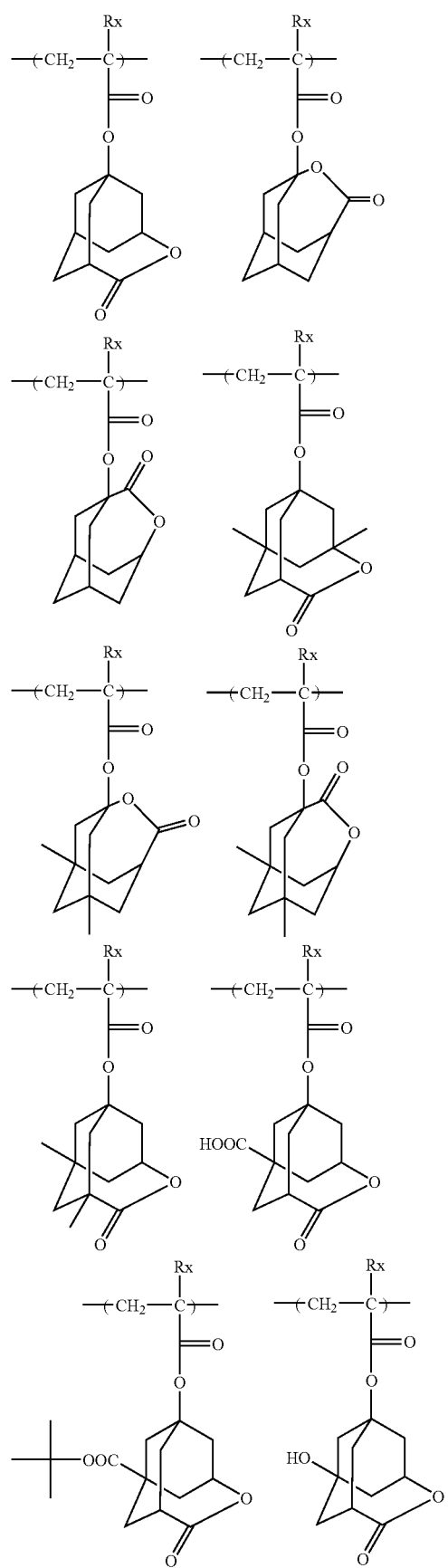
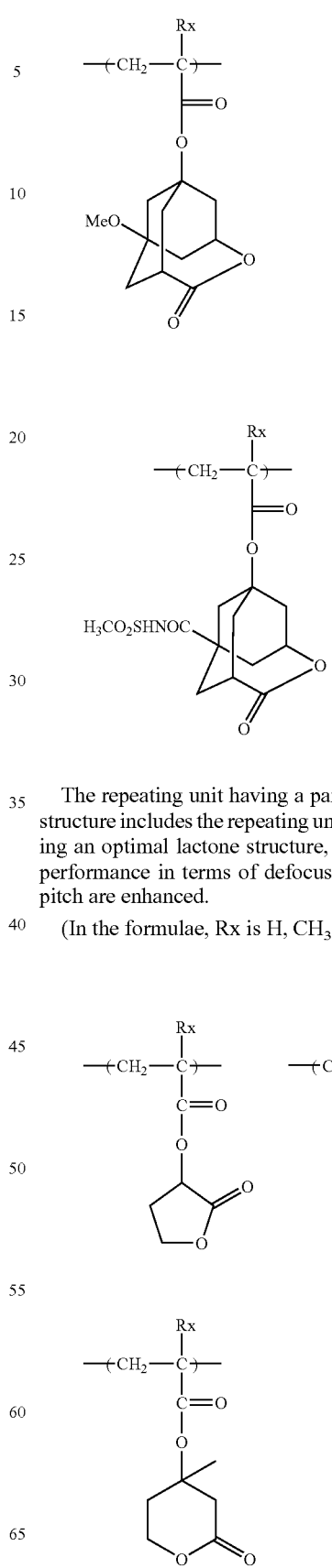
The repeating unit having a particularly preferred lactone structure includes the repeating units shown below. By selecting an optimal lactone structure, the pattern profile and the performance in terms of defocus latitude depended on line pitch are enhanced.
(In the formulae, Rx is H, $CH_3$, $CH_2OH$ or $CF_3$.)

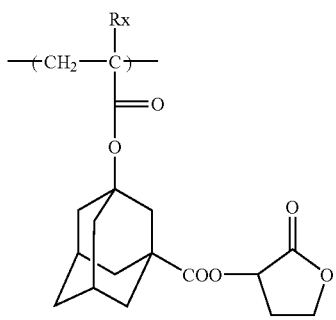
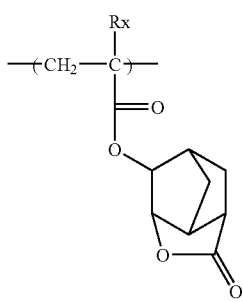
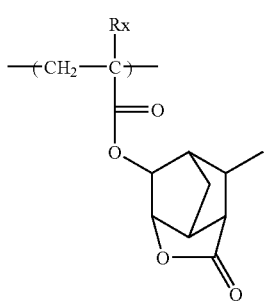
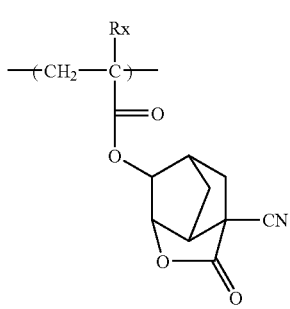
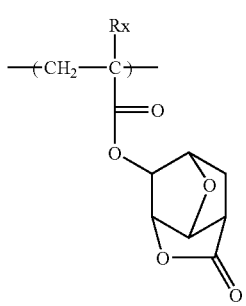

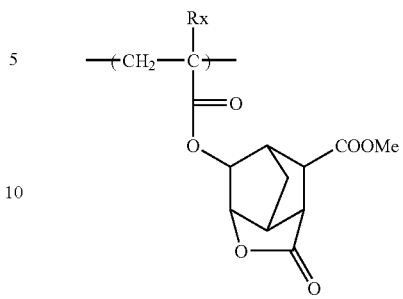
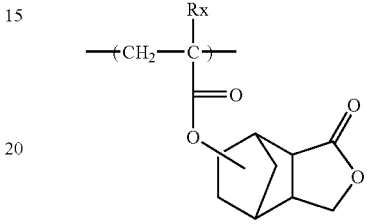
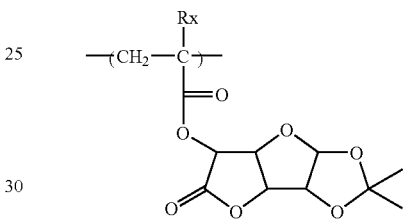
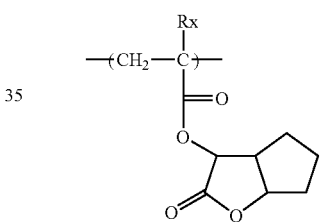

The resin as the component (B) preferably contains a repeating unit having a hydroxyl group or a cyano group. By virtue of this repeating unit, the adhesion to substrate and the affinity for developer are enhanced. The repeating unit having a hydroxyl group or a cyano group is preferably a repeating unit having an alicyclic hydrocarbon structure substituted by a hydroxyl group or a cyano group. The alicyclic hydrocarbon structure in the alicyclic hydrocarbon structure substituted by a hydroxyl group or a cyano group is preferably an adamantyl group, a diamantyl group or a norbornane group. The alicyclic hydrocarbon structure substituted by a hydroxyl group or a cyano group is preferably a partial structure represented by any one of the following formulae (VIIa) to (VIId):

(VIIa)

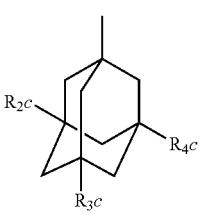

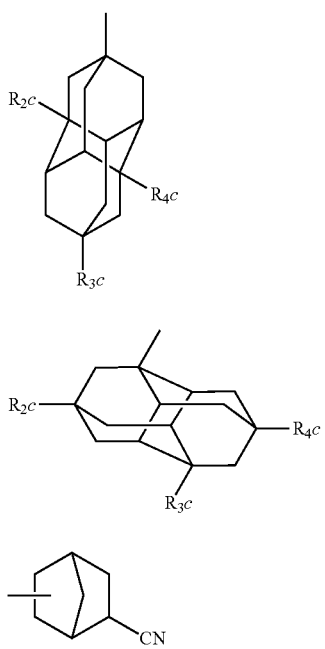

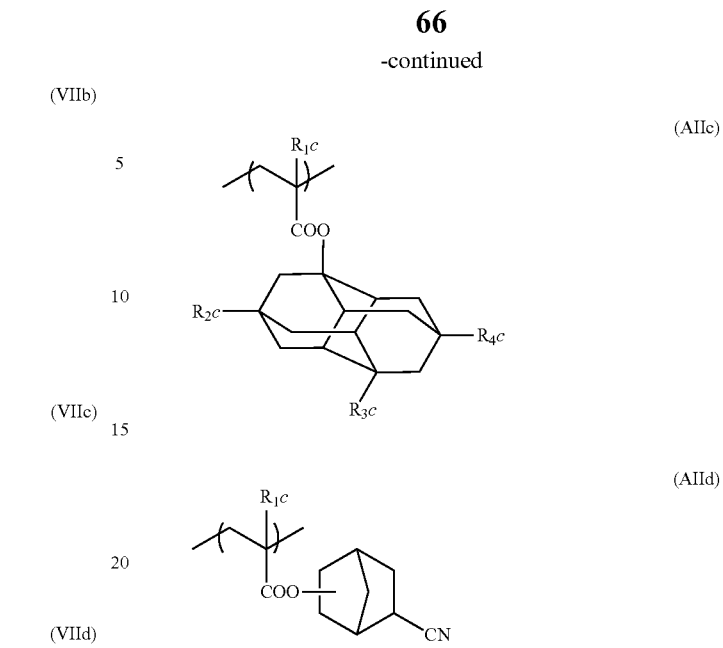

In formulae (VIIa) to (VIIc), $R_{2c}$ to $R_{4c}$ each independently represents a hydrogen atom, a hydroxyl group or a cyano group, provided that at least one of $R_{2c}$ to $R_{4c}$ represents a hydroxyl group or a cyano group. A structure where one or two members out of $R_{2c}$ to $R_{4c}$ are a hydroxyl group with the remaining being a hydrogen atom is preferred. In formula (VIIa), it is more preferred that two members out of $R_{2c}$ to $R_{4c}$ are a hydroxyl group and the remaining is a hydrogen atom.

The repeating unit having a partial structure represented by any one of formulae (VIIa) to (VIId) includes repeating units represented by the following formulae (AIIa) to (AIId).

In formulae (AIIa) to (AIId), $R_{1c}$ represents a hydrogen atom, a methyl group, a trifluoromethyl group or a hydroxymethyl group, $R_{2c}$ to $R_{4c}$ have the same meanings as $R_{2c}$ to $R_{4c}$ in formulae (VIIa) to (VIIc).

The content of the repeating unit having an alicyclic hydrocarbon structure substituted by a hydroxyl group or a cyano group is preferably from 5 to 40 mol %, more preferably from 5 to 30 mol %, still more preferably from 10 to 25 mol %, based on all repeating units in the polymer.

Specific examples of the repeating unit having a hydroxyl group or a cyano group are set forth below, but the present invention is not limited thereto.

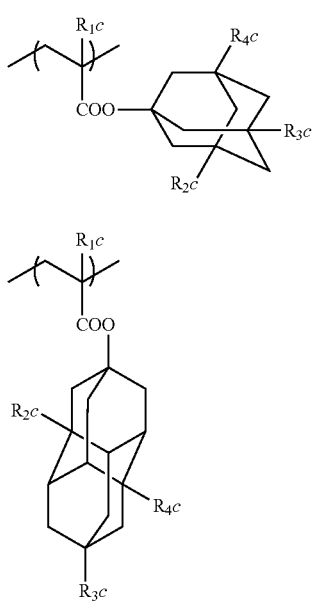

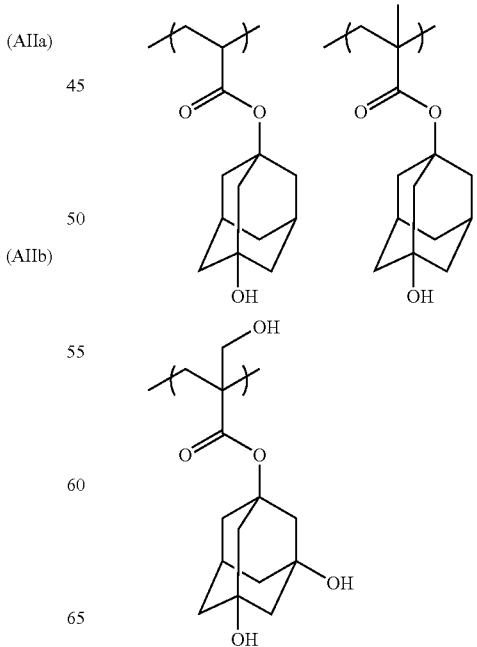

-continued

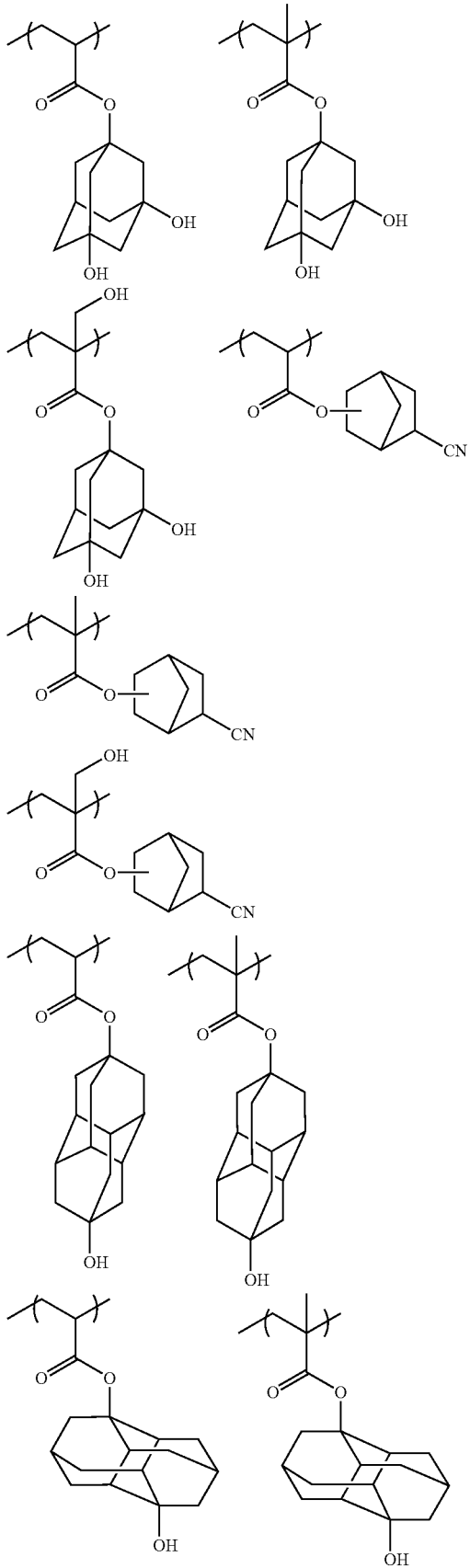

The resin as the component (B) preferably contains a repeating unit having an alkali-soluble group. The alkali-soluble group includes a carboxyl group, a sulfonamide group, a sulfonylimide group, a bisulfonylimide group, and an aliphatic alcohol with the α-position being substituted by an electron-withdrawing group, such as hexafluoroisopropanol group. A repeating unit having a carboxyl group is more preferred. By virtue of containing the repeating unit having an alkali-soluble group, the resolution increases in the usage of forming contact holes. As for the repeating unit having an alkali-soluble group, all of a repeating unit where an alkali-soluble group is directly bonded to the resin main chain, such as repeating unit by an acrylic acid or a methacrylic acid, a repeating unit where an alkali-soluble group is bonded to the resin main chain through a linking group, and a repeating unit where an alkali-soluble group is introduced into the polymer chain terminal by using an alkali-soluble group-containing polymerization initiator or chain transfer agent at the polymerization, are preferred. The linking group may have a monocyclic or polycyclic cyclohydrocarbon structure. In particular, a repeating unit by an acrylic acid or a methacrylic acid is preferred.

The content of the repeating unit having an alkali-soluble group is preferably from 1 to 20 mol %, more preferably from 3 to 15 mol %, still more preferably from 5 to 10 mol %, based on all repeating units in the polymer.

Specific examples of the repeating unit having an alkali-soluble group are set forth below, but the present invention is not limited thereto.

(In the formulae, Rx is H, $CH_3$, $CF_3$ or $CH_2OH$.)

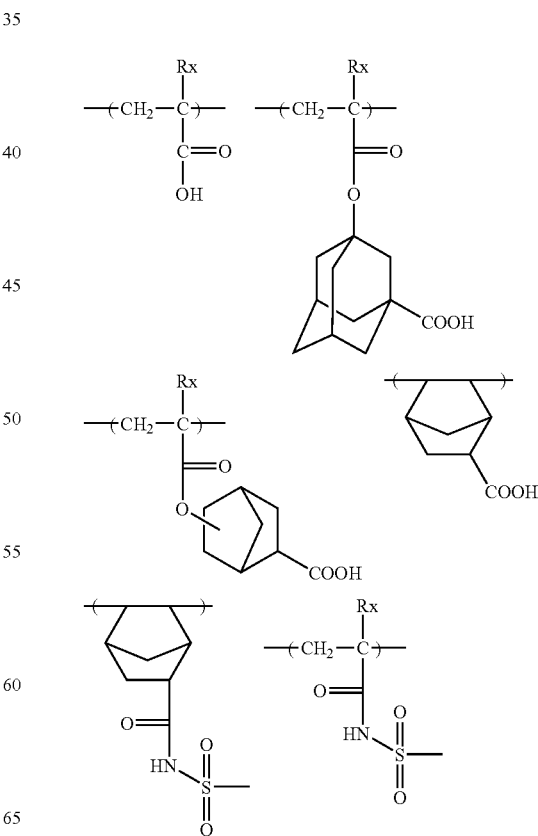

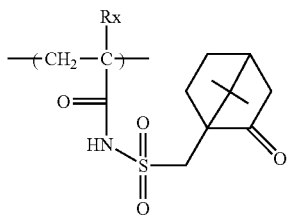
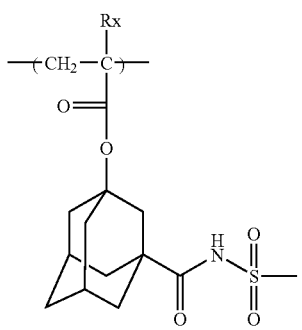
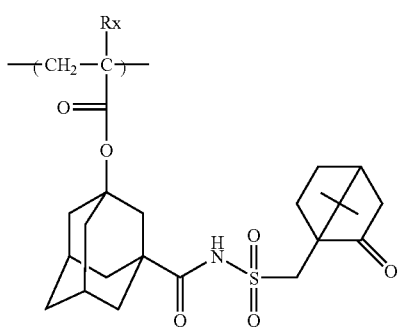
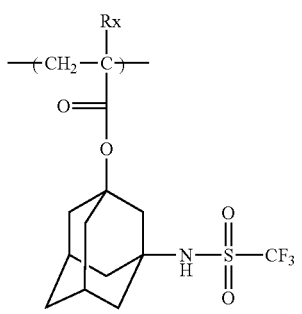
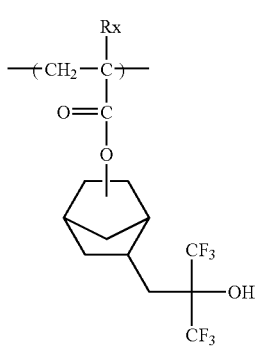

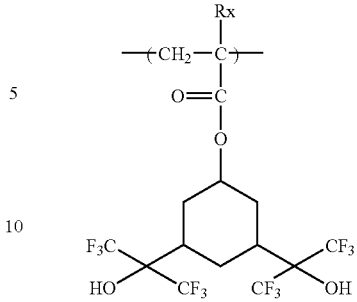

The repeating unit having at least one kind of a group selected from a lactone group, a hydroxyl group, a cyano group and an alkali-soluble group is more preferably a repeating unit having at least two groups selected from a lactone group, a hydroxyl group, a cyano group and an alkali-soluble group, still more preferably a repeating unit having a cyano group and a lactone group, yet still more preferably a repeating unit having a structure where a cyano group is substituted to the lactone structure of LC1-4 above.

The resin as the component (B) may further contain a repeating unit having an alicyclic hydrocarbon structure and not exhibiting acid decomposability. By containing such a repeating unit, the dissolving out of low molecular components from the resist film to the immersion liquid at the immersion exposure can be reduced. Examples of this repeating unit include 1-adamantyl(meth)acrylate, diamantyl(meth)acrylate, tricyclodecanyl(meth)acrylate and cyclohexyl(meth)acrylate.

It is preferred that the resin as the component (B) of the present invention further contains a repeating unit represented by formula (IX) having neither a hydroxyl group nor a cyano group:

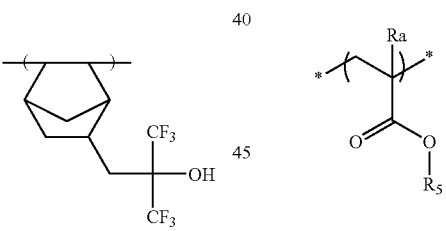 (IX)

In formula (IX), $R_5$ represents a hydrocarbon group having at least one cyclic structure and having neither a hydroxyl group nor a cyano group.

Ra represents a hydrogen atom, an alkyl group or a —$CH_2$—O—$Ra_2$ group, wherein $Ra_2$ represents a hydrogen atom, an alkyl group or an acyl group. Ra is preferably a hydrogen atom, a methyl group, a hydroxymethyl group or a trifluoromethyl group, particularly preferably a hydrogen atom or a methyl group.

The cyclic structure possessed by $R_5$ includes a monocyclic hydrocarbon group and a polycyclic hydrocarbon group. Examples of the monocyclic hydrocarbon group include a cycloalkyl group having a carbon number of 3 to 12, such as cyclopentyl group, cyclohexyl group, cycloheptyl group and cyclooctyl group, and a cycloalkenyl group having a carbon number of 3 to 12, such as cyclohexenyl group. As the monocyclic hydrocarbon group, a monocyclic hydrocarbon group having a carbon number of 3 to 7 is preferred, and a cyclopentyl group and a cyclohexyl group are more preferred.

The polycyclic hydrocarbon group includes a ring gathered hydrocarbon group and a crosslinked cyclic hydrocarbon group. Examples of the ring gathered hydrocarbon group include a bicyclohexyl group and a perhydronaphthalenyl group. Examples of the crosslinked cyclic hydrocarbon ring include a bicyclic hydrocarbon ring such as pinane, bornane, norpinane, norbornane and bicyclooctane rings (e.g., bicyclo[2.2.2]octane ring, bicyclo[3.2.1]octane ring), a tricyclic hydrocarbon ring such as homobredane, adamantane, tricyclo[5.2.1.0$^{2,6}$]decane and tricyclo[4.3.1.1$^{2,5}$]undecane rings, and a tetracyclic hydrocarbon ring such as tetracyclo[4.4.0.1$^{2,5}$.1$^{7,10}$]dodecane and perhydro-1,4-methano-5,8-methanonaphthalene rings. The crosslinked cyclic hydrocarbon ring also includes a condensed cyclic hydrocarbon ring, and examples thereof include a condensed ring formed by condensing a plurality of 5- to 8-membered cycloalkane rings such as perhydronaphthalene (decalin), perhydroanthracene, perhydrophenanthrene, perhydroacenaphthene, perhydrofluorene, perhydroindene and perhydrophenanthrene rings.

As the crosslinked cyclic hydrocarbon ring, a norbornyl group, an adamantyl group, a bicyclooctanyl group, a tricyclo[5.2.1.0$^{2,6}$]decanyl group are preferred, and a norbornyl group and an adamantyl group are more preferred.

Such an alicyclic hydrocarbon group may have a substituent, and preferred examples of the substituent include a halogen atom, an alkyl group, a hydroxyl group protected by a protective group, and an amino group protected by a protective group. Preferred halogen atoms include bromine, chlorine and fluorine atoms, and preferred alkyl groups include methyl, ethyl, butyl and tert-butyl groups. This alkyl group may further have a substituent, and the substituent which the alkyl group may further have includes a halogen atom, an alkyl group, a hydroxyl group protected by a protective group, and an amino group protected by a protective group.

Examples of the protective group include an alkyl group, a cycloalkyl group, an aralkyl group, a substituted methyl group, a substituted ethyl group, an acyl group, an alkoxycarbonyl group and an aralkyloxycarbonyl group. For example, the alkyl group is preferably an alkyl group having a carbon number of 1 to 4, the substituted methyl group is preferably a methoxymethyl, methoxythiomethyl, benzoyloxymethyl, tert-butoxymethyl or 2-methoxyethoxymethyl group, the substituted ethyl group is preferably a 1-ethoxyethyl or 1-methyl-1-methoxyethyl group, the acyl group is preferably an aliphatic acyl group having a carbon number of 1 to 6, such as formyl, acetyl, propionyl, butyryl, isobutyryl, valeryl and pivaloyl groups, and the alkoxycarbonyl group is preferably an alkoxycarbonyl group having a carbon number of 1 to 4.

The content of the repeating unit represented by formula (IX) having neither a hydroxyl group nor a cyano group is preferably from 0 to 40 mol %, more preferably from 0 to 20 mol %, based on all repeating units in the resin as the component (B).

Specific examples of the repeating unit represented by formula (IX) are set forth below, but the present invention is not limited thereto.

In formulae, Ra represents H, CH$_3$, CH$_2$OH or CF$_3$.

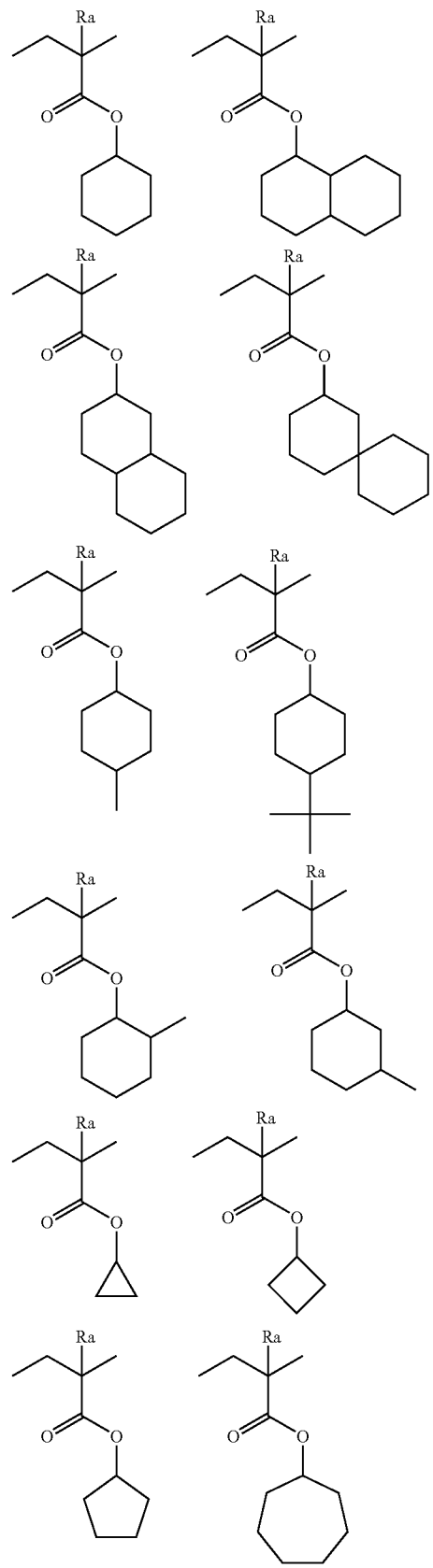

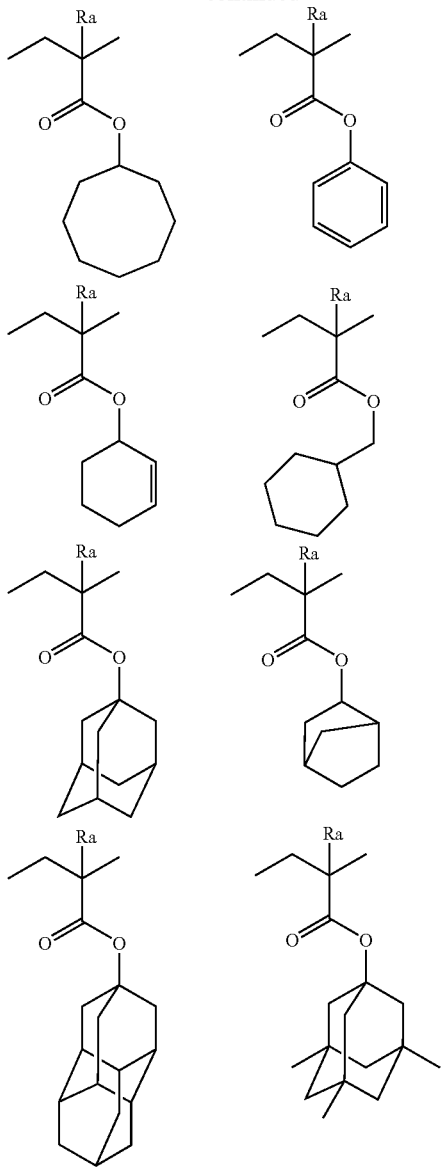

The resin as the component (B) may further contain, in addition to the above-described repeating units, various repeating structural units for the purpose of controlling dry etching resistance, suitability for standard developer, adhesion to substrate, resist profile and properties generally required of the resist, such as resolving power, heat resistance and sensitivity.

Examples of such a repeating structural unit include, but are not limited to, repeating structural units corresponding to the monomers described below.

By virtue of such a repeating structural unit, the performance required of the resin as the component (B), particularly, (1) solubility in coating solvent,
(2) film-forming property (glass transition point),
(3) alkali developability,
(4) film loss (selection of hydrophilic, hydrophobic or alkali-soluble group),
(5) adhesion of unexposed area to substrate,
(6) dry etching resistance
and the like, can be subtly controlled.

Examples of the monomer include a compound having one addition-polymerizable unsaturated bond selected from acrylic acid esters, methacrylic acid esters, acrylamides, methacrylamide, allyl compounds, vinyl ethers and vinyl esters.

Other than these, an addition-polymerizable unsaturated compound copolymerizable with the monomers corresponding to the above-described various repeating structural units may be copolymerized.

In the resin as the component (B), the molar ratio of respective repeating structural units contained is appropriately determined to control the dry etching resistance of resist, suitability for standard developer, adhesion to substrate, resist profile and performances generally required of the resist, such as resolving power, heat resistance and sensitivity.

In the case of using the positive resist composition of the present invention for ArF exposure, the resin as the component (B) preferably has no aromatic group in view of transparency to ArF light.

The resin as the component (B) is preferably a resin where all repeating units are composed of a (meth)acrylate-based repeating unit. In this case, the repeating units all may be a methacrylate-based repeating unit, all may be an acrylate-based repeating unit, or all may comprise a methacrylate-based repeating unit and an acrylate-based repeating unit, but the content of the acrylate-based repeating unit is preferably 50 mol % or less based on all repeating units. The resin is more preferably a copolymerization polymer containing from 20 to 50 mol % of an acid decomposable group-containing (meth)acrylate-based repeating unit represented by formula (Ia) and/or formula (Ib), from 20 to 50 mol % of a (meth)acrylate-based repeating unit having a lactone structure, from 5 to 30 mol % of a (meth)acrylate-based repeating unit having an alicyclic hydrocarbon structure substituted by a hydroxyl group or a cyano group, and from 0 to 20 mol % of other (meth)acrylate-based repeating units.

In the case where the positive resist composition of the present invention is irradiated with KrF excimer laser light, electron beam, X-ray or high-energy beam at a wavelength of 50 nm or less (e.g., EUV), the resin as the component (B) preferably further contains a hydroxystyrene-based repeating unit, more preferably a hydroxystyrene-based repeating unit, a hydroxystyrene-based repeating unit protected by an acid-decomposable group, and an acid-decomposable repeating unit such as tertiary alkyl(meth)acrylate, in addition to the repeating unit represented by formula (Ia) and/or the repeating unit represented by formula (Ib).

Preferred examples of the repeating unit having an acid-decomposable group include a tert-butoxycarbonyloxystyrene, a 1-alkoxyethoxystyrene and a tertiary alkyl(meth)acrylate. A 2-alkyl-2-adamantyl(meth)acrylate and a dialkyl(1-adamantyl)methyl(meth)acrylate are more preferred.

The resin as the component (B) can be synthesized by an ordinary method (for example, radical polymerization). Examples of the synthesis method in general include a batch polymerization method of dissolving monomer species and an initiator in a solvent and heating the solution, thereby effecting the polymerization, and a dropping polymerization method of adding dropwise a solution containing monomer species and an initiator to a heated solvent over 1 to 10 hours. A dropping polymerization method is preferred. Examples of the reaction solvent include tetrahydrofuan, 1,4-dioxane, ethers such as diisopropyl ether, ketones such as methyl ethyl ketone and methyl isobutyl ketone, an ester solvent such as ethyl acetate, an amide solvent such as dimethylformamide and dimethylacetamide, and a solvent capable of dissolving the composition of the present invention, which is described later, such as propylene glycol monomethyl ether acetate, propylene glycol monomethyl ether and cyclohexanone. The polymerization is more preferably performed using the same solvent as the solvent used in the positive resist composition of the present invention. By the use of this solvent, production of particles during storage can be suppressed.

The polymerization reaction is preferably performed in an inert gas atmosphere such as nitrogen and argon. As for the polymerization initiator, the polymerization is initiated using a commercially available radical initiator (e.g., azo-based initiator, peroxide). The radical initiator is preferably an azo-based initiator, and an azo-based initiator having an ester group, a cyano group or a carboxyl group is preferred. Preferred examples of the initiator include azobisisobutyronitrile, azobisdimethylvaleronitrile and dimethyl 2,2'-azobis(2-methylpropionate). The initiator is added additionally or in parts, if desired. After the completion of reaction, the reaction product is charged into a solvent, and the desired polymer is recovered by a method such as powder or solid recovery. The reaction concentration is from 5 to 50 mass %, preferably from 10 to 30 mass %, and the reaction temperature is usually from 10 to 150° C., preferably from 30 to 120° C., more preferably from 60 to 100° C.

The weight average molecular weight of the resin as the component (B) is preferably from 1,000 to 200,000, more preferably from 2,000 to 20,000, still more preferably from 3,000 to 15,000, yet still more preferably from 3,000 to 10,000, in terms of polystyrene by the GPC method. When the weight average molecular weight is from 1,000 to 200,000, the heat resistance, dry etching resistance and developability can be prevented from deterioration and also, the film-forming property can be prevented from deteriorating due to high viscosity.

The dispersity (molecular weight distribution) is usually from 1 to 3, preferably from 1 to 2, more preferably from 1.4 to 1.7. As the molecular weight distribution is smaller, the resolution and resist profile are more excellent, the side wall of the resist pattern is smoother, and the property in terms of roughness is more improved.

In the positive resist composition of the present invention, the amount of the resin as the component (B) blended in the entire composition is preferably from 50 to 99.9 mass %, more preferably from 60 to 99.0 mass %, based on the entire solid content.

In the present invention, as for the resin as the component (B), one species may be used or a plurality of species may be used in combination.

(C) Compound Capable of Decomposing Under the Action of an Acid to Generate an Acid The positive resist composition of the present invention contains a compound capable of decomposing under the action of an acid to generate an acid (hereinafter sometimes referred to as an "acid-increasing agent").

The acid-increasing agent for use in the present invention is a compound which is stable in the absence of an acid but decomposes under the action of an acid generated from an acid generator upon exposure and produces an acid. The acid produced from the acid-increasing agent preferably has a large acid strength. Specifically, the dissociation constant (pKa) of the acid is preferably 3 or less, more preferably 2 or less. The acid generated from the acid-increasing agent is preferably a sulfonic acid having an alkyl group, a cycloalkyl group, an aryl group or an aralkyl group. In particular, the acid-increasing agent is preferably a compound which generates an alkylsulfonic acid or a benzenesulfonic acid.

The acid-increasing agent is described, for example, in WO95/29968, WO98/24000, JP-A-8-305262, JP-A-9-34106, JP-A-8-248561, JP-T-8-503082 (the term "JP-T" as used herein means a "published Japanese translation of a PCT patent application"), U.S. Pat. No. 5,445,917, JP-T-8-503081, U.S. Pat. Nos. 5,534,393, 5,395,736, 5,741,630, 5,334,489, 5,582,956, 5,578,424, 5,453,345 and 5,445,917, European Patents 665,960, 757,628 and 665,961, U.S. Pat. No. 5,667,943, JP-A-10-1508, JP-A-10-282642 and JP-A-9-512498, and one of these acid-increasing agents may be used, or two or more thereof may be used in combination.

Specifically, compounds represented by the following formulae (1) to (5) are preferred.

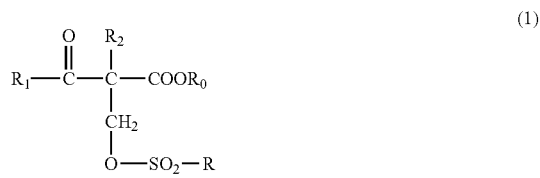

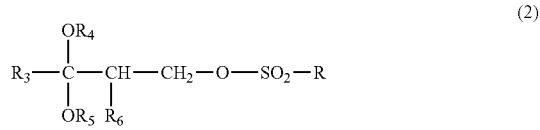

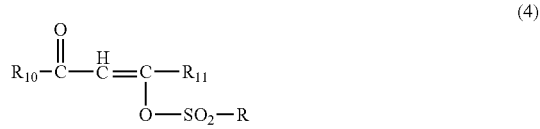

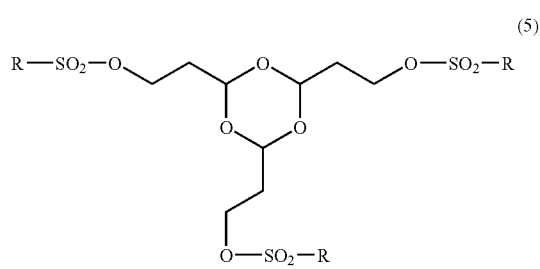

In formulae (1) to (5), R represents an alkyl group, a cycloalkyl group, an aryl group or an aralkyl group.

$R_0$ represents a group which leaves under the action of an acid.

$R_1$ represents an alkyl group, a cycloalkyl group, an aryl group, an aralkyl group, an alkoxy group or an aryloxy group.

$R_2$ represents an alkyl group or an aralkyl group.

$R_3$ represents an alkyl group, a cycloalkyl group, an aryl group or an aralkyl group.

$R_4$ and $R_5$ each independently represents an alkyl group, and $R_4$ and $R_5$ may combine with each other to form a ring.

$R_6$ represents a hydrogen atom or an alkyl group.

$R_7$ represents a hydrogen atom, an alkyl group, a cycloalkyl group, an aryl group or an aralkyl group.

$R_8$ represents an alkyl group, a cycloalkyl group, an aryl group or an aralkyl group.

$R_9$ represents a hydrogen atom, an alkyl group, a cycloalkyl group, an aryl group or an aralkyl group.

$R_9$ may combine with $R_7$ to form a ring.

$R_{10}$ represents an alkyl group, a cycloalkyl group, an alkoxy group, an aryl group, an aralkyl group, an aryloxy group or an alkenyloxy group.

$R_{11}$ represents an alkyl group, a cycloalkyl group, an alkoxy group, an aryl group, an aralkyl group, an aryloxy group or an alkenyl group.

$R_{10}$ and $R_{11}$ may combine with each other to form a ring.

In formulae (1) to (5), the alkyl group is, for example, an alkyl group having a carbon number of 1 to 8, and specific examples thereof include a methyl group, an ethyl group, a propyl group, an isopropyl group, a butyl group and an octyl group.

The cycloalkyl group is, for example, a cycloalkyl group having a carbon number of 4 to 10, and specific examples thereof include a cyclopropyl group, a cyclopentyl group, a cyclohexyl group, a cycloheptyl group, an adamantyl group, a boronyl group, an isoboronyl group, a tricyclodecanyl group, a dicyclopentenyl group, a norbornane epoxy group, a menthyl group, an isomenthyl group, a neomenthyl group and a tetracyclododecanyl group.

The aryl group is, for example, an aryl group having a carbon number of 6 to 14, and specific examples thereof include a phenyl group, a naphthyl group and a tolyl group.

The aralkyl group is, for example, an aralkyl group having a carbon number of 7 to 20, and specific examples thereof include a benzyl group, a phenethyl group and a naphthylethyl group.

The alkoxy group is, for example, an alkoxy group having a carbon number of 1 to 8, and specific examples thereof include a methoxy group, an ethoxy group, a propoxy group and a butoxy group.

The alkenyl group is, for example, an alkenyl group having a carbon number of 2 to 6, and specific examples thereof include a vinyl group, a propenyl group, an allyl group, a butenyl group, a pentenyl group, a hexenyl group and a cyclohexenyl group.

The aryloxy group is, for example, an aryloxy group having a carbon number of 6 to 14, and specific examples thereof include a phenoxy group and a naphthoxy group.

The alkenyloxy group is, for example, an alkenyloxy group having a carbon number of 2 to 8, and specific examples thereof include a vinyloxy group and an allyloxy group.

These substituents each may further have a substituent, and examples of the substituent include a halogen atom such as Cl, Br and F, a —CN group, an —OH group, an alkyl group having a carbon number of 1 to 4, a cycloalkyl group having a carbon number of 3 to 8, an alkoxy group having a carbon number of 1 to 4, an acylamino group such as acetylamino group, an aralkyl group such as benzyl group and phenethyl group, an aryloxyalkyl group such as phenoxyethyl group, an alkoxycarbonyl group having a carbon number of 2 to 5, and an acyloxy group having a carbon number of 2 to 5. However, the range of the substituent is not limited thereto.

Examples of the ring formed by combining $R_4$ and $R_5$ with each other include a 1,3-dioxolane ring and a 1,3-dioxane ring.

Examples of the ring formed by combining $R_7$ and $R_9$ with each other include a cyclopentyl ring and a cylohexyl ring.

Examples of the ring formed by combining $R_{10}$ and $R_{11}$ with each other include a 3-oxocyclohexenyl ring and a 3-oxoindenyl ring, which rings each may contain an oxygen atom in the ring.

Examples of the group which leaves under the action of an acid, represented by $R_0$, include a tertiary alkyl group such as tert-butyl group and tert-amyl group, an isoboronyl group, a 1-alkoxyethyl group such as 1-ethoxyethyl group, 1-butoxyethyl group, 1-isobutoxyethyl group and 1-cyclohexyloxyethyl group, an alkoxymethyl group such as 1-methoxymethyl group and 1-ethoxymethyl group, a tetrahydropyranyl group, a tetrahydrofuranyl group, a trialkylsilyl group, and a 3-oxocyclohexyl group.

R, $R_0$ and $R_1$ to $R_{11}$ each is preferably as follows.

R: A methyl group, an ethyl group, a propyl group, a butyl group, an octyl group, a trifluoromethyl group, a nonafluorobutyl group, a heptadecafluorooctyl group, a 2,2,2-trifluoroethyl group, a phenyl group, a pentafluorophenyl group, a methoxyphenyl group, a toluyl group, a mesityl group, a fluorophenyl group, a naphthyl group, a cyclohexyl group or a camphor group, $R_0$: A tert-butyl group, a methoxymethyl group, an ethoxymethyl group, a 1-ethoxyethyl group or a tetrahydropyranyl group, $R_1$: A methyl group, an ethyl group, a propyl group, a cyclopropyl group, a cyclopentyl group, a cyclohexyl group, a phenyl group, a naphthyl group, a benzyl group, a phenethyl group, a methoxy group, an ethoxy group, a propoxy group, a phenoxy group or a naphthoxy group.

$R_2$: A methyl group, an ethyl group, a propyl group, a butyl group or a benzyl group.

$R_3$: A methyl group, an ethyl group, a propyl group, a cyclopropyl group, a cyclopentyl group, a cyclohexyl group, a phenyl group, a naphthyl group, a benzyl group, a phenethyl group or a naphthylmethyl group.

$R_4$ and $R_5$: A methyl group, an ethyl group, a propyl group, or an ethylene or propylene group formed by combining with each other.

$R_6$: A hydrogen atom, a methyl group or an ethyl group.

$R_7$ and $R_9$: A hydrogen atom, a methyl group, an ethyl group, a propyl group, a butyl group, a pentyl group, a cyclopropyl group, a cyclopentyl group, a cyclohexyl group, a phenyl group, a naphthyl group, a benzyl group, a phenethyl group, or a cyclopentyl or cyclohexyl ring formed by combining with each other.

$R_8$: A methyl group, an ethyl group, an isopropyl group, a tert-butyl group, a neopentyl group, a cyclohexyl group, a phenyl group or a benzyl group.

$R_{10}$: A methyl group, an ethyl group, a propyl group, an isopropyl group, a butyl group, an isobutyl group, a cyclopropyl group, a cyclopentyl group, a cyclohexyl group, a methoxy group, an ethoxy group, a phenyl group, a naphthyl group, a benzyl group, a phenoxy group, a naphthoxy group, a vinyloxy group, a methylvinyloxy group, or a 3-oxocyclohexenyl or 3-oxoindenyl ring formed by combining with $R_{11}$, which may contain an oxygen atom.

$R_{11}$: A methyl group, an ethyl group, a propyl group, an isopropyl group, a butyl group, an isobutyl group, a cyclopropyl group, a cyclopentyl group, a cyclohexyl group, a methoxy group, an ethoxy group, a phenyl group, a naphthyl group, a benzyl group, a phenoxy group, a naphthoxy group, a vinyl group, an allyl group, or a 3-oxocyclohexenyl or 3-oxoindenyl ring formed by combining with $R_{10}$, which may contain an oxygen atom, Specific examples of the compounds represented by formulae (1) to (5) are set forth below, but the present invention is not limited thereto.

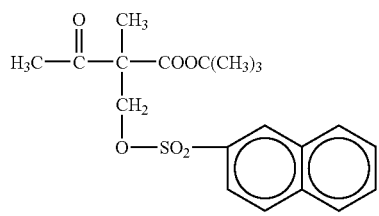 (1-1)
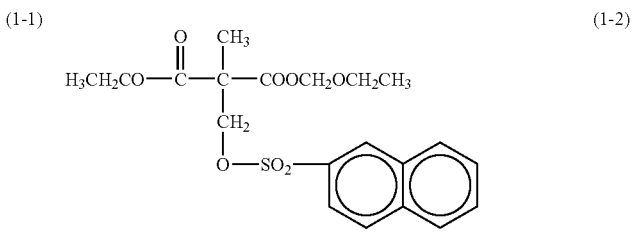 (1-2)
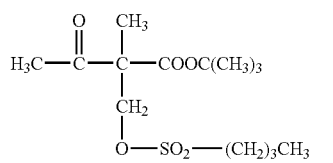 (1-3)
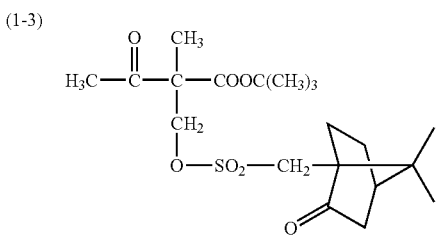 (1-4)
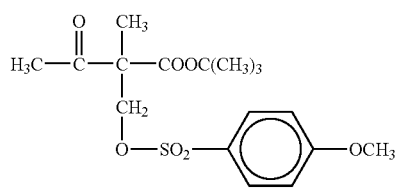 (1-5)
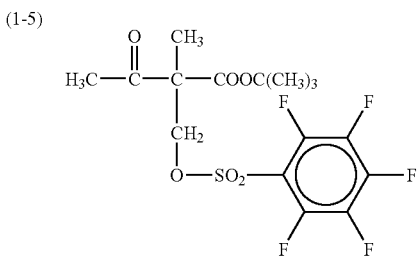 (1-6)
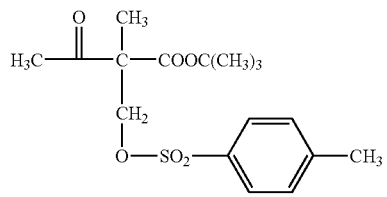 (1-7)
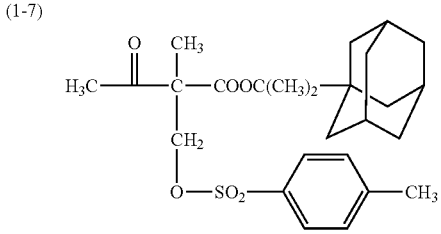 (1-8)
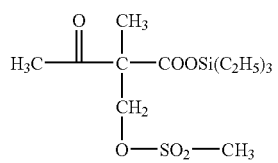 (1-9)
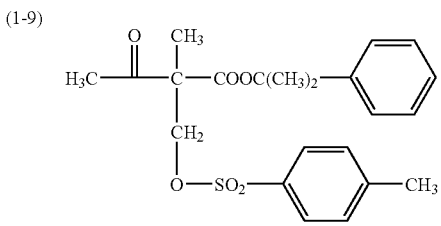 (1-10)
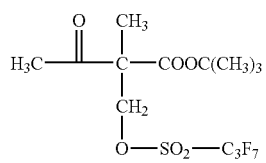 (1-11)
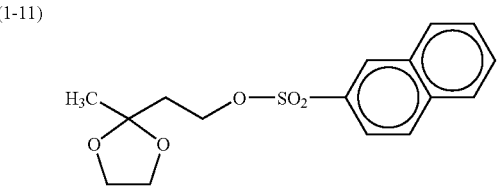 (2-1)
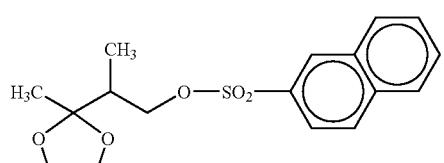 (2-2)
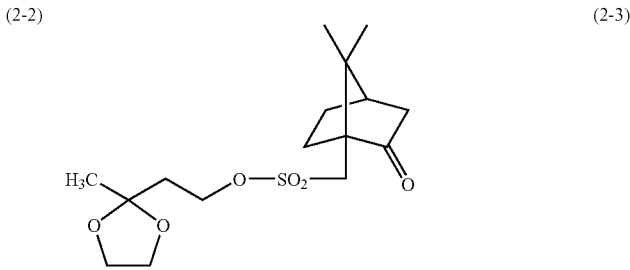 (2-3)

(2-4) 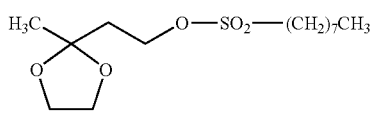
(2-5) 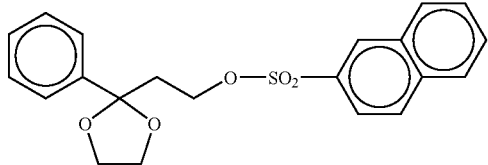
(2-6) 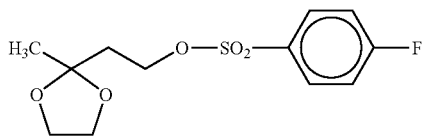
(3-1) 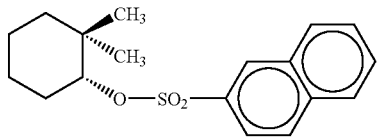
(3-2) 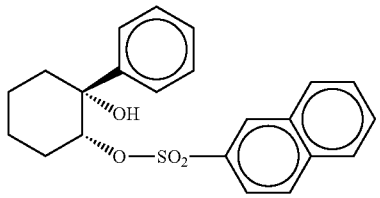
(3-3) 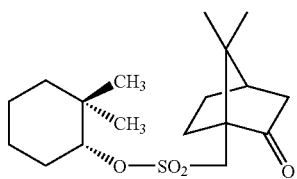
(3-4) 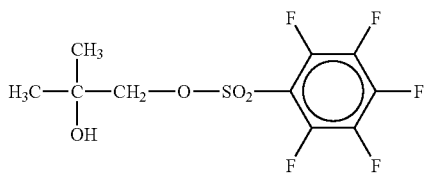
(3-5) 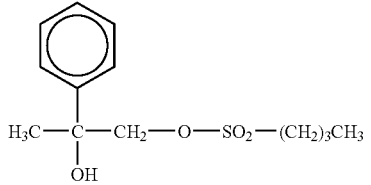
(3-6) 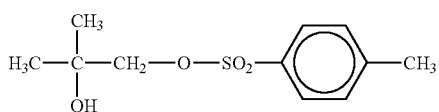
(4-1) 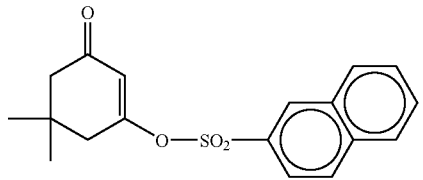
(4-2) 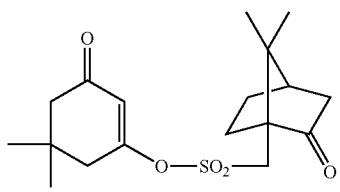
(4-3) 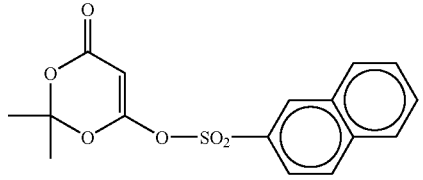
(4-4) 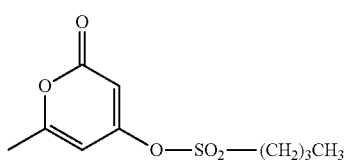
(4-5) 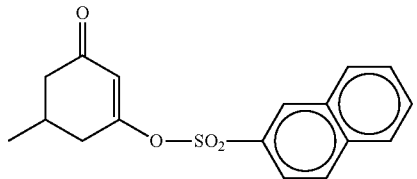
(4-6) 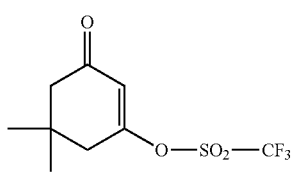
(4-7) 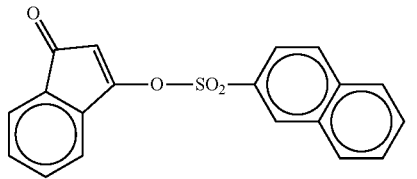

-continued

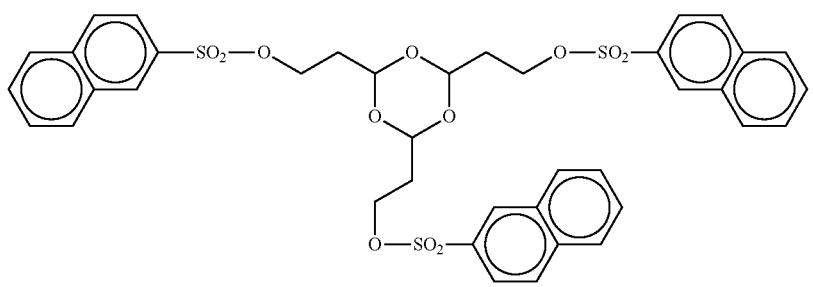
(5-1)

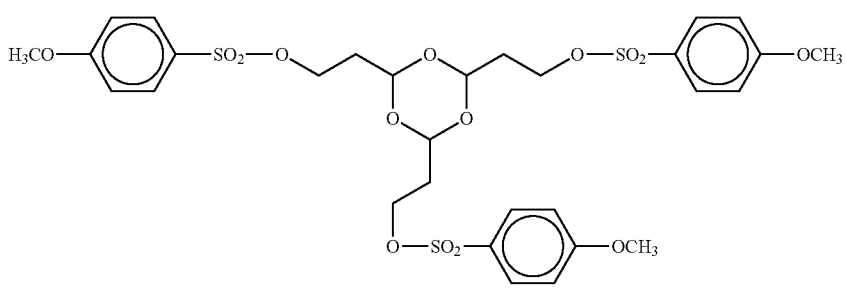
(5-2)

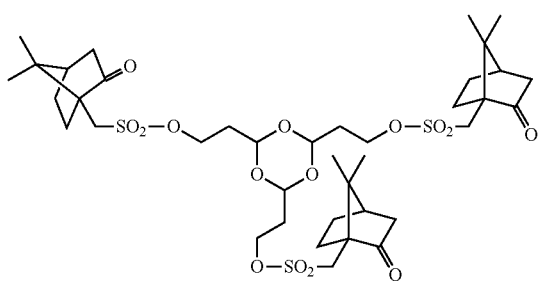
(5-3)

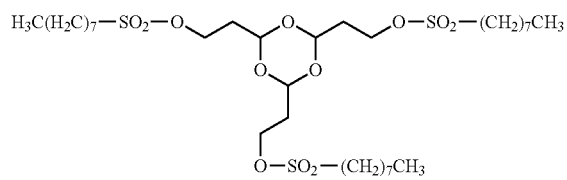
(5-4)

In the present invention, above all, the acid-increasing agent is preferably a compound represented by formula (4), more preferably a compound capable of generating an acid having one sulfonic acid group, still more preferably a compound capable of generating an acid having a molecular weight of 150 or more, and most preferably a compound capable of generating an alkylsulfonic acid or a benzenesulfonic acid.

In the present invention, the amount of the acid-increasing agent added to the composition is preferably from 0.3 to 20 mass %, more preferably from 1.5 to 10 mass %, based on the entire solid content of the composition.

In the present invention, the absolute value of the difference in pKa between the acid generated from the acid generator (A) and the acid generated from the acid-increasing agent (C) is preferably 2 or less and at the same time, the absolute value of the difference in the molecular weight is preferably 50 or less.

The absolute value of the difference in pKa of the acids is more preferably from 1 to 0. The absolute value of the difference in the molecular weight is more preferably from 30 to 0.

If the pKa of the acid generated from the photoacid generator is too small, large LWR results, whereas if it is excessively large, the sensitivity is worsened or the pattern formation is not enabled. By setting the absolute value of the difference in pKa of the acids to the range of 2 or less, LWR is reduced and this is preferred.

If the molecular weight of the acid generated from the photoacid generator is too small, the pitch dependency of the pattern dimension becomes large, whereas if it is excessively large, the sensitivity is worsened or the pattern formation is not enabled. By setting the absolute value of the difference in the molecular weight to the range of 50 or less, it is possible to reduce the pitch dependency of the pattern dimension.

In the present invention, the acid dissociation index pKa indicates an acid dissociation index pKa in an aqueous solution, and the "acid dissociation index" is the logarithm of the reciprocal of the acid dissociation constant and is described, for example, in Kagaku Binran (Chemical Handbook) II, 4th revised edition, compiled by The Chemical Society of Japan, Maruzen Co., Ltd. (1993). As this value is lower, the acid strength is larger. The acid dissociation index pKa in an aqueous solution can be specifically measured in practice with an aqueous infinite dilution solution by measuring the acid dissociation constant at 25° C. Alternatively, a value based on a data base containing Hammett's substituent constants and publication values can be determined using Software Package 1 (Advanced Chemistry Development (ACD/Labs) Software V8.14 for Solaris (1994-2007 ACD/Labs)). The pKa values referred to in the present invention all are a value determined by calculation using this software package.

Specific examples of the pKa and molecular weight of the acid generated are set forth below.

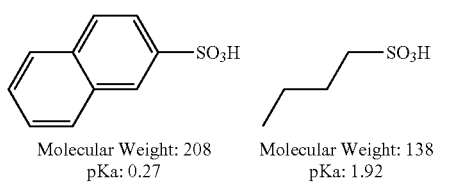
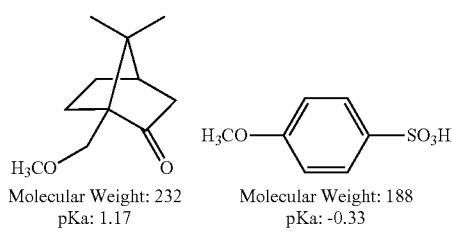
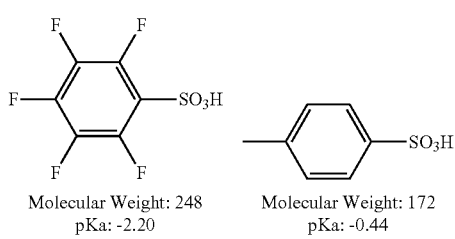
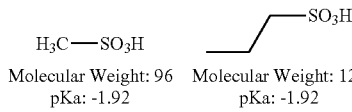
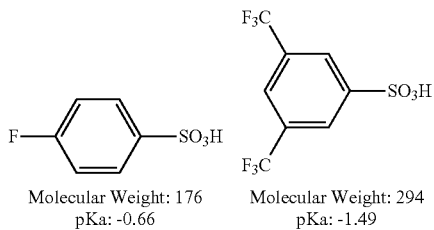
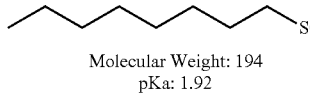
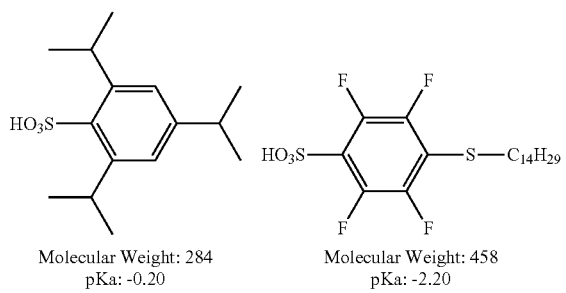
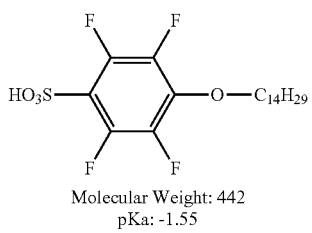
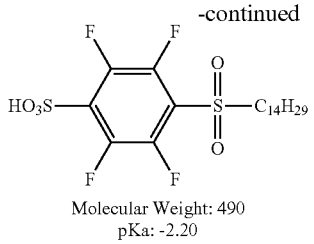
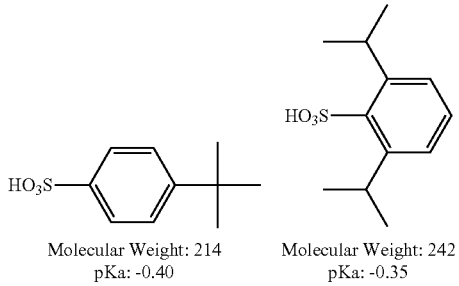
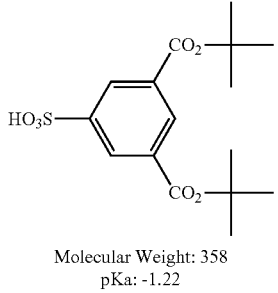
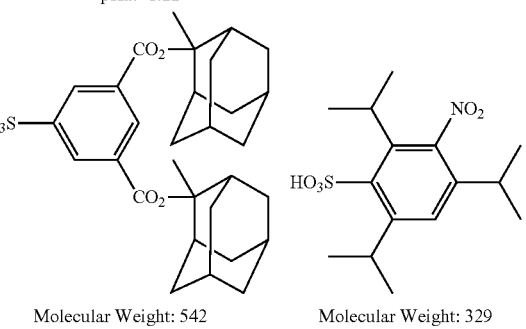
It is most preferred that the acid generated from the acid generator (A) and the acid generated from the acid-increasing agent (C) have the same chemical structure.
The ratio between acid generator and acid-increasing agent added is preferably from 1:1 to 1:100, more preferably from 1:2 to 1:50, still more preferably from 1:2 to 1:30, and most preferably from 1:3 to 1:20.

(D) Compound which Itself Acts as a Base for the Acids Generated from the Component (A) and the Component (C) but Decomposes Upon Irradiation with Actinic Rays or Radiation to Lose the Basicity for the Acids Generated from the Component (A) and the Component (C)

The positive resist composition of the present invention contains (D) a compound which itself acts as a base for the acids generated from the component (A) and the component (C) but decomposes upon irradiation with actinic rays or radiation to lose the basicity for the acids generated from the component (A) and the component (C) (hereinafter sometimes referred to as a "component (D)"), As for (D) the compound which itself acts as a base for the acids generated from the component (A) and the component (C) but decomposes upon irradiation with actinic rays or radiation to lose the basicity for the acids generated from the component (A) and the component (C), the compound as the component (D) is preferably a compound capable of generating a carboxylic acid and/or a compound represented by the following formula (I) upon irradiation with actinic rays or radiation.

The content of the component (D) is from 1 to 100 mass %, preferably from 5 to 70 mass %, more preferably from 10 to 50 mass %, and most preferably from 20 to 40 mass %, based on the content of the component (A) and the component (C).

(D1) Compound Capable of Generating a Compound Represented by Formula (I) Upon Irradiation with Actinic Rays or Radiation The photosensitive composition of the present invention contains a compound capable of generating a compound represented by the following formula (I) upon irradiation with actinic rays or radiation (hereinafter sometimes referred to as a "compound (D1)")

(I)

In formula (I), $R_1$ and $R_2$ each independently represents a monovalent organic group, provided that either one of $R_1$ and $R_2$ has a proton acceptor functional group, $R_1$ and $R_2$ may combine to form a ring, and the ring formed may have a proton acceptor functional group; and $X_1$ and $X_2$ each independently represents —CO— or —SO$_2$—.

The monovalent organic group as $R_1$ and $R_2$ in formula (I) is preferably a monovalent organic group having a carbon number of 1 to 40, and examples thereof include an alkyl group, a cycloalkyl group, an aryl group, an aralkyl group and an alkenyl group.

The alkyl group as $R_1$ and $R_2$, which may have a substituent, is preferably a linear or branched alkyl group having a carbon number of 1 to 30 and may contain an oxygen atom, a sulfur atom or a nitrogen atom in the alkyl chain. Specific examples thereof include a linear alkyl group such as methyl group, ethyl group, n-propyl group, n-butyl group, n-pentyl group, n-hexyl group, n-octyl group, n-dodecyl group, n-tetradecyl group and n-octadecyl group; and a branched alkyl group such as isopropyl group, isobutyl group, tert-butyl group, neopentyl group and 2-ethylhexyl group.

The cycloalkyl group as $R_1$ and $R_2$, which may have a substituent, is preferably a cycloalkyl group having a carbon number of 3 to 20 and may contain an oxygen atom or a nitrogen atom in the ring. Specific examples thereof include a cyclopropyl group, a cyclopentyl group, a cyclohexyl group, a norbornyl group and an adamantyl group.

The aryl group as $R_1$ and $R_2$, which may have a substituent, is preferably an aryl group having a carbon number of 6 to 14, and examples thereof include a phenyl group and a naphthyl group.

The aralkyl group as $R_1$ and $R_2$, which may have a substituent, is preferably an aralkyl group having a carbon number of 7 to 20, and examples thereof include a benzyl group, a phenethyl group, a naphthylmethyl group and a naphthylethyl group.

The alkenyl group as $R_1$ and $R_2$, which may have a substituent, includes a group having a double bond at an arbitrary position of the alkyl group above.

Examples of the substituent which these groups each may have include a halogen atom, a hydroxyl group, a nitro group, a cyano group, a carboxy group, a carbonyl group, a cycloalkyl group (preferably having a carbon number of 3 to 10), an aryl group (preferably having a carbon number of 6 to 14), an alkoxy group (preferably having a carbon number of 1 to 10), an acyl group (preferably having a carbon number of 2 to 20), an acyloxy group (preferably having a carbon number of 2 to 10), an alkoxycarbonyl group (preferably having a carbon number of 2 to 20), and an aminoacyl group (preferably having a carbon number of 2 to 10). As for the cyclic structure in the aryl group, cycloalkyl group and the like, examples of the substituent further include an alkyl group (preferably having a carbon number of 1 to 10). As for the aminoacyl group, examples of the substituent further include an alkyl group (preferably having a carbon number of 1 to 10). Examples of the alkyl group having a substituent include a perfluoroalkyl group such as perfluoromethyl group, perfluoroethyl group, perfluoropropyl group and perfluorobutyl group.

Either one monovalent organic group of $R_1$ an $R_2$ has a proton acceptor functional group. The proton acceptor functional group is a group capable of electrostatically interacting with a proton or a functional group having a lone pair of electrons, and examples thereof include a functional group having a macrocyclic structure such as cyclic polyether, and a functional group containing a nitrogen atom having a lone pair of electrons less contributing to π-conjugation. Examples of the nitrogen atom having a lone pair of electrons less contributing to π-conjugation include a nitrogen atom having a partial structure represented by either one of the following formulae:

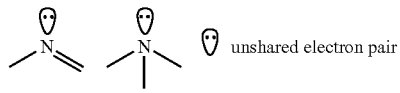 unshared electron pair

Preferred examples of the partial structure of the proton acceptor functional group include crown ether, aza-crown ether, tertiary amine, secondary amine, primary amine, pyridine, imidazole, pyrazine and aniline structures. The carbon number thereof is preferably from 4 to 30. Examples of the group containing such a structure include an alkyl group, a cycloalkyl group, an aryl group, an aralkyl group and an alkenyl group. The alkyl group, cycloalkyl group, aryl group, aralkyl group and alkenyl group are the same as those described above.

Examples of the substituent which these groups each may have include a halogen atom, a hydroxyl group, a nitro group, a cyano group, a carboxy group, a carbonyl group, a cycloalkyl group (preferably having a carbon number of 3 to 10), an aryl group (preferably having a carbon number of 6 to 14), an alkoxy group (preferably having a carbon number of 1 to 10), an acyl group (preferably having a carbon number of 2 to 20), an acyloxy group (preferably having a carbon number of 2 to 10), an alkoxycarbonyl group (preferably having a carbon number of 2 to 20), and an aminoacyl group (preferably having a carbon number of 2 to 20). As for the cyclic structure in the aryl group, cycloalkyl group and the like, examples of the substituent further include an alkyl group (preferably having a carbon number of 1 to 20). As for the aminoacyl group, examples of the substituent further include an alkyl group (preferably having a carbon number of 1 to 20).

The proton acceptor functional group may be substituted by an organic group having a bond which is breakable by an acid. Examples of the organic group having a bond breakable by an acid include an amido group, an ester group (preferably a tertiary alkyloxycarbonyl group), an acetal group (preferably a 1-alkyloxy-alkyloxy group), a carbamoyl group and a carbonate group.

The structure where $R_1$ and $R_2$ combine to form a ring and the ring formed has a proton acceptor functional group includes, for example, a structure where the organic group of $R_1$ or $R_2$ is further bonded by an alkylene group, an oxy group, an imino group or the like.

In formula (I), at least either one of $X_1$ and $X_2$ is preferably —$SO_2$—,

The compound represented by formula (I) is preferably represented by the following formula (II):

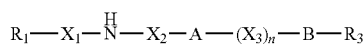
(II)

In formula (II), $R_1$ and $R_3$ each independently represents a monovalent organic group, provided that either one of $R_1$ and $R_3$ has a proton acceptor functional group. $R_1$ and $R_3$ may combine to form a ring, and the ring formed may have a proton acceptor functional group.

$X_1$, $X_2$ and $X_3$ each independently represents —CO— or —$SO_2$—.

A represents a divalent linking group.

B represents a single bond, an oxygen atom or —N($R_x$)—.

$R_x$ represents a hydrogen atom or a monovalent organic group.

When B is —N($R_x$)—, $R_3$ and $R_x$ may combine to form a ring.

n represents 0 or 1.

$R_1$ has the same meaning as $R_1$ in formula (I).

Examples of the organic group of $R_3$ are the same as those of the organic group of $R_1$ and $R_2$ in formula (I).

The divalent linking group as A is preferably a divalent linking group having a carbon number of 1 to 8 and containing a fluorine atom, and examples thereof include a fluorine atom-containing alkylene group having a carbon number of 1 to 8 and a fluorine atom-containing phenylene group. A fluorine atom-containing alkylene group is more preferred, and the carbon number thereof is preferably from 2 to 6, more preferably from 2 to 4, The alkylene chain may contain a linking group such as oxygen atom and sulfur atom. The alkylene group is preferably an alkylene group where from 30 to 100% by number of the hydrogen atom is replaced by a fluorine atom, more preferably a perfluoroalkylene group, still more preferably a perfluoroethylene group, a perfluoropropylene group or a perfluorobutylene group.

The monovalent organic group as $R_x$ is preferably a monovalent organic group having a carbon number of 4 to 30, and examples thereof include an alkyl group, a cycloalkyl group, an aryl group, an aralkyl group and an alkenyl group.

Examples of the alkyl group, cycloalkyl group, aryl group, aralkyl group and alkenyl group are the same as those described above.

In formula (II), $X_1$, $X_2$ and $X_3$ each is preferably —$SO_2$—.

Specific examples of the compounds represented by formulae (I) and (II) are set forth below, but the present invention is not limited thereto.

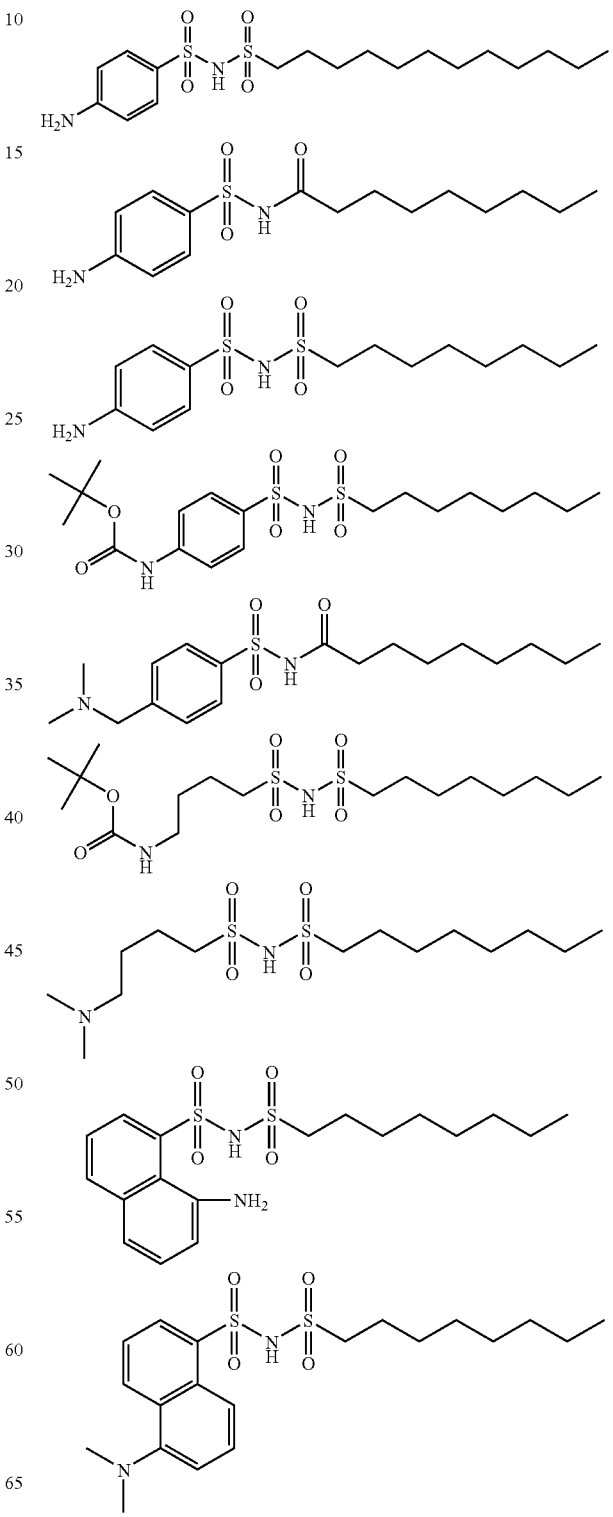

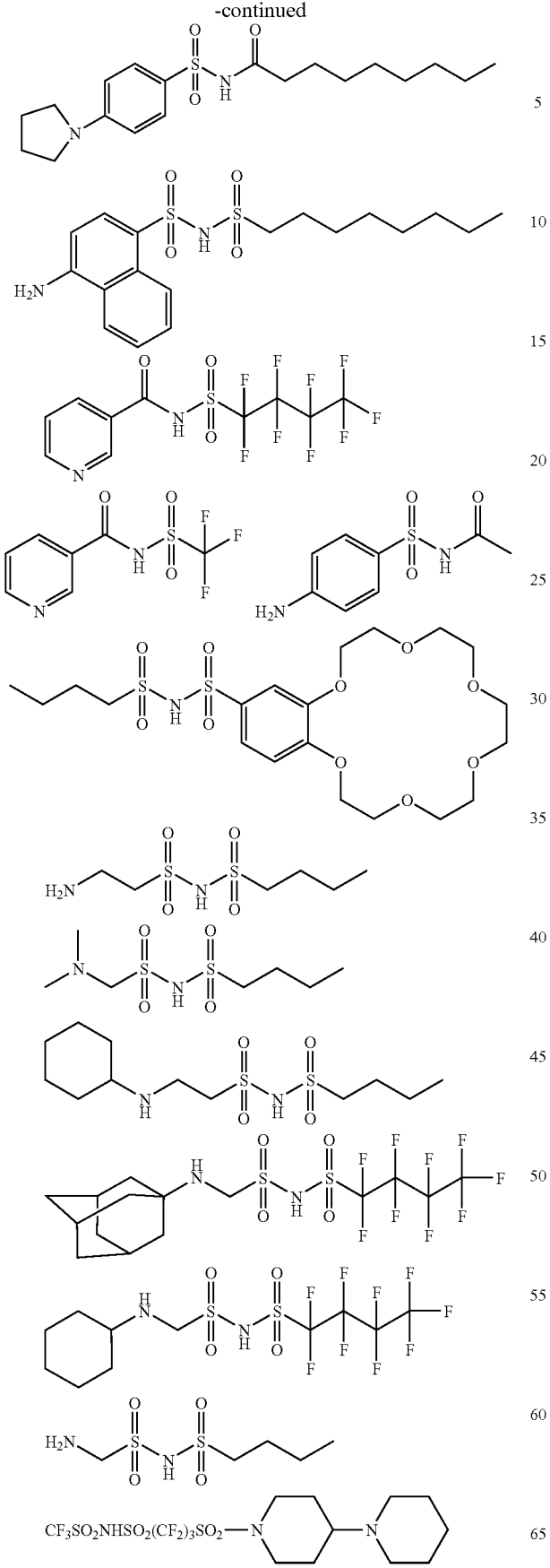
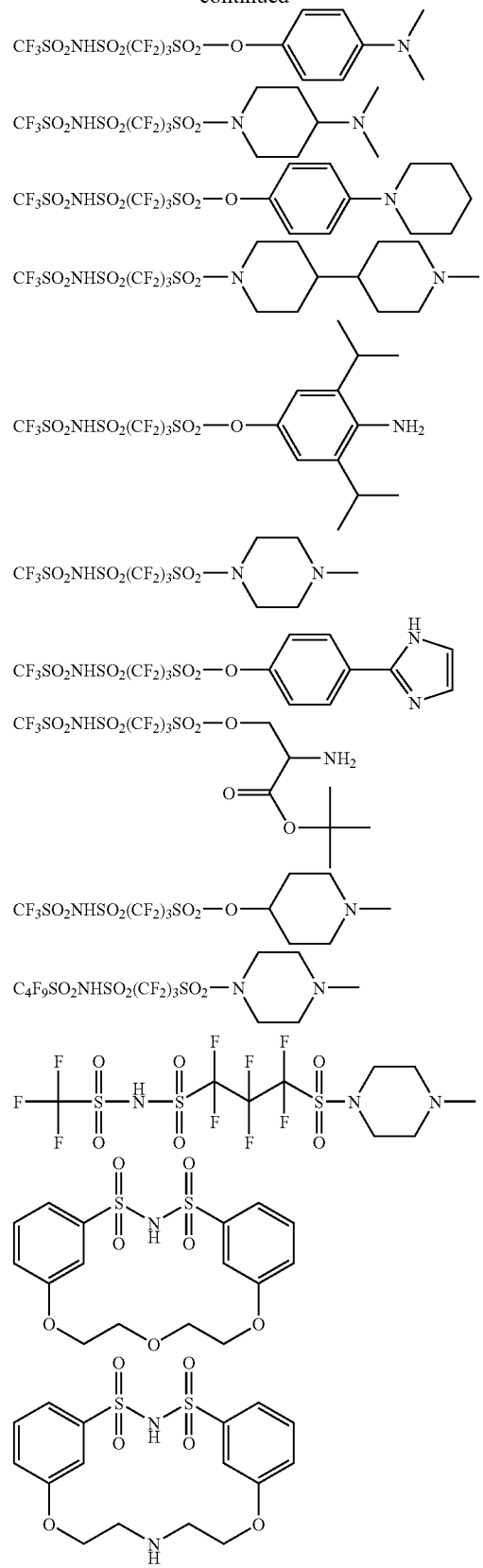
The compound capable of generating a compound represented by formula (I) or (II) upon irradiation with actinic rays or radiation is preferably a sulfonium salt compound of the compound represented by formula (I) or (II), or an iodonium salt compound of the compound represented by formula (I) or (II).

The compound capable of generating a compound represented by formula (I) or (II) upon irradiation with actinic rays or radiation is more preferably a compound represented by the following formula (A1) or (A2):

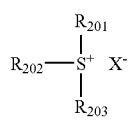
(A1)

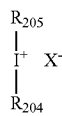
(A2)

In formula (A1), $R_{201}$, $R_{202}$ and $R_{203}$ each independently represents an organic group.

$X^-$ represents an anion of the compound represented by formula (I) or (II).

The carbon number of the organic group as $R_{201}$, $R_{202}$ and $R_{203}$ is generally from 1 to 30, preferably from 1 to 20.

Two members out of $R_{201}$ to $R_{203}$ may combine to form a ring structure, and the ring may contain an oxygen atom, a sulfur atom, an ester bond, an amido bond or a carbonyl group. Examples of the group formed by combining two members out of $R_{201}$ to $R_{203}$ include an alkylene group (e.g., butylene, pentylene).

Specific examples of the organic group as $R_{201}$, $R_{202}$ and $R_{203}$ include the corresponding groups in the compounds (A1a), (A1b) and (A1c) described later.

The compound may be a compound having a plurality of structures represented by formula (A1). For example, the compound may be a compound having a structure where at least one of $R_{201}$ to $R_{203}$ in the compound represented by formula (A1) is bonded to at least one of $R_{201}$ to $R_{203}$ in another compound represented by formula (A1).

The component (A1) is more preferably a compound (A1a), (A1b) or (A1c) described below.

The compound (A1a) is an arylsulfonium compound where at least one of $R_{201}$ to $R_{203}$ in formula (A1) is an aryl group, that is, a compound having arylsulfonium as the cation.

In the arylsulfonium compound, $R_{201}$ to $R_{203}$ all may be an aryl group or a part of $R_{201}$ to $R_{203}$ may be an aryl group with the remaining being an alkyl group or a cycloalkyl group.

Examples of the arylsulfonium compound include a triarylsulfonium compound, a diarylalkylsulfonium compound, a diarylcycloalkylsulfonium compound, an aryldialkyl-sulfonium compound, an aryldicycloalkylsulfonium compound and an arylalkylcycloalkylsulfonium compound.

The aryl group in the arylsulfonium compound is preferably a phenyl group or a naphthyl group, more preferably a phenyl group. The aryl group may be an aryl group having a heterocyclic structure containing an oxygen atom, a nitrogen atom, a sulfur atom or the like. Examples of the aryl group having a heterocyclic structure include a pyrrole residue (a group formed by removing one hydrogen atom from a pyrrole), a furan residue (a group formed by removing one hydrogen atom from a furan), a thiophene residue (a group formed by removing one hydrogen atom from a thiophene), an indole residue (a group formed by removing one hydrogen atom from an indole), a benzofuran residue (a group formed by removing one hydrogen atom from a benzofuran) and a benzothiophene residue (a group formed by removing one hydrogen atom from a benzothiophene). In the case where the arylsulfonium compound has two or more aryl groups, these two or more aryl groups may be the same or different.

The alkyl group which is present, if desired, in the arylsulfonium compound is preferably a linear or branched alkyl group having a carbon number of 1 to 15, and examples thereof include a methyl group, an ethyl group, a propyl group, an n-butyl group, a sec-butyl group and a tert-butyl group.

The cycloalkyl group which is present, if desired, in the arylsulfonium compound is preferably a cycloalkyl group having a carbon number of 3 to 15, and examples thereof include a cyclopropyl group, a cyclobutyl group and a cyclohexyl group.

The aryl group, alkyl group and cycloalkyl group of $R_{201}$ to $R_{203}$ each may have, as the substituent, an alkyl group (for example, an alkyl group having a carbon number of 1 to 15), a cycloalkyl group (for example, a cycloalkyl group having a carbon number of 3 to 15), an aryl group (for example, an aryl group having a carbon number of 6 to 14), an alkoxy group (for example, an alkoxy group having a carbon number of 1 to 15), a halogen atom, a hydroxyl group or a phenylthio group. The substituent is preferably a linear or branched alkyl group having a carbon number of 1 to 12, a cycloalkyl group having a carbon number of 3 to 12, or a linear, branched or cyclic alkoxy group having a carbon number of 1 to 12, and most preferably an alkyl group having a carbon number of 1 to 4, or an alkoxy group having a carbon number of 1 to 4. The substituent may be substituted to any one of three members $R_{201}$ to $R_{203}$ or may be substituted to all of these three members. In the case where $R_{201}$ to $R_{203}$ are an aryl group, the substituent is preferably substituted at the p-position of the aryl group.

The compound (A1B) is described below.

The compound (A1b) is a compound when $R_{201}$ to $R_{203}$ in formula (A1) each independently represents an aromatic ring-free organic group. The aromatic ring as used herein includes an aromatic ring having a heteroatom.

The aromatic ring-free organic group as $R_{201}$ to $R_{203}$ has a carbon number of generally from 1 to 30, preferably from 1 to 20.

$R_{201}$ to $R_{203}$ each independently represents preferably an alkyl group, a cycloalkyl group, an allyl group or a vinyl group, more preferably a linear or branched 2-oxoalkyl group, a 2-oxocycloalkyl group or an alkoxycarbonylmethyl group, still more preferably a linear or branched 2-oxoalkyl group.

The alkyl group as $R_{201}$ to $R_{203}$ may be either linear or branched and is preferably a linear or branched alkyl group having a carbon number of 1 to 20 (e.g., methyl, ethyl, propyl, butyl, pentyl). The alkyl group as $R_{201}$ to $R_{203}$ is more preferably a linear or branched 2-oxoalkyl group or an alkoxycarbonylmethyl group.

The cycloalkyl group as $R_{201}$ to $R_{203}$ is preferably a cycloalkyl group having a carbon number of 3 to 10 (e.g., cyclopentyl, cyclohexyl, norbornyl). The cycloalkyl group as $R_{201}$ to $R_{203}$ is more preferably a 2-oxocycloalkyl group.

The linear or branched 2-oxoalkyl group as $R_{201}$ to $R_{203}$ may have a double bond in the chain and is preferably a group having >C=O at the 2-position of the alkyl group above.

The 2-oxocycloalkyl group as $R_{201}$ to $R_{203}$ may have a double bond in the chain and is preferably a group having >C=O at the 2-position of the cycloalkyl group above.

The alkoxy group in the alkoxycarbonylmethyl group of $R_{201}$ to $R_{203}$ is preferably an alkoxy group having a carbon number of 1 to 5 (e.g., methoxy, ethoxy, propoxy, butoxy, pentoxy).

$R_{201}$ to $R_{203}$ each may be further substituted by a halogen atom, an alkoxy group (for example, an alkoxy group having a carbon number of 1 to 5), an alkoxycarbonyl group (for example, an alkoxycarbonyl group having a carbon number of 2 to 5), a hydroxyl group, a cyano group or a nitro group, The compound (A1c) is a compound represented by the following formula (A1c), and this is a compound having an arylacylsulfonium salt structure.

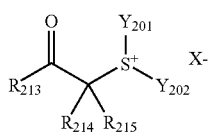

(A1c)

In formula (A1c), $R_{213}$ represents an aryl group which may have a substituent, and is preferably a phenyl group or a naphthyl group.

Preferred examples of the substituent on $R_{213}$ include an alkyl group, an alkoxy group, an acyl group, a nitro group, a hydroxyl group, an alkoxycarbonyl group and a carboxy group.

$R_{214}$ and $R_{215}$ each independently represents a hydrogen atom, an alkyl group or a cycloalkyl group.

$Y_{201}$ and $Y_{202}$ each independently represents an alkyl group, a cycloalkyl group, an aryl group or a vinyl group.

$X^-$ represents an anion of the compound represented by formula (I) or (II).

$R_{213}$ and $R_{214}$ may combine with each other to form a ring structure, $R_{214}$ and $R_{215}$ may combine with each other to form a ring structure, and $Y_{201}$ and $Y_{202}$ may combine with each other to form a ring structure. The ring structure formed may contain an oxygen atom, a sulfur atom, an ester bond or an amide bond. Examples of the group formed by combining each pair of $R_{213}$ and $R_{214}$, $R_{214}$ and $R_{215}$, and $Y_{201}$ and $Y_{202}$ include a butylene group and a pentylene group.

The alkyl group as $R_{214}$, $R_{215}$, $Y_{201}$ and $Y_{202}$ is preferably a linear or branched alkyl group having a carbon number of 1 to 20. The alkyl group of $Y_{201}$ and $Y_{202}$ is more preferably a 2-oxoalkyl group having $>C=O$ at the 2-position of the alkyl group, an alkoxycarbonylalkyl group (preferably with the alkoxy group having a carbon number of 2 to 20), or a carboxyalkyl group.

The cycloalkyl group as $R_{214}$, $R_{215}$, $Y_{201}$ and $Y_{202}$ is preferably a cycloalkyl group having a carbon number of 3 to 20.

The aryl group as $Y_{201}$ and $Y_{202}$ is preferably a phenyl group or a naphthyl group.

$Y_{201}$ and $Y_{202}$ each is preferably an alkyl group having a carbon number of 4 or more, more preferably from 4 to 6, still more preferably from 4 to 12.

At least either one of $R_{214}$ and $R_{215}$ is preferably an alkyl group, and more preferably, $R_{214}$ and $R_{215}$ both are an alkyl group.

In formula (A2), $R_{204}$ and $R_{205}$ each independently represents an aryl group, an alkyl group or a cycloalkyl group.

$X^-$ represents an anion of the compound represented by formula (I) or (II).

The aryl group of $R_{204}$ and $R_{205}$ is preferably a phenyl group or a naphthyl group, more preferably a phenyl group. The aryl group of $R_{204}$ and $R_{205}$ may be an aryl group having a heterocyclic structure containing an oxygen atom, a nitrogen atom, a sulfur atom or the like. Examples of the aryl group having a heterocyclic structure include a pyrrole residue (a group formed by removing one hydrogen atom from a pyrrole), a furan residue (a group formed by removing one hydrogen atom from a furan), a thiophene residue (a group formed by removing one hydrogen atom from a thiophene), an indole residue (a group formed by removing one hydrogen atom from an indole), a benzofuran residue (a group formed by removing one hydrogen atom from a benzofuran) and a benzothiophene residue (a group formed by removing one hydrogen atom from a benzothiophene).

The alkyl group as $R_{204}$ and $R_{205}$ may be either linear or branched and is preferably a linear or branched alkyl group having a carbon number of 1 to 10 (e.g., methyl, ethyl, propyl, butyl, pentyl).

The cycloalkyl group as $R_{204}$ and $R_{205}$ is preferably a cycloalkyl group having a carbon number of 3 to 10 (e.g., cyclopentyl, cyclohexyl, norbornyl).

$R_{204}$ and $R_{205}$ each may have a substituent, and examples of the substituent which $R_{204}$ and $R_{205}$ each may have include an alkyl group (for example, an alkyl group having a carbon number of 1 to 15), a cycloalkyl group (for example, a cycloalkyl group having a carbon number of 3 to 15), an aryl group (for example, an aryl group having a carbon number of 6 to 15), an alkoxy group (for example, an alkoxy group having a carbon number of 1 to 15), a halogen atom, a hydroxyl group and a phenylthio group.

The compound (D1) is preferably a compound represented by formula (A1), more preferably a compound represented by any one of formulae (A1a) to (A1e).

Specific examples of the compound (D1) are set forth below, but the present invention is not limited thereto.

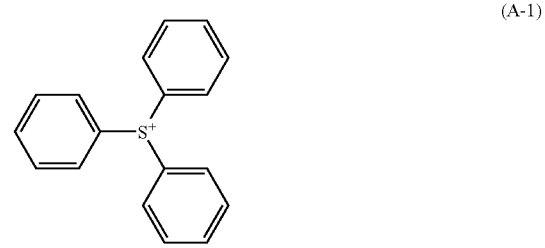

(A-1)

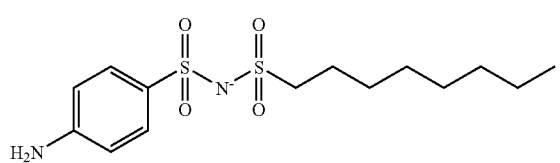

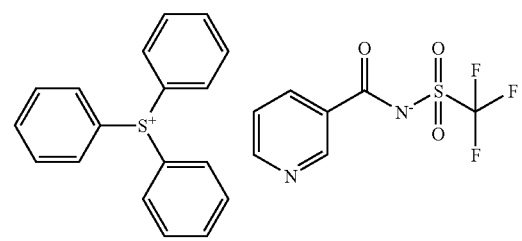

(A-2)

(A-3)
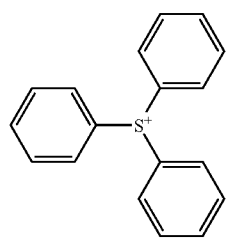
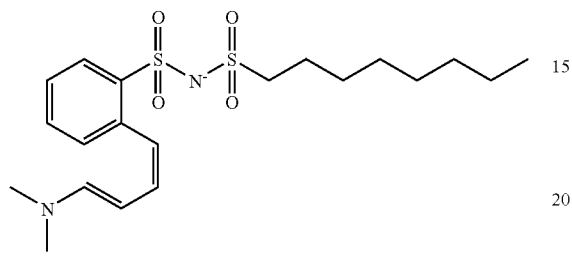
(A-4)
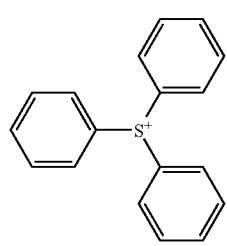
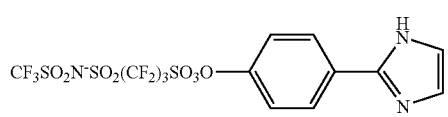
(A-5)
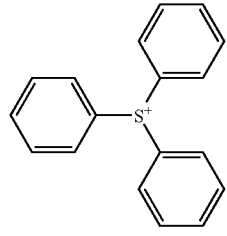
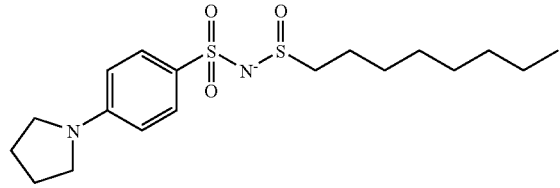
(A-6)
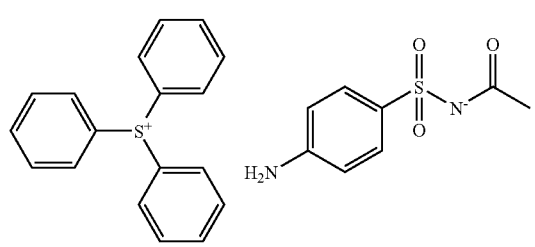
(A-7)
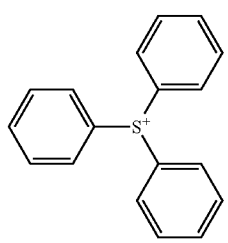
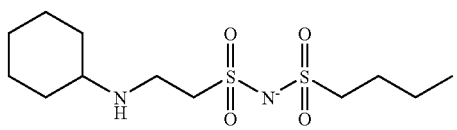
(A-8)
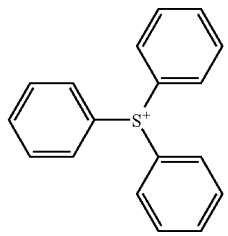
(A-9)
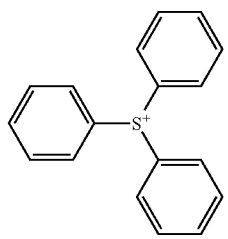
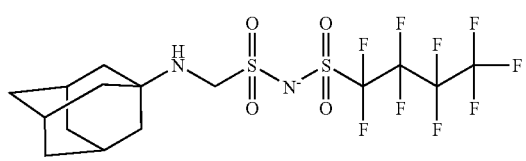
(A-10)
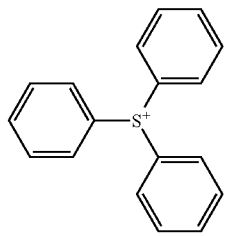
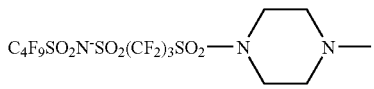

(A-11)
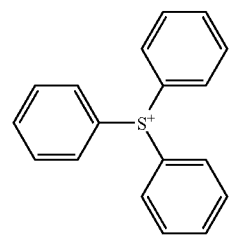
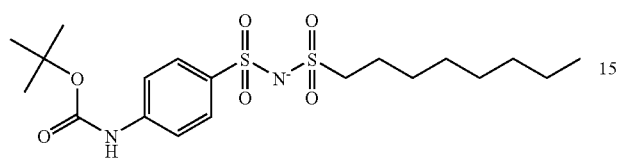
(A-12)
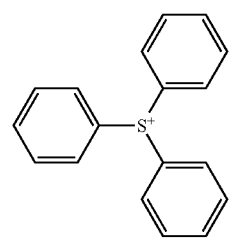
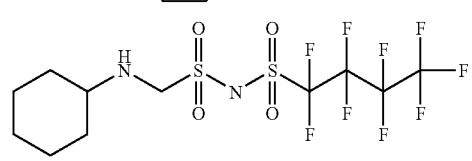
(A-13)
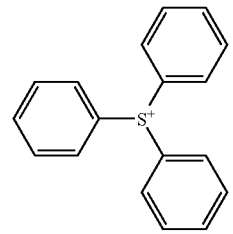
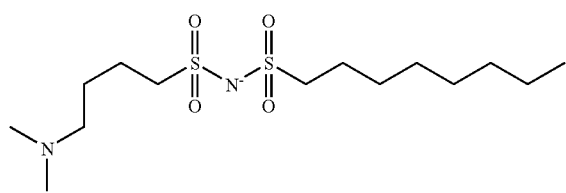
(A-14)
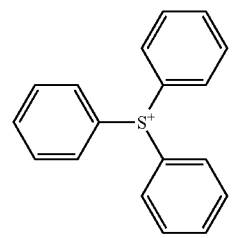
CF$_3$SO$_2$NHSO$_2$(CF$_2$)$_3$SO$_2$—O—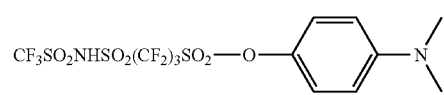
(A-15)
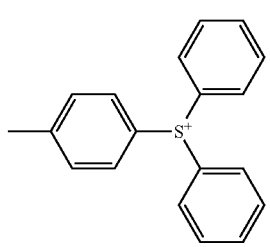
CF$_3$SO$_2$N$^-$SO$_2$(CF$_2$)$_3$SO$_3$—O—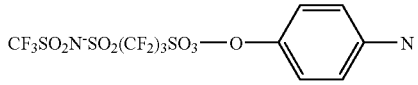
(A-16)
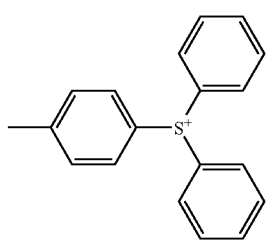
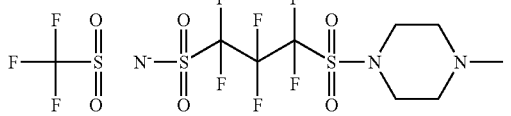
(A-17)
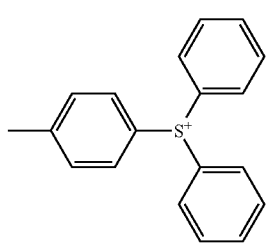
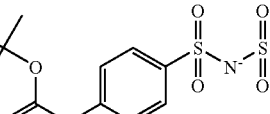
(A-18)
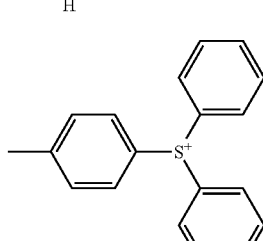
CF$_2$SO$_2$N$^-$SO$_2$(CF$_2$)$_3$SO$_2$O—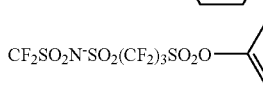
(A-19)
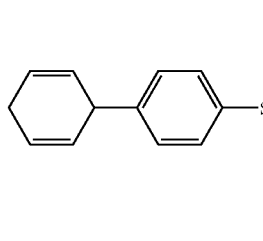

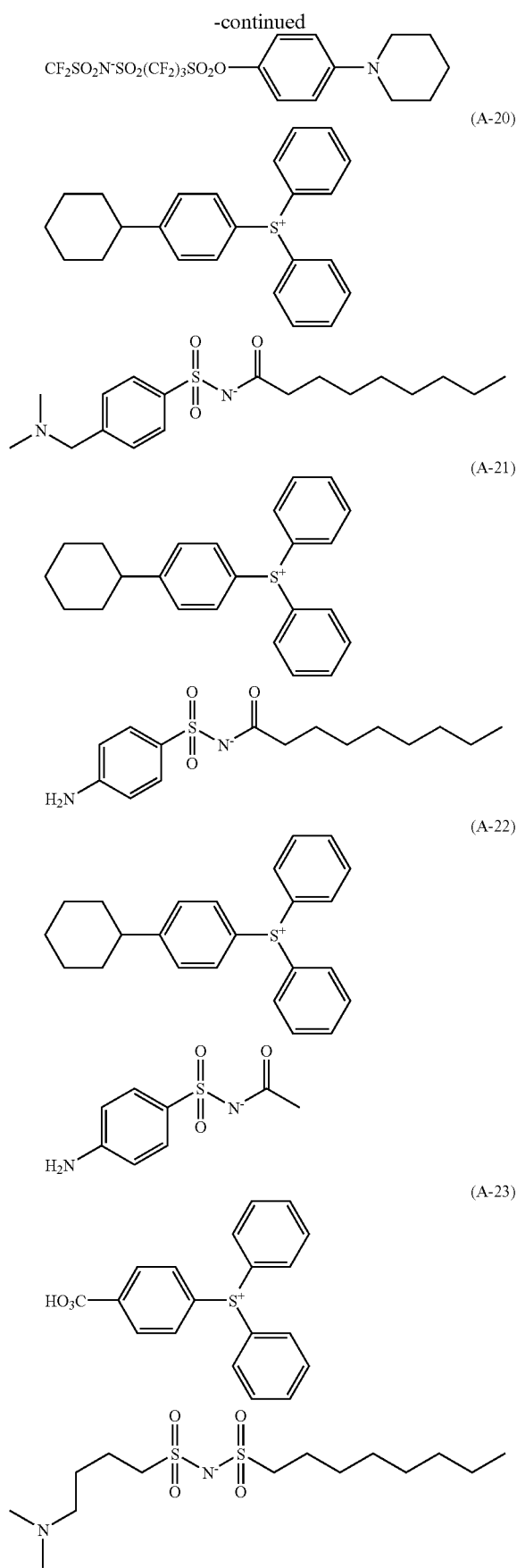
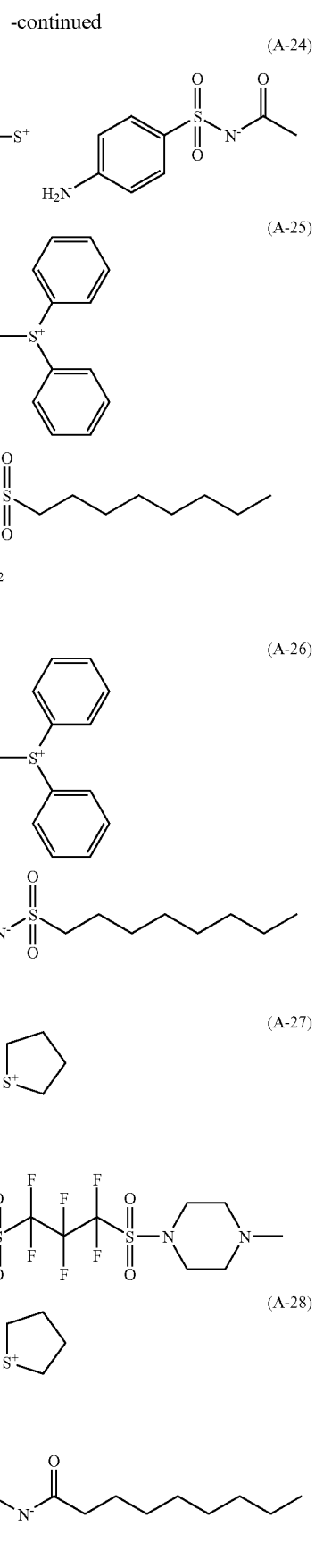

103
-continued
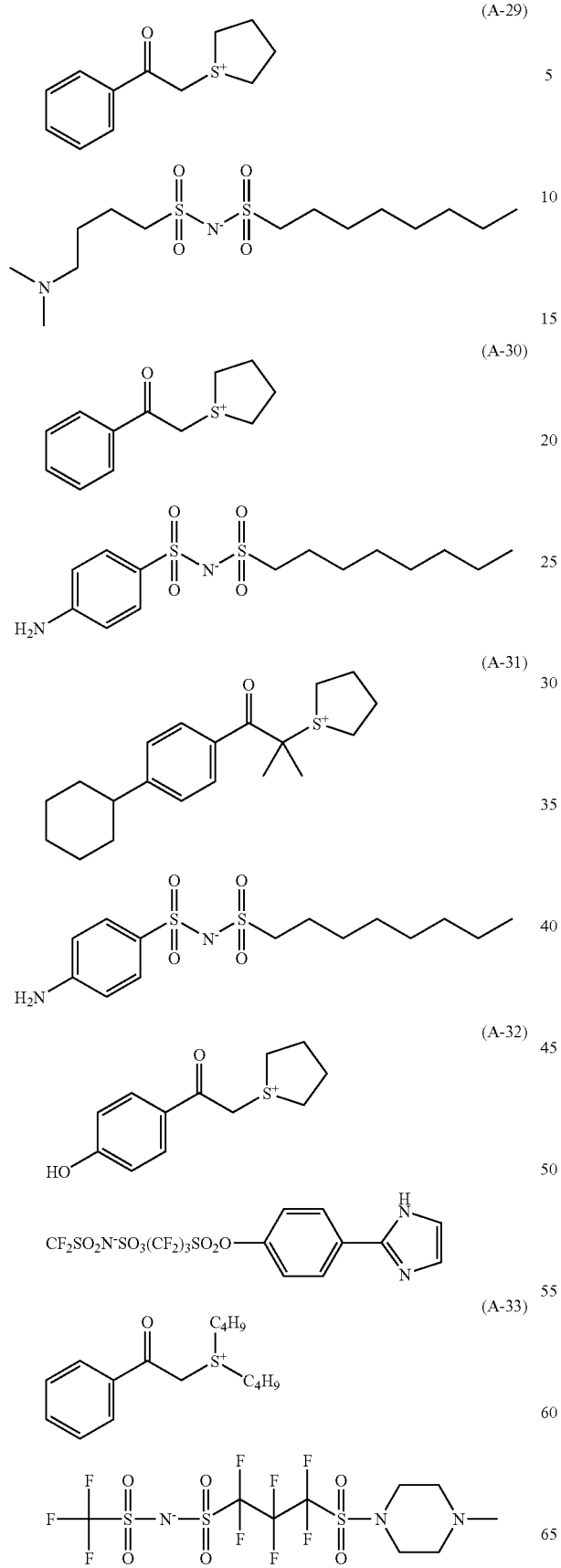
104
-continued
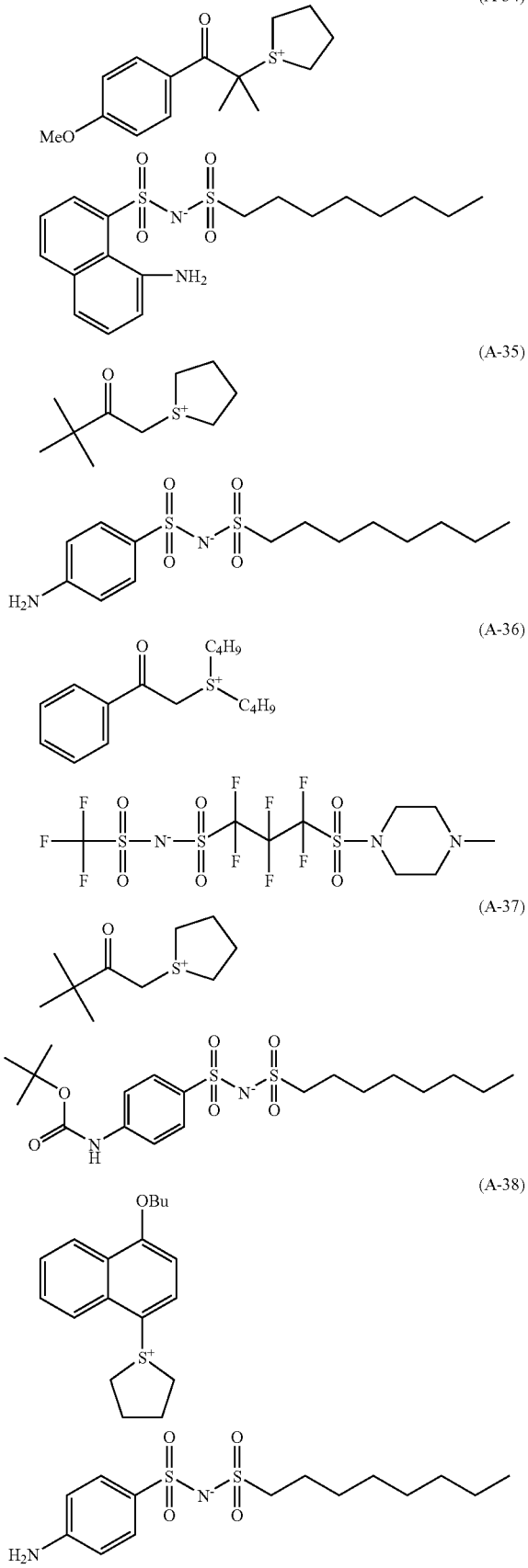

-continued (A-39) 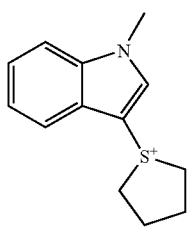

(A-40) 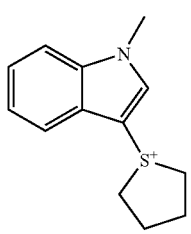

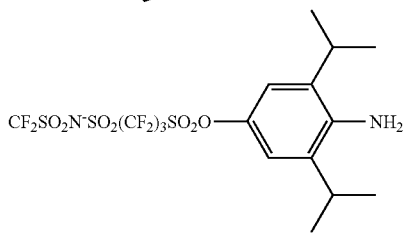 (A-41)

(A-41) 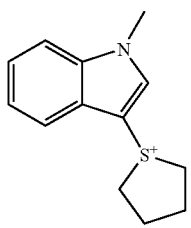

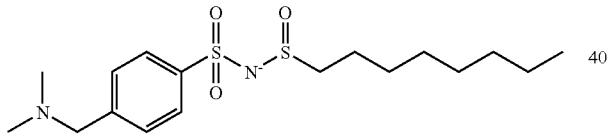 (A-42)

(A-42) 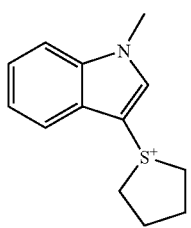

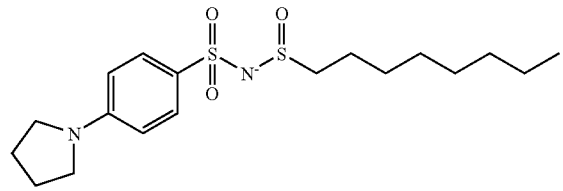

(A-43) 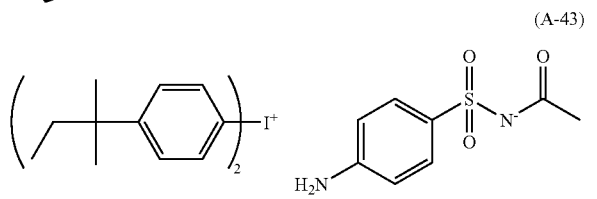

-continued (A-44) 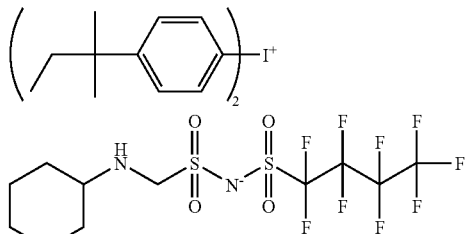

The compound (D1) can be easily synthesized using a general sulfonic acid esterification reaction or sulfonamidation reaction. The compound can be obtained, for example, by a method of selectively reacting one sulfonyl halide moiety of a bissulfonylhalide compound with an amine, alcohol or the like containing the partial structure represented by formula (I) to form a sulfonamide bond, a sulfonic acid ester bond, and then hydrolyzing another sulfonyl halide moiety, or a method of ring-opening a cyclic sulfonic acid anhydride by an amine or alcohol containing the partial structure represented by formula (I). The amine or alcohol containing the partial structure represented by formula (I) can be synthesized by reacting an amine or an alcohol with an anhydride or acid chloride compound such as $(R'O_2C)_2O$ or $R'O_2CCl$ under basic conditions.

(D2) Compound Capable of Generating a Carboxylic Acid

Examples of the onium carboxylate in the component (D) for use in the present invention include sulfonium carboxylate, iodonium carboxylate and ammonium carboxylate.

The onium carboxylate which can be used in the present invention includes the compounds represented by the following formulae (AI) to (AVI).

(AI) 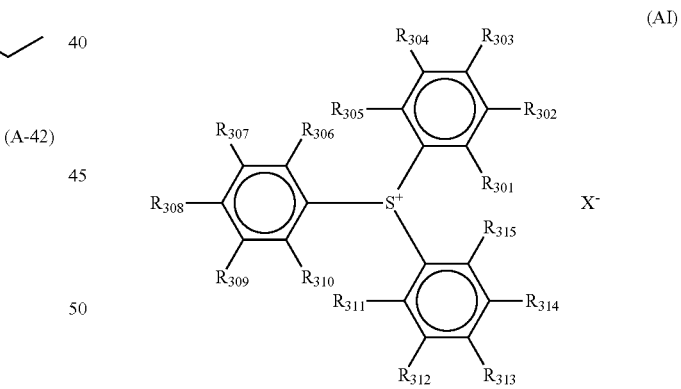

(AII) 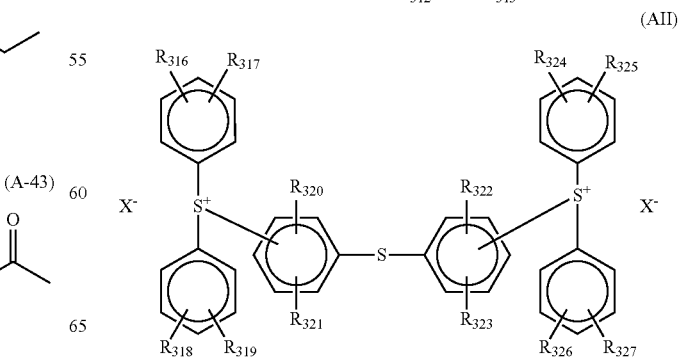

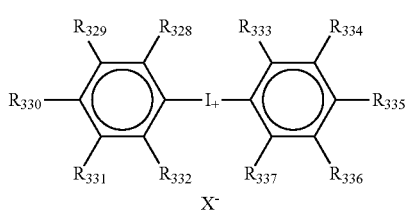
(AIII)

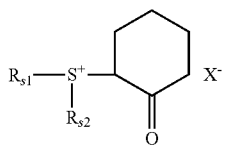
(AIV)

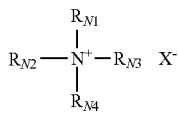
(AV)

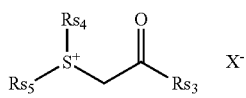
(AVI)

In the formulae above, $R_{301}$ to $R_{337}$ each independently represents a hydrogen atom, a linear, branched or cyclic alkyl group, a linear, branched or cyclic alkoxy group, a hydroxy group, a halogen atom or an —S—$R_0$ group, where $R_0$ represents a linear, branched or cyclic alkyl group or an aryl group.

$R_{s1}$ and $R_{s2}$ each independently represents a linear, branched or cyclic alkyl group.

$R_{N1}$ to $R_{N4}$ each independently represents a linear, branched or cyclic alkyl group which may have a substituent. Any two substituents out of $R_{N1}$ to $R_{N4}$ may combine to form a ring.

In formula (AV), any one of $R_{N1}$ to $R_{N4}$ may be bonded to $X^-$ within the molecule.

$R_{s3}$ to $R_{s5}$ each independently represents a linear, branched or cyclic alkyl group which may have a substituent, or an aryl group. Two or more members out of $R_{s3}$ to $R_{s5}$ may combine to form a ring.

Incidentally, formula (AVI) includes compounds containing two or more sulfonium structures.

$X^-$ represents an anion formed from a carboxylic acid compound represented by any one of the following formulae.

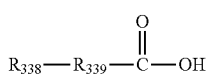
(C1)

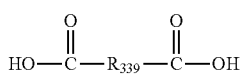
(C2)

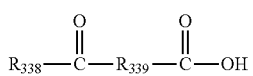
(C3)

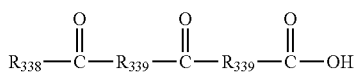
(C4)

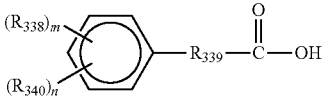
(C5)

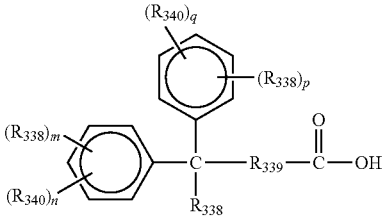
(C6)

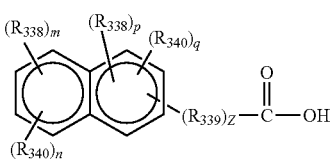
(C7)

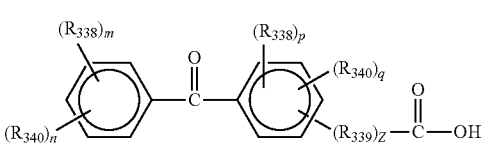
(C8)

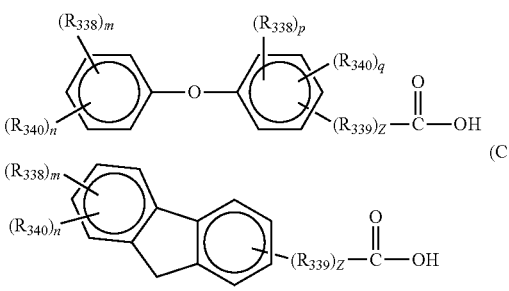
(C9)

(C10)

In the formulae above, $R_{338}$ represents a substituted or unsubstituted, linear or branched alkyl group having a carbon number of 1 to 30, a substituted or unsubstituted cycloalkyl group having a carbon number of 1 to 30 (here, the alkyl group or cycloalkyl group may contain an oxygen atom or a nitrogen atom in the chain thereof), a linear, branched or cyclic alkenyl group having a carbon number of 1 to 20, a linear, branched or cyclic alkynyl group having a carbon number of 1 to 20, a linear, branched or cyclic alkoxyl group having a carbon number of 1 to 20, a substituted or unsubstituted aryl group having a carbon umber of 6 to 20, a halogen atom, a nitro group, or a camphor residue.

At least a part of the hydrogen atom in the above-described alkyl or cycloalkyl group may be substituted by a halogen atom and/or a hydroxyl group. Also, at least a part of the hydrogen atom in the above-described alkenyl group may be substituted by a halogen atom and/or a hydroxyl group Examples of the substituent of the aryl group include an alkyl group, a nitro group, a hydroxyl group, an alkoxy group, an acyl group, an alkoxycarbonyl group and a halogen atom.

$R_{339}$ represents a single bond, a linear, branched or cyclic alkylene group having a carbon number of 1 to 20 (here, the alkylene group may contain an oxygen atom or a nitrogen atom in the chain thereof), a linear, branched or cyclic alkenylene group having a carbon number of 1 to 20, or an alkoxyalkylene group having a carbon number of 2 to 20. When a plurality of $R_{338}$'s or $R_{339}$'s are present, these may be the same or different.

At least a part of the hydrogen atom in the above-described alkylene group may be substituted by a halogen atom and/or a hydroxyl group. Also, at least a part of the hydrogen atom in the above-described alkenylene group may be substituted by a halogen atom.

$R_{340}$ represents a hydroxyl group or a halogen atom and when a plurality of $R_{340}$'s are present, these may be the same or different. m, n, p and q each independently represents an integer of 0 to 3 and satisfy $m+n \geqq 5$ and $p+q \geqq 5$. z is 0 or 1.

In formulae (AI) to (AVI), the linear or branched alkyl group of $R_{301}$ to $R_{337}$, $R_{s1}$ to $R_{s5}$ and $R_{N1}$ to $R_{N4}$ includes a linear or branched alkyl group having a carbon number of 1 to 4, which may have a substituent, such as methyl group, ethyl group, propyl group, n-butyl group, sec-butyl group and tert-butyl group.

The cyclic alkyl group includes a cyclic alkyl group having a carbon number of 3 to 8, which may have a substituent, such as cyclopropyl group, cyclopentyl group and cyclohexyl group.

The alkoxy group of $R_{301}$ to $R_{337}$ includes an alkoxy group having a carbon number of 1 to 4, such as methoxy group, ethoxy group, hydroxyethoxy group, propoxy group, n-butoxy group, isobutoxy group, sec-butoxy group and tert-butoxy group.

The halogen atom of $R_{301}$ to $R_{337}$ includes a fluorine atom, a chlorine atom, a bromine atom and an iodine atom.

The aryl group of $R_0$, $R_{s3}$ to $R_{s5}$ includes an aryl group having a carbon number of 6 to 14, which may have a substituent, such as phenyl group, tolyl group, methoxyphenyl group and naphthyl group.

Preferred examples of the substituent include an alkoxy group having a carbon number of 1 to 4, a halogen atom (e.g., fluorine, chlorine, iodine), an aryl group having a carbon number of 6 to 10, an alkenyl group having a carbon number of 2 to 6, a cyano group, a hydroxy group, a carboxy group, an alkoxycarbonyl group and a nitro group.

Examples of the aromatic ring and monocyclic or polycyclic cyclohydrocarbon (these rings each may contain an oxygen atom or a nitrogen atom) formed by combining any two members out of $R_{N1}$ to $R_{N4}$ include a benzene structure, a naphthalene structure, a cyclohexane structure, a norbornene structure and an oxabicyclo structure.

The sulfonium, iodonium or ammonium compound represented by formulae (AI) to (AVI) for use in the present invention contains, as the counter anion $X^-$, an anion (—COO$^-$) formed from a carboxyl group (—COOH) of at least one compound out of the carboxylic acid compounds represented by formulae (C1) to (C10).

Examples of the linear or branched alkyl group having a carbon number of 1 to 30 (here, the alkyl group may contain an oxygen atom or a nitrogen atom in the chain thereof) of $R_{338}$ include a methyl group, an ethyl group, a propyl group, a butyl group, a pentyl group, a hexyl group, a dodecyl group, a 2-ethoxyethyl group and a 2-hydroxyethyl group.

Examples of the cycloalkyl group having a carbon number of 1 to 30 include a monocyclic or polycyclic alicyclic group such as cyclohexyl group, adamantyl group, cyclopentyl group and bicyclo, oxabicyclo or tricyclo ring-containing group.

Representative structural examples of the monocyclic or polycyclic alicyclic moiety are set forth below.

 (1)

 (2)

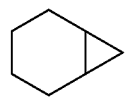 (3)

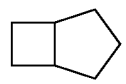 (4)

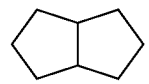 (5)

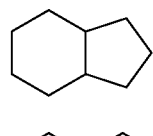 (6)

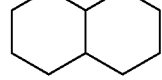 (7)

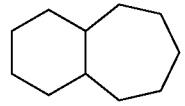 (8)

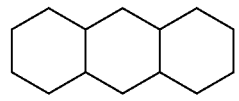 (9)

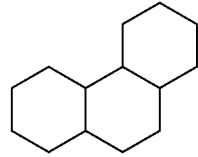 (10)

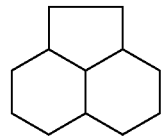 (11)

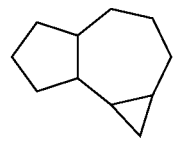 (12)

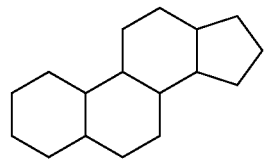 (13)

111
-continued
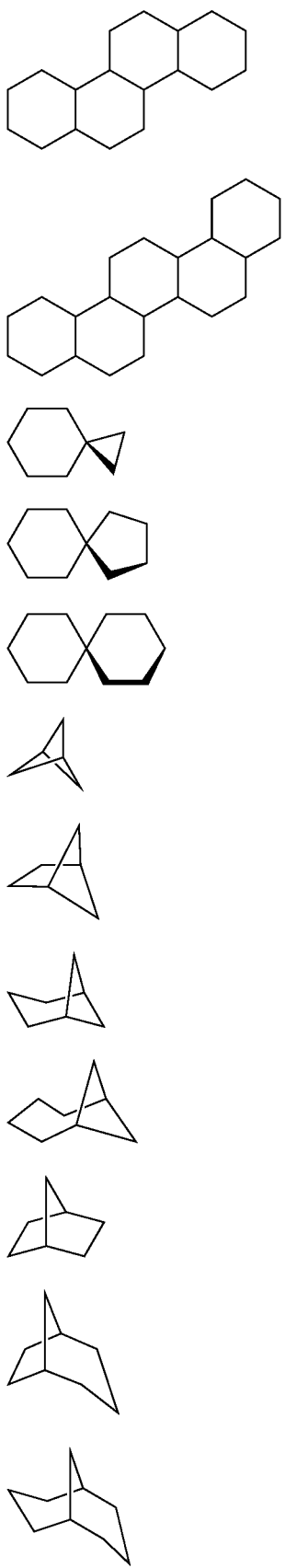
112
-continued
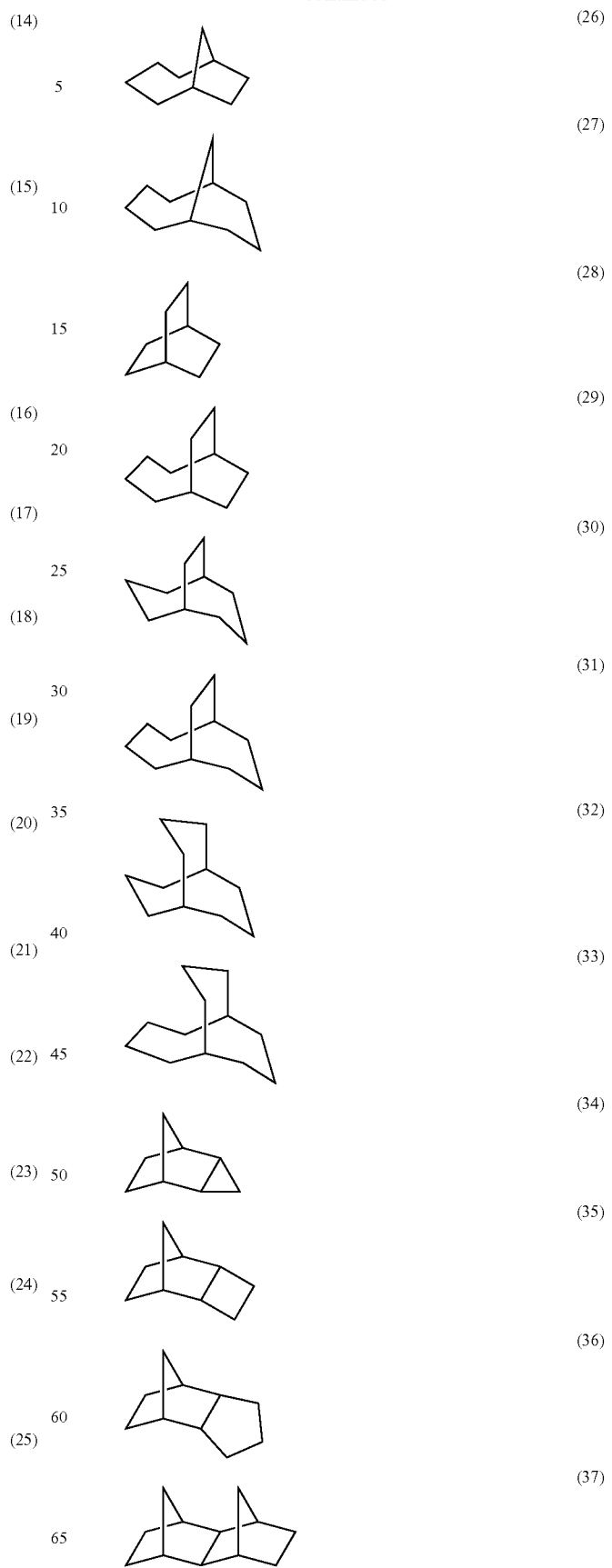

-continued

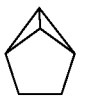
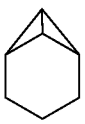
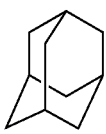
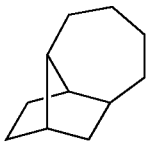
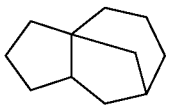
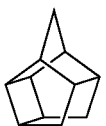

(38)
(39)
(40)
(41)
(42)
(43)
(44)
(45)
(46)
(47)
(48)
(49)
(50)

Examples of the linear, branched or cyclic alkenyl group having a carbon number of 1 to 20 include ethenyl, propenyl, isopropenyl and cyclohexene.

Examples of the linear, branched or cyclic alkynyl group having a carbon number of 1 to 20 include acetylene and propenylene.

Examples of the linear, branched or cyclic alkoxy group having a carbon number of 1 to 20 include methoxy, ethoxy, propyloxy, butoxy, cyclohexyloxy, isobutoxy and dodecyloxy.

Examples of the substituted or unsubstituted aryl group having a carbon number of 6 to 20 include phenyl, naphthyl and anthranyl.

Examples of the substituent of the linear or branched alkyl group, cycloalkyl group and aryl group include an alkyl group, a nitro group, a hydroxyl group, an alkoxy group, an acyl group, an alkoxycarbonyl group and a halogen atom.

Examples of the linear, branched or cyclic alkylene group having a carbon number of 1 to 20 (here, the alkylene group may contain an oxygen atom or a nitrogen atom in the chain thereof) of $R_{339}$ include methylene, ethylene, propylene, butylene, isobutylene, ethoxyethylene and cyclohexylene.

Examples of the linear, branched or cyclic alkenylene group having a carbon number of 1 to 20 include vinylene and allylene.

In the present invention, the onium carboxylate in the component (D) is preferably an iodonium salt or a sulfonium salt.

Furthermore, the carboxylate residue of the onium carboxylate in the component (D) for use in the present invention preferably contains no aromatic group and no carbon-carbon double bond.

$X^-$ is preferably a linear, branched, monocyclic or polycyclic alkylcarboxylate anion having a carbon number of 1 to 30, more preferably an anion of a carboxylic acid with the alkyl group being partially or entirely fluorine-substituted. The alkyl chain may contain an oxygen atom. By virtue of such a construction, the transparency to light at 220 nm or less is ensured, the sensitivity and resolution are enhanced, and the defocus latitude depended on line pitch and the exposure margin are improved.

Examples of the anion of a fluorine-substituted carboxylic acid include anions of fluoroacetic acid, difluoroacetic acid, trifluoroacetic acid, pentafluoropropionic acid, heptafluorobutyric acid, nonafluoropentanoic acid, perfluorododecanoic acid, perfluorotridecanoic acid, perfluorocyclohexanecarboxylic acid and 2,2-bistrifluoromethylpropionic acid.

Specific examples of the onium carboxylate in the component (D) are set forth below, but the present invention is not limited thereto.

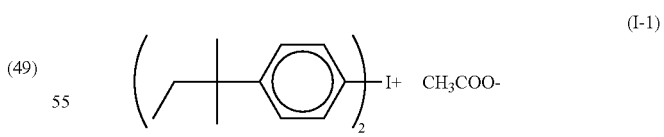

(I-1)

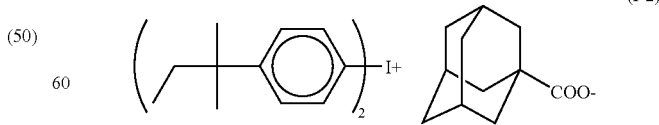

(I-2)

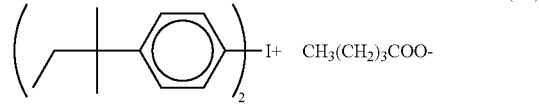

(I-3)

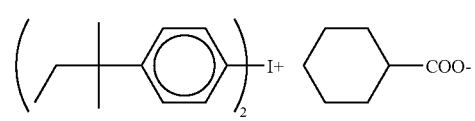 (I-4)
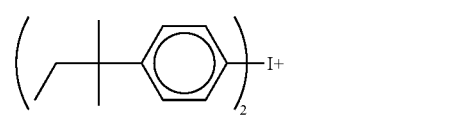 (I-5)
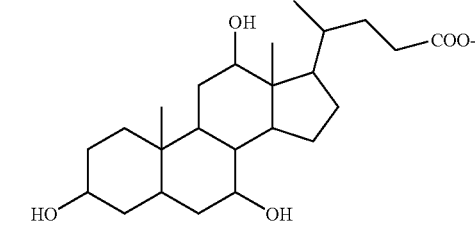
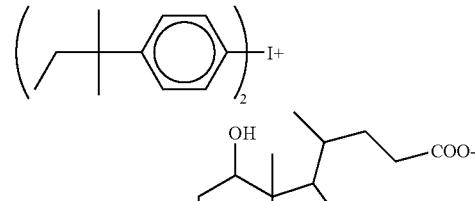 (I-6)
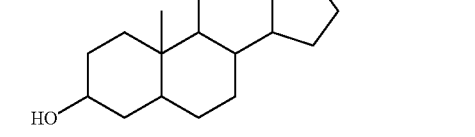 (I-7)
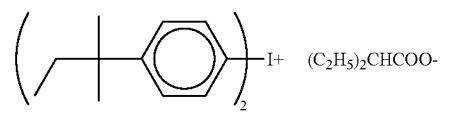 (I-8)
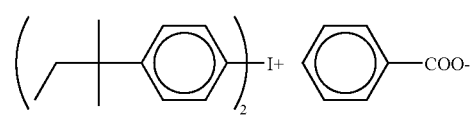 (I-9)
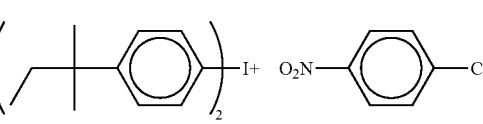 (I-10)
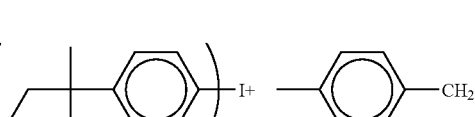 (I-11)
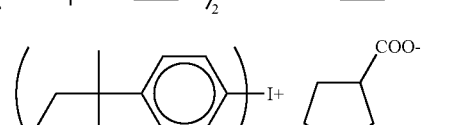 (I-12)
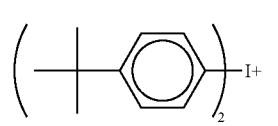 (I-13)
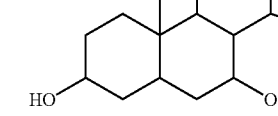 (I-14)
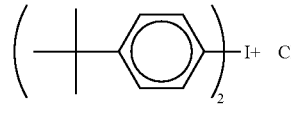 (I-15)
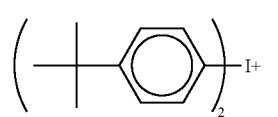 (I-16)
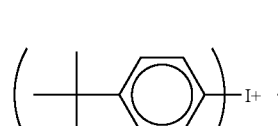 (I-17)
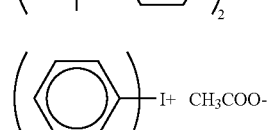 (I-18)
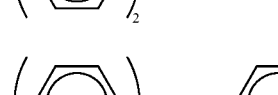 (I-19)
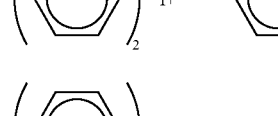 (I-20)
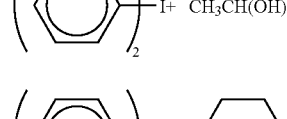 (I-21)
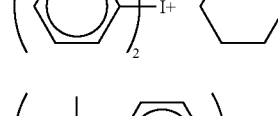 (II-1)
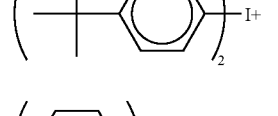 (II-2)

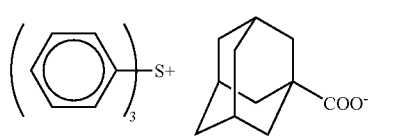 (II-3)
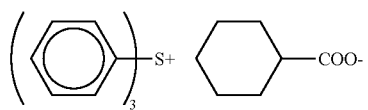 (II-4)
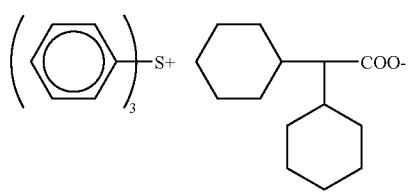 (II-5)
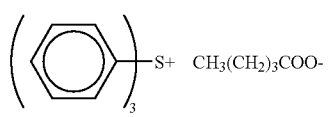 (II-6)
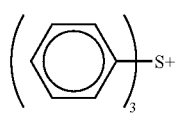 (II-7)
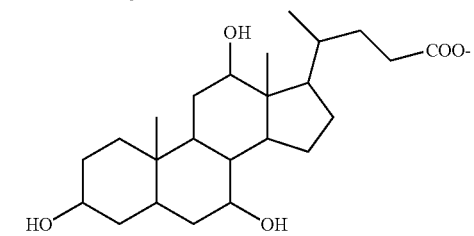 (II-8)
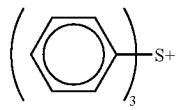 
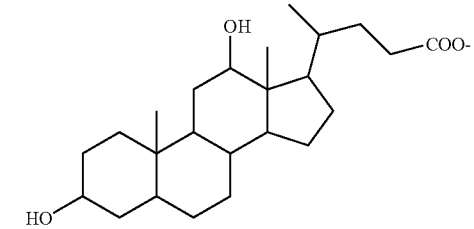 (II-9)
 (II-10)
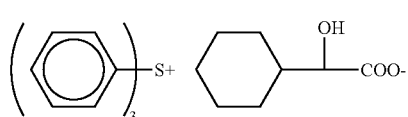 (II-11)
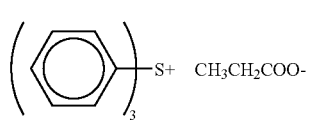
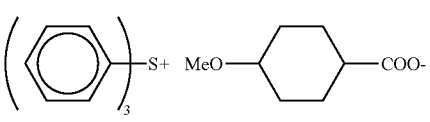 (II-12)
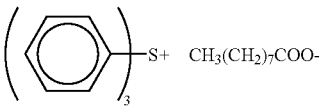 (II-13)
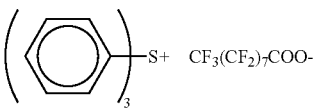 (II-14)
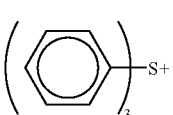 (II-15)
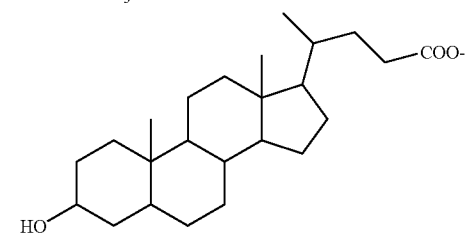
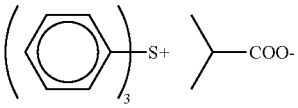 (II-16)
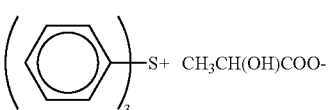 (II-17)
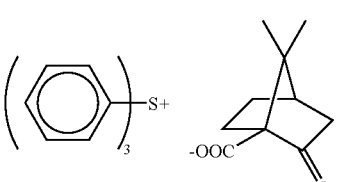 (II-18)
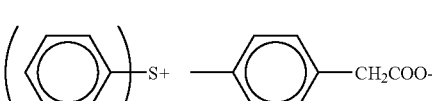 (II-19)
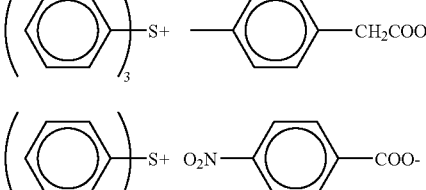 (II-20)
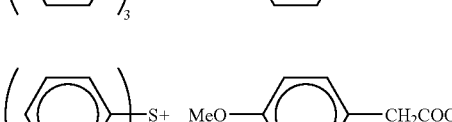 (II-21)
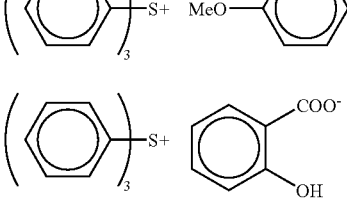 (II-22)

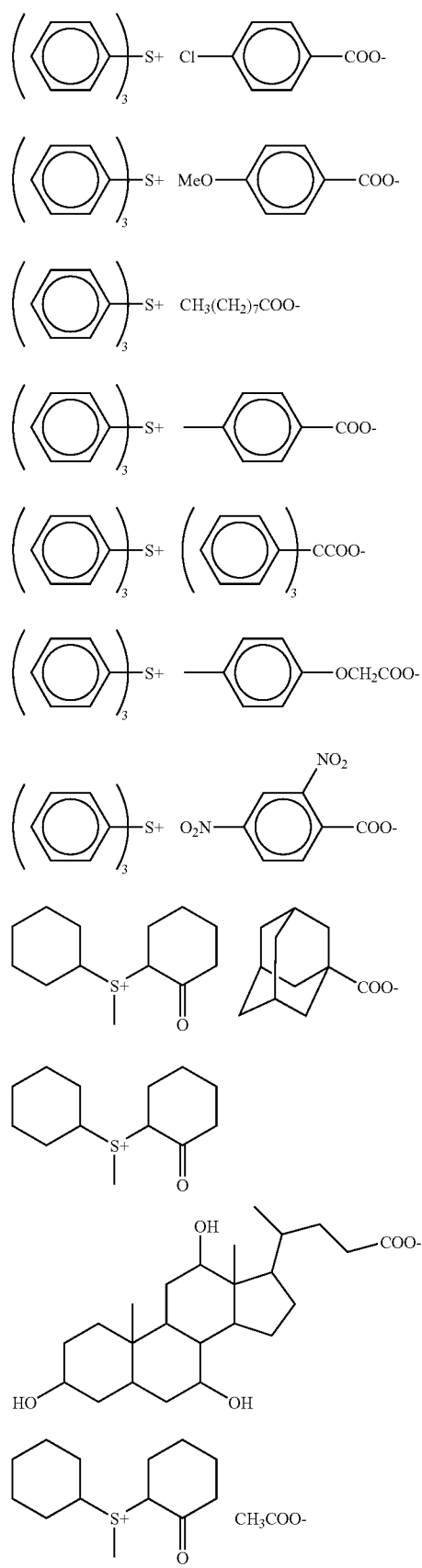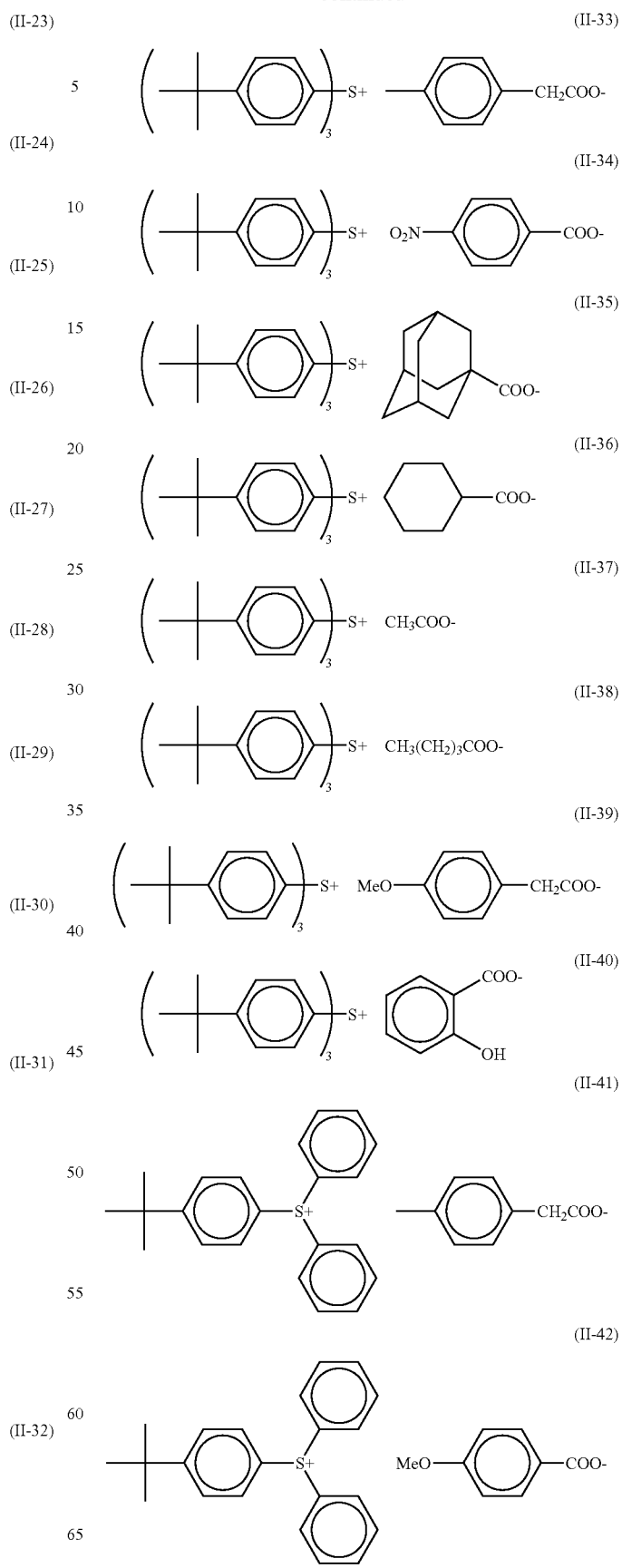

(II-43) 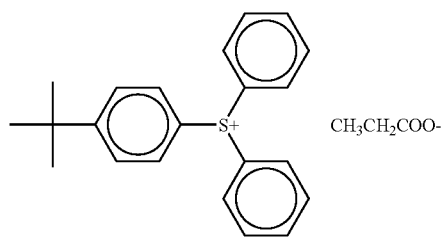
(II-44) 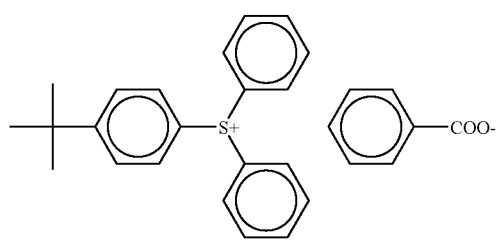
(II-45) 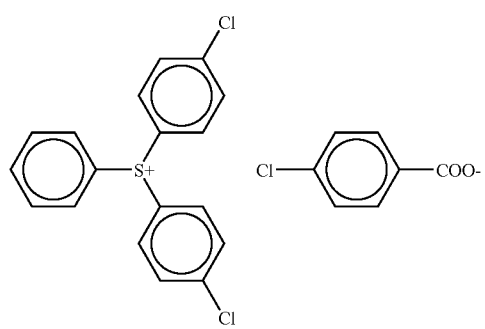
(II-46) 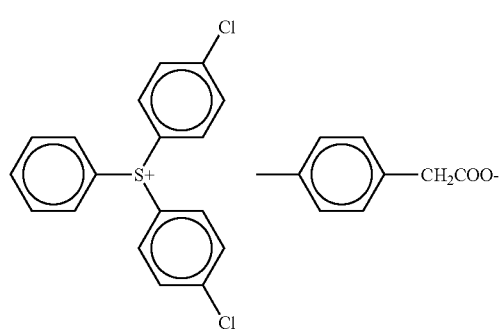
(II-47) 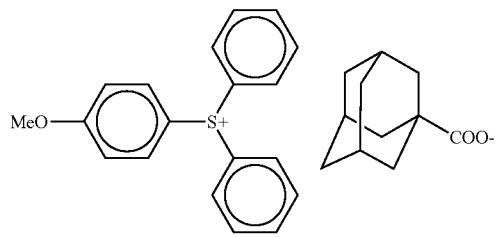
(II-48) 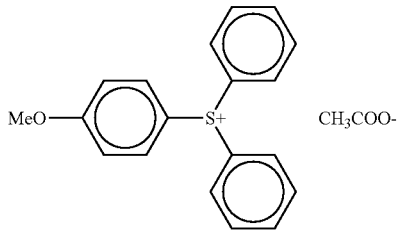
(II-49) 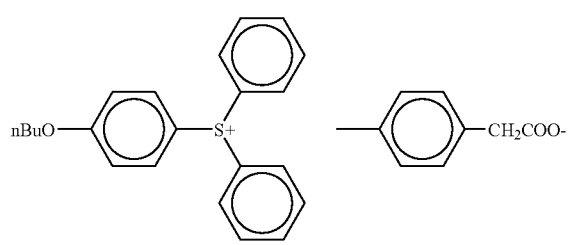
(II-50) 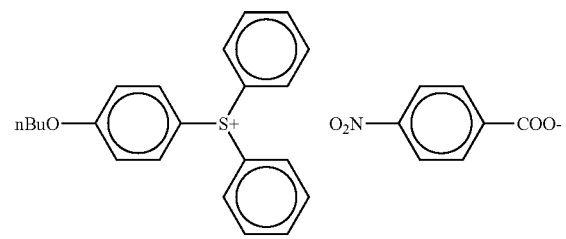
(II-51) 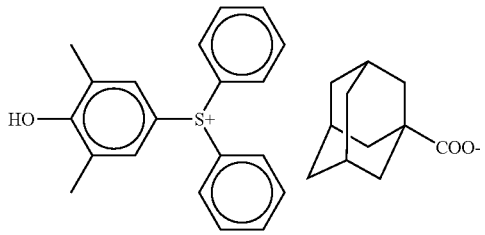
(II-52) 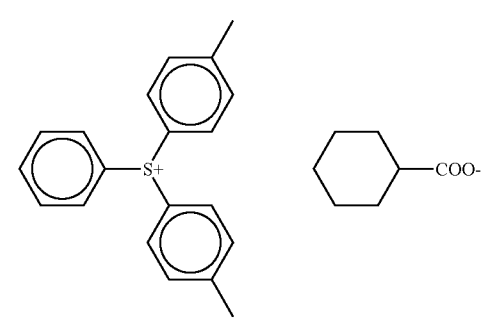
(II-53) 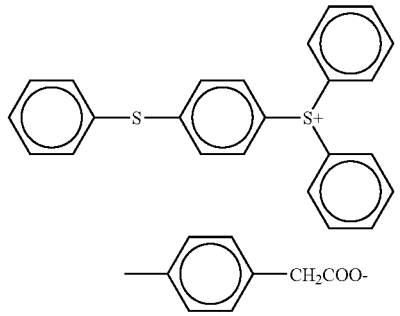

(II-54)
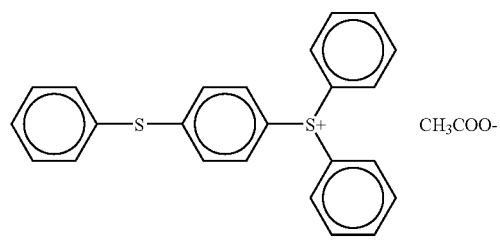 CH₃COO⁻
(II-55)
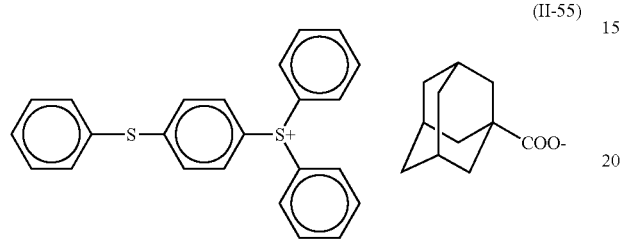
(II-56)
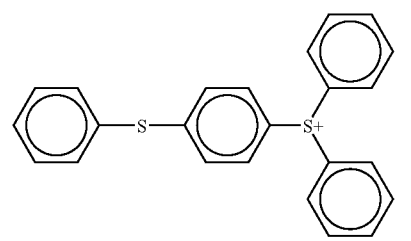
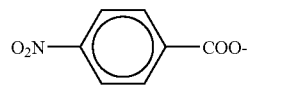
(II-57)
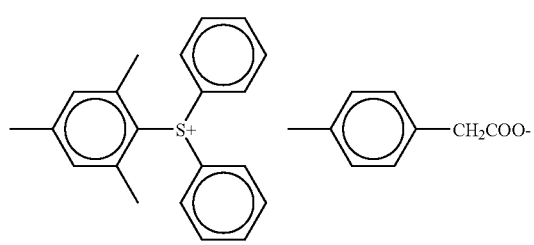
(II-58)
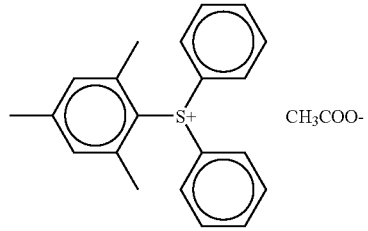 CH₃COO⁻
(II-59)
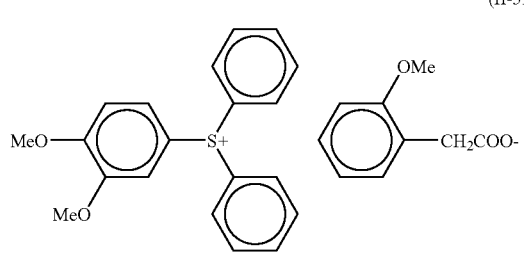
(II-60)
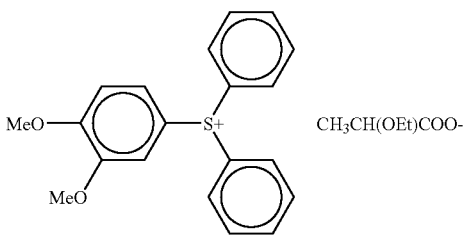 CH₃CH(OEt)COO⁻
(II-61)
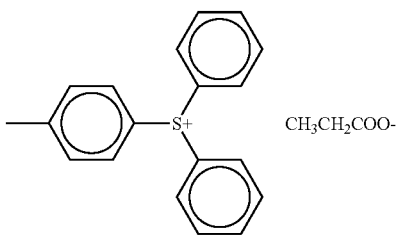 CH₃CH₂COO⁻
(II-62)
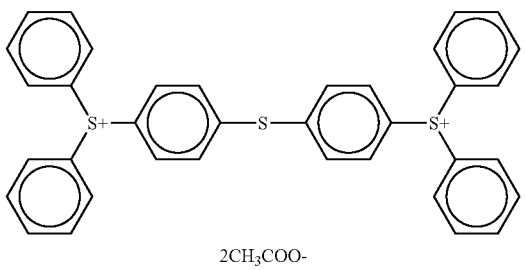
2CH₃COO⁻
(II-63)
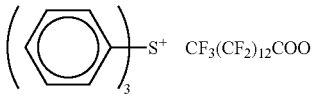 CF₃(CF₂)₁₂COO⁻
(II-64)
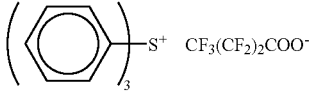 CF₃(CF₂)₂COO⁻
(II-65)
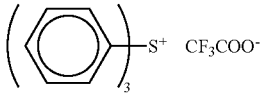 CF₃COO⁻
(II-66)
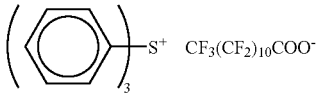 CF₃(CF₂)₁₀COO⁻
(II-67)
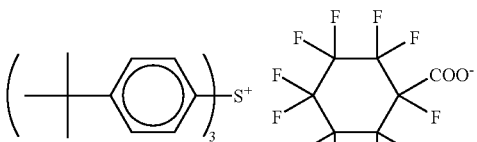
(II-68)
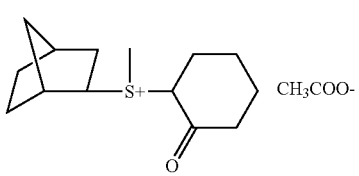 CH₃COO⁻

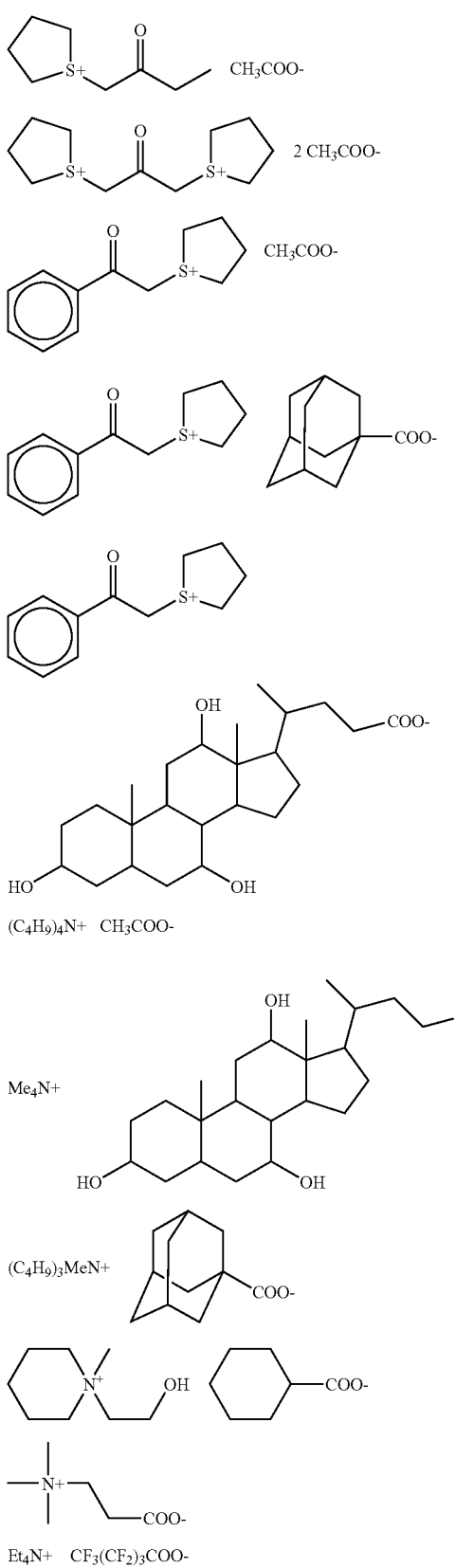

As for the compounds represented by formulae (AI) to (AVI), one species may be used alone or two or more species may be used in combination.

The compounds represented by formulae (AI) to (AVI) each can be synthesized by reacting a sulfonium hydroxide, an iodonium hydroxide or an ammonium hydroxide with a carboxylic acid in an appropriate solvent. The sulfonium hydroxide, iodonium hydroxide or ammonium hydroxide can be obtained by reacting sulfonium iodide, iodonium iodide or ammonium iodide with silver oxide in an appropriate solvent.

The total amount of the component (D) is generally from 0.01 to 10 wt %, preferably from 0.03 to 7 wt %, more preferably from 0.05 to 3 wt %, based on the entire solid content in the composition.

The ratio (by weight) of the components (A1) and (D) contained is usually from 99/1 to 1/99, preferably from 99/1 to 20/80, more preferably from 90/10 to 40/60. Incidentally, the amount of the component (A1) is preferably larger than the amount of the component (D).

<Solvent>

Examples of the solvent which can be used at the time of preparing a positive resist composition by dissolving respective components described above include an organic solvent such as alkylene glycol monoalkyl ether carboxylate, alkylene glycol monoalkyl ether, alkyl lactate, alkyl alkoxypropionate, cyclic lactone having a carbon number of 4 to 10, monoketone compound having a carbon number of 4 to 10 which may contain a ring, alkylene carbonate, alkyl alkoxyacetate and alkyl pyruvate.

Preferred examples of the alkylene glycol monoalkyl ether carboxylate include propylene glycol monomethyl ether acetate, propylene glycol monoethyl ether acetate, propylene glycol monopropyl ether acetate, propylene glycol monobutyl ether acetate, propylene glycol monomethyl ether propionate, propylene glycol monoethyl ether propionate, ethylene glycol monomethyl ether acetate and ethylene glycol monoethyl ether acetate.

Preferred examples of the alkylene glycol monoalkyl ether include propylene glycol monomethyl ether, propylene glycol monoethyl ether, propylene glycol monopropyl ether, propylene glycol monobutyl ether, ethylene glycol monomethyl ether and ethylene glycol monoethyl ether.

Preferred examples of the alkyl lactate include methyl lactate, ethyl lactate, propyl lactate and butyl lactate.

Preferred examples of the alkyl alkoxypropionate include ethyl 3-ethoxypropionate, methyl 3-methoxypropionate, methyl 3-ethoxypropionate and ethyl 3-methoxypropionate.

Preferred examples of the cyclic lactone having a carbon number of 4 to 10 include β-propiolactone, β-butyrolactone, γ-butyrolactone, α-methyl-γ-butyrolactone, β-methyl-γ-butyrolactone, γ-valerolactone, γ-caprolactone, γ-octanoic lactone and α-hydroxy-γ-butyrolactone.

Preferred examples of the monoketone compound having a carbon number of 4 to 10 which may contain a ring include 2-butanone, 3-methylbutanone, pinacolone, 2-pentanone, 3-pentanone, 3-methyl-2-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexen-2-one, 3-penten-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dim- In the formulae above, Me indicates a methyl group and Et indicates an ethyl group.

ethyloyclohexanone, 2,6-dimethylcyclohexanone, 2,2,6-trimethylcyclohexanone, cycloheptanone, 2-methylcycloheptanone and 3-methylcycloheptanone.

Preferred examples of the alkylene carbonate include propylene carbonate, vinylene carbonate, ethylene carbonate and butylene carbonate.

Preferred examples of the alkyl alkoxyacetate include 2-methoxyethyl acetate, 2-ethoxyethyl acetate, 2-(2-ethoxyethoxy)ethyl acetate, 3-methoxy-3-methylbutyl acetate and 1-methoxy-2-propyl acetate.

Preferred examples of the alkyl pyruvate include methyl pyruvate, ethyl pyruvate and propyl pyruvate.

The solvent which can be preferably used is a solvent having a boiling point of 130° C. or more at ordinary temperature under atmospheric pressure, and specific examples thereof include cyclopentanone, γ-butyrolactone, cyclohexanone, ethyl lactate, ethylene glycol monoethyl ether acetate, propylene glycol monomethyl ether acetate, ethyl 3-ethoxypropionate, ethyl pyruvate, 2-ethoxyethyl acetate, 2-(2-ethoxyethoxy)ethyl acetate and propylene carbonate.

In the present invention, one of these solvents may be used alone, or two or more species thereof may be used in combination.

In the present invention, a mixed solvent prepared by mixing a solvent containing a hydroxyl group in the structure and a solvent not containing a hydroxyl group may be used as the organic solvent Examples of the solvent containing a hydroxyl group include ethylene glycol, ethylene glycol monomethyl ether, ethylene glycol monoethyl ether, propylene glycol, propylene glycol monomethyl ether, propylene glycol monoethyl ether and ethyl lactate. Among these, propylene glycol monomethyl ether and ethyl lactate are preferred.

Examples of the solvent not containing a hydroxyl group include propylene glycol monomethyl ether acetate, ethyl ethoxypropionate, 2-heptanone, γ-butyrolactone, cyclohexanone, butyl acetate, N-methylpyrrolidone, N,N-dimethylacetamide and dimethylsulfoxide. Among these, propylene glycol monomethyl ether acetate, ethyl ethoxypropionate, 2-heptanone, γ-butyrolactone, cyclohexanone and butyl acetate are preferred, and propylene glycol monomethyl ether acetate, ethyl ethoxypropionate and 2-heptanone are most preferred.

The mixing ratio (by mass) of the solvent containing a hydroxyl group and the solvent not containing a hydroxyl group is from 1/99 to 99/1, preferably from 10/90 to 90/10, more preferably from 20/80 to 60/40. A mixed solvent in which the solvent not containing a hydroxyl group is contained in an amount of 50 mass % or more is preferred in view of coating uniformity.

The solvent is preferably a mixed solvent of two or more kinds of solvents including propylene glycol monomethyl ether acetate.

<Basic Compound>

The positive resist composition of the present invention preferably contains a basic compound for reducing the change of performance with aging from exposure until heating, as well as producing the effects of the present invention.

Preferred basic compounds other than the component (D) include compounds having a structure represented by any one of the following formulae (A) to (E).

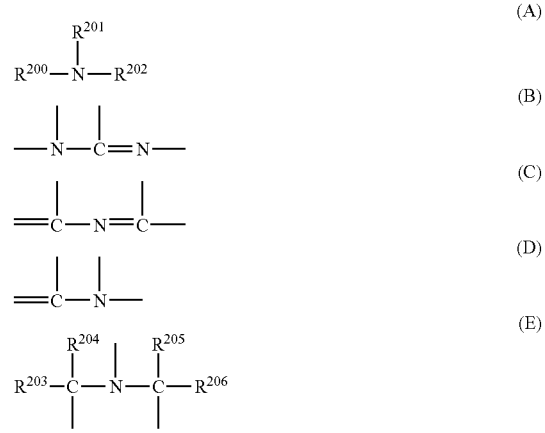

In formulae (A) and (E), $R^{200}$, $R^{201}$ and $R^{202}$, which may be the same or different, each represents a hydrogen atom, an alkyl group (preferably having a carbon number of 1 to 20), a cycloalkyl group (preferably having a carbon number of 3 to 20) or an aryl group (having a carbon number of 6 to 20), and $R^{201}$ and $R^{202}$ may combine with each other to form a ring.

As for the alkyl group, the alkyl group having a substituent is preferably an aminoalkyl group having a carbon number of 1 to 20, a hydroxyalkyl group having a carbon number of 1 to 20, or a cyanoalkyl group having a carbon number of 1 to 20.

$R^{203}$, $R^{204}$, $R^{205}$ and $R^{206}$, which may be the same or different, each represents an alkyl group having a carbon number of 1 to 20.

The alkyl group in these formulae (A) and (E) is more preferably unsubstituted.

Preferred examples of the compound include guanidine, aminopyrrolidine, pyrazole, pyrazoline, piperazine, aminomorpholine, aminoalkylmorpholine and piperidine. More preferred examples of the compound include a compound having an imidazole structure, a diazabicyclo structure, an onium hydroxide structure, an onium carboxylate structure, a trialkylamine structure, an aniline structure or a pyridine structure; an alkylamine derivative having a hydroxyl group and/or an ether bond; and an aniline derivative having a hydroxyl group and/or an ether bond.

Examples of the compound having an imidazole structure include imidazole, 2,4,5-triphenylimidazole and benzimidazole. Examples of the compound having a diazabicyclo structure include 1,4-diazabicyclo[2,2,2]octane, 1,5-diazabicyclo[4,3,0]non-5-ene and 1,8-diazabicyclo[5,4,0]undec-7-ene. Examples of the compound having an onium hydroxide structure include triarylsulfonium hydroxide, phenacylsulfonium hydroxide and sulfonium hydroxide having a 2-oxoalkyl group, specifically, triphenylsulfonium hydroxide, tris(tert-butylphenyl)sulfonium hydroxide, bis(tert-butylphenyl)iodonium hydroxide, phenacylthiophenium hydroxide and 2-oxopropylthiophenium hydroxide. Examples of the compound having an onium carboxylate structure include a compound where the anion moiety of the compound having an onium hydroxide structure becomes a carboxylate, such as acetate, adamantane-1-carboxylate and perfluoroalkyl carboxylate. Examples of the compound having a trialkylamine structure include tri(n-butyl)amine and tri(n-octyl)amine. Examples of the aniline compound include 2,6-diisopropylaniline, N,N-dimethylaniline, N,N-dibutylaniline and N,N-dihexylaniline. Examples of the alkylamine derivative having a hydroxyl group and/or an ether bond include ethanolamine, diethanolamine, triethanolamine and tris(methoxyethoxyethyl)amine. Examples of the aniline derivative having a hydroxyl group and/or an ether bond include N,N-bis(hydroxyethyl)aniline.

One of these basic compounds is used alone, or two or more species thereof are used in combination.

The amount of the basic compound used is usually 50 mass % or less, preferably 25 mass % or less, more preferably 20 mass % or less, and most preferably 10 mass % or less, based on the content of the component (D).

The ratio of acid generator and basic compound used in the composition is preferably acid generator/basic compound (by mol)=from 2.5 to 300. That is, the molar ratio is preferably 2.5 or more in view of sensitivity and resolution and preferably 300 or less from the standpoint of suppressing the reduction in resolution due to thickening of the resist pattern with aging after exposure until heat treatment. The acid generator/basic compound (by mol) is more preferably from 5.0 to 200, still more preferably from 7.0 to 150.

<Surfactant>

The positive resist composition of the present invention preferably further contains a surfactant, more preferably any one species or two or more species of fluorine-containing and/or silicon-containing surfactants (a fluorine-containing surfactant, a silicon-containing surfactant and a surfactant containing both a fluorine atom and a silicon atom).

By incorporating the above-described surfactant into the positive resist composition of the present invention, a resist pattern with good sensitivity, resolution and adherence as well as less development defects can be obtained when using an exposure light source of 250 nm or less, particularly 220 nm or less.

Examples of the fluorine-containing and/or silicon-containing surfactant include surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862 and U.S. Pat. Nos. 5,405,720, 5,360,692, 5,529,881, 5,296,330, 5,436,098, 5,576,143, 5,294,511 and 5,824,451. The following commercially available surfactants each may also be used as it is.

Examples of the commercially available surfactant which can be used include a fluorine-containing surfactant and a silicon-containing surfactant, such as Eftop EF301 and EF303 (produced by Shin-Akita Kasei K.K.); Florad FC430, 431 and 4430 (produced by Sumitomo 3M Inc.); Megaface F171, F173, F176, F189, F113, F110, F177, F120 and R08 (produced by Dainippon Ink & Chemicals, Inc.); Surflon S-382, SC101, 102, 103, 104, 105 and 106 (produced by Asahi Glass Co., Ltd.); Troysol S-366 (produced by Troy Chemical); GF-300 and GF-150 (produced by Toagosei Chemical Industry Co., Ltd.); Surflon S-393 (produced by Seimi Chemical Co., Ltd.); Eftop EF121, EF122A, EF122B, RF122C, EF125M, EF135M, EF351, 352, EF801, EF802 and EF601 (produced by JEMCO Inc.); PF636, PF656, PF6320 and PF6520 (produced by OMNOVA); and FTX-204D, 208G, 218G, 230G, 204D, 208D, 212D, 218 and 222D (produced by NEOS Co., Ltd.). In addition, polysiloxane polymer KP-341 (produced by Shin-Etsu Chemical Co., Ltd.) may also be used as a silicon-containing surfactant.

Other than these known surfactants, a surfactant using a polymer having a fluoro-aliphatic group derived from a fluoro-aliphatic compound which is produced by a telomerization process (also called a telomer process) or an oligomerization process (also called an oligomer process), may be used. The fluoro-aliphatic compound can be synthesized by the method described in JP-A-2002-90991.

The polymer having a fluoro-aliphatic group is preferably a copolymer of a fluoro-aliphatic group-containing monomer with a (poly(oxyalkylene)) acrylate and/or a (poly(oxyalkylene))methacrylate, and the polymer may have an irregular distribution or may be a block copolymer. Examples of the poly(oxyalkylene) group include a poly(oxyethylene) group, a poly(oxypropylene) group and a poly(oxybutylene) group. This group may also be a unit having alkylenes differing in the chain length within the same chain, such as block-linked poly(oxyethylene, oxypropylene and oxyethylene) and block-linked poly(oxyethylene and oxypropylene). Furthermore, the copolymer of a fluoro-aliphatic group-containing monomer and a (poly(oxyalkylene))acrylate (or methacrylate) is not limited only to a binary copolymer but may also be a ternary or greater copolymer obtained by simultaneously copolymerizing two or more different fluoro-aliphatic group-containing monomers or two or more different (poly(oxyalkylene))acrylates (or methacrylates).

Examples thereof include, as the commercially available surfactant, Megaface F178, F-470, F-473, F-475, F-476 and F-472 (produced by Dainippon Ink & Chemicals, Inc.) and further include a copolymer of a $C_6F_{13}$ group-containing acrylate (or methacrylate) with a (poly(oxyalkylene))acrylate (or methacrylate), and a copolymer of a $C_3F_7$ group-containing acrylate (or methacrylate) with a (poly(oxyethylene))acrylate (or methacrylate) and a (poly(oxypropylene))acrylate (or methacrylate).

In the present invention, a surfactant other than the fluorine-containing and/or silicon-containing surfactant may also be used. Specific examples thereof include a nonionic surfactant such as polyoxyethylene alkyl ethers (e.g., polyoxyethylene lauryl ether, polyoxyethylene stearyl ether, polyoxyethylene cetyl ether, polyoxyethylene oleyl ether), polyoxyethylene alkylallyl ethers (e.g., polyoxyethylene octylphenol ether, polyoxyethylene nonylphenol ether), polyoxyethylene.polyoxypropylene block copolymers, sorbitan fatty acid esters (e.g., sorbitan monolaurate, sorbitan monopalmitate, sorbitan monostearate, sorbitan monooleate, sorbitan trioleate, sorbitan tristearate), and polyoxyethylene sorbitan fatty acid esters (e.g., polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate).

One of these surfactants may be used alone, or several species thereof may be used in combination.

The amount of the surfactant used is preferably from 0.01 to 10 mass %, more preferably from 0.1 to 5 mass %, based on the entire amount of the positive resist composition (excluding the solvent).

<Onium Carboxylate>

The positive resist composition of the present invention may contain an onium carboxylate. Examples of the onium carboxylate include sulfonium carboxylate, iodonium carboxylate and ammonium carboxylate. In particular, the onium carboxylate is preferably an iodonium salt or a sulfonium salt. Furthermore, the carboxylate residue of the onium carboxylate for use in the present invention preferably contains no aromatic group and no carbon-carbon double bond. The anion moiety is preferably a linear, branched, monocyclic or polycyclic alkylcarboxylate anion having a carbon number of 1 to 30, more preferably an anion of a carboxylic acid with the alkyl group being partially or entirely fluorine-substituted. The alkyl chain may contain an oxygen atom. By virtue of such a construction, the transparency to light at 220 nm or less is ensured, the sensitivity and resolution are enhanced, and the defocus latitude depended on line pitch and the exposure margin are improved.

Examples of the anion of a fluorine-substituted carboxylic acid include anions of fluoroacetic acid, difluoroacetic acid, trifluoroacetic acid, pentafluoropropionic acid, heptafluorobutyric acid, nonafluoropentanoic acid, perfluorododecanoic acid, perfluorotridecanoic acid, perfluorocyclohexanecarboxylic acid and 2,2-bistrifluoromethylpropionic acid.

These onium carboxylates can be synthesized by reacting a sulfonium, iodonium or ammonium hydroxide and a carboxylic acid with silver oxide in an appropriate solvent.

The content of the onium carboxylate in the composition is generally from 0.1 to 20 mass %, preferably from 0.5 to 10 mass %, more preferably from 1 to 7 mass %, based on the entire solid content of the composition.

<Dissolution Inhibiting Compound having a Molecular Weight of 3,000 or Less, Which Decomposes Under the Action of an Acid to Increase the Solubility in an Alkali Developer>

The dissolution inhibiting compound having a molecular weight of 3,000 or less, which decomposes under the action of an acid to increase the solubility in an alkali developer (hereinafter, sometimes referred to as a "dissolution inhibiting compound"), is preferably an alicyclic or aliphatic compound containing an acid-decomposable group, such as acid-decomposable group-containing cholic acid derivatives described in Proceeding of SPIE, 2724, 355 (1996), so as not to reduce the transparency to light at 220 nm or less. The acid-decomposable group and alicyclic structure include those described above for the alicyclic hydrocarbon-based acid-decomposable resin.

In the case where the positive resist composition of the present invention is exposed by a KrF excimer laser or irradiated with electron beams, the composition preferably contains a structure of the phenolic hydroxyl group of a phenol compound being substituted by an acid-decomposable group. The phenol compound is preferably a compound containing from 1 to 9 phenol skeletons, more preferably from 2 to 6 phenol skeletons.

The molecular weight of the dissolution inhibiting compound for use in the present invention is 3,000 or less, preferably from 300 to 3,000, more preferably from 500 to 2,500.

The amount of the dissolution inhibiting compound added is preferably from 3 to 50 mass %, more preferably from 5 to 40 mass %, based on the solid content of the positive resist composition.

Specific examples of the dissolution inhibiting compound are set forth below, but the present invention is not limited thereto.

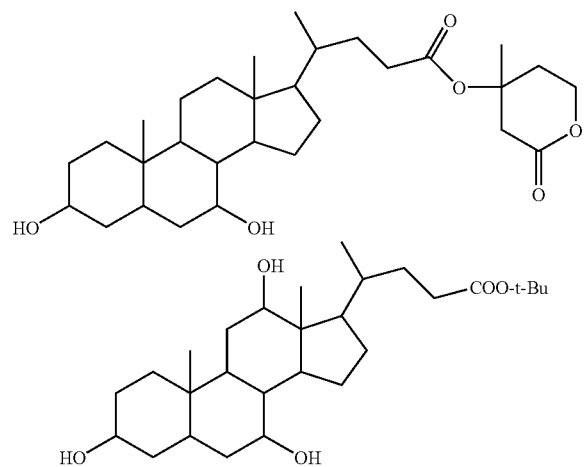

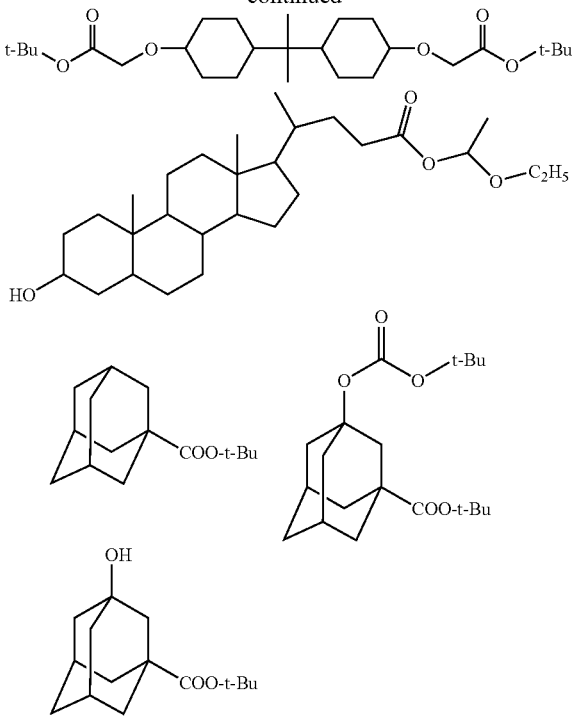

<Other Additives>

The positive resist composition of the present invention may further contain, for example, a dye, a plasticizer, a photosensitizer, a light absorbent and a compound for accelerating dissolution in a developer (for example, a phenol compound having a molecular weight of 1,000 or less, or a carboxyl group-containing alicyclic or aliphatic compound), if desired.

The phenol compound having a molecular weight of 1,000 or less can be easily synthesized by one skilled in the art with reference to the methods described, for example, in JP-A-4-122938, JP-A-2-28531, U.S. Pat. No. 4,916,210 and European Patent 219294.

Specific examples of the carboxyl group-containing alicyclic or aliphatic compound include, but are not limited to, a carboxylic acid derivative having a steroid structure, such as cholic acid, deoxycholic acid and lithocholic acid, an adamantanecarboxylic acid derivative, an adamantanedicarboxylic acid, a cyclohexanecarboxylic acid and a cyclohexanedicarboxylic acid.

In the case where the resist film formed from the positive resist composition of the present invention is exposed through an immersion medium, a hydrophobic resin (HR) may be further added, if desired. The hydrophobic resin (HR) when added is unevenly distributed to the surface layer of the resist film and in the case of using water as the immersion medium, the resist film formed can be enhanced in the receding contact angle on the resist film surface for water as well as in the followability to the immersion liquid.

The hydrophobic resin (HR) may be any resin as long as the receding contact angle on the surface is enhanced by its addition, but a resin having at least either one of a fluorine atom and a silicon atom is preferred.

The receding contact angle (at the temperature in use, for example, at 23° C.) of the resist film for the immersion liquid such as water is preferably from 60 to 90°, more preferably 70° or more.

The amount of the hydrophobic resin added may be appropriately adjusted to give a resist film having a receding contact angle in the range above but is preferably from 0.1 to 10 mass %, more preferably from 0.1 to 5 mass %, based on the entire solid content of the positive resist composition.

The hydrophobic resin (HR) is, as described above, unevenly distributed to the interface but unlike a surfactant, need not have necessarily a hydrophilic group in the molecule and may not contribute to uniform mixing of polar/nonpolar substances.

The fluorine atom or silicon atom in the hydrophobic resin (HR) may be present in the main chain of the resin or may be substituted to the side chain.

The hydrophobic resin (HR) is preferably a resin where a fluorine atom-containing alkyl group, a fluorine atom-containing cycloalkyl group or a fluorine atom-containing aryl group is contained as a fluorine atom-containing partial structure.

The fluorine atom-containing alkyl group (preferably having a carbon number of 1 to 10, more preferably from 1 to 4) is a linear or branched alkyl group with at least one hydrogen atom being substituted by a fluorine atom and may further have another substituent.

The fluorine atom-containing cycloalkyl group is a monocyclic or polycyclic cycloalkyl group with at least one hydrogen atom being substituted by a fluorine atom and may further have another substituent.

The fluorine atom-containing aryl group is an aryl group (e.g., phenyl, naphthyl) with at least one hydrogen atom being substituted by a fluorine atom and may further have another substituent.

Preferred examples of the fluorine atom-containing alkyl group, fluorine atom-containing cycloalkyl group and fluorine atom-containing aryl group include the groups represented by the following formulae (F2) to (F4), but the present invention is not limited thereto.

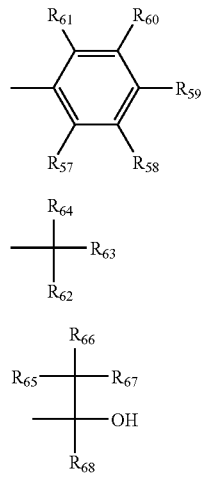

In formulae (F2) to (F4), $R_{57}$ to $R_{68}$ each independently represents a hydrogen atom, a fluorine atom or an alkyl group, provided that at least one of $R_{57}$ to $R_{61}$, at least one of $R_{62}$ to $R_{64}$ and at least one of $R_{65}$ to $R_{68}$ are a fluorine atom or an alkyl group (preferably having a carbon number of 1 to 4) with at least one hydrogen atom being substituted by a fluorine atom. It is preferred that $R_{57}$ to $R_{61}$ and $R_{65}$ to $R_{67}$ all are a fluorine atom. $R_{62}$, $R_{63}$ and $R_{68}$ each is preferably an alkyl group (preferably having a carbon number of 1 to 4) with at least one hydrogen atom being substituted by a fluorine atom, more preferably a perfluoroalkyl group having a carbon number of 1 to 4. $R_{62}$ and $R_{63}$ may combine with each other to form a ring.

Specific examples of the group represented by formula (F2) include p-fluorophenyl group, pentafluorophenyl group and 3,5-di(trifluoromethyl)phenyl group.

Specific examples of the group represented by formula (F3) include trifluoromethyl group, pentafluoropropyl group, pentafluoroethyl group, heptafluorobutyl group, hexafluoroisopropyl group, heptafluoroisopropyl group, hexafluoro(2-methyl)isopropyl group, nonafluorobutyl group, octafluoroisobutyl group, nonafluorohexyl group, nonafluoro-tert-butyl group, perfluoroisopentyl group, perfluorooctyl group, perfluoro(trimethyl)hexyl group, 2,2,3,3-tetrafluorocyclobutyl group and perfluorocyclohexyl group. Among these, hexafluoroisopropyl group, heptafluoroisopropyl group, hexafluoro(2-methyl)isopropyl group, octafluoroisobutyl group, nonafluoro-tert-butyl group and perfluoroisopentyl group are preferred, and hexafluoroisopropyl group and heptafluoroisopropyl group are more preferred.

Specific examples of the group represented by formula (F4) include —C(CF$_3$)$_2$OH, —C(C$_2$F$_5$)$_2$OH, —C(CF$_3$)(CH$_3$)OH and —CH(CF$_3$)OH, with —C(CF$_3$)$_2$OH being preferred.

Specific examples of the repeating unit having a fluorine atom are set forth below, but the present invention is not limited thereto.

In specific examples, $X_1$ represents a hydrogen atom, —CH$_3$, —F or —CF$_3$.

$X_2$ represents —F or —CF$_3$.

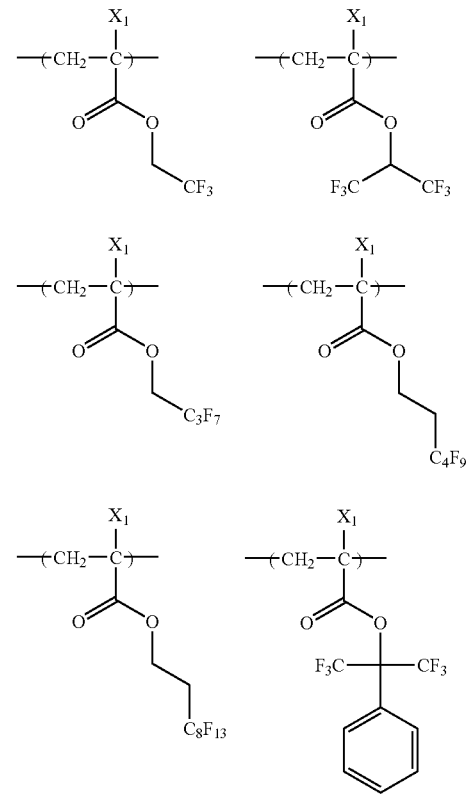

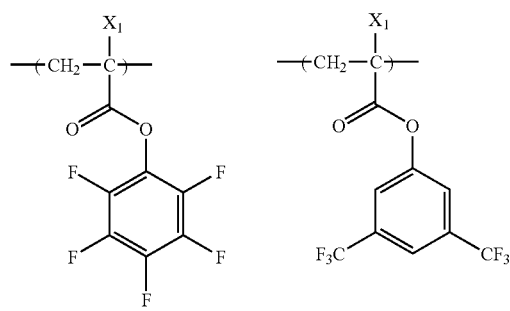
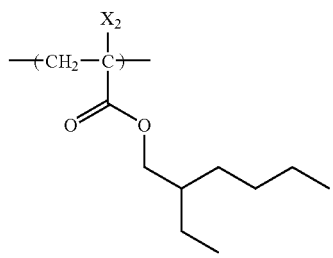
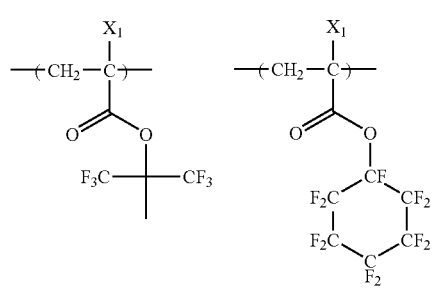
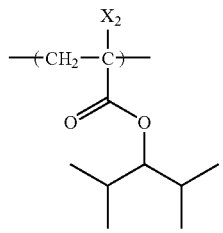
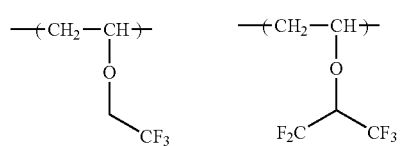
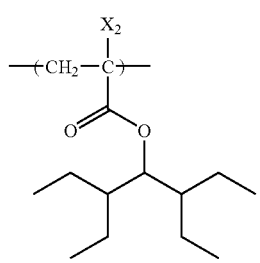
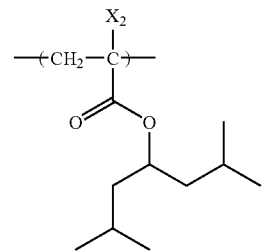
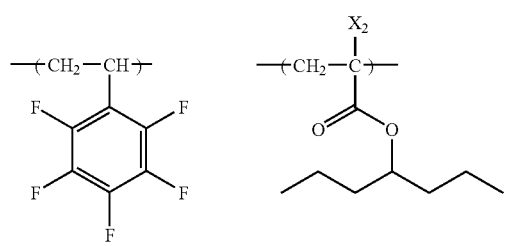
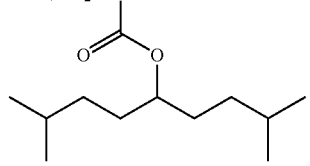
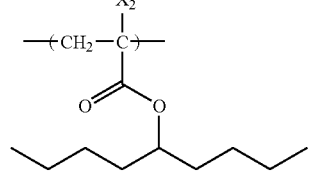
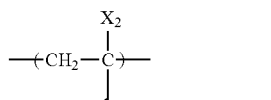
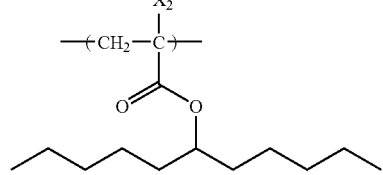
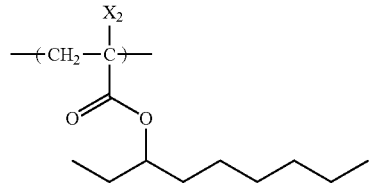
The hydrophobic resin (HR) is preferably a resin where an alkylsilyl structure (preferably a trialkylsilyl group) or a cyclic siloxane structure is contained as a silicon atom-containing partial structure.
Specific examples of the alkylsilyl structure and cyclic siloxane structure include the groups represented by the following formulae (CS-1) to (CS-3):
(CS-1)
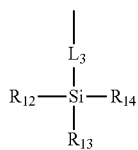

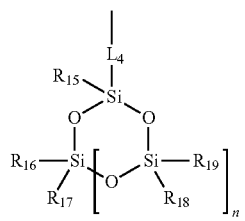

(CS-2)

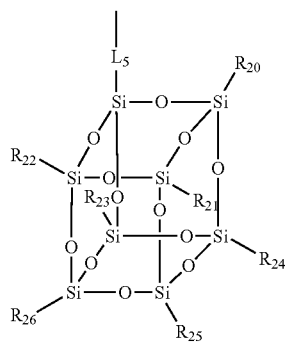

(CS-3)

In formulae (CS-1) to (CS-3), $R_{12}$ to $R_{26}$ each independently represents a linear or branched alkyl group (preferably having a carbon number of 1 to 20) or a cycloalkyl group (preferably having a carbon number of 3 to 20).

$L_3$ to $L_5$ each represents a single bond or a divalent linking group. The divalent linking group is a sole group or a combination of two or more groups selected from the group consisting of an alkylene group, a phenylene group, an ether group, a thioether group, a carbonyl group, an ester group, an amide group, a urethane group and a ureylene group.

n represents an integer of 1 to 5.

Specific examples of the repeating unit having a silicon atom are set forth below, but the present invention is not limited thereto.

In specific examples, $X_1$ represents a hydrogen atom, —$CH_3$, —F or —$CF_3$.

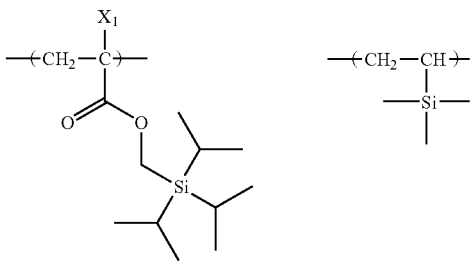

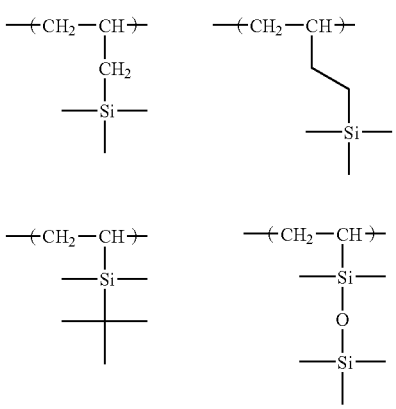

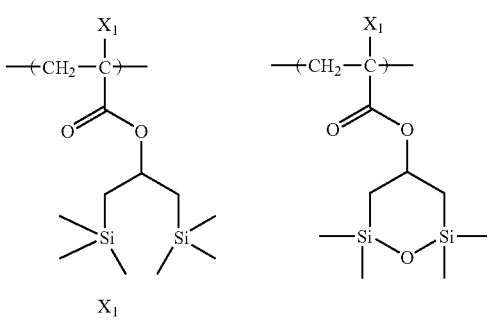

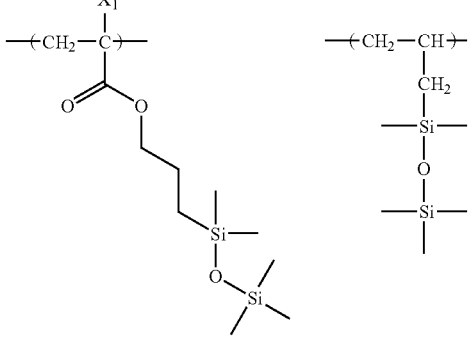

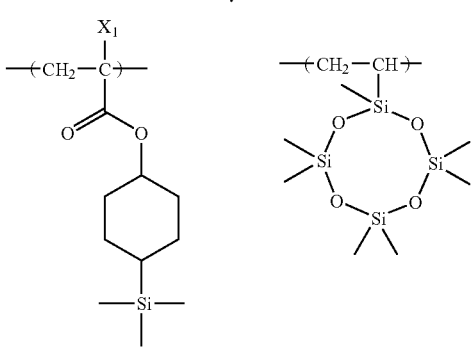

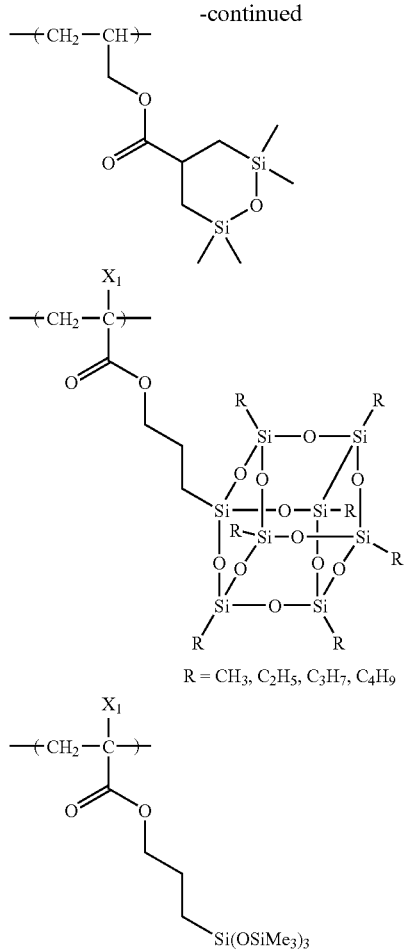

Furthermore, the hydrophobic resin (HR) may contain at least one group selected from the group consisting of the following (x) to (z):

(x) an alkali-soluble group,
(y) a group which decomposes under the action of an alkali developer to increase the solubility in an alkali developer, and
(z) a group which decomposes under the action of an acid.

Examples of the (x) alkali-soluble group include groups having a phenolic hydroxyl group, a carboxylic acid group, a fluorinated alcohol group, a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)-imide group, a tris(alkylcarbonyl)methylene group or a tris(alkylsulfonyl)methylene group.

Preferred alkali-soluble groups are a fluorinated alcohol group (preferably hexafluoroisopropanol), a sulfonimide group and a bis(carbonyl)methylene group.

As for the repeating unit having (x) an alkali-soluble group, all of a repeating unit where an alkali-soluble group is directly bonded to the resin main chain, such as repeating unit by an acrylic acid or a methacrylic acid, a repeating unit where an alkali-soluble group is bonded to the resin main chain through a linking group, and a repeating unit where an alkali-soluble group is introduced into the polymer chain terminal by using an alkali-soluble group-containing polymerization initiator or chain transfer agent at the polymerization, are preferred.

The content of the repeating unit having (x) an alkali-soluble group is preferably from 1 to 50 mol %, more preferably from 3 to 35 mol %, still more preferably from 5 to 20 mol %, based on all repeating units in the polymer.

Specific examples of the repeating unit having (x) an alkali-soluble group are set forth below, but the present invention is not limited thereto.

In the formulae, Rx represents H, $CH_3$, $CF_3$ or $CH_2OH$.

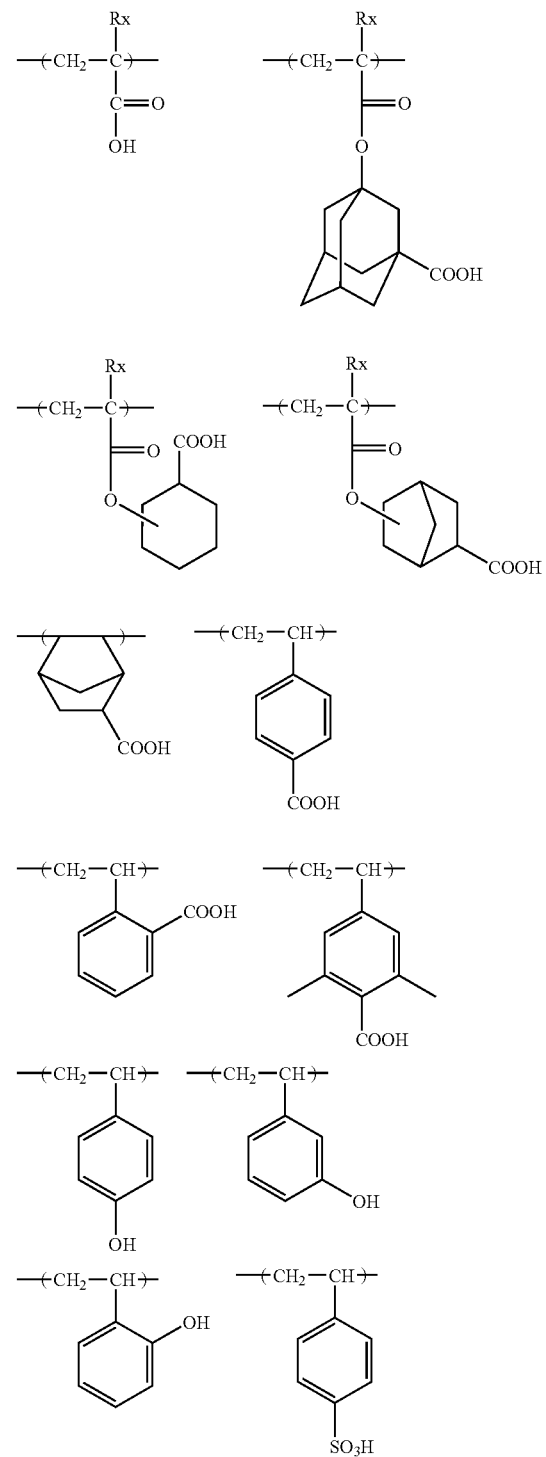

-continued

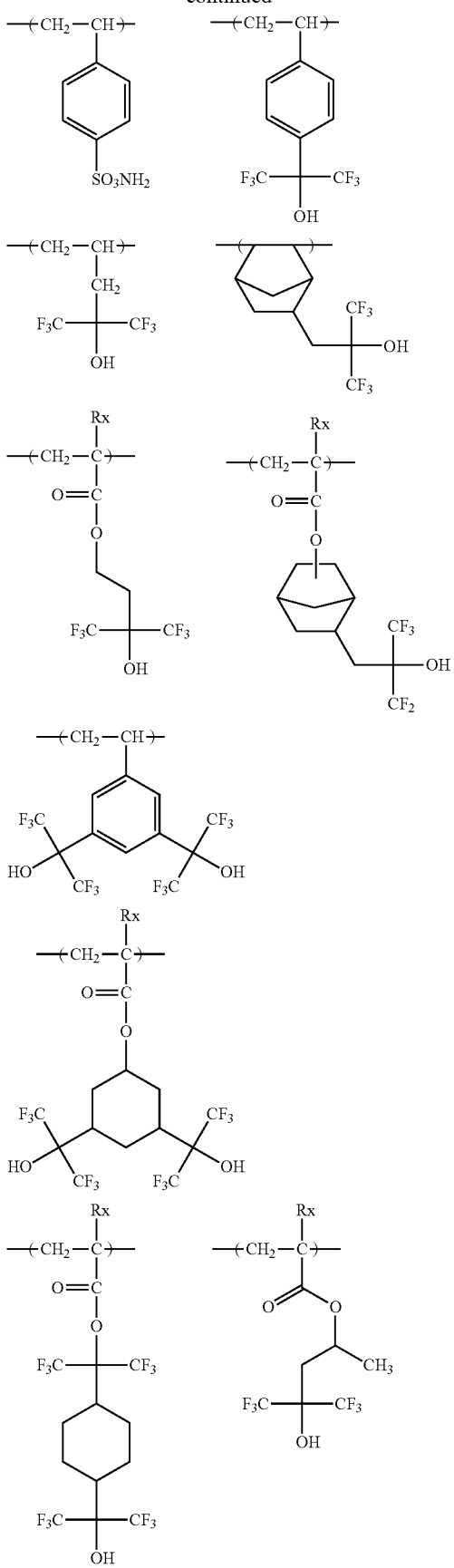

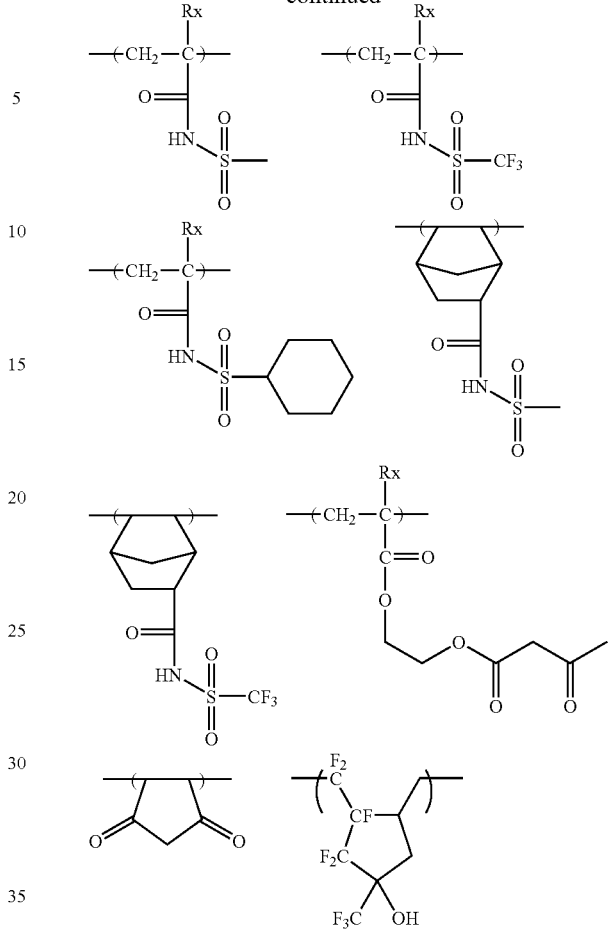

Examples of the (y) group which decomposes under the action of an alkali developer to increase the solubility in an alkali developer include a lactone structure-containing group, an acid anhydride and an acid imide group, with a lactone group being preferred.

As for the repeating unit having (y) a group which decomposes under the action of an alkali developer to increase the solubility in an alkali developer, both a repeating unit where (y) a group which decomposes under the action of an alkali developer to increase the solubility in an alkali developer is bonded to the resin main chain, such as repeating unit by an acrylic acid ester or a methacrylic acid ester, and a repeating unit where (y) a group of which solubility in an alkali developer increases is introduced into the polymer chain terminal by using a polymerization initiator or chain transfer agent containing this group at the polymerization are preferred.

The content of the repeating unit having (y) a group of which solubility in an alkali developer increases is preferably from 1 to 40 mol %, more preferably from 3 to 30 mol %, still more preferably from 5 to 15 mol %, based on all repeating units in the polymer.

Specific examples of the repeating unit having (y) a group of which solubility in an alkali developer increases are the same as those of the repeating unit having a lactone structure described for the resin as the component (B).

Examples of the repeating unit having (z) a group which decomposes under the action of an acid, contained in the hydrophobic resin (HR), are the same as those of the repeating unit having an acid-decomposable group described for the resin as the component (B). In the hydrophobic resin (HR), the content of the repeating unit having (z) a group which decomposes under the action of an acid is preferably from 1 to 80 mol %, more preferably from 10 to 80 mol %, still more preferably from 20 to 60 mol %, based on all repeating units in the polymer.

The hydrophobic resin (HR) may flier contain a repeating unit represented by the following formula (III).

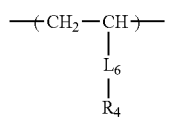

In formula (III), $R_4$ represents a group having an alkyl group, a cycloalkyl group, an alkenyl group or a cycloalkenyl group.

$L_6$ represents a single bond or a divalent linking group,

In formula (III), the alkyl group of $R_4$ is preferably a linear or branched alkyl group having a carbon number of 3 to 20.

The cycloalkyl group is preferably a cycloalkyl group having a carbon number of 3 to 20.

The alkenyl group is preferably an alkenyl group having a carbon number of 3 to 20.

The cycloalkenyl group is preferably a cycloalkenyl group having a carbon number of 3 to 20.

The divalent linking group of $L_6$ is preferably an alkylene group (preferably having a carbon number of 1 to 5) or an oxy group.

In the case where the hydrophobic resin (HR) contains a fluorine atom, the fluorine atom content is preferably from 5 to 80 mass %, more preferably from 10 to 80 mass %, based on the molecular weight of the hydrophobic resin (HR). Also, the fluorine atom-containing repeating unit preferably occupies from 10 to 100 mass %, more preferably from 30 to 100 mass %, in the hydrophobic resin (HR).

In the case where the hydrophobic resin (HR) contains a silicon atom, the silicon atom content is preferably from 2 to 50 mass %, more preferably from 2 to 30 mass %, based on the molecular weight of the hydrophobic resin (HR). Also, the silicon atom-containing repeating unit preferably occupies from 10 to 100 mass %, more preferably from 20 to 100 mass %, in the hydrophobic resin (HR).

The standard polystyrene-reduced weight average molecular of the hydrophobic resin (HR) is preferably from 1,000 to 100,000, more preferably from 1,000 to 50,000, still more preferably from 2,000 to 15,000.

Similarly to the resin as the component (B), it is preferred that, as a matter of course, the hydrophobic resin (HR) has less impurities such as metal and also, the content of the residual monomer or oligomer component is from 0 to 10 mass %, more preferably from 0 to 5 mass %, still more preferably from 0 to 1 mass %. When these conditions are satisfied, a resist free from foreign matters in liquid or change in the sensitivity and the like with the lapse of time can be obtained. Also, in view of the resolution, resist profile, and side wall, roughness or the like of the resist pattern, the molecular weight distribution (Mw/Mn, also called dispersity) is preferably from 1 to 5, more preferably from 1 to 3, still more preferably from 1 to 2.

As for the hydrophobic resin (HR), various commercially available products may be used or the resin may be synthesized by an ordinary method (for example, radical polymerization)). Examples of the synthesis method in general include a batch polymerization method of dissolving monomer species and an initiator in a solvent and heating the solution, thereby effecting the polymerization, and a dropping polymerization method of adding dropwise a solution containing ionomer species and an initiator to a heated solvent over 1 to 10 hours. A dropping polymerization method is preferred. Examples of the reaction solvent include tetrahydrofuran, 1,4-dioxane, ethers such as diisopropyl ether, ketones such as methyl ethyl ketone and methyl isobutyl ketone, an ester solvent such as ethyl acetate, an amide solvent such as dimethylformamide and dimethylacetamide, and a solvent capable of dissolving the composition of the present invention, which is described later, such as propylene glycol monomethyl ether acetate, propylene glycol monomethyl ether and cyclohexanone. The polymerization is more preferably performed using the same solvent as the solvent used in the positive resist composition of the present invention. By the use of the same solvent, production of particles during storage can be suppressed.

The polymerization reaction is preferably preformed in an inert gas atmosphere such as nitrogen and argon. As for the polymerization initiator, the polymerization is initiated using a commercially available radical initiator (e.g., azo-based initiator, peroxide). The radical initiator is preferably an azo-based initiator, and an azo-based initiator having an ester group, a cyano group or a carboxyl group is preferred. Preferred examples of the initiator include azobisisobutyronitrile, azobisdimethylvaleronitrile and dimethyl 2,2'-azobis(2-methylpropionate). The reaction concentration is from 5 to 50 mass %, preferably from 30 to 50 mass %, and the reaction temperature is usually from 10 to 150° C., preferably from 30 to 120° C., more preferably from 60 to 100° C.

After the completion of reaction, the reaction product is allowed to cool to room temperature and purified. The purification may be performed by a normal method, for example, a liquid-liquid extraction method of applying water washing or combining an appropriate solvent to remove residual monomers or oligomer components; a purification method in a solution sate, such as ultrafiltration of removing by extraction only polymers having a molecular weight not more than a specific molecular weight; a reprecipitation method of adding dropwise the resin solution in a bad solvent to solidify the resin in the bad solvent and thereby remove residual monomers or the like; and a purification method in a solid state, such as a method of washing a resin slurry separated by filtration with a bad solvent. For example, the resin is precipitated as a solid matter by contacting the reaction solution with a solvent in which the resin is sparingly soluble or insoluble (bad solvent) and which is in a volume amount of 10 times or less, preferably from 10 to 5 times, the reaction solution.

The solvent used at the operation of precipitation or reprecipitation from the polymer solution (precipitation or reprecipitation solvent) may be sufficient if it is a bad solvent to the polymer, and the solvent used may be appropriately selected from a hydrocarbon, a halogenated hydrocarbon, a nitro compound, an ether, a ketone, an ester, a carbonate, an alcohol, a carboxylic acid, water, a mixed solvent containing such a solvent and the like, according to the kind of the polymer. Among these solvents, the precipitation or reprecipitation solvent is preferably a solvent containing at least an alcohol particularly methanol or the like) or water.

The amount of the precipitation or reprecipitation solvent used may be appropriately selected by taking into consideration the efficiency, yield and the like, but in general, the amount used is from 100 to 10,000 parts by mass, preferably from 200 to 2,000 parts by mass, more preferably from 300 to 1,000 parts by mass, per 100 parts by mass of the polymer solution.

The temperature at the precipitation or reprecipitation may be appropriately selected by taking into consideration the efficiency or operability but is usually on the order of 0 to 50° C., preferably in the vicinity of room temperature (for example, approximately from 20 to 35° C.). The precipitation or reprecipitation operation may be performed using a commonly employed mixing vessel such as stirring tank by a known method such as batch system and continuous system.

The precipitated or reprecipitated polymer is usually subjected to commonly employed solid-liquid separation such as filtration and centrifugation, then dried and used. The filtration is performed using a solvent-resistant filter element preferably under pressure. The drying is performed under atmospheric pressure or reduced pressure (preferably under reduced pressure) at a temperature of approximately from 30 to 100° C., preferably on the order of 30 to 50° C.

Incidentally, after the resin is once precipitated and separated, the resin may be again dissolved in a solvent and then put into contact with a solvent in which the resin is sparingly soluble or insoluble. That is, there may be used a method comprising, after the completion of radical polymerization reaction, bringing the polymer into contact with a solvent in which the polymer is sparingly soluble or insoluble, to precipitate a resin (step a), separating the resin from the solution (step b), anew dissolving the resin in a solvent to prepare a resin solution A (step c), bringing the resin solution A into contact with a solvent in which the resin is sparingly soluble or insoluble and which is in a volume amount of less than 10 times (preferably 5 times or less) the resin solution A, to precipitate a resin solid (step d), and separating the precipitated resin (step e).

Specific examples of the hydrophobic resin (HR) are set forth below. Also, the molar ratio of repeating units (corresponding to repeating units from the left), weight average molecular weight and dispersity of each resin are shown in Table 1 below.

TABLE 1

(HR-1)

(HR-2)

(HR-3)

TABLE 1-continued (HR-4)

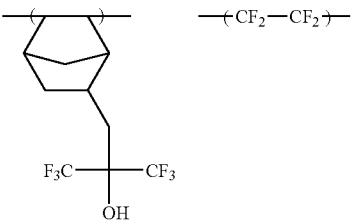

(HR-5)

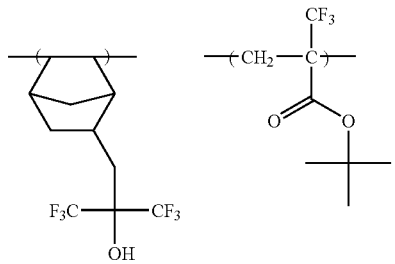

(HR-6)

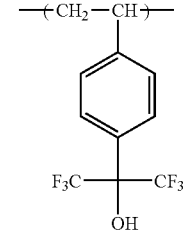

(HR-7)

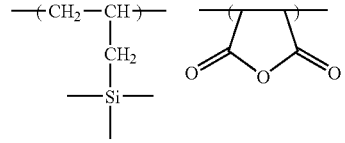

(HR-8)

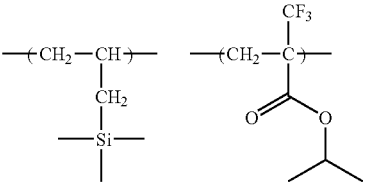

(HR-9)

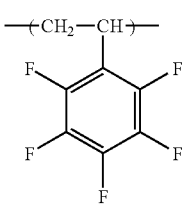

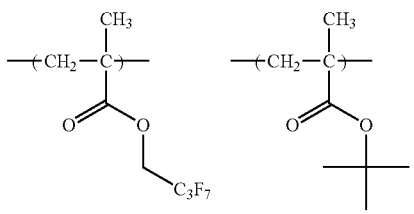

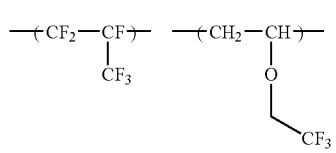

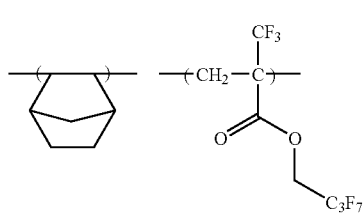

TABLE 1-continued
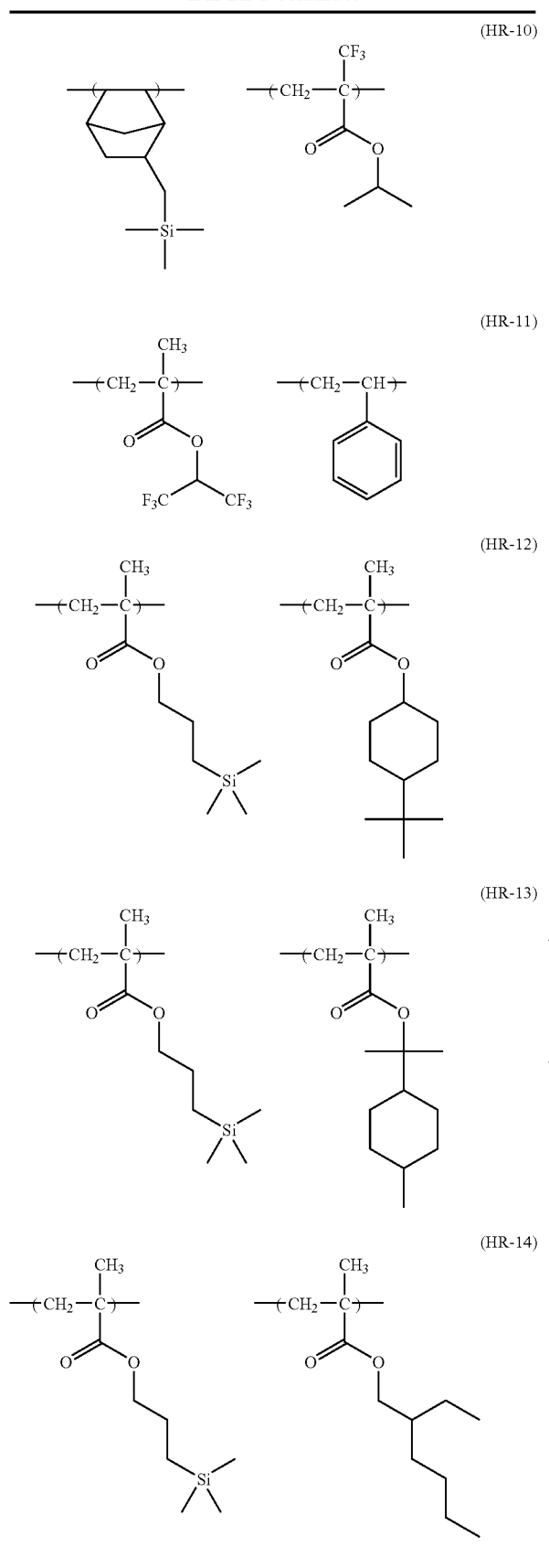
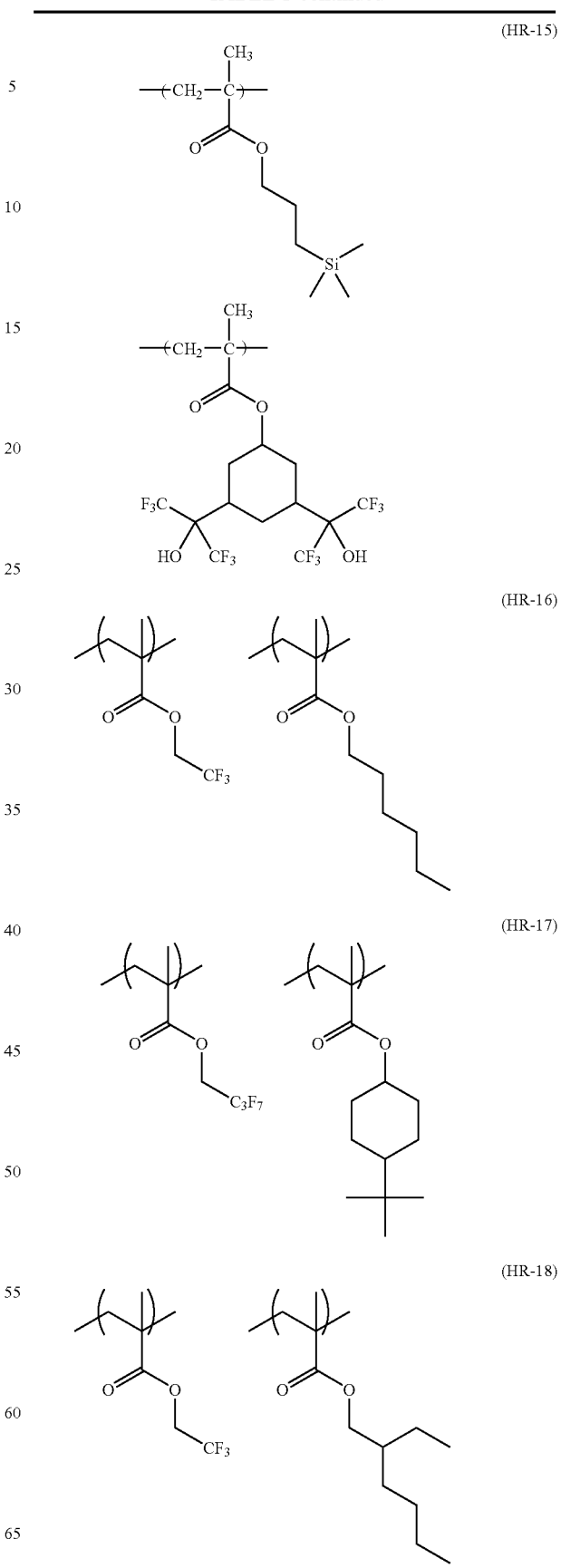

TABLE 1-continued

TABLE 1-continued
(HR-30)
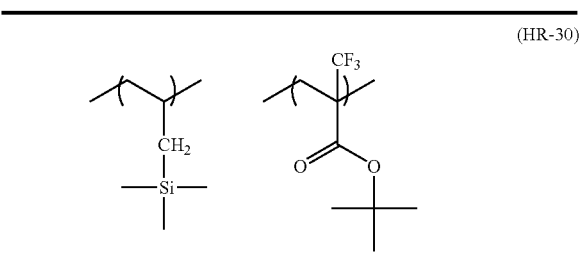
(HR-31)
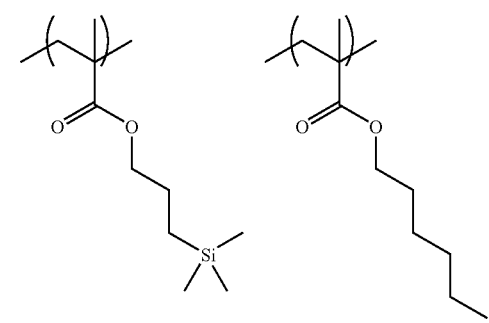
(HR-32)
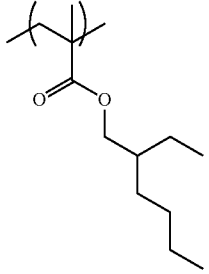
(HR-33)
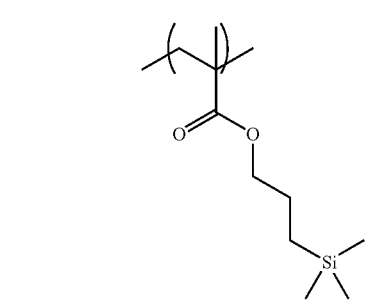
(HR-34)
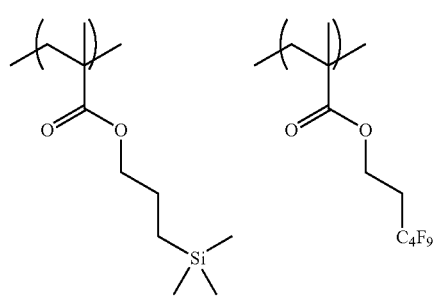
TABLE 1-continued
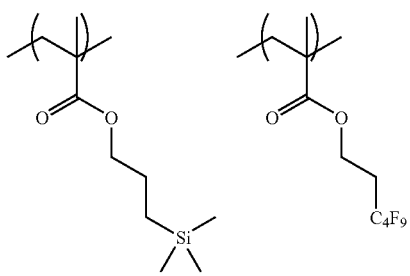
(HR-35)
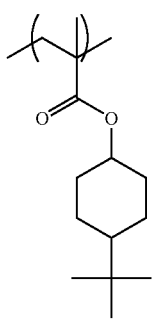
(HR-36)
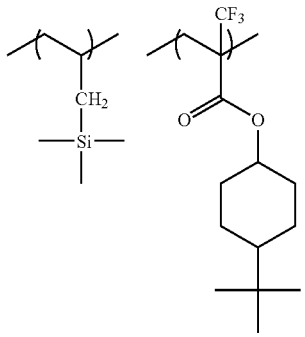
(HR-37)
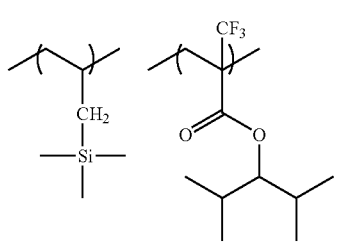
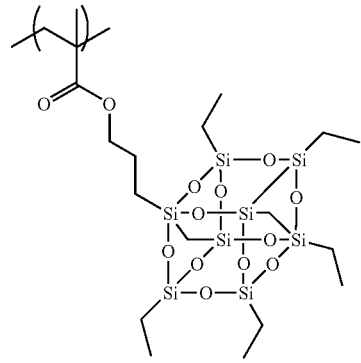

TABLE 1-continued
(HR-38)
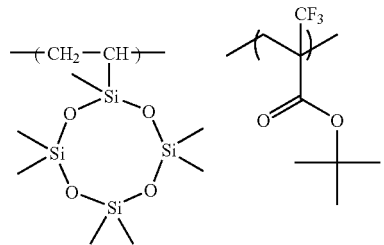
(HR-39)
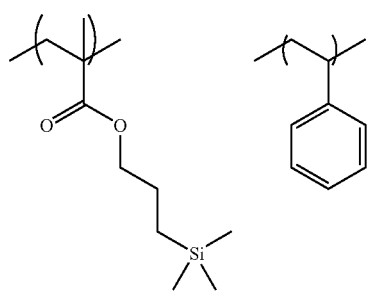
(HR-40)
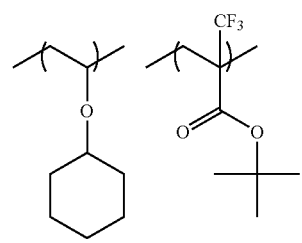
(HR-41)
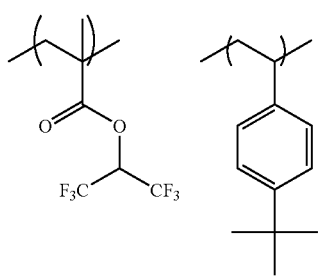
(HR-42)
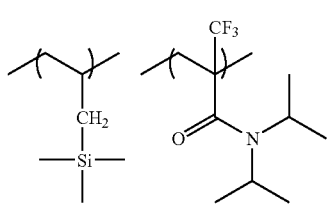
(HR-43)
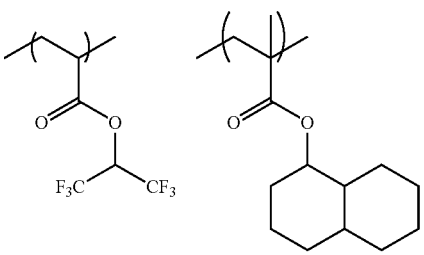
(HR-44)
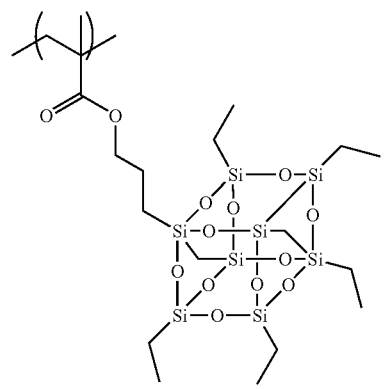
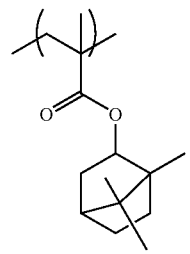
(HR-45)
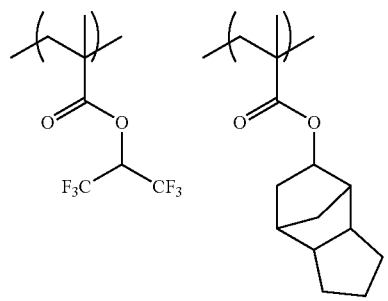
(HR-46)
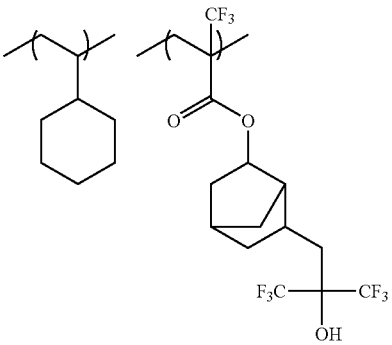

TABLE 1-continued
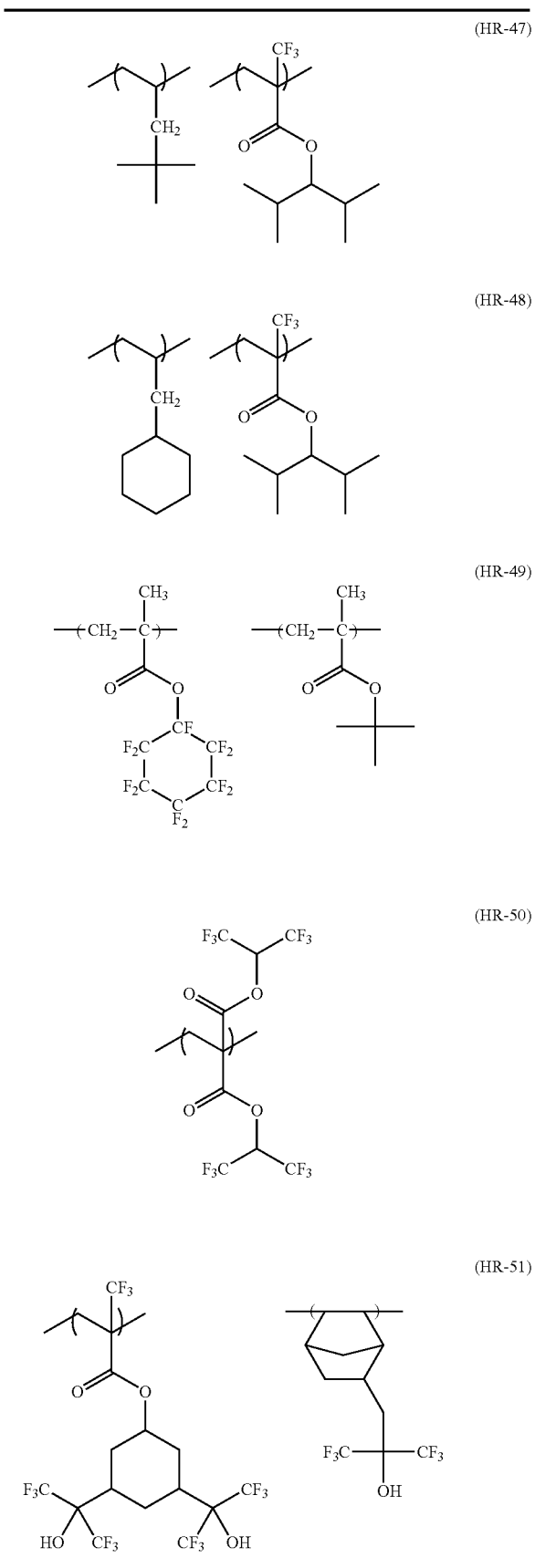
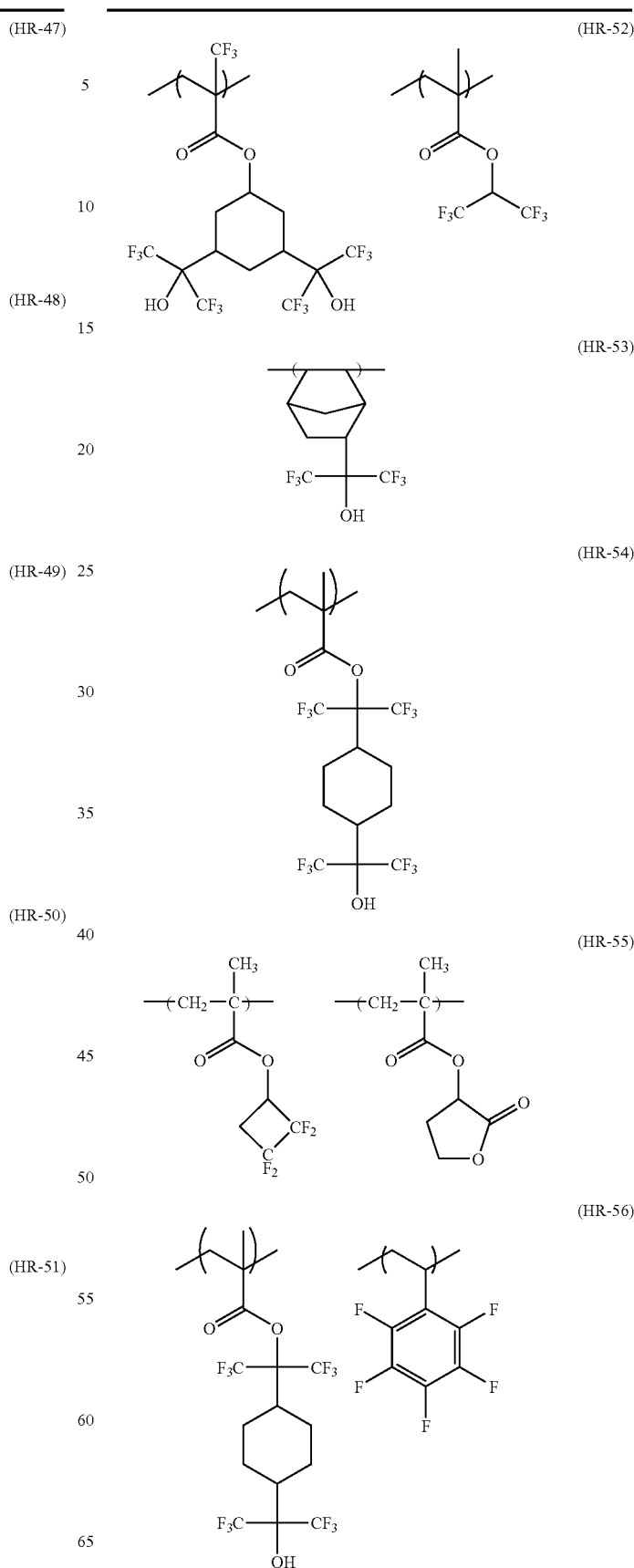

TABLE 1-continued
(HR-57) 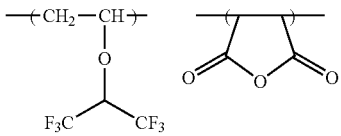
(HR-58) 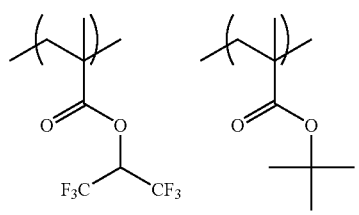
(HR-59) 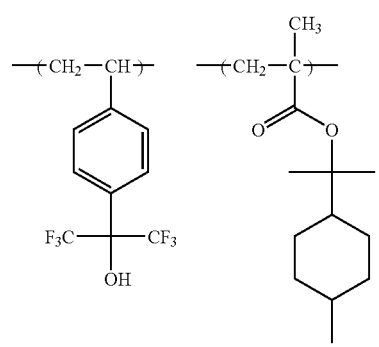
(HR-60) 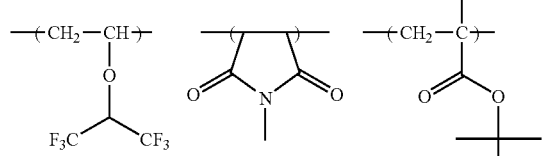
(HR-61) 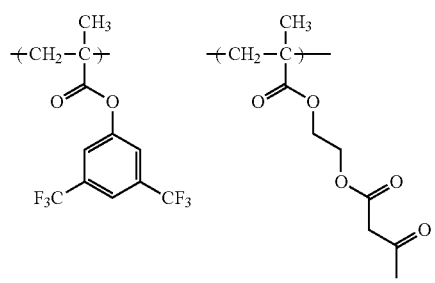
(HR-62) 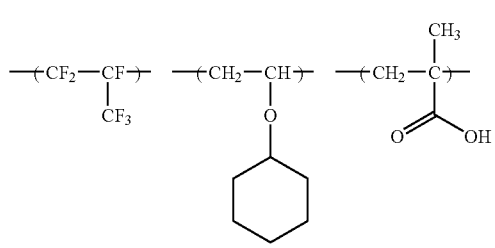
TABLE 1-continued
(HR-63) 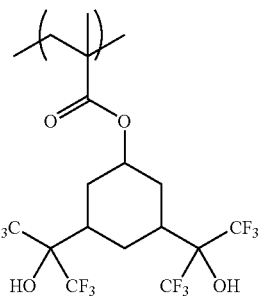
(HR-64) 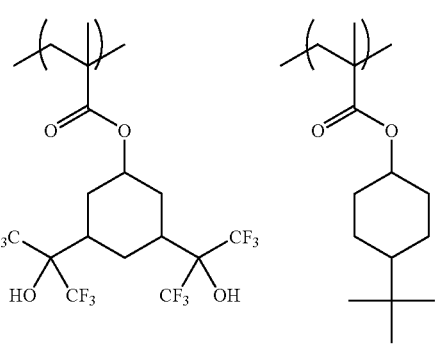
(HR-65) 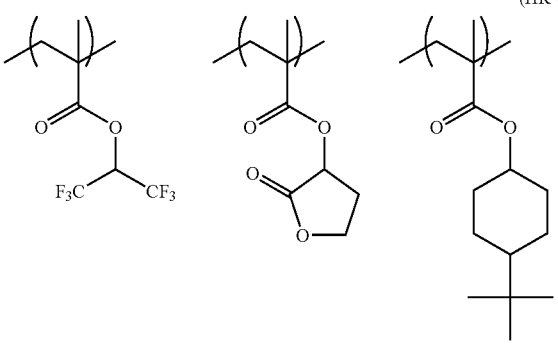
(HR-66) 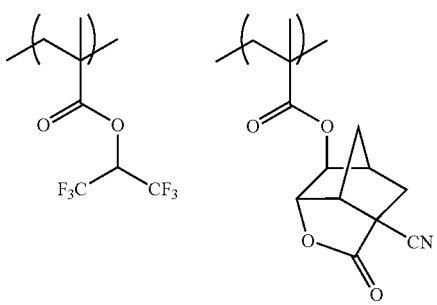
(HR-67) 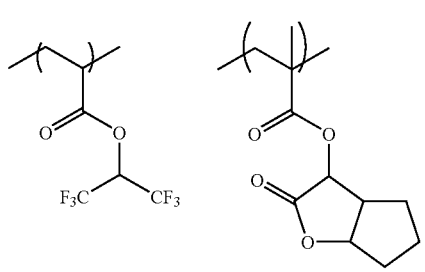

TABLE 1-continued
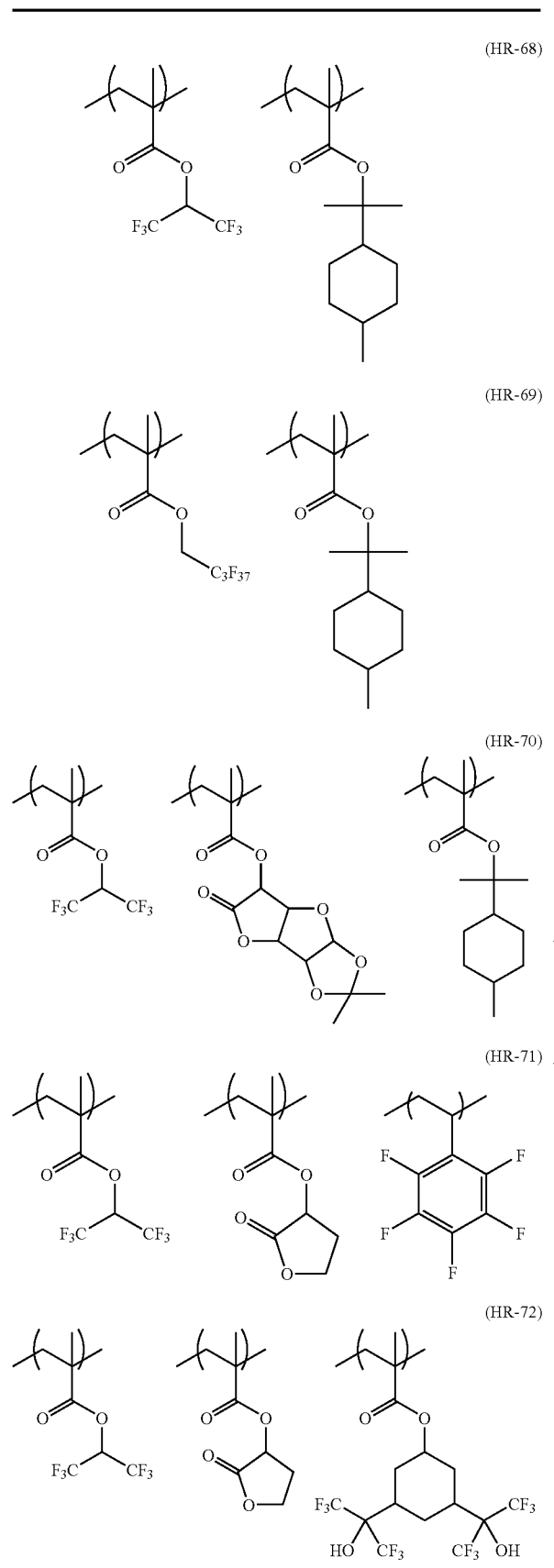
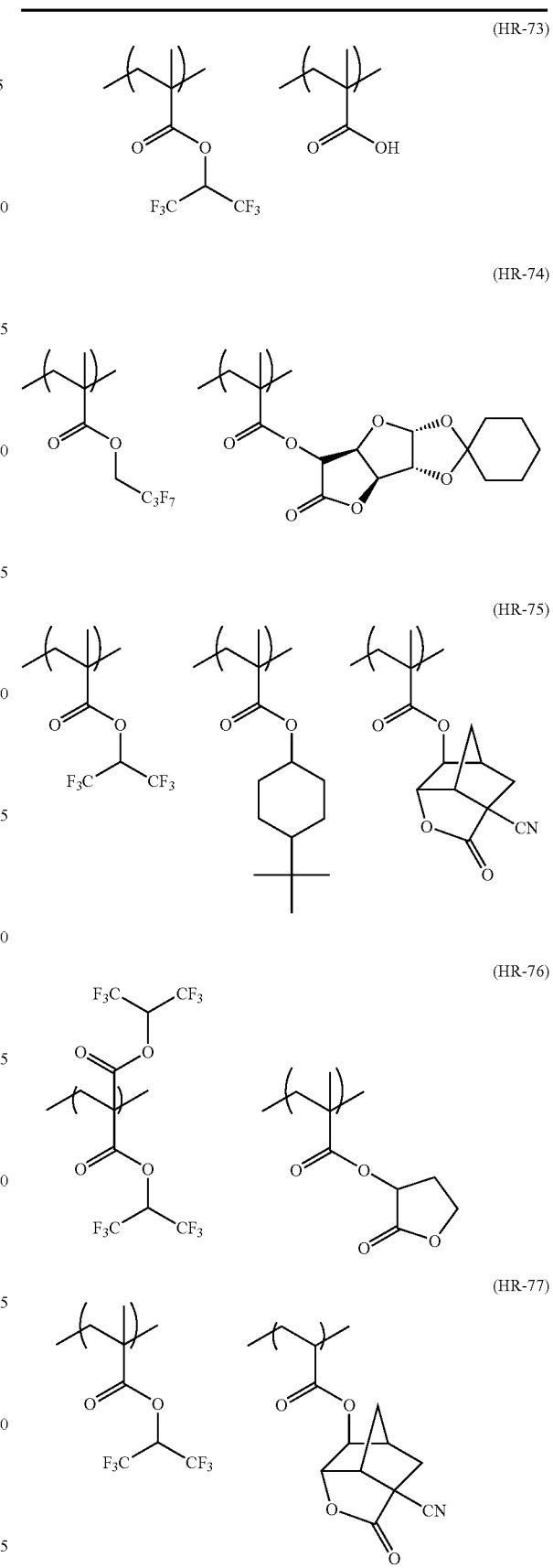

TABLE 1-continued
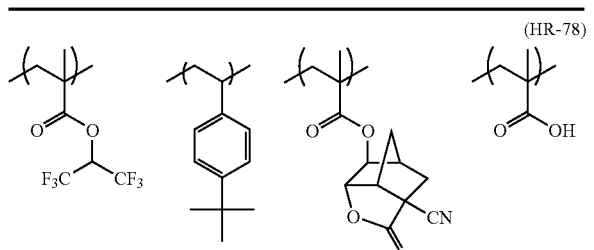
(HR-78)
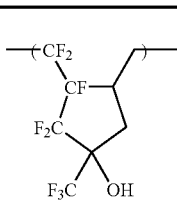
(HR-83)
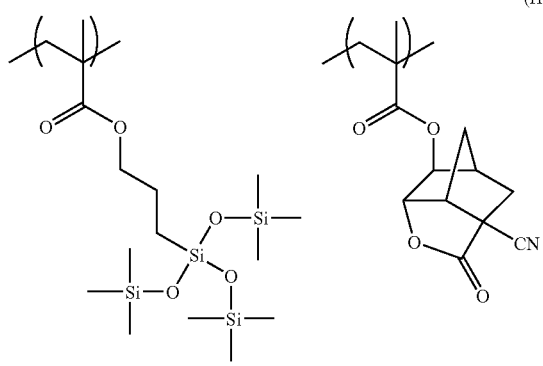
(HR-79)
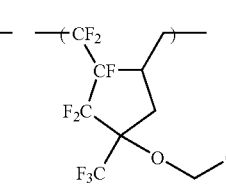
(HR-84)
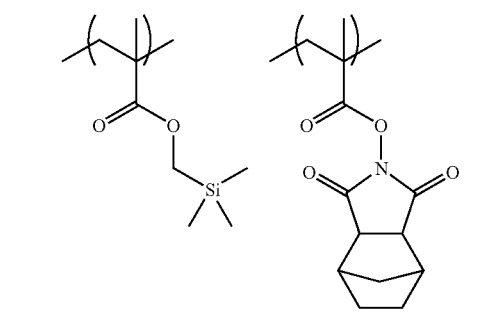
(HR-80)
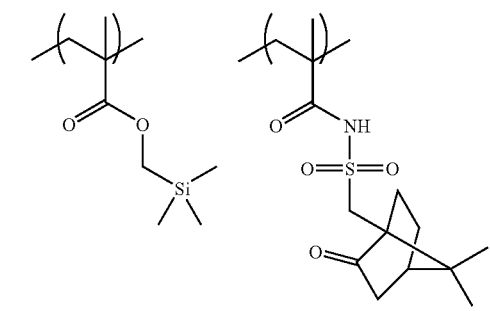
(HR-81)
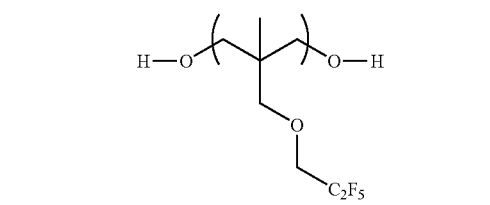
(HR-82)
| Resin | Composition | Mw | Mw/Mn |
|---|---|---|---|
| HR-1 | 50/50 | 8800 | 2.1 |
| HR-2 | 50/50 | 5200 | 1.8 |
| HR-3 | 50/50 | 4800 | 1.9 |
| HR-4 | 50/50 | 5300 | 1.9 |
| HR-5 | 50/50 | 6200 | 1.9 |
| HR-6 | 100 | 12000 | 2.0 |
| HR-7 | 50/50 | 5800 | 1.9 |
| HR-8 | 50/50 | 6300 | 1.9 |
| HR-9 | 100 | 5500 | 2.0 |
| HR-10 | 50/50 | 7500 | 1.9 |
| HR-11 | 70/30 | 10200 | 2.2 |
| HR-12 | 40/60 | 15000 | 2.2 |
| HR-13 | 40/60 | 13000 | 2.2 |
| HR-14 | 80/20 | 11000 | 2.2 |
| HR-15 | 60/40 | 9800 | 2.2 |
| HR-16 | 50/50 | 8000 | 2.2 |
| HR-17 | 50/50 | 7600 | 2.0 |
| HR-18 | 50/50 | 12000 | 2.0 |
| HR-19 | 20/80 | 6500 | 1.8 |
| HR-20 | 100 | 6500 | 1.2 |
| HR-21 | 100 | 6000 | 1.6 |
| HR-22 | 100 | 2000 | 1.6 |
| HR-23 | 50/50 | 6000 | 1.7 |
| HR-24 | 50/50 | 8800 | 1.9 |
| HR-25 | 50/50 | 7800 | 2.0 |
| HR-26 | 50/50 | 8000 | 2.0 |
| HR-27 | 80/20 | 8000 | 1.8 |
| HR-28 | 30/70 | 7000 | 1.7 |
| HR-29 | 50/50 | 6500 | 1.6 |
| HR-30 | 50/50 | 6500 | 1.6 |
| HR-31 | 50/50 | 9000 | 1.8 |
| HR-32 | 100 | 10000 | 1.6 |
| HR-33 | 70/30 | 8000 | 2.0 |
| HR-34 | 10/90 | 8000 | 1.8 |
| HR-35 | 30/30/40 | 9000 | 2.0 |
| HR-36 | 50/50 | 6000 | 1.4 |
| HR-37 | 50/50 | 5500 | 1.5 |
| HR-38 | 50/50 | 4800 | 1.8 |
| HR-39 | 60/40 | 5200 | 1.8 |
| HR-40 | 50/50 | 8000 | 1.5 |
| HR-41 | 20/80 | 7500 | 1.8 |
| HR-42 | 50/50 | 6200 | 1.6 |
| HR-43 | 60/40 | 16000 | 1.8 |
| HR-44 | 80/20 | 10200 | 1.8 |
| HR-45 | 50/50 | 12000 | 2.6 |
| HR-46 | 50/50 | 10900 | 1.9 |
| HR-47 | 50/50 | 6000 | 1.4 |
| HR-48 | 50/50 | 4500 | 1.4 |
| HR-49 | 50/50 | 6900 | 1.9 |
| HR-50 | 100 | 2300 | 2.6 |
| HR-51 | 60/40 | 8800 | 1.5 |
| HR-52 | 68/32 | 11000 | 1.7 |
| HR-53 | 100 | 8000 | 1.4 |
| HR-54 | 100 | 8500 | 1.4 |
| HR-55 | 80/20 | 13000 | 2.1 |
| HR-56 | 70/30 | 18000 | 2.3 |
| HR-57 | 50/50 | 5200 | 1.9 |
| HR-58 | 50/50 | 10200 | 2.2 |

TABLE 1-continued

| | | | |
|---|---|---|---|
| HR-59 | 60/40 | 7200 | 2.2 |
| HR-60 | 32/32/36 | 5600 | 2.0 |
| HR-61 | 30/30/40 | 9600 | 1.6 |
| HR-62 | 40/40/20 | 12000 | 2.0 |
| HR-63 | 100 | 6800 | 1.6 |
| HR-64 | 50/50 | 7900 | 1.9 |
| HR-65 | 40/30/30 | 5600 | 2.1 |
| HR-66 | 50/50 | 6800 | 1.7 |
| HR-67 | 50/50 | 5900 | 1.6 |
| HR-68 | 49/51 | 6200 | 1.8 |
| HR-69 | 50/50 | 8000 | 1.9 |
| HR-70 | 30/40/30 | 9600 | 2.3 |
| HR-71 | 30/40/30 | 9200 | 2.0 |
| HR-72 | 40/29/31 | 3200 | 2.1 |
| HR-73 | 90/10 | 6500 | 2.2 |
| HR-74 | 50/50 | 7900 | 1.9 |
| HR-75 | 20/30/50 | 10800 | 1.6 |
| HR-76 | 50/50 | 2200 | 1.9 |
| HR-77 | 50/50 | 5900 | 2.1 |
| HR-78 | 40/20/30/10 | 14000 | 2.2 |
| HR-79 | 50/50 | 5500 | 1.8 |
| HR-80 | 50/50 | 10600 | 1.9 |
| HR-81 | 50/50 | 8600 | 2.3 |
| HR-82 | 100 | 15000 | 2.1 |
| HR-83 | 100 | 6900 | 2.5 |
| HR-84 | 50/50 | 9900 | 2.3 |

<Preparation of Positive Resist Composition>

The positive resist composition of the present invention is preferably used in a film thickness of 30 to 250 nm, more preferably from 30 to 200 nm, from the standpoint of enhancing the resolving power. Such a film thickness can be obtained by setting the solid content concentration in the positive resist composition to an appropriate range, thereby giving an appropriate viscosity to enhance the coatability and film-forming property.

The entire solid content concentration in the positive resist composition is generally from 1 to 10 mass %, preferably from 1 to 8.0 mass %, more preferably from 1.0 to 6.0 mass %.

The positive resist composition of the present invention is used by dissolving the components described above in a predetermined organic solvent, preferably in the above-described mixed solvent, filtering the solution, and coating it on a predetermined support as follows. The filter used for filtering is preferably a polytetrafluoroethylene-, polyethylene- or nylon-made filter having a pore size of 0.1 µm or less, more preferably 0.05 µm or less, still more preferably 0.03 µm or less.

<Pattern Forming Method>

A resist film is formed using the positive resist composition of the present invention and the resist film is exposed and developed, whereby a pattern can be formed.

The pattern forming method of the present invention comprises performing exposure once or more times on the same resist film and is characterized by having a step of heating the resist film after each exposure and a step of heating, before development, the resist film at a temperature higher than that in the heating step after exposure.

That is, the pattern forming method of the present invention includes the following steps in the order as below:
 a step of coating a substrate with the positive resist composition, so as to form a resist film;
 a step of exposing the resist film;
 a step of heating the resist film at a first temperature;
 a step of heating the resist film at a second temperature; and
 a step of developing the resist film,
wherein the second temperature is higher than the first temperature.

For example, the positive resist composition is coated on such a substrate (e.g., silicon/silicon dioxide-coated substrate) as that used in the production of a precision integrated circuit device by an appropriate coating method such as spinner or coater and dried to form a resist film.

The resist film is exposed by irradiating actinic rays or radiation thereon through a predetermined mask, preferably heated and then subjected to development and rinsing, whereby a good pattern can be obtained.

In the case of performing exposure twice or more times (multiple exposure), the formed resist film is irradiated with actinic rays or radiation through a predetermined mask, but the multiple exposure process as used in the present invention is a process of applying exposure a plurality of times to the same resist film, where the pattern in the exposure field is divided into a plurality of pattern groups and the exposure is preformed in parts a plurality of times for respective divided pattern groups.

For example, as disclosed in Digest of Papers, Micro Process' 94, pp. 4-5, this process is generally performed by a method of dividing the pattern in the exposure field into two groups and performing double exposure. As regards the specific method for dividing the pattern, for example, as shown in FIG. 1, two masks each having a pattern consisting of a 60-nm line and a 180-nm space are used and exposure is performed twice by displacing the position between those masks by 120 nm, whereby a 1:1 line-and-space pattern of 60 nm is formed. In general, as the pitch of the pattern (in the 1:1 line-and-space pattern of 60 nm, the pitch is 120 nm) becomes narrower, the optical resolution decreases. In the double exposure, the pattern in each of divided groups comes to have as a large pitch as 2 times the pitch in the original pattern and the resolution is enhanced.

The method of the present invention comprises a step of heating the resist film in at least one interval out of respective exposure intervals of multiple exposure. That is, the method comprises a heating step between exposure and exposure, like exposure-heating-exposure. By virtue of this heating step, the distribution of the acid generated in the exposed region upon light irradiation can be made uniform before the resin is solubilized in an alkali developer under the action of the acid, so that the performance in terms of resolution and line edge roughness can be enhanced.

Also, in the case of using a resist containing an acid-increasing agent, by virtue of this heating step, the acid generated in the exposed region upon light irradiation is caused to accelerate the acid increasing reaction before the resin is solubilized in an alkali developer under the action of an acid, so that the acid concentration in the exposed region can be increased and the performance in terms of resolution and line edge roughness can be more enhanced.

The temperature of heating after exposure needs to be a temperature not allowing the resin to be solubilized in an alkali developer under the action of an acid, but even at a temperature not allowing the resin to be solubilized in an alkali developer under the action of an acid, since the acid generated in the exposed region upon light irradiation is inhibited to diffuse into the unexposed region, the temperature of heating after exposure is preferably from 40 to 80° C., more preferably from 40 to 70° C., and most preferably from 50 to 70° C. The preferred range of heating temperature is the same also in the case of using an acid-increasing agent. This heating temperature is an actual temperature of the resist film.

Furthermore, if the heating time is too short, the temperature history in the wafer plane comes to have bad uniformity, whereas if it is excessively long, the acid generated is diffused out. Accordingly, the heating time is preferably from 30 to 100 seconds, more preferably from 40 to 80 seconds, and most preferably from 50 to 80 seconds.

The above-described heating may be performed by placing the resist film with the substrate on a hot plate or charging it into an oven, where the hot plate or oven is set to a predetermined temperature.

In the case of performing the exposure in parts three or more times, a heating step may be provided either between first exposure and second exposure or between second exposure and third exposure, but the heating step is preferably provided in all intervals between respective exposures. Incidentally, it is preferred that the same heating step as in the above-described inter-exposure heating step is provided also after final exposure.

Separately from the heating step between exposures (inter-exposure heating), in which the distribution of the acid generated in the exposed region upon light irradiation is made uniform, and the heating step after final exposure (after-exposure heating), which is the same as the heating step between exposures, a heating step at a temperature higher than that in the heating step after exposure is preferably added before development (before-development heating) so as to solubilize the resin in an alkali developer under the action of an acid.

The temperature in the before-development heating step is preferably from 100 to 150° C., more preferably from 100 to 130° C., and most preferably from 110 to 130° C.

The heating time is preferably from 30 to 150 seconds, more preferably from 40 to 100 seconds, and most preferably from 50 to 90 seconds, because if the heating time is too short, the temperature history in the wafer plane comes to have bad uniformity, whereas if it is excessively long, the acid generated is diffused out.

Also in the before-development heating step, the heating temperature is the actual temperature of the resist film, and the heating may be performed, for example, by placing the resist film with the substrate on a hot plate or charging it into an oven, where the hot plate or oven is set to a predetermined temperature.

The heating temperature in the heating step between exposure and exposure is preferably lower than the heating temperature in the heating steps after final exposure and before development by 20° C. or more, more preferably by from 40 to 90° C., and most preferably by from 50 to 60° C.

Immediately after each heating step of inter-exposure heating, after-exposure heating and before-development heating, a step of cooling the resist film to room temperature is preferably provided, but in the case of continuously performing the heating steps, the cooling step may be omitted.

As regards the actual process from exposure to development, for example, the double exposure process most preferably flows through first exposure, first after-exposure heating, cooling to room temperature, second exposure, second after-exposure heating, before-development heating, cooling to room temperature, and development.

Examples of the actinic rays or radiation include infrared light, visible light, ultraviolet light, far ultraviolet light, X-ray and electron beam, but the radiation is preferably far ultraviolet light at a wavelength of 250 nm or less, more preferably 220 nm or less, still more preferably from 1 to 200 nm. Specific examples thereof include KrF excimer laser light (248 nm), ArF excimer laser light (193 nm), $F_2$ excimer laser light (157 nm), X-ray and electron beam. ArF excimer laser light, $F_2$ excimer laser light, EUV (13 nm) and electron beam are preferred.

Before forming the resist film, an antireflection film may be previously provided by coating on the substrate.

The antireflection film used may be either an inorganic film type such as titanium, titanium dioxide, titanium nitride, chromium oxide, carbon and amorphous silicon, or an organic film type comprising a light absorbent and a polymer material. Also, the organic antireflection film may be a commercially available organic antireflection film such as DUV30 Series and DUV-40 Series produced by Brewer Science, Inc., and AR-2, AR-3 and AR-5 produced by Shipley Co., Ltd.

In the development step, an alkali developer is used as follows. The alkali developer which can be used for the positive resist composition is an alkaline aqueous solution of, for example, inorganic alkalis such as sodium hydroxide, potassium hydroxide, sodium carbonate, sodium silicate, sodium metasilicate and aqueous ammonia, primary amines such as ethylamine and n-propylamine, secondary amines such as diethylamine and di-n-butylamine, tertiary amines such as triethylamine and methyldiethylamine, alcohol amines such as dimethylethanolamine and triethanolamine, quaternary ammonium salts such as tetramethylammonium hydroxide and tetraethylammonium hydroxide, or cyclic amines such as pyrrole and piperidine.

Furthermore, this alkali developer may be used after adding thereto alcohols and a surfactant each in an appropriate amount.

The alkali concentration of the alkali developer is usually from 0.1 to 20 mass %.

The pH of the alkali developer is usually from 10.0 to 15.0.

Also, the above-described alkaline aqueous solution may be used after adding thereto alcohols and a surfactant each in an appropriate amount.

As for the rinsing solution, pure water is used, and the pure water may be used after adding thereto a surfactant in an appropriate amount.

After the development or rinsing, the developer or rinsing solution adhering on the pattern may removed by a supercritical fluid, <Immersion Exposure>

The exposure may be performed by filling a liquid (immersion medium) having a refractive index higher than that of air between the resist film and a lens at the irradiation with actinic rays or radiation (immersion exposure). By this exposure, the resolution can be enhanced. The immersion medium used may be any liquid as long as it has a refractive index higher than that of air, but pure water is preferred.

The immersion liquid used in the immersion exposure is described below.

The immersion liquid is preferably a liquid transparent to light at the exposure wavelength and having as small a temperature coefficient of refractive index as possible so as to minimize the distortion of an optical image projected on the resist film. Particularly, when the exposure light source is an ArF excimer laser (wavelength: 193 nm), water is preferably used in view of easy availability and easy handleability in addition to the above-described aspects.

Furthermore, a medium having a refractive index of 1.5 or more can also be used from the standpoint that the refractive index can be more enhanced. This medium may be either an aqueous solution or an organic solvent.

In the case of using water as the immersion liquid, for the purpose of decreasing the surface tension of water and increasing the surface activity, an additive (liquid) which does not dissolve the resist film on a wafer and at the same time, gives only a negligible effect on the optical coat at the under-surface of the lens element, may be added in a small ratio. The additive is preferably an aliphatic alcohol having a refractive index nearly equal to that of water, and specific examples thereof include methyl alcohol, ethyl alcohol and isopropyl alcohol. By virtue of adding an alcohol having a refractive index nearly equal to that of water, even when the alcohol component in water is evaporated and its content concentration is changed, the change in the refractive index of the entire liquid can be advantageously made very small. On the other hand, if a substance opaque to light at 193 nm or an impurity greatly differing in the refractive index from water is mingled, this incurs distortion of the optical image projected on the resist film. Therefore, the water used is preferably distilled water. Pure water obtained by further filtering the distilled water through an ion exchange filter or the like may also be used.

The electrical resistance of water is preferably 18.3 MΩcm or more, and TOC (total organic carbon) is preferably 20 ppb or less. Also, the water is preferably subjected to a deaeration treatment.

The lithography performance can be enhanced by increasing the refractive index of the immersion liquid. From such a standpoint, an additive for increasing the refractive index may be added to water, or heavy water ($D_2O$) may be used in place of water.

In the patterning by immersion exposure, the positive resist composition for forming the resist film preferably contains a hydrophobic resin (HR) described later, Furthermore, in order to prevent the resist film from directly contacting with the immersion liquid, an immersion liquid sparingly soluble film (hereinafter, sometimes referred to as a "topcoat") may be provided between the immersion liquid and the resist film formed from the positive resist composition of the present invention. The functions required of the topcoat are suitability for coating on the resist upper layer part, transparency to radiation particularly at 193 nm, and sparing solubility in the immersion liquid. It is preferred that the topcoat does not intermix with the resist and can be uniformly coated on the resist upper layer.

In view of transparency to light at 193 nm, the topcoat is preferably a polymer not abundantly containing an aromatic, and specific examples thereof include a hydrocarbon polymer, an acrylic acid ester polymer, a polymethacrylic acid, a polyacrylic acid, a polyvinyl ether, a silicon-containing polymer and a fluorine-containing polymer. The hydrophobic resin (HR) may also be suitably used as the topcoat. If impurities dissolve out into the immersion liquid from the topcoat, the optical lens is contaminated. In this viewpoint, the residual monomer components of the polymer are preferably less contained in the topcoat.

On peeling off the topcoat, a developer may be used or a releasing agent may be separately used. The releasing agent is preferably a solvent less permeating into the resist film. From the standpoint that the peeling step can be performed simultaneously with the development step of the resist film, the topcoat is preferably peelable with an alkali developer and for enabling the peeling with an alkali developer, the topcoat is preferably acidic, but in view of non-intermixing with the resist film, the topcoat may be neutral or alkaline.

With no difference in the refractive index between the topcoat and the immersion liquid, the resolving power is enhanced. In the case of using water as the immersion liquid at the exposure with an ArF excimer laser (wavelength: 193 nm), the topcoat for ArF immersion exposure preferably has a refractive index close to the refractive index of the immersion liquid. From the standpoint of making the refractive index close to that of the immersion liquid, the topcoat preferably contains a fluorine atom. Also, in view of transparency and refractive index, the topcoat is preferably a thin film.

The topcoat is preferably free of intermixing with the resist film and further with the immersion liquid. From this standpoint, when the immersion liquid is water, the topcoat solvent is preferably a medium which is sparingly soluble in the solvent used for the positive resist composition and insoluble in water. Furthermore, when the immersion liquid is an organic solvent, the topcoat may be either water-soluble or water-insoluble.

The pattern forming method of the present invention and the positive resist composition of the present invention may be applied to a multilayer resist process (particularly, a three-layer resist process). The multilayer resist process comprises the following steps:

(a) forming a lower resist layer comprising an organic material on a substrate to be processed, (b) sequentially stacking on the lower resist layer an intermediate layer and an upper resist layer comprising an organic material capable of crosslinking or decomposing upon irradiation with radiation, and (c) forming a predetermined pattern on the upper resist layer and then sequentially etching the intermediate layer, the lower layer and the substrate.

An organopolysiloxane (silicone resin) or $SiO_2$ coating solution (SOG) is generally used for the intermediate layer. As for the lower layer resist, an appropriate organic polymer film is used, but various known photoresists may be used. Examples thereof include various series such as FH Series and FHi Series produced by Fujifilm Arch Co., Ltd., and PFI Series produced by Sumitomo Chemical Co., Ltd.

The film thickness of the lower resist layer is preferably from 0.1 to 4.0 μm, more preferably from 0.2 to 2.0 μm, still more preferably from 0.25 to 1.5 μm. The film thickness is preferably 0.1 μm or more in view of antireflection or dry etching resistance and preferably 4.0 μm or less from the standpoint of aspect ratio or pattern collapse of the fine pattern formed.

In the method of the present invention, the resist film may be a general resist film but is preferably a resist film formed from a positive resist composition using the above-described components.

EXAMPLES

The present invention is described in greater detail below by referring to Examples, but the contents of the present invention should not be construed as being limited by these Examples.

Synthesis Example 1

Synthesis of Resin (1)

Under a nitrogen stream, 8.8 g of cyclohexanone was charged into a three-neck flask and heated at 80° C. Thereto, a solution prepared by dissolving 8.5 g of γ-butyrolactone methacrylate, 4.7 g of 3-hydroxyadamantyl-1-methacrylate, 8.8 g of 2-methyl-2-adamantyloxycarbonylmethyl methacrylate and a polymerization initiator V-60 (produced by Wako Pure Chemical Industries, Ltd.) in an amount of 13 mol % based on the monomers, in 79 g of cyclohexanone was added dropwise over 6 hours. After the completion of dropwise addition, the reaction was further allowed to proceed at 80° C. for 2 hours. The reaction solution was left standing to cool and then added dropwise to a mixed solution of 900-ml methanol/100-ml water over 20 minutes, and the precipitated powder was collected by filtration and dried to obtain 18 g of Resin (1). The weight average molecular weight of Resin (1)

obtained was 6,200 in terms of standard polystyrene, and the dispersity (Mw/Mn) was 1.6.

Other resins were synthesized in the same manner. The weight average molecular weight was adjusted by changing the amount of the polymerization initiator.

Regarding Resins (1) to (20) of the present invention, the monomers used for the synthesis, the molar ratio of repeating units corresponding to the monomers, the weight average molecular weight (Mw) and the dispersity (Mw/Mn) are shown in Tables 2 and 3 below.

TABLE 2

| No. | Monomer (1) | Monomer (2) | Monomer (3) | Monomer (4) | Compositional Ratio (by mol) | Mw | Mw/Mn |
|---|---|---|---|---|---|---|---|
| 1 | [structure] | [structure] | [structure] | — | 50/20/30 | 6200 | 1.6 |
| 2 | [structure] | [structure] | — | — | 89/11 | 9600 | 2.1 |
| 3 | [structure] | [structure] | [structure] | — | 42/10/48 | 8700 | 2.1 |

TABLE 2-continued

| No. | Monomer (1) | Monomer (2) | Monomer (3) | Monomer (4) | Compositional Ratio (by mol) | Mw | Mw/Mn |
|---|---|---|---|---|---|---|---|
| 4 | (methacrylate with norbornane lactone CN group) | (methacrylate with dihydroxyadamantane) | (methacrylate with adamantane carboxylate ester) | (methacrylate with adamantyl dimethyl group) | 40/10/26/24 | 9900 | 2.3 |
| 5 | (methacrylate with norbornane lactone CN group) | (methacrylate with glycolate cyclohexyl dimethyl group) | (methacrylate with glycolate methoxymethyl cyclohexyl group) | — | 50/10/40 | 7400 | 2.3 |
| 6 | (methacrylate with glycolate diethyl cyclohexyl group) | (methacrylate with methyleneoxy adamantyl group) | — | — | 50/50 | 6300 | 2.2 |

TABLE 2-continued

| No. | Monomer (1) | Monomer (2) | Monomer (3) | Monomer (4) | Compositional Ratio (by mol) | Mw | Mw/Mn |
|---|---|---|---|---|---|---|---|
| 7 | [structure] | — | — | — | 100 | 3200 | 1.5 |
| 8 | [structure] | [structure] | [structure] | — | 40/30/30 | 9000 | 2.1 |
| 9 | [structure] | [structure] | [structure] | [structure] | 20/50/20/10 | 8000 | 2.2 |

TABLE 2-continued

| No. | Monomer (1) | Monomer (2) | Monomer (3) | Monomer (4) | Compositional Ratio (by mol) | Mw | Mw/Mn |
|---|---|---|---|---|---|---|---|
| 10 | (structure) | (structure) | — | — | 50/50 | 8500 | 1.9 |

TABLE 3

| 11 | (structure) | (structure) | (structure) | (structure) | 40/20/20/20 | 7900 | 2.0 |
| 12 | (structure) | (structure) | (structure) | (structure) | 30/15/11/44 | 5900 | 1.9 |

TABLE 3-continued

| 13 | [structure] | [structure] | — | — | 50/50 | 6300 | 1.8 |
| 14 | [structure] | — | — | — | 100 | 6200 | 1.7 |
| 15 | [structure] | [structure] | — | — | 30/70 | 6300 | 1.9 |

TABLE 3-continued

| | | | | | | |
|---|---|---|---|---|---|---|
| 16 | (structure) | (structure) | — | — | 40/60 | 2600 2.3 |
| 17 | (structure) | (structure) | — | — | 20/80 | 12000 2.4 |
| 18 | (structure) | (structure) | (structure) | | 20/40/40 | 7500 2.3 |

TABLE 3-continued

| | Structure 1 | Structure 2 | Structure 3 | Ratio | Mw | Mw/Mn |
|---|---|---|---|---|---|---|
| 19 | (methacrylate with (CH₂)₃ linker to cyclohexyl-diethyl ester) | — | — | 100 | 6100 | 1.9 |
| 20 | (methacrylate of lactone-CN bicyclic) | (methacrylate with (CH₂)₃ linker to cyclohexyl-diethyl ester) | — | 50/50 | 5900 | 2.0 |

Synthesis Example 2

Synthesis of Resin (HR-22)

Under a nitrogen stream, 5.0 g of cyclohexanone was charged into a three-neck flask and heated at 80° C. Subsequently, a solution prepared by dissolving 5.0 g of bis(trifluoromethyl)methyl methacrylate and azobisisobutyronitrile in an amount corresponding to 10 mol % of the mass of the monomer, in 25.0 g of cyclohexanone was added dropwise to the flask over 2 hours. After the completion of dropwise addition, the flask was heated at 80° C. for 2 hours. The reaction solution was left standing to cool to room temperature and then poured in 300-ml methanol, and the precipitated powder was collected by filtration and dried to obtain 4.5 g of Resin (HR-22). The weight average molecular weight (Mw) of Resin (HR-22) obtained was 2,000, the dispersity (Mw/Mn) was 1.6.

Other hydrophobic resins were synthesized in the same manner. The weight average molecular weight was adjusted by changing the amount of the polymerization initiator.

Examples 1 to 22 and Comparative Examples 1 and 2

Preparation of Resist

The components shown in Tables 4 and 5 below were dissolved in a solvent to prepare a solution having a solid content concentration of 5 mass %, and the obtained solution was filtered through a polyethylene filter having a pore size of 0.1 μm to prepare a positive resist composition. As for each component in Tables 4 and 5, when a plurality of species were used, the ratio is a ratio by mass.

TABLE 4

Preparation of Resist for Dry Exposure

| Resist | Compound (D) | g | Compound (C) | g | Acid Generator | g | Resin (10 g) | Basic Compound | g | Surfactant (0.02 g) | Solvent | (ratio by mass) |
|---|---|---|---|---|---|---|---|---|---|---|---|---|
| 1 | II-3 | 0.45 | 1-1 | (0.50) | Z5 | (0.10) | 1 | — | — | W-5 | A1/B1 | (80/20) |
| 2 | II-8 | 0.23 | 1-4 | (1.0) | Z28 | (0.15) | 2 | — | — | W-3 | A1/A3 | (60/40) |
| 3 | II-9 | 1.00 | 1-5 | (2.0) | Z7 | (0.50) | 3 | — | — | W-2 | A1/A4 | (50/50) |
| 4 | II-18 | 2.20 | 1-6 | (4.0) | Z4 | (0.40) | 4 | — | — | W-4 | A1/B2 | (90/10) |
| 5 | II-72 | 0.85 | 1-7 | (2.5) | Z26 | (0.20) | 5 | — | — | W-1 | A3/B2 | (70/30) |
| 6 | II-55 | 0.32 | 2-2 | (3.0) | Z7 | (0.15) | 6 | PEA | 0.01 | W-6 | A4/B1 | (60/40) |
| 7 | II-50 | 0.30 | 2-3 | (1.0) | Z29 | (0.30) | 7 | TOA | 0.03 | W-1 | A3/B2 | (90/10) |
| 8 | A-1 | 0.45 | 2-6 | (1.5) | Z30 | (0.25) | 8 | — | — | W-3 | A3/B3 | (95/5) |
| 9 | A-4 | 0.70 | 3-1 | (2.0) | Z6 | (0.20) | 9 | — | — | W-6 | A1/B1 | (60/40) |

TABLE 4-continued

Preparation of Resist for Dry Exposure

| Resist | Compound (D) | g | Compound (C) | g | Acid Generator | g | Resin (10 g) | Basic Compound | g | Surfactant (0.02 g) | Solvent | (ratio by mass) |
|---|---|---|---|---|---|---|---|---|---|---|---|---|
| 10 | A-8  | 0.35 | 3-3 | (1.5) | Z28 | (0.15) | 10 | —   | —    | W-4 | A3/B2 | (80/20) |
| 11 | A-12 | 0.25 | 3-4 | (0.80)| Z2  | (0.25) | 11 | —   | —    | W-1 | A1/B1 | (70/30) |
| 12 | A-10 | 0.40 | 4-3 | (1.0) | Z21 | (0.30) | 12 | —   | —    | W-6 | A1/B2 | (70/30) |
| 13 | A-19 | 1.00 | 4-2 | (3.5) | Z18 | (0.45) | 13 | —   | —    | W-2 | A3    | (100)   |
| 14 | A-27 | 0.90 | 4-5 | (3.0) | Z17 | (0.70) | 14 | —   | —    | W-1 | A1    | (100)   |
| 15 | A-38 | 0.90 | 2-1 | (2.5) | Z28 | (0.30) | 15 | —   | —    | W-3 | A4/B2 | (90/10) |
| 16 | A-42 | 0.50 | 1-6 | (2.0) | Z16 | (0.50) | 16 | —   | —    | W-1 | A4/B1 | (50/50) |
| 17 | A-33 | 1.00 | 3-4 | (2.5) | Z25 | (0.35) | 17 | —   | —    | W-3 | A1/A3 | (60/40) |
| 18 | A-18 | 0.75 | 2-3 | (2.0) | Z24 | (0.45) | 18 | PBI | 0.04 | W-4 | A1/A3 | (80/20) |
| 19 | A-30 | 0.40 | 1-7 | (1.5) | Z26 | (0.30) | 19 | DIA | 0.02 | W-2 | A1/B2 | (70/30) |
| 20 | A-5  | 0.45 | 3-3 | (1.0) | Z29 | (0.25) | 20 | TPA | 0.02 | W-1 | A1/B1 | (80/20) |
| 21 | —    | —    | 1-6 | (1.5) | Z5  | (0.30) | 1  | PBI | 0.03 | W-6 | A1/B1 | (80/20) |
| 22 | —    | —    | 1-4 | (2.0) | Z4  | (0.40) | 1  | DIA | 0.03 | W-1 | A1/B1 | (80/20) |

TABLE 5

Preparation of Resist for Immersion Exposure

| Resist | Compound (D) | g | Compound (C) | (g) | Acid Generator | (g) | Resin (10 g) | Basic Compound | (g) | Hydrophobic Compound (HR) | (g) | Surfactant (0.02 g) | Solvent | (ratio by mass) |
|---|---|---|---|---|---|---|---|---|---|---|---|---|---|---|
| 23 | II-3  | 0.45 | 1-1 | (0.50) | Z5  | (0.10) | 1  | —   | —    | HR-22 | (0.1) | W-5 | A1/B1 | (80/20) |
| 24 | II-8  | 0.23 | 1-4 | (1.0)  | Z28 | (0.15) | 2  | —   | —    | HR-37 | (0.4) | W-3 | A1/A3 | (60/40) |
| 25 | II-9  | 1.00 | 1-5 | (2.0)  | Z7  | (0.50) | 3  | —   | —    | HR-2  | (0.3) | W-2 | A1/A4 | (50/50) |
| 26 | II-18 | 2.20 | 1-6 | (4.0)  | Z4  | (0.40) | 4  | —   | —    | HR-15 | (0.2) | W-4 | A1/B2 | (90/10) |
| 27 | II-72 | 0.85 | 1-7 | (2.5)  | Z26 | (0.20) | 5  | —   | —    | HR-53 | (0.2) | W-1 | A3/B2 | (70/30) |
| 28 | II-55 | 0.32 | 2-2 | (3.0)  | Z7  | (0.15) | 6  | PEA | 0.01 | HR-37 | (0.4) | W-6 | A4/B1 | (60/40) |
| 29 | II-50 | 0.30 | 2-3 | (1.0)  | Z29 | (0.30) | 7  | TOA | 0.03 | HR-65 | (0.2) | W-1 | A3/B2 | (90/10) |
| 30 | A-1   | 0.45 | 2-6 | (1.5)  | Z30 | (0.25) | 8  | —   | —    | HR-83 | (0.3) | W-3 | A3/B3 | (95/5)  |
| 31 | A-4   | 0.70 | 3-1 | (2.0)  | Z6  | (0.20) | 9  | —   | —    | HR-44 | (0.1) | W-6 | A1/B1 | (60/40) |
| 32 | A-8   | 0.35 | 3-3 | (1.5)  | Z28 | (0.15) | 10 | —   | —    | HR-22 | (0.1) | W-4 | A3/B2 | (80/20) |
| 33 | A-12  | 0.25 | 3-4 | (0.80) | Z2  | (0.25) | 11 | —   | —    | HR-31 | (0.3) | W-1 | A1/B1 | (70/30) |
| 34 | A-10  | 0.40 | 4-3 | (1.0)  | Z21 | (0.30) | 12 | —   | —    | HR-54 | (0.5) | W-6 | A1/B2 | (70/30) |
| 35 | A-19  | 1.00 | 4-2 | (3.5)  | Z18 | (0.45) | 13 | —   | —    | HR-37 | (0.2) | W-2 | A3    | (100)   |
| 36 | A-27  | 0.90 | 4-5 | (3.0)  | Z17 | (0.70) | 14 | —   | —    | HR-72 | (0.3) | W-1 | A1    | (100)   |
| 37 | A-38  | 0.90 | 2-1 | (2.5)  | Z28 | (0.30) | 15 | —   | —    | HR-32 | (0.3) | W-3 | A4/B2 | (90/10) |
| 38 | A-42  | 0.50 | 1-6 | (2.0)  | Z16 | (0.50) | 16 | —   | —    | HR-22 | (0.2) | W-1 | A4/B1 | (50/50) |
| 39 | A-33  | 1.00 | 3-4 | (2.5)  | Z25 | (0.35) | 17 | —   | —    | HR-31 | (0.1) | W-3 | A1/A3 | (60/40) |
| 40 | A-18  | 0.75 | 2-3 | (2.0)  | Z24 | (0.45) | 18 | PBI | 0.04 | HR-53 | (0.2) | W-4 | A1/A3 | (80/20) |
| 41 | A-30  | 0.40 | 1-7 | (1.5)  | Z26 | (0.30) | 19 | DIA | 0.02 | HR-83 | (0.5) | W-2 | A1/B2 | (70/30) |
| 42 | A-5   | 0.45 | 3-3 | (1.0)  | Z29 | (0.25) | 20 | TPA | 0.02 | HR-5  | (0.3) | W-1 | A1/B1 | (80/20) |
| 43 | —     | —    | 1-6 | (1.5)  | Z5  | (0.30) | 1  | PBI | 0.03 | HR-22 | (0.1) | W-6 | A1/B1 | (80/20) |
| 44 | —     | —    | 1-4 | (2.0)  | Z4  | (0.40) | 1  | DIA | 0.03 | HR-22 | (0.1) | W-1 | A1/B1 | (80/20) |

The denotations in the Tables are as follows.

Acid generators are corresponding to Z1 to Z34 illustrated above,

[Basic Compound]
DIA: 2,6-diisopropylaniline
TPA: tripentylamine
PEA: N-phenyldiethanolamine
TOA: trioctylamine
PBI: 2-phenylbenzimidazole

[Surfactant]
W-1: Megaface F176 (produced by Dainippon Ink & Chemicals, Inc.) (fluorine-containing)
W-2: Megaface R08 (produced by Dainippon Ink & Chemicals, Inc.) (fluorine- and silicon-containing)
W-3: polysiloxane polymer KP-341 (produced by Shin-Etsu Chemical Co., Ltd.) (silicon-containing)
W-4: Troysol S-366 (produced by Troy Chemical)
W-5: PF656 (produced by OMNOVA, fluorine-containing)
W-6: PF6320 (produced by OMNOVA, fluorine-containing)

[Solvent]
A1: propylene glycol monomethyl ether acetate
A3: cyclohexanone
A4: γ-butyrolactone
B1: propylene glycol monomethyl ether
B2: ethyl lactate
B3: propylene carbonate <Dry Single Exposure>
<Image Performance Test>

An organic antireflection film ARC29A (produced by Nissan Chemical Industries, Ltd.) was coated on a silicon wafer and baked at 205° C. for 60 seconds to form an antireflection film having a film thickness of 78 nm. The positive resist composition prepared was coated thereon and baked at 120° C. for 60 seconds to form a resist film having a film thickness of 120 nm. The obtained wafer was exposed using an ArF excimer laser scanner (PAS5500/1100, manufactured by ASML, NA: 0.75) through a 6% halftone mask having a 1:1 line-and-space pattern of 72 nm. Thereafter, the wafer was heated under the after-exposure heating conditions shown in Table 6 and then cooled to room temperature.

Furthermore, the wafer was heated under the before-development heating conditions shown in Table 6, cooled to room temperature, developed with an aqueous tetramethylammonium hydroxide solution (2.38 mass %) for 30 seconds, rinsed with pure water and spin-dried to obtain a resist pattern. The resolving performance was evaluated by observing the cross-sectional shape of the 1:1 line-and-space pattern of 72 nm through a scanning microscope (S-4800, manufactured by Hitachi, Ltd.), and the results obtained are shown in Table 6.

composition prepared was coated thereon and baked at 120° C. for 60 seconds to form a resist film having a film thickness of 120 nm. The obtained wafer was subjected to first exposure using an ArF excimer laser scanner (PAS5500/1100, manufactured by ASML, NA: 0,75) through a 6% halftone mask with a pattern having 90 nm spaces and 270 nm lines. Thereafter, the wafer was heated under the first after-exposure heating conditions shown in Table 7 and then cooled to room temperature.

Furthermore, second exposure was performed by displacing the position of a mask having the same pattern as that of the first mask by 180 nm so as to locate the space in the middle between a space and a space of the first exposure, and the wafer was heated under the second after-exposure heating conditions shown in Table 7 and then heated under the before-development heating conditions shown in Table 7. Subsequently, the wafer was cooled to room temperature, developed with an aqueous tetramethylammonium hydroxide solution (2.38 mass %) for 30 seconds, rinsed with pure water and spin-dried to obtain a resist pattern.

The resolving performance was evaluated by observing the cross-sectional profile of the 1:1 line-and-space pattern of 90 nm through a scanning microscope (S-4800, manufactured by Hitachi, Ltd.), and the results obtained are shown in Table 7.

TABLE 6

Dry Single Exposure

| Example | Resist | After-Exposure Heating Conditions | | Before-Development Heating Conditions | | Pattern Profile |
| --- | --- | --- | --- | --- | --- | --- |
| | | Temperature | Time | Temperature | Time | |
| Example 1 | 1 | none | | 120° C. | 60 sec | somewhat forwardly tapered |
| Example 2 | 2 | none | | 120° C. | 60 sec | rectangular |
| Example 3 | 1 | 60° C. | 60 sec | 120° C. | 60 sec | rectangular |
| Example 4 | 2 | 60° C. | 60 sec | 120° C. | 60 sec | rectangular |
| Example 5 | 3 | 60° C. | 60 sec | 120° C. | 60 sec | rectangular |
| Example 6 | 4 | 60° C. | 60 sec | 120° C. | 60 sec | somewhat forwardly tapered |
| Example 7 | 5 | 60° C. | 60 sec | 120° C. | 60 sec | rectangular |
| Example 8 | 6 | 60° C. | 60 sec | 120° C. | 60 sec | somewhat forwardly tapered |
| Example 9 | 7 | 60° C. | 60 sec | 120° C. | 60 sec | rectangular |
| Example 10 | 8 | 60° C. | 60 sec | 120° C. | 60 sec | rectangular |
| Example 11 | 9 | 60° C. | 60 sec | 120° C. | 60 sec | rectangular |
| Example 12 | 10 | 60° C. | 60 sec | 120° C. | 60 sec | rectangular |
| Example 13 | 11 | 60° C. | 60 sec | 120° C. | 60 sec | rectangular |
| Example 14 | 12 | 60° C. | 60 sec | 120° C. | 60 sec | rectangular |
| Example 15 | 13 | 60° C. | 60 sec | 120° C. | 60 sec | rectangular |
| Example 16 | 14 | 60° C. | 60 sec | 120° C. | 60 sec | rectangular |
| Example 17 | 15 | 60° C. | 60 sec | 120° C. | 60 sec | rectangular |
| Example 18 | 16 | 60° C. | 60 sec | 120° C. | 60 sec | rectangular |
| Example 19 | 17 | 60° C. | 60 sec | 120° C. | 60 sec | rectangular |
| Example 20 | 18 | 60° C. | 60 sec | 120° C. | 60 sec | rectangular |
| Example 21 | 19 | 60° C. | 60 sec | 120° C. | 60 sec | rectangular |
| Example 22 | 20 | 60° C. | 60 sec | 120° C. | 60 sec | rectangular |
| Comparative Example 1 | 21 | 60° C. | 60 sec | 120° C. | 60 sec | forwardly tapered |
| Comparative Example 2 | 22 | 60° C. | 60 sec | 120° C. | 60 sec | forwardly tapered |

Examples 23 to 44 and Comparative Examples 3 and 4

Dry Double Exposure

<Image Performance Test>

An organic antireflection film ARC29A (produced by Nissan Chemical Industries, Ltd.) was coated on a silicon wafer and baked at 205° C. for 60 seconds to form an antireflection film having a film thickness of 78 nm. The positive resist

TABLE 7

Dry Double Exposure

| Example | Resist | First After-Exposure Heating Conditions | | Second After-Exposure Heating Conditions | | Before-Development Heating Conditions | | Pattern Profile |
|---|---|---|---|---|---|---|---|---|
| | | Temperature | Time | Temperature | Time | Temperature | Time | |
| Example 23 | 1 | none | | none | | 120° C. | 60 sec | somewhat forwardly tapered |
| Example 24 | 2 | none | | none | | 120° C. | 60 sec | rectangular |
| Example 25 | 1 | 60° C. | 60 sec | 60° C. | 60 sec | 120° C. | 60 sec | rectangular |
| Example 26 | 2 | 60° C. | 60 sec | 60° C. | 60 sec | 120° C. | 60 sec | rectangular |
| Example 27 | 3 | 60° C. | 60 sec | 60° C. | 60 sec | 120° C. | 60 sec | rectangular |
| Example 28 | 4 | 60° C. | 60 sec | 60° C. | 60 sec | 120° C. | 60 sec | somewhat forwardly tapered |
| Example 29 | 5 | 60° C. | 60 sec | 60° C. | 60 sec | 120° C. | 60 sec | rectangular |
| Example 30 | 6 | 60° C. | 60 sec | 60° C. | 60 sec | 120° C. | 60 sec | somewhat forwardly tapered |
| Example 31 | 7 | 60° C. | 60 sec | 60° C. | 60 sec | 120° C. | 60 sec | rectangular |
| Example 32 | 8 | 60° C. | 60 sec | 60° C. | 60 sec | 120° C. | 60 sec | rectangular |
| Example 33 | 9 | 60° C. | 60 sec | 60° C. | 60 sec | 120° C. | 60 sec | rectangular |
| Example 34 | 10 | 60° C. | 60 sec | 60° C. | 60 sec | 120° C. | 60 sec | rectangular |
| Example 35 | 11 | 60° C. | 60 sec | 60° C. | 60 sec | 120° C. | 60 sec | rectangular |
| Example 36 | 12 | 60° C. | 60 sec | 60° C. | 60 sec | 120° C. | 60 sec | rectangular |
| Example 37 | 13 | 60° C. | 60 sec | 60° C. | 60 sec | 120° C. | 60 sec | rectangular |
| Example 38 | 14 | 60° C. | 60 sec | 60° C. | 60 sec | 120° C. | 60 sec | rectangular |
| Example 39 | 15 | 60° C. | 60 sec | 60° C. | 60 sec | 120° C. | 60 sec | rectangular |
| Example 40 | 16 | 60° C. | 60 sec | 60° C. | 60 sec | 120° C. | 60 sec | rectangular |
| Example 41 | 17 | 60° C. | 60 sec | 60° C. | 60 sec | 120° C. | 60 sec | rectangular |
| Example 42 | 18 | 60° C. | 60 sec | 60° C. | 60 sec | 120° C. | 60 sec | rectangular |
| Example 43 | 19 | 60° C. | 60 sec | 60° C. | 60 sec | 120° C. | 60 sec | rectangular |
| Example 44 | 20 | 60° C. | 60 sec | 60° C. | 60 sec | 120° C. | 60 sec | rectangular |
| Comparative Example 3 | 21 | 60° C. | 60 sec | 60° C. | 60 sec | 120° C. | 60 sec | forwardly tapered |
| Comparative Example 4 | 22 | 60° C. | 60 sec | 60° C. | 60 sec | 120° C. | 60 sec | forwardly tapered |

Examples 45 to 64 and Comparative Examples 5 and 6

Immersion Single Exposure

<Image Performance Test>

An organic antireflection film ARC29A (produced by Nissan Chemical Industries, Ltd.) was coated on a silicon wafer and baked at 205° C. for 60 seconds to form an antireflection film having a film thickness of 78 nm. The positive resist composition prepared was coated thereon and baked at 120° C. for 60 seconds to form a resist film having a film thickness of 120 nm. The obtained wafer was exposed using an ArF excimer laser immersion scanner (PASS500/1250i, manufactured by ASML, NA: 0.85) through a 6% halftone mask having a 1:1 line-and-space pattern of 60 nm. Thereafter, the wafer was heated under the after-exposure heating conditions shown in Table 8 and then cooled to room temperature.

Furthermore, the wafer was heated under the before-development heating conditions shown in Table 8, cooled to room temperature, developed with an aqueous tetramethylammonium hydroxide solution (2.38 mass %) for 30 seconds, rinsed with pure water and spin-dried to obtain a resist pattern.

The resolving performance was evaluated by observing the cross-sectional profile of the 1:1 line-and-space pattern of 72 nm through a scanning microscope (S-4800, manufactured by Hitachi, Ltd.), and the results obtained are shown in Table 8.

TABLE 8

Immersion Single Exposure

| Example | Resist | After-Exposure Heating Conditions | | Before-Development Heating Conditions | | Pattern Profile |
|---|---|---|---|---|---|---|
| | | Temperature | Time | Temperature | Time | |
| Example 45 | 25 | none | | 120° C. | 60 sec | somewhat forwardly tapered |
| Example 46 | 26 | none | | 120° C. | 60 sec | rectangular |
| Example 47 | 25 | 60° C. | 60 sec | 120° C. | 60 sec | rectangular |
| Example 48 | 26 | 60° C. | 60 sec | 120° C. | 60 sec | rectangular |
| Example 49 | 27 | 60° C. | 60 sec | 120° C. | 60 sec | rectangular |
| Example 50 | 28 | 60° C. | 60 sec | 120° C. | 60 sec | somewhat forwardly tapered |

TABLE 8-continued

Immersion Single Exposure

| Example | Resist | After-Exposure Heating Conditions | | Before-Development Heating Conditions | | Pattern Profile |
| --- | --- | --- | --- | --- | --- | --- |
| | | Temperature | Time | Temperature | Time | |
| Example 51 | 29 | 60° C. | 60 sec | 120° C. | 60 sec | rectangular |
| Example 52 | 30 | 60° C. | 60 sec | 120° C. | 60 sec | somewhat forwardly tapered |
| Example 53 | 31 | 60° C. | 60 sec | 120° C. | 60 sec | rectangular |
| Example 54 | 32 | 60° C. | 60 sec | 120° C. | 60 sec | rectangular |
| Example 55 | 33 | 60° C. | 60 sec | 120° C. | 60 sec | rectangular |
| Example 56 | 34 | 60° C. | 60 sec | 120° C. | 60 sec | rectangular |
| Example 57 | 35 | 60° C. | 60 sec | 120° C. | 60 sec | rectangular |
| Example 58 | 36 | 60° C. | 60 sec | 120° C. | 60 sec | rectangular |
| Example 59 | 37 | 60° C. | 60 sec | 120° C. | 60 sec | rectangular |
| Example 60 | 38 | 60° C. | 60 sec | 120° C. | 60 sec | rectangular |
| Example 61 | 39 | 60° C. | 60 sec | 120° C. | 60 sec | rectangular |
| Example 62 | 40 | 60° C. | 60 sec | 120° C. | 60 sec | rectangular |
| Example 63 | 41 | 60° C. | 60 sec | 120° C. | 60 sec | rectangular |
| Example 64 | 42 | 60° C. | 60 sec | 120° C. | 60 sec | rectangular |
| Comparative Example 5 | 43 | 60° C. | 60 sec | 120° C. | 60 sec | forwardly tapered |
| Comparative Example 6 | 44 | 60° C. | 60 sec | 120° C. | 60 sec | forwardly tapered |

Examples 67 to 86 and Comparative Examples 7 and 8

Immersion Double Exposure

<Image Performance Test

An organic antireflection film ARC29A (produced by Nissan Chemical Industries, Ltd.) was coated on a silicon wafer and baked at 205° C. for 60 seconds to form an antireflection film having a film thickness of 78 nm. The positive resist composition prepared was coated thereon and baked at 120° C. for 60 seconds to form a resist film having a film thickness of 120 nm. The obtained wafer was exposed using an ArF excimer laser immersion scanner (PASS500/1250i, manufactured by ASML, NA: 0.85) through a 6% halftone mask with a pattern having 80 nm spaces and 240 nm lines. Thereafter, the wafer was heated under the first after-exposure heating conditions shown in Table 9 and then cooled to room temperature.

Furthermore, second exposure was performed by displacing the position of a mask having the same pattern as that of the first mask by 160 nm so as to locate the space in the middle between a space and a space of the first exposure, and the wafer was heated under the second after-exposure heating conditions shown in Table 9 and then heated under the before-development heating conditions shown in Table 9. Subsequently, the wafer was cooled to room temperature, developed with an aqueous tetramethylammonium hydroxide solution (2.38 mass %) for 30 seconds, rinsed with pure water and spin-dried to obtain a resist pattern.

The resolving performance was evaluated by observing the cross-sectional profile of the 1:1 line-and-space pattern of 80 nm through a scanning microscope (S-4800, manufactured by Hitachi, Ltd.), and the results obtained are shown in Table 9.

TABLE 9

Immersion Double Exposure

| Example | Resist | First After-Exposure Heating Conditions | | Second After-Exposure Heating Conditions | | Before-Development Heating Conditions | | Pattern Profile |
| --- | --- | --- | --- | --- | --- | --- | --- | --- |
| | | Temperature | Time | Temperature | Time | Temperature | Time | |
| Example 67 | 25 | none | | none | | 120° C. | 60 sec | somewhat forwardly tapered |
| Example 68 | 26 | none | | none | | 120° C. | 60 sec | rectangular |
| Example 69 | 25 | 60° C. | 60 sec | 60° C. | 60 sec | 120° C. | 60 sec | rectangular |
| Example 70 | 26 | 60° C. | 60 sec | 60° C. | 60 sec | 120° C. | 60 sec | rectangular |
| Example 71 | 27 | 60° C. | 60 sec | 60° C. | 60 sec | 120° C. | 60 sec | rectangular |
| Example 72 | 28 | 60° C. | 60 sec | 60° C. | 60 sec | 120° C. | 60 sec | somewhat forwardly tapered |
| Example 73 | 29 | 60° C. | 60 sec | 60° C. | 60 sec | 120° C. | 60 sec | rectangular |
| Example 74 | 30 | 60° C. | 60 sec | 60° C. | 60 sec | 120° C. | 60 sec | somewhat forwardly tapered |
| Example 75 | 31 | 60° C. | 60 sec | 60° C. | 60 sec | 120° C. | 60 sec | rectangular |
| Example 76 | 32 | 60° C. | 60 sec | 60° C. | 60 sec | 120° C. | 60 sec | rectangular |
| Example 77 | 33 | 60° C. | 60 sec | 60° C. | 60 sec | 120° C. | 60 sec | rectangular |
| Example 78 | 34 | 60° C. | 60 sec | 60° C. | 60 sec | 120° C. | 60 sec | rectangular |
| Example 79 | 35 | 60° C. | 60 sec | 60° C. | 60 sec | 120° C. | 60 sec | rectangular |
| Example 80 | 36 | 60° C. | 60 sec | 60° C. | 60 sec | 120° C. | 60 sec | rectangular |
| Example 81 | 37 | 60° C. | 60 sec | 60° C. | 60 sec | 120° C. | 60 sec | rectangular |

TABLE 9-continued

| | | Immersion Double Exposure | | | | | | |
|---|---|---|---|---|---|---|---|---|
| | | First After-Exposure Heating Conditions | | Second After-Exposure Heating Conditions | | Before-Development Heating Conditions | | |
| Example | Resist | Temperature | Time | Temperature | Time | Temperature | Time | Pattern Profile |
| Example 82 | 38 | 60° C. | 60 sec | 60° C. | 60 sec | 120° C. | 60 sec | rectangular |
| Example 83 | 39 | 60° C. | 60 sec | 60° C. | 60 sec | 120° C. | 60 sec | rectangular |
| Example 84 | 40 | 60° C. | 60 sec | 60° C. | 60 sec | 120° C. | 60 sec | rectangular |
| Example 85 | 41 | 60° C. | 60 sec | 60° C. | 60 sec | 120° C. | 60 sec | rectangular |
| Example 86 | 42 | 60° C. | 60 sec | 60° C. | 60 sec | 120° C. | 60 sec | rectangular |
| Comparative Example 7 | 43 | 60° C. | 60 sec | 60° C. | 60 sec | 120° C. | 60 sec | forwardly tapered |
| Comparative Example 8 | 44 | 60° C. | 60 sec | 60° C. | 60 sec | 120° C. | 60 sec | forwardly tapered |

It is seen from the results in Tables 6 to 9 that a pattern with excellent pattern profile can be formed by the method of the present invention.

According to the present invention, a resist composition and a pattern forming method, which are assured of high resolving power and applicable also to a multiple exposure process of performing exposure a plurality of times on the same resist film, can be provided.

The entire disclosure of each and every foreign patent application from which the benefit of foreign priority has been claimed in the present application is incorporated herein by reference, as if fully set forth.

What is claimed is:

1. A positive resist composition, comprising:
   (A) a compound capable of generating an acid upon irradiation with actinic rays or radiation;
   (B) a resin of which solubility in an alkali developer increases under an action of an acid;
   (C) a compound capable of decomposing under an action of an acid to generate an acid having a dissociation constant (pKa) of 3 or less; and
   (D) a compound which itself acts as a base for the acids generated from the component (A) and the component (C) but decomposes upon irradiation with actinic rays or radiation to lose a basicity for the acids generated from the component (A) and the component (C).

2. The positive resist composition according to claim 1, wherein the resin as the component (B) contains at least one of a repeating unit represented by formula (Ia) and a repeating unit represented by formula (Ib) and is a resin of which solubility in an alkali developer increases under an action of an acid:

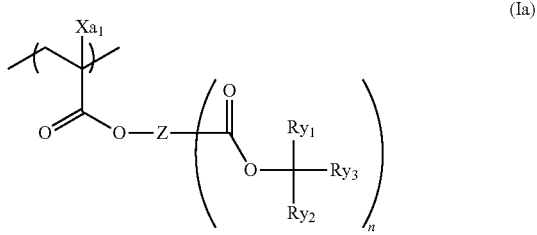

(Ia)

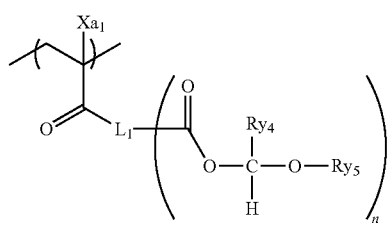

(Ib)

wherein $Xa_1$ represents a hydrogen atom, an alkyl group, a cyano group or a halogen atom;

$Ry_1$ to $Ry_3$ each independently represents an alkyl group or a cycloalkyl group, and at least two members out of $Ry_1$ to $Ry_3$ may combine to form a monocyclic or polycyclic cyclohydrocarbon structure;

Z represents a (n+1)-valent linking group;

$Ry_4$ represents a hydrogen atom, an alkyl group or a cycloalkyl group; $Ry_5$ represents an alkyl group or a cycloalkyl group; and $Ry_4$ and $Ry_5$ may combine to form a monocyclic or polycyclic cyclohydrocarbon structure;

$L_1$ represents a (n+1)-valent linking group; and n represents an integer of 1 to 3.

3. The positive resist composition according to claim 1, wherein the compound as the component (D) is a compound capable of generating at least one of a carboxylic acid and a compound represented by formula (I) upon irradiation with actinic rays or radiation:

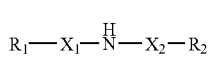

(I)

wherein $R_1$ and $R_2$ each independently represents a monovalent organic group, provided that either one of $R_1$ and $R_2$ has a proton acceptor functional group, $R_1$ and $R_2$ may combine to form a ring, and the ring formed may have a proton acceptor functional group; and $X_1$ and $X_2$ each independently represents —CO— or —$SO_2$—.

4. The positive resist composition according to claim 1, wherein the compound as the component (A) is a sulfonium salt of an alkylsulfonic acid, a benzenesulfonic acid, an imide acid or a methide acid.

5. The positive resist composition according to claim 1, wherein the compound as the component (C) generates the same acid under an action of an acid as the acid generated from the compound as the component (A) upon irradiation with actinic rays or radiation.

6. A pattern forming method, comprising:
forming a resist film from the positive resist composition according to claim 1; and exposing and developing the resist film.

7. The positive resist composition according to claim 1, wherein the resin as the component (B) further contains a repeating unit having a lactone structure.

8. The positive resist composition according to claim 1, wherein the resin as the component (B) further contains a repeating unit having a hydroxyl group or a cyano group.

9. The positive resist composition according to claim 1, further comprising: at least one of a fluorine-containing surfactant and a silicon-containing surfactant.

10. The positive resist composition according to claim 1, further comprising: a hydrophobic resin.

11. A pattern forming method, comprising in this order:
coating a substrate with the positive resist composition according to claim 1, so as to form a resist film;
exposing the resist film;
heating the resist film at a first temperature;
heating the resist film at a second temperature; and
developing the resist film,
wherein the second temperature is higher than the first temperature.

12. The positive resist composition according to claim 1, wherein the compound as the component (C) is represented by any one of formulas (1) to (5):

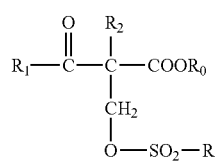

(1)

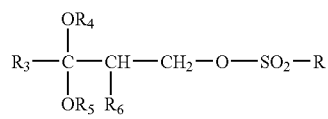

(2)

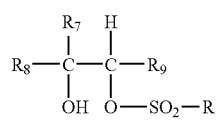

(3)

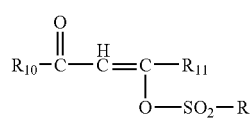

(4)

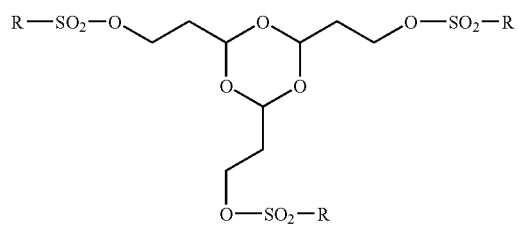

(5)

wherein R represents an alkyl group, a cycloalkyl group, an aryl group or an aralkyl group;
$R_o$ represents a group which leaves under the action of an acid;
$R_1$ represents an alkyl group, a cycloalkyl group, an aryl group, an aralkyl group, an alkoxy group or an aryloxy group;
$R_2$ represents an alkyl group or an aralkyl group;
$R_3$ represents an alkyl group, a cycloalkyl group, an aryl group, or an aralkyl group;
$R_4$ and $R_5$ each independently represents an alkyl group, and $R_4$ and $R_5$ may combine with each other to form a ring;
$R_6$ represents a hydrogen atom or an alkyl group;
$R_7$ represents a hydrogen atom, an alkyl group, a cycloalkyl group, an aryl group or an aralkyl group;
$R_8$ represents an alkyl group, a cycloalkyl group, an aryl group or an aralkyl group;
$R_9$ represents a hydrogen atom, an alkyl group, a cycloalkyl group, an aryl group or an aralkyl group and $R_9$ may combine with $R_7$ to form a ring;
$R_{10}$ represents an alkyl group, a cycloalkyl group, an alkoxy group, an aryl group, an aralkyl group, an aryloxy group or an alkenyloxy group;
$R_{11}$ represents an alkyl group, a cycloalkyl group, an alkoxy group, an aryl group, an aralkyl group, an aryloxy group or an alkenyl group and $R_{10}$ and $R_{11}$ may combine with each other to form a ring.

13. The positive resist composition according to claim 1 wherein the resin as the component (B) does not contain an aromatic group.

14. The positive resist composition according to claim 1 wherein the compound as the component (D) is a sulfonium salt or an iodonium salt.

15. The pattern forming method according to claim 6 wherein the resist film is exposed by immersion exposure.

16. The pattern forming method according to claim 6 wherein the resist film is exposed with an ArF excimer laser having a wavelength of 193 nm.

17. The positive resist composition according to claim 1, wherein the acid generated from the compound as the component (C) is a sulfonic acid having an alkyl group, a cycloalkyl group, an aryl group or an aralkyl group.

18. The positive resist composition according to claim 10, wherein the hydrophobic resin has a fluorine atom.

19. The positive resist composition according to claim 10, wherein the hydrophobic resin has a silicon atom.

* * * * *